United States Patent
Cardwell et al.

(10) Patent No.: US 12,027,635 B2
(45) Date of Patent: Jul. 2, 2024

(54) METHODS FOR COUPLING OF OPTICAL FIBERS TO A POWER PHOTODIODE

(71) Applicant: SLT Technologies, Inc., Los Angeles, CA (US)

(72) Inventors: Drew W. Cardwell, Camas, WA (US); Mark P. D'Evelyn, Vancouver, WA (US)

(73) Assignee: SLT Technologies, Inc., Los Angeles, CA (US)

( * ) Notice: Subject to any disclaimer, the term of this patent is extended or adjusted under 35 U.S.C. 154(b) by 0 days.

(21) Appl. No.: 18/059,307

(22) Filed: Nov. 28, 2022

(65) Prior Publication Data

US 2023/0104302 A1    Apr. 6, 2023

Related U.S. Application Data

(63) Continuation of application No. 17/151,110, filed on Jan. 15, 2021, now Pat. No. 11,575,055, which is a
(Continued)

(51) Int. Cl.
*H01L 31/0232* (2014.01)
*G01J 1/04* (2006.01)
(Continued)

(52) U.S. Cl.
CPC ...... *H01L 31/02327* (2013.01); *G01J 1/0425* (2013.01); *G01J 1/44* (2013.01); *H01L 31/109* (2013.01); *G01J 2001/4466* (2013.01)

(58) Field of Classification Search
CPC ......... H01L 31/02327; H01L 31/02161; H01L 31/022408; H01L 31/03048;
(Continued)

(56) References Cited

U.S. PATENT DOCUMENTS

| 5,883,988 A | 3/1999 | Yamamoto et al. |
| 5,937,274 A * | 8/1999 | Kondow ............. H01L 33/30 |
| | | 257/E27.128 |

(Continued)

FOREIGN PATENT DOCUMENTS

| CN | 107046071 A | 8/2017 |
| JP | H11500273 A * | 1/1999 |

(Continued)

OTHER PUBLICATIONS

L. J. Meyer, "Using fiber optics with analog RF signals," IEEE 39th Vehicular Technology Conference, San Francisco, CA, USA, 1989, pp. 398-400 vol. 1, doi: 10.1109/VETEC.1989.40106. (Year: 1989).*

(Continued)

*Primary Examiner* — Sitaramarao S Yechuri
(74) *Attorney, Agent, or Firm* — Patterson + Sheridan, LLP

(57) ABSTRACT

According to the present disclosure, techniques related to manufacturing and applications of power photodiode structures and devices based on group-III metal nitride and gallium-based substrates are provided. More specifically, embodiments of the disclosure include techniques for fabricating photodiode devices comprising one or more of GaN, AlN, InN, InGaN, AlGaN, and AlInGaN, structures and devices. Such structures or devices can be used for a variety of applications including optoelectronic devices, photodiodes, power-over-fiber receivers, and others.

18 Claims, 58 Drawing Sheets

Related U.S. Application Data continuation-in-part of application No. 16/930,250, filed on Jul. 15, 2020, now Pat. No. 11,444,216.

(60) Provisional application No. 62/978,281, filed on Feb. 18, 2020, provisional application No. 62/874,487, filed on Jul. 15, 2019.

(51) Int. Cl.
*G01J 1/44* (2006.01)
*H01L 31/109* (2006.01)

(58) Field of Classification Search
CPC ........... H01L 31/035236; H01L 31/036; H01L 31/109; H01L 31/1892; H01L 31/105; H01L 31/1852; G02B 6/4206; G02B 6/4214; H02J 50/30; G01J 1/0425; G01J 1/44; G01J 2001/4466
See application file for complete search history.

(56) References Cited

U.S. PATENT DOCUMENTS

| | | | |
|---|---|---|---|
| 6,297,495 B1 | 10/2001 | Bulovic et al. | |
| 6,333,458 B1 | 12/2001 | Forrest et al. | |
| 6,440,769 B2 | 8/2002 | Peumans et al. | |
| 6,806,508 B2 | 10/2004 | D'Evelyn et al. | |
| 7,119,372 B2 | 10/2006 | Stokes et al. | |
| 8,148,801 B2 | 4/2012 | D'Evelyn | |
| 8,455,894 B1 * | 6/2013 | D'Evelyn | H01L 33/405 257/E33.068 |
| 8,866,149 B2 | 10/2014 | Holder et al. | |
| 9,917,227 B1 | 3/2018 | Hurni et al. | |
| 2006/0000976 A1 | 1/2006 | Brouns | |
| 2006/0255341 A1 | 11/2006 | Pinnington et al. | |
| 2008/0123198 A1 | 5/2008 | Fujita | |
| 2010/0147382 A1 | 6/2010 | Chiang et al. | |
| 2013/0250991 A1 | 9/2013 | Homewood et al. | |
| 2014/0147650 A1 | 5/2014 | Jiang et al. | |
| 2014/0353713 A1 | 12/2014 | Kuh et al. | |
| 2015/0146757 A1 | 5/2015 | Ohki et al. | |
| 2015/0221803 A1 | 8/2015 | Suarez Arias | |
| 2016/0020284 A1 | 1/2016 | D'Evelyn et al. | |
| 2018/0195206 A1 | 7/2018 | Jiang et al. | |
| 2019/0088495 A1 | 3/2019 | Youtsey et al. | |
| 2019/0115497 A1 | 4/2019 | Zhang et al. | |
| 2019/0288132 A1 | 9/2019 | Wang et al. | |
| 2020/0373723 A1 | 11/2020 | Sugime | |
| 2020/0386957 A1 | 12/2020 | Sugime | |
| 2021/0036784 A1 | 2/2021 | Sugime | |
| 2021/0036785 A1 | 2/2021 | Sugime et al. | |
| 2021/0184769 A1 | 6/2021 | Suyama | |
| 2021/0247578 A1 | 8/2021 | Tamate | |
| 2021/0359759 A1 | 11/2021 | Suyama | |
| 2022/0094433 A1 | 3/2022 | Mizukami | |
| 2022/0094444 A1 | 3/2022 | Tamate | |
| 2022/0094445 A1 | 3/2022 | Tamate | |
| 2022/0094446 A1 | 3/2022 | Sugime | |
| 2022/0094447 A1 | 3/2022 | Tetsuka | |
| 2022/0094448 A1 | 3/2022 | Kobayashi | |
| 2022/0094449 A1 | 3/2022 | Suyama | |
| 2022/0094450 A1 | 3/2022 | Kobayashi et al. | |
| 2022/0224421 A1 | 7/2022 | Tamate | |
| 2022/0236487 A1 | 7/2022 | Tetsuka | |
| 2022/0236498 A1 | 7/2022 | Tsunoda | |
| 2022/0239157 A1 | 7/2022 | Tetsuka | |
| 2022/0255633 A1 | 8/2022 | Tetsuka | |
| 2022/0285996 A1 | 9/2022 | Tetsuka | |
| 2022/0311282 A1 | 9/2022 | Suyama | |
| 2022/0352992 A1 | 11/2022 | Sugime | |
| 2022/0360343 A1 | 11/2022 | Suyama | |
| 2022/0360344 A1 | 11/2022 | Sugime | |
| 2022/0365581 A1 | 11/2022 | Mizukami | |
| 2022/0368426 A1 | 11/2022 | Tamate | |
| 2022/0393514 A1 | 12/2022 | Kobayashi | |
| 2022/0393773 A1 | 12/2022 | Suyama | |

FOREIGN PATENT DOCUMENTS

| | | |
|---|---|---|
| WO | 2002054129 | 7/2002 |
| WO | 2014141028 A1 | 9/2014 |
| WO | 2021/075087 | 4/2021 |
| WO | 2021/075088 | 4/2021 |
| WO | 2021/075164 | 4/2021 |
| WO | 2021/075196 | 4/2021 |

OTHER PUBLICATIONS

X. Zhou et al., "Vertically Integrated Optical Sensor With Photoconductive Gain > 10 and Fill Factor > 70%," in IEEE Electron Device Letters, vol. 39, No. 3, pp. 386-389, Mar. 2018, doi: 10.1109/LED.2018.2792003 (Year: 2018).*

C. Budelmann, "Opto-Electronic Sensor Network Powered Over Fiber for Harsh Industrial Applications," in IEEE Transactions on Industrial Electronics, vol. 65, No. 2, pp. 1170-1177, Feb. 2018, doi: 10.1109/TIE.2017.2733479. (Year: 2018).*

Carlo De Santi et al. "GaN-Based Laser Wireless Power Transfer System", Materials 2018, 11, 153; doi: 10.3390/ma11010153.

"Improved Photovoltaic Effects of a Vertical-Type InGaN/GaN Multiple Quantum Well Solar Cell", Si-Young Bae et al 2011 Jpn. J. Appl. Phys. 50 092301.

J. Bai et al. "Efficiency enhancement of InGaN/GaN solar cells with nanostructures", Appl. Phys. Lett. 104, 051129 (2014); https://doi.org/10.1063/1.4864640 Submitted: Dec. 18, 2013 . Accepted: Jan. 23, 2014 . Published Online: Feb. 7, 2014.

Xiao-Mei Cai et al. "Fabrication and characterization of InGaN p-i-n homojunction solar cell", Appl. Phys. Lett. 95, 173504 (2009); https://doi.org/10.1063/1.3254215 Submitted: Jul. 24, 2009 . Accepted: Oct. 5, 2009 . Published Online: Oct. 28, 2009.

X. Chen et al. "Growth, fabrication, and characterization of InGaN solar cells", p hys. stat. sol. (a) 205, No. 5, 1103-1105 (2008) / DOI 10.1002/pssa.200778695.

Zhaoying Chen et al. "Positive temperature coefficient of photovoltaic efficiency in solar cells based on InGaN/GaN MQWs", Appl. Phys. Lett. 109, 062104 (2016); https://doi.org/10.1063/1.4960765 Submitted: Jul. 2, 2016 . Accepted: Jul. 26, 2016 . Published Online: Aug. 10, 2016.

Sang-Bae Choi, "Effect of indium composition on carrier escape in InGaN/GaN multiple quantum well solar cells", Appl. Phys. Lett. 103, 033901 (2013); https://doi.org/10.1063/1.4813623 Submitted: Jun. 4, 2013 . Accepted: Jun. 19, 2013 . Published Online: Jul. 15, 2013.

R. Dahal et al. "InGaN/GaN multiple quantum well concentrator solar cells", Appl. Phys. Lett. 97, 073115 (2010); https://doi.org/10.1063/1.3481424 Submitted: Jul. 8, 2010 . Accepted: Aug. 1, 2010 . Published Online: Aug. 19, 2010.

R. Dahal et al. "InGaN/GaN multiple quantum well solar cells with long operating wavelengths", Appl. Phys. Lett. 94, 063505 (2009); https://doi.org/10.1063/1.3081123 Submitted: Dec. 9, 2008 . Accepted: Jan. 20, 2009 . Published Online: Feb. 10, 2009.

Young, Nathan "Improving Efficiency of III-N Quantum Well Based Optoelectronic Devices through Active Region Design and Growth Techniques" 2015.

Robert Farrell et al. "High quantum efficiency InGaN/GaN multiple quantum well solar cells with spectral response extending out to 520 nm", Article in Applied Physics Letters—May 2011.

Guangxu Ju, "Role of threading dislocations in strain relaxation during GaInN growth monitored by real-time X-ray reflectivity", Article in Applied Physics Letters . Jun. 2017.

Y. El Gmili et al. "Multilayered InGaN/GaN structure vs. single InGaN layer for solar cell applications: A comparative study" Science Direct. Acta Materialia 61 (2013) 6587-6596.

Ray-Hua Horng et al. "Improved Conversion Efficiency of GaN/InGaN Thin-Film Solar Cells", IEEE Electron Device Letters, vol. 30, No. 7, Jul. 2009.

(56) References Cited

OTHER PUBLICATIONS

Omkar Jani et al. "Characterization and Analysis of InGaN Photovoltaic Devices", 0-7803-8707-4/05/$20.00 02005 IEEE.
Omkar Jani, "Design and characterization of solar cells", Appl. Phys. Lett. 91, 132117 (2007); https://doi.org/10.1063/1.2793180 Submitted: Jul. 22, 2007 . Accepted: Sep. 11, 2007 . Published Online: Sep. 28, 2007.
Omkar Jani1 et al. "Design, Growth, Fabrication and Characterization of High-Band Gap InGaN/GaN Solar Cells", 1-4244-0016-3/06/$20.00 ® 2006 IEEE.
Omkar K. Jani, "Development of Wide-Band Gap InGaN Solar Cells for High-Efficiency Photovoltaics", 2008.
Ming-Jer Jeng et al. "Effect of Silicon Doping on Performance of 30-Pair InxGa1¬xN/GaN Quantum Well Solar Cells", Japanese Journal of Applied Physics 49 (2010) 052302.
Ming-Jer Jeng, "Influence of Polarization on the Efficiency of InxGa1 xN/GaN p-i-n Solar Cells", Japanese Journal of Applied Physics 49 (2010) 128001.
Asghar Asgari et al. "Temperature dependence of InGaN/GaN multiple quantum well based high efficiency solar cell", Solar Energy Materials & Solar Cells 95 (2011) 3124-3129.
Yen-Kuang Kuo et al. "Numerical Study of the Effects of Hetero-Interfaces, Polarization Charges, and Step-Graded Interlayers on the Photovoltaic Properties of (0001) Face GaN/InGaN p-i-n Solar Cell", IEEE Journal of Quantum Electronics, vol. 48, No. 3, Mar. 2012.
Yousuke Kuwahara et al. "GaInN-Based Solar Cells Using Strained-Layer GaInN/GaInN Superlattice Active Layer on a Freestanding GaN Substrate", Applied Physics Express 4 (2011) 021001.
Yosuke Kuwahara et al. "Realization of Nitride-Based Solar Cell on Freestanding GaN Substrate", 2010 Appl. Phys. Express 3 111001.
J. R. Lang, et al. "High external quantum efficiency and fillfactor InGaN/GaN heterojunction solar cells grown by -based molecular beam epitaxy", Appl. Phys. Lett. 98, 131115 (2011); https://doi.org/10.1063/1.3575563 Submitted: Mar. 3, 2011 . Accepted: Mar. 21, 2011 . Published Online: Apr. 1, 2011.
Z. Q. Li et al. "Effects of polarization charge on the photovoltaic properties of InGaN solar cells", Phys. Status Solidi A 208, No. 4, 928-931 (2011) / DOI 10.1002/pssa.201026489.
Na Lu, "III-nitrides for energy production: photovoltaic and thermoelectric applications", Semicond. Sci. Technol. 28 (2013) 074023 (11pp).
Elison Matioli et al. "High internal and external quantum efficiency InGaN/GaN solar cells", Applied Physics Letters 98, 021102 (2011).
Anna Mukhtarova et al. "Dependence of the photovoltaic performance of pseudomorphic InGaN/GaN multiple-quantum-well solar cells on the active region thickness", Appl. Phys. Lett. 108, 161907 (2016); https://doi.org/10.1063/1.4947445 Submitted: Feb. 22, 2016 . Accepted: Apr. 12, 2016 . Published Online: Apr. 22, 2016.
Carl J. Neufeld et al. "Effect of doping and polarization on carrier collection in InGaN quantum well solar cells", Appl. Phys. Lett. 98, 243507 (2011); https://doi.org/10.1063/1.3595487 Submitted: Mar. 24, 2011 . Accepted: May 9, 2011 Published Online: Jun. 16, 2011.
Carl J. Neufeld et al. "High quantum efficiency InGaN/GaN solar cells with 2.95 eV band gap", Appl. Phys. Lett. 93, 143502 (2008); https://doi.org/10.1063/1.2988894 Submitted: Aug. 19, 2008 . Accepted: Sep. 3, 2008 . Published Online: Oct. 8, 2008.
Carl Neufeld et al. "Effect of doping and polarization on carrier collection in InGaN quantum well solar cells", Article in Applied Physics Letters—Jul. 2011, DOI: 10.1063/1.3595487—Source: IEEE Xplore.
Cyril Pernot et al. "Solar-Blind UV Photodetectors Based on GaN/AlGaN p-i-n Photodiodes", Jpn. J. Appl. Phys. vol. 39 (2000) pp. L 387-L 389, Part 2, No. 5A, May 1, 2000, The Japan Society of Applied Physics.
L. Redaelli et al. "Effect of the quantum well thickness on the performance of InGaN photovoltaic cells", Appl. Phys. Lett. 105, 131105 (2014); https://doi.org/10.1063/1.4896679 Submitted: Jul. 29, 2014 . Accepted: Sep. 16, 2014 . Published Online: Sep. 29, 2014.

Daisuke Iida et al. "Analysis of strain relaxation process in GaInN/GaN heterostructure by in situ X-ray diffraction monitoring during metalorganic vapor-phase epitaxial growth", Article in physica status solidi (RRL)—Rapid Research Letters—Mar. 2013.
Liwen Sang et al. "Enhanced performance of InGaN solar cell by using a super-thin AlN interlayer", Appl. Phys. Lett. 99, 161109 (2011); https://doi.org/10.1063/1.3654155 Submitted: Sep. 4, 2011 . Accepted: Sep. 30, 2011 . Published Online: Oct. 19, 2011.
Jinn-Kong Sheu et al., "Demonstration of GaN-Based Solar Cells With GaN/InGaN Superlattice Absorption Layers", IEEE Electron Device Letters, vol. 30, No. 3, Mar. 2009.
Ehsan Vadiee, et al. "Evaluating the performance of InGaN/GaN multi-quantum-well solar cells operated at elevated temperatures via DC and small-signal AC analysis", Japanese Journal of Applied Physics 58, 101003 (2019).
Sirona Valdueza-Felip et al. "Photovoltaic Response of InGaN/GaN Multiple-Quantum Well Solar Cells", Japanese Journal of Applied Physics 52 (2013) 08JH05.
Noriyuki Watanabe et al. "Barrier Thickness Dependence of Photovoltaic Characteristics of InGaN/GaN Multiple Quantum Well Solar Cells", 2012 Jpn. J. Appl. Phys. 51 10ND10.
Noriyuki Watanabe et al. "Influence of InGaN/GaN multiple quantum well structure on photovoltaic characteristics of solar cell", 2014 Jpn. J. Appl. Phys. 53 112301.
J. J. Wierer, et al. "Influence of barrier thickness on the performance of InGaN/GaN multiple quantum well solar cells" Appl. Phys. Lett. 100, 111119 (2012); https://doi.org/10.1063/1.3695170 Submitted: Jan. 24, 2012 . Accepted: Mar. 1, 2012 . Published Online: Mar. 16, 2012.
Zhang Xiao-Bin et al. "InGaN/GaN multiple quantum well solar cells with an enhanced open-circuit voltage", 2011 Chinese Phys. B 20 028402.
C. C. Yang et al. "Enhancement of the conversion efficiency of GaN-based photovoltaic devices with AlGaN/InGaN absorption layers", Appl. Phys. Lett. 97, 021113 (2010); https://doi.org/10.1063/1.3463469, Submitted: Apr. 24, 2010 . Accepted: Jun. 22, 2010 . Published Online: Jul. 16, 2010.
J. Yang, et al. "Photovoltaic response of InGaN/GaN multi-quantum well solar cells enhanced by inserting thin GaN cap layers", Journal of Alloys and Compounds 635 (2015) 82-86.
N. G. Young et al. "High-performance broadband optical coatings on InGaN/GaN solar cells for multijunction device integration", Appl. Phys. Lett. 104, 163902 (2014); https://doi.org/10.1063/1.4873117 Submitted: Mar. 12, 2014 . Accepted: Apr. 11, 2014 . Published Online: Apr. 22, 2014.
N. G. Young et al. "High performance thin quantum barrier InGaN/GaN solar cells on sapphire and bulk (0001) GaN substrates", Appl. Phys. Lett. 103, 173903 (2013); https://doi.org/10.1063/1.4826483 Submitted: Aug. 16, 2013 . Accepted: Oct. 6, 2013 . Published Online: Oct. 22, 2013.
Xinhe Zheng et al. High-quality InGaN/GaN heterojunctions and their photovoltaic effects, Phys. Lett. 93, 261108 (2008); https://doi.org/10.1063/1.3056628 Submitted: Oct. 30, 2008 . Accepted: Dec. 4, 2008 . Published Online: Dec. 29, 2008.
International Search Report dated Apr. 19, 2021, Application No. PCT/US2020/066900.
Asgari, A., Khalili, K. (2011). Temperature dependence of InGaN/GaN multiple quantum well based high efficiency solar cell. Solar Energy Materials and Solar Cells, 95(11), 3124-3129. https://doi.org/10.1016/j.solmat.2011.07.001.
Bae, S.-Y., Shim, J.-P., Lee, D.-S., Jeon, S.-R., Namkoong, G. (2011). Improved Photovoltaic Effects of a Vertical-Type InGaN/GaN Multiple Quantum Well Solar Cell. Japanese Journal of Applied Physics, 50(98), 092301.
Bai, J., Yang, C. C., Athanasiou, M., Wang, T. (2014). Efficiency enhancement of InGaN/GaN solar cells with nanostructures. Applied Physics Letters, 104(5), 051129. https://doi.org/10.1063/1.4864640.
Cai, X. M., Zeng, S. W., Zhang, B. P. (2009). Fabrication and characterization of InGaN p-i-n homojunction solar cell. Applied Physics Letters, 95(17), 173504. https://doi.org/10.1063/1.3254215.
Chen, X., Matthews, K. D., Hao, D., Schaff, W. J., Eastman, L. F. (2008). Growth, fabrication, and characterization of InGaN solar

(56) References Cited

OTHER PUBLICATIONS cells. Physica Status Solidi (A) Applications and Materials Science, 205(5), 1103-1105. https://doi.org/10.1002/pssa.200778695.

Chen, Z., Zheng, X., Li, Z., Wang, P., Rong, X., Wang, T., Yang, X., Xu, F., Qin, Z., Ge, W., Shen, B., Wang, X. (2016). Positive temperature coefficient of photovoltaic efficiency in solar cells based on InGaN/GaN MQWs. Applied Physics Letters, 109(6), 062104. https://doi.org/10.1063/1.4960765.

Choi, S. B., Shim, J. P., Kim, D. M., Jeong, H. Il, Jho, Y. D., Song, Y. H., Lee, D. S. (2013). Effect of indium composition on carrier escape in InGaN/GaN multiple quantum well solar cells. Applied Physics Letters, 103(3), 033901. https://doi.org/10.1063/1.4813623.

Dahal, R., Li, J., Aryal, K., Lin, J. Y., Jiang, H. X. (2010). InGaN/GaN multiple quantum well concentrator solar cells. Applied Physics Letters, 97(7), 073115. https://doi.org/10.1063/1.3481424.

Dahal, R., Pantha, B., Li, J., Lin, J. Y., Jiang, H. X. (2009). InGaN/GaN multiple quantum well solar cells with long operating wavelengths. Applied Physics Letters, 94(6), 063505. https://doi.org/10.1063/1.3081123.

De Santi, C., Meneghini, M., Caria, A., Dogmus, E., Zegaoui, M., Medjdoub, F., Kalinic, B., Cesca, T., Meneghesso, G., Zanoni, E. (2018). GaN-based laser wireless power transfer system. Materials, 11(1), 153. https://doi.org/10.3390/ma11010153.

El Gmili, Y., Orsal, G., Pantzas, K., Moudakir, T., Sundaram, S., Patriarche, G., Hester, J., Ahaitouf, A., Salvestrini, J. P., Ougazzaden, A. (2013). Multilayered InGaN/GaN structure vs. single InGaN layer for solar cell applications: A comparative study. Acta Materialia, 61(17), 6587-6596. https://doi.org/10.1016/j.actamat.2013.07.041.

Farrell, R. M., Neufeld, C. J., Cruz, S. C., Lang, J. R., Iza, M., Keller, S., Nakamura, S., Denbaars, S. P., Mishra, U. K., Speck, J. S. (2011). High quantum efficiency InGaN/GaN multiple quantum well solar cells with spectral response extending out to 520 nm. Applied Physics Letters, 98(20), 201107. https://doi.org/10.1063/1.3591976.

Horng, R. H., Lin, S. T., Tsai, Y. L., Chu, M. T., Liao, W. Y., Wu, M. H., Lin, R. M., Lu, Y. C. (2009). Improved conversion efficiency of GaN/InGaN thin-film solar cells. IEEE Electron Device Letters, 30(7), 724-726. https://doi.org/10.1109/LED.2009.2021414.

Iida, D., Kondo, Y., Sowa, M., Sugiyama, T., Iwaya, M., Takeuchi, T., Kamiyama, S., Akasaki, I. (2013). Analysis of strain relaxation process in GaInN/GaN heterostructure by in situ X-ray diffraction monitoring during metalorganic vapor-phase epitaxial growth. Physica Status Solidi—Rapid Research Letters, 7(3), 211-214. https://doi.org/10.1002/pssr.201307023.

Jani, O. K. (2008). Development of Wide-Band Gap InGaN Solar Cells for High-Efficiency Photovoltaics a Dissertation Presented to the Academic Faculty. Georgia Institute of Technology.

Jani, O., Ferguson, I., Honsberg, C., Kurtz, S. (2007). Design and characterization of GaNInGaN solar cells. Applied Physics Letters, 91(13), 132117. https://doi.org/10.1063/1.2793180.

Jani, O., Honsberg, C., Asghar, A., Nicol, D., Ferguson, I., Doolittle, A., Kurtz, S. (2005). Characterization and Analysis of InGaN Photovoltaic Devices. Conference Record of the Thirty-First IEEE Photovoltaic Specialists Conference, 37-42. https://doi.org/10.1109/PVSC.2005.1488064.

Jani, O., Honsberg, C., Huang, Y., Song, J.-O., Ferguson, I., Namkoong, G., Trybus, E., Doolittle, A., Kurtz, S. (2006). Design, Growth, Fabrication and Characterization of High-Band Gap InGaN/GaN Solar Cells. IEEE 4th World Conference on Photovoltaic Energy Conference, 20-25. https://doi.org/10.1109/WCPEC.2006.279337.

Jeng, M. J. (2010). Influence of polarization on the efficiency of InxGa 1-xN/GaN p-i-n solar cells. Japanese Journal of Applied Physics, 49(12), 128001. https://doi.org/10.1143/JJAP.49.128001.

Jeng, M. J., Su, T. W., Lee, Y. L., Chang, Y. H., Chang, L. B., Lin, R. M., Jiang, J. H., Lu, Y. C. (2010). Effect of silicon doping on performance of 30-pair InxGa 1-xN/GaN quantum well solar cells. Japanese Journal of Applied Physics, 49(5 Part 1), 0523021-0523024. https://doi.org/10.1143/JJAP.49.052302.

Ju, G., Tabuchi, M., Takeda, Y., Amano, H. (2017). Role of threading dislocations in strain relaxation during GaInN growth monitored by real-time X-ray reflectivity. Applied Physics Letters, 110(26), 262105. https://doi.org/10.1063/1.4990687.

Kuo, Y. K., Chang, J. Y., Shih, Y. H. (2012). Numerical study of the effects of hetero-interfaces, polarization charges, and step-graded interlayers on the photovoltaic properties of (0001) face GaN/InGaN p-i-n solar cell. IEEE Journal of Quantum Electronics, 48(3), 367-374. https://doi.org/10.1109/JQE.2011.2181972.

Kuwahara, Y., Fujii, T., Fujiyama, Y., Sugiyama, T., Iwaya, M., Takeuchi, T., Kamiyama, S., Akasaki, I., Amano, H. (2010). Realization of nitride-based solar cell on freestanding GaN substrate. Applied Physics Express, 3(11), 111001. https://doi.org/10.1143/APEX.3.111001.

Kuwahara, Y., Fujii, T., Sugiyama, T., Iida, D., Isobe, Y., Fujiyama, Y., Morita, Y., Iwaya, M., Takeuchi, T., Kamiyama, S., Akasaki, I., Amano, H. (2011). GaInN-based solar cells using strained-layer GaInN/GaInN superlattice active layer on a freestanding GaN substrate. Applied Physics Express, 4(2), 021001. https://doi.org/10.1143/APEX.4.021001.

Lang, J. R., Neufeld, C. J., Hurni, C. A., Cruz, S. C., Matioli, E., Mishra, U. K., Speck, J. S. (2011). High external quantum efficiency and fill-factor InGaN/GaN heterojunction solar cells grown by NH3-based molecular beam epitaxy. Applied Physics Letters, 98(13), 131115. https://doi.org/10.1063/1.3575563.

Li, Z. Q., Lestradet, M., Xiao, Y. G., Li, S. (2011). Effects of polarization charge on the photovoltaic properties of InGaN solar cells. Physica Status Solidi (A) Applications and Materials Science, 208(4), 928-931. https://doi.org/10.1002/pssa.201026489.

Lu, N., Ferguson, I. (2013). III-nitrides for energy production: Photovoltaic and thermoelectric applications. In Semiconductor Science and Technology (vol. 28, Issue 7, pp. 1-11). https://doi.org/10.1088/0268-1242/28/7/074023.

Matioli, E., Neufeld, C., Iza, M., Cruz, S. C., Al-Heji, A. A., Chen, X., Farrell, R. M., Keller, S., DenBaars, S., Mishra, U., Nakamura, S., Speck, J., Weisbuch, C. (2011). High internal and external quantum efficiency InGaN/GaN solar cells. Applied Physics Letters, 98(2), 021102. https://doi.org/10.1063/1.3540501.

Mukhtarova, A., Valdueza-Felip, S., Redaelli, L., Durand, C., Bougerol, C., Monroy, E., Eymery, J. (2016). Dependence of the photovoltaic performance of pseudomorphic InGaN/GaN multiple-quantum-well solar cells on the active region thickness. Applied Physics Letters, 108(16), 161907. https://doi.org/10.1063/1.4947445.

Neufeld, C. J., Cruz, S. C., Farrell, R. M., Iza, M., Lang, J. R., Keller, S., Nakamura, S., Denbaars, S. P., Speck, J. S., Mishra, U. K. (2011). Effect of doping and polarization on carrier collection in InGaN quantum well solar cells. Applied Physics Letters, 98(24), 243507. https://doi.org/10.1063/1.3595487.

Neufeld, C. J., Toledo, N. G., Cruz, S. C., Iza, M., DenBaars, S. P., Mishra, U. K. (2008). High quantum efficiency InGaN/GaN solar cells with 2.95 eV band gap. Applied Physics Letters, 93(14), 143502. https://doi.org/10.1063/1.2988894.

Pernot, C., Hirano, A., Iwaya, M., Detchprohm, T., Amano, H., Akasaki, I. (2000). Solar-Blind UV Photodetectors Based on GaN/AlGaN p-i-n Photodiodes. Jpn. J. Appl. Phys, 39(Part 2, No. 5A), L387-L 389.

Redaelli, L., Mukhtarova, A., Valdueza-Felip, S., Ajay, A., Bougerol, C., Himwas, C., Faure-Vincent, J., Durand, C., Eymery, J., Monroy, E. (2014). Effect of the quantum well thickness on the performance of InGaN photovoltaic cells. Applied Physics Letters, 105(13), 131105. https://doi.org/10.1063/1.4896679.

Sang, L., Liao, M., Ikeda, N., Koide, Y., Sumiya, M. (2011). Enhanced performance of InGaN solar cell by using a super-thin AlN interlayer. Applied Physics Letters, 99(16), 161109. https://doi.org/10.1063/1.3654155.

Sheu, J. K., Yang, C. C., Tu, S. J., Chang, K. H., Lee, M. L., Lai, W. C., Peng, L. C. (2009). Demonstration of GaN-based solar cells with GaN/InGaN superlattice absorption layers. IEEE Electron Device Letters, 30(3), 225-227. https://doi.org/10.1109/LED.2008.2012275.

Vadiee, E., Fischer, A. M., Clinton, E. A., McFavilen, H., Patadia, A., Arena, C., Ponce, F. A., King, R. R., Honsberg, C. B., Doolittle, W. A. (2019). Evaluating the performance of InGaN/GaN multi-

(56) References Cited

OTHER PUBLICATIONS quantum-well solar cells operated at elevated temperatures via DC and small-signal AC analysis. Japanese Journal of Applied Physics, 58(10), 101003. https://doi.org/10.7567/1347-4065/ab3b66.

Valdueza-Felip, S., Mukhtarova, A., Pan, Q., Altamura, G., Grenet, L., Durand, C., Bougerol, C., Peyrade, D., Gonzalez-Posada, F., Eymery, J., Monroy, E. (2013). Photovoltaic response of InGaN/GaN multiple-quantum well solar cells. Japanese Journal of Applied Physics, 52(8 Part 2), 08JH05. https://doi.org/10.7567/JJAP.52.08JH05.

Watanabe, N., Mitsuhara, M., Yokoyama, H., Liang, J., Shigekawa, N. (2014). Influence of InGaN/GaN multiple quantum well structure on photovoltaic characteristics of solar cell. Japanese Journal of Applied Physics, 53(11), 112301. https://doi.org/10.7567/JJAP.53.112301.

Watanabe, N., Yokoyama, H., Shigekawa, N., Sugita, K. I., Yamamoto, A. (2012). Barrier thickness dependence of photovoltaic characteristics of InGaN/GaN multiple quantum well solar cells. Japanese Journal of Applied Physics, 51 (10S), 10ND10. https://doi.org/10.1143/JJAP.51.10ND10.

Wierer, J. J., Koleske, D. D., Lee, S. R. (2012). Influence of barrier thickness on the performance of InGaN/GaN multiple quantum well solar cells. Applied Physics Letters, 100(11), 11111. https://doi.org/10.1063/1.3695170.

Yang, C. C., Sheu, J. K., Liang, X. W., Huang, M. S., Lee, M. L., Chang, K. H., Tu, S. J., Huang, F. W., Lai, W. C. (2010). Enhancement of the conversion efficiency of GaN-based photovoltaic devices with AlGaN/InGaN absorption layers. Applied Physics Letters, 97(2), 021113. https://doi.org/10.1063/1.3463469.

Yang, J., Zhao, D. G., Jiang, D. S., Chen, P., Zhu, J. J., Liu, Z. S., Le, L. C., He, X. G., Li, X. J., Yang, H., Zhang, Y. T., Du, G. T. (2015). Photovoltaic response of InGaN/GaN multi-quantum well solar cells enhanced by inserting thin GaN cap layers. Journal of Alloys and Compounds, 635, 82-86. https://doi.org/10.1016/j.jallcom.2015.02.052.

Young, N. G., Farrell, R. M., Hu, Y. L., Terao, Y., Iza, M., Keller, S., Denbaars, S. P., Nakamura, S., Speck, J. S. (2013). High performance thin quantum barrier InGaN/GaN solar cells on sapphire and bulk (0001) GaN substrates. Applied Physics Letters, 103(17), 173903. https://doi.org/10.1063/1.4826483.

Young, N. G., Perl, E. E., Farrell, R. M., Iza, M., Keller, S., Bowers, J. E., Nakamura, S., Denbaars, S. P., Speck, J. S. (2014). High-performance broadband optical coatings on InGaN/GaN solar cells for multijunction device integration. Applied Physics Letters, 104(16), 163902. https://doi.org/10.1063/1.4873117.

Young, N. G. (2015). Improving Efficiency of III-N Quantum Well Based Optoelectronic Devices through Active Region Design and Growth Techniques. University of California Santa Barbara.

Zhang, X. Bin, Wang, X. L., Xiao, H. L., Yang, C. B., Hou, Q. F., Yin, H. B., Chen, H., Wang, Z. G. (2011). InGaN/GaN multiple quantum well solar cells with an enhanced open-circuit voltage. Chinese Physics B, 20(2), 028402. https://doi.org/10.1088/1674-1056/20/2/028402.

Zhang, Y., Kappers, M. J., Zhu, D., Oehler, F., Gao, F., Humphreys, C. J. (2013). The effect of dislocations on the efficiency of InGaN/GaN solar cells. Solar Energy Materials and Solar Cells, 117, 279-284. https://doi.org/10.1016/j.solmat.2013.06.022.

Zheng, X., Horng, R. H., Wuu, D. S., Chu, M. T., Liao, W. Y., Wu, M. H., Lin, R. M., Lu, Y. C. (2008). High-quality InGaN/GaN heterojunctions and their photovoltaic effects. Applied Physics Letters, 93(26), 261108. https://doi.org/10.1063/1.3056628.

International Search Report dated Sep. 4, 2020, Application No. PCT/US2020/042205.

International Search Report dated Oct. 18, 2021, Application No. PCT/US2021/013760.

US Office Action for U.S. Appl. No. 16/930,250 mailed Dec. 15, 2021, 19 pages.

European Patent Application No. 21707436.8, Office Action dated Aug. 24, 2023, 6 pages.

Non-Final Office Action for U.S. Appl. No. 17/151,110 mailed Mar. 17, 2022.

Non-Final Office Action for U.S. Appl. No. 17/151,109 mailed Apr. 11, 2022.

Non-Final Office Action dated Apr. 11, 2022 for Application No. 17/151,109.

\* cited by examiner

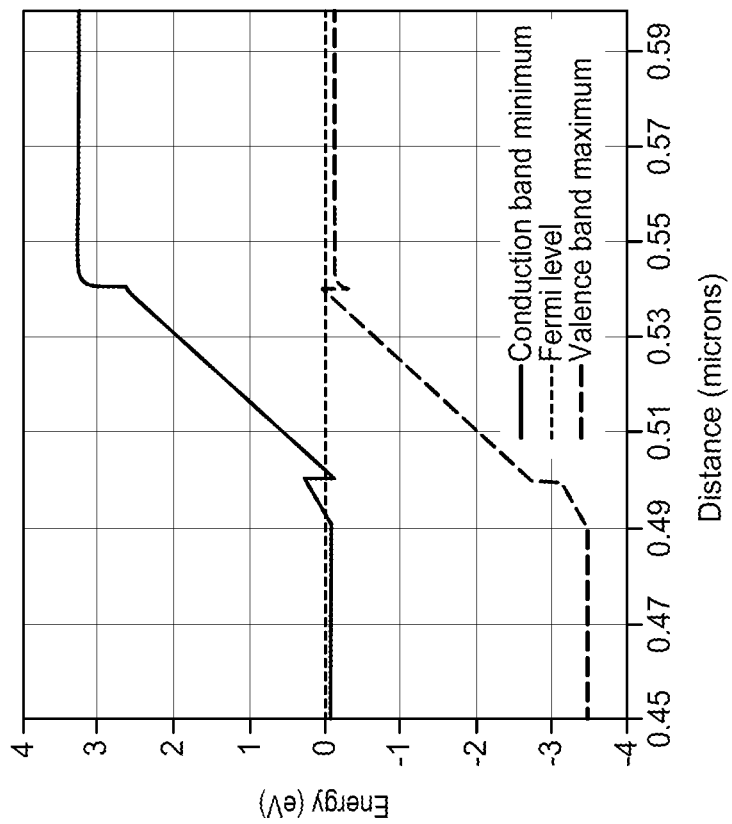
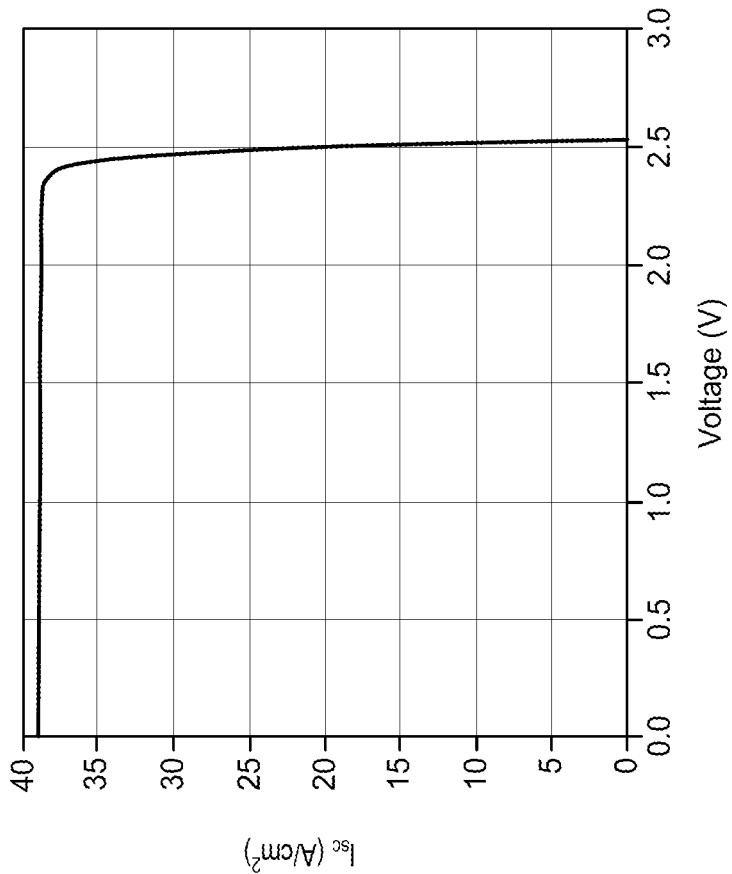
FIG. 9A
FIG. 9B

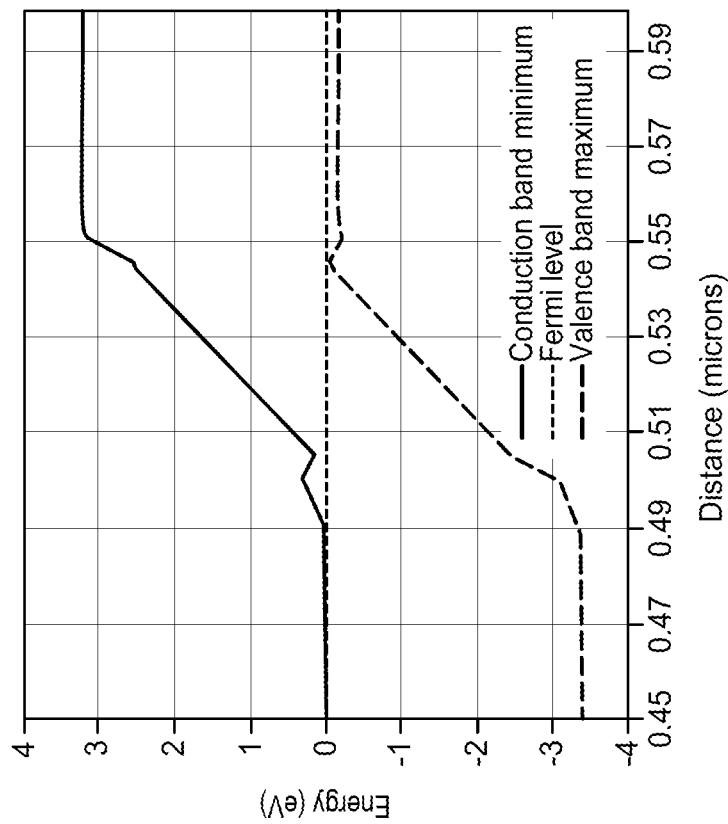
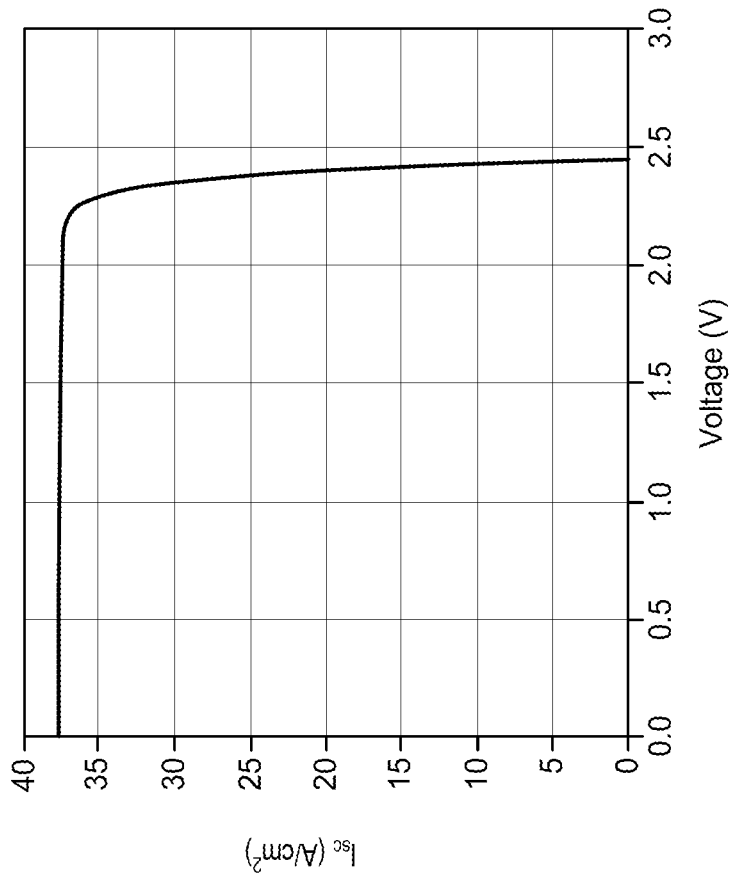
FIG. 10A
FIG. 10B

| Crystallographic orientation | N-type doping layer doping (cm⁻³) | N-type cladding layer % In | N-type cladding layer thickness (nm) | N-type cladding layer doping (cm⁻³) | Absorber Layer % In | P-type cladding layer % In | P-type cladding layer thickness (nm) | P-type cladding layer doping (cm⁻³) | P-type doping layer doping (cm⁻³) | Fill factor % | $V_{oc}$ (V) |
|---|---|---|---|---|---|---|---|---|---|---|---|
| (0001) | 2.00E+19 | | | | 18 | | | | 2.00E+19 | 6 | 2.53 |
| (0001) | 1.50E+19 | | | | 18 | | | | 6.00E+20 | 18 | 2.52 |
| (0001) | 1.50E+19 | 8 | 3 | 1.50E+19 | 18 | | | | 6.00E+20 | 86 | 2.45 |
| (0001) | 3.50E+19 | | | | 18 | | | | 5.00E+19 | 63 | 2.53 |
| (0001) | 3.50E+19 | | | | 18 | | | | 6.00E+19 | 69 | 2.53 |
| (0001) | 3.50E+19 | | | | 18 | | | | 8.00E+19 | 76 | 2.53 |
| (0001) | 3.50E+19 | | | | 18 | | | | 1.20E+20 | 84 | 2.53 |
| (0001) | 3.50E+19 | | | | 18 | | | | 2.00E+20 | 89 | 2.53 |
| (0001) | 3.50E+19 | | | | 18 | | | | 4.00E+20 | 92 | 2.53 |
| (0001) | 3.50E+19 | | | | 18 | | | | 6.00E+20 | 92 | 2.53 |
| (0001) | 4.50E+19 | | | | 18 | | | | 1.20E+20 | 85 | 2.53 |
| (0001) | 4.50E+19 | | | | 18 | | | | 2.00E+20 | 91 | 2.53 |
| (0001) | 2.00E+19 | | | | 12 | | | | 8.00E+18 | 49 | 2.78 |
| (0001) | 2.00E+19 | | | | 12 | | | | 1.30E+19 | 69 | 2.78 |
| (0001) | 2.00E+19 | | | | 12 | | | | 2.00E+19 | 80 | 2.78 |
| (0001) | 2.00E+19 | | | | 12 | | | | 1.00E+20 | 93 | 2.78 |
| (0001) | 2.00E+19 | | | | 12 | 0 | 10 | 5.00E+18 | 8.00E+18 | 28 | 2.77 |
| (0001) | 2.00E+19 | | | | 12 | 0 | 10 | 5.00E+18 | 2.00E+19 | 38 | 2.77 |
| (0001) | 2.00E+19 | | | | 12 | 0 | 3 | 5.00E+18 | 2.00E+19 | 66 | 2.78 |
| (0001) | 2.00E+19 | | | | 12 | 0 | 3 | 5.00E+18 | 1.00E+20 | 82 | 2.78 |
| (0001) | 2.00E+19 | | | | 12 | 6 | 3 | 5.00E+18 | 1.00E+20 | 93 | 2.78 |
| (0001) | 2.00E+19 | 0 | 3 | 5.00E+18 | 12 | 6 | 3 | 5.00E+18 | 1.00E+20 | 81 | 2.78 |
| (0001) | 2.00E+19 | 6 | 3 | 5.00E+18 | 12 | 6 | 3 | 5.00E+18 | 1.00E+20 | 90 | 2.74 |
| (0001) | 1.50E+16 | 0→18 | 10 | 1.50E+16 | 18 | | | | 2.00E+20 | 16 | 2.44 |
| (0001) | 1.50E+17 | 0→18 | 10 | 1.50E+17 | 18 | | | | 2.00E+20 | 83 | 2.44 |
| (0001) | 1.50E+18 | 0→18 | 10 | 1.50E+18 | 18 | | | | 2.00E+20 | 86 | 2.45 |
| (0001) | 1.50E+17 | 0→18 | 5 | 1.50E+17 | 18 | | | | 2.00E+20 | 16 | 2.52 |
| (0001) | 1.50E+18 | 0→18 | 5 | 1.50E+18 | 18 | | | | 2.00E+20 | 86 | 2.45 |
| (0001) | 1.50E+18 | 0→18 | 5 | 1.50E+18 | 18 | | | | 5.00E+19 | 58 | 2.47 |
| (0001) | 1.50E+18 | 0→18 | 5 | 1.50E+18 | 18 | 0→18 | 5 | 5.00E+19 | 5.00E+19 | 89 | 2.45 |
| (000-1) | 1.00E+18 | | | | 12 | | | | 1.00E+18 | 94 | 2.78 |
| (000-1) | 1.00E+16 | | | | 18 | | | | 1.00E+16 | 93 | 2.53 |
| (000-1) | 1.00E+17 | | | | 18 | | | | 1.00E+17 | 94 | 2.53 |
| (000-1) | 1.00E+18 | | | | 18 | | | | 1.00E+18 | 94 | 2.53 |
| (10-10) | 4.00E+18 | | | | 18 | | | | 4.00E+18 | 58 | 2.53 |
| (10-10) | 8.00E+18 | | | | 18 | | | | 8.00E+18 | 78 | 2.53 |
| (10-10) | 1.20E+19 | | | | 18 | | | | 1.20E+19 | 84 | 2.53 |
| (10-10) | 2.00E+19 | | | | 18 | | | | 2.00E+19 | 90 | 2.53 |
| (10-10) | 2.00E+19 | | | | 12 | | | | 2.00E+19 | 94 | 2.78 |
| (30-3-1) | 1.00E+18 | | | | 12 | | | | 1.00E+18 | 94 | 2.78 |
| (30-3-1) | 1.00E+18 | | | | 18 | | | | 1.00E+18 | 57 | 2.53 |
| (30-3-1) | 8.00E+18 | | | | 18 | | | | 8.00E+18 | 89 | 2.53 |
| (30-3-1) | 1.20E+19 | | | | 18 | | | | 1.20E+19 | 91 | 2.53 |

FIG. 15

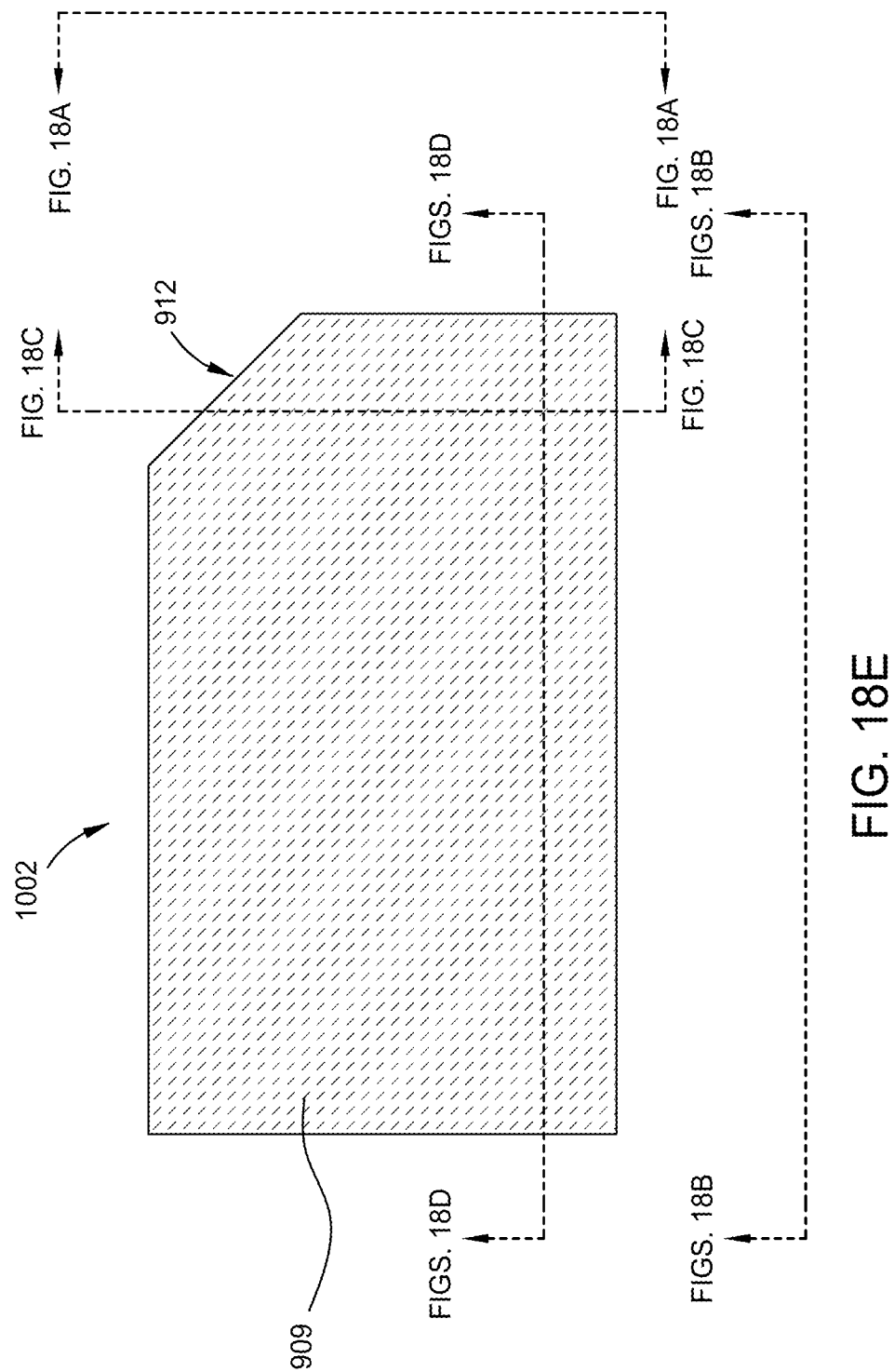

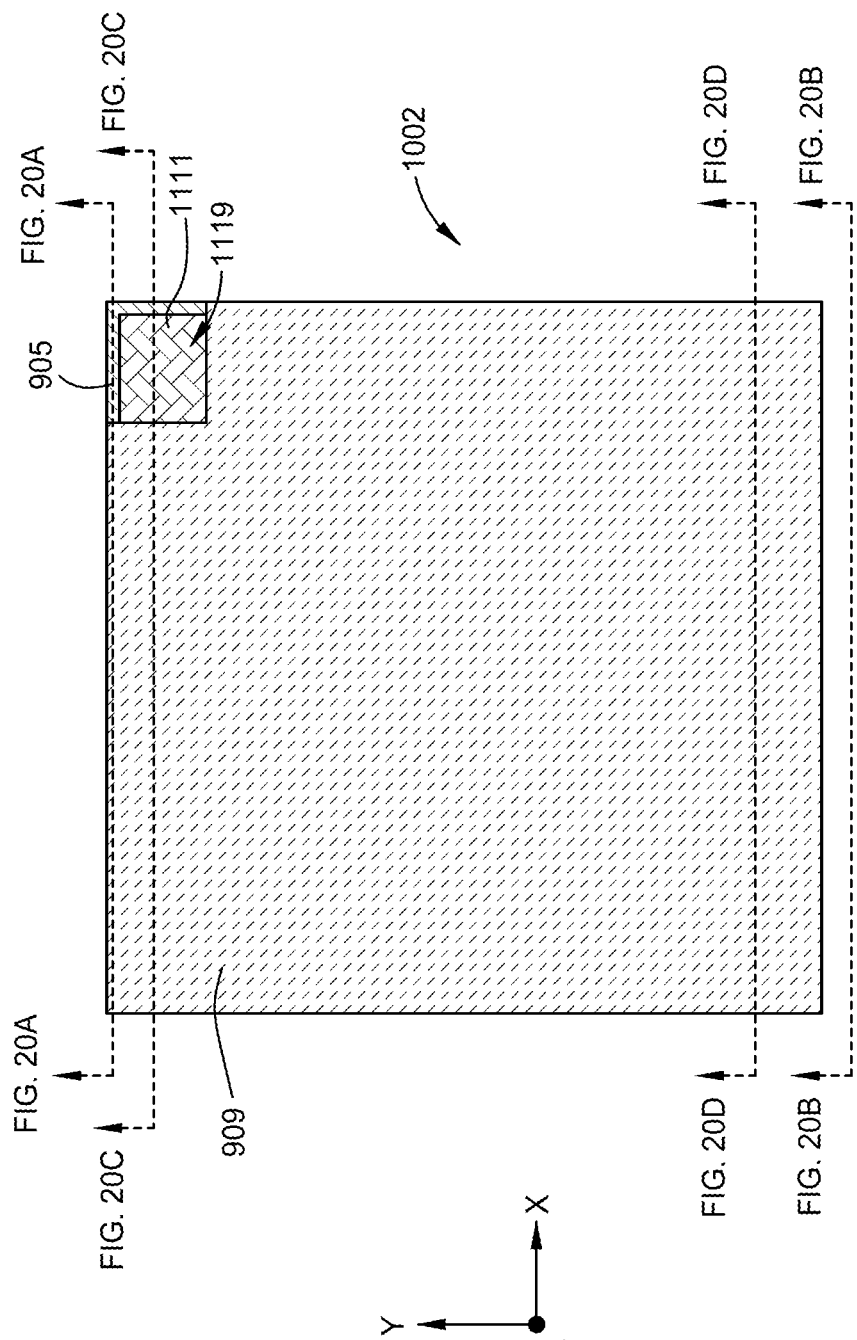

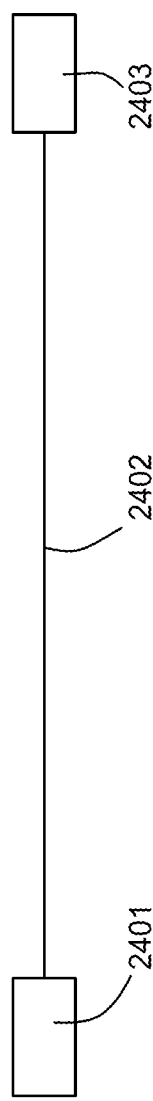
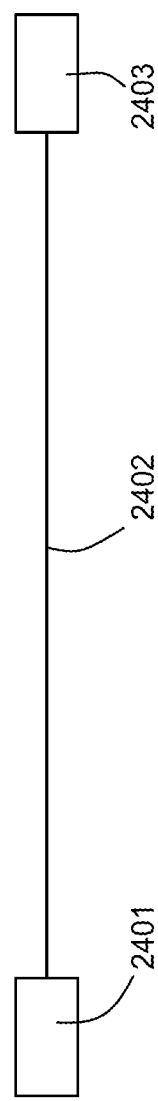
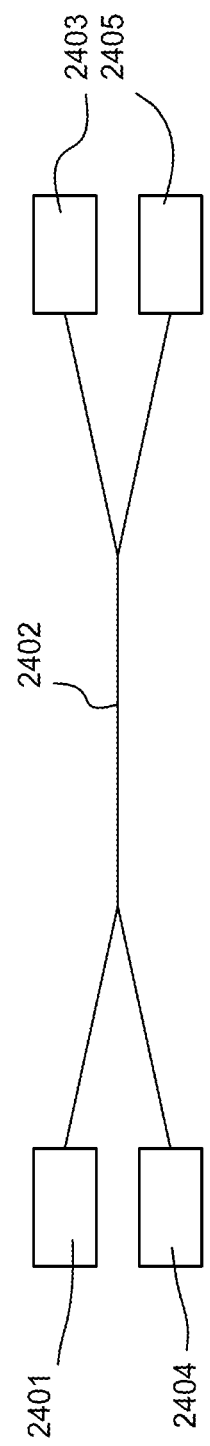
FIG. 25A
FIG. 25B
FIG. 25C

| Items | Value | Units |
|---|---|---|
| absorption coefficient of absorber layer, $\alpha_{abslay}$ | 1.0E+05 | cm$^{-1}$ |
| absorber layer thickness | 4.0E-06 | cm |
| absorber layer refractive index for angle calc, $n_{abs}$ | 2.55 | |
| absorption coefficient of substrate, $\alpha_{sub}$ | 0.4 | cm$^{-1}$ |
| substrate thickness | 0.05 | cm |
| substrate refractive index, $n_{sub}$ | 2.45 | |
| top surface reflectance, $R_{ts}$ | 85 | % |
| bottom surface reflectance, $R_{bs}$ | 94 | % |
| angle in substrate relative to bottom surface, $\theta$ | 15 | degrees |

FIG. 29A

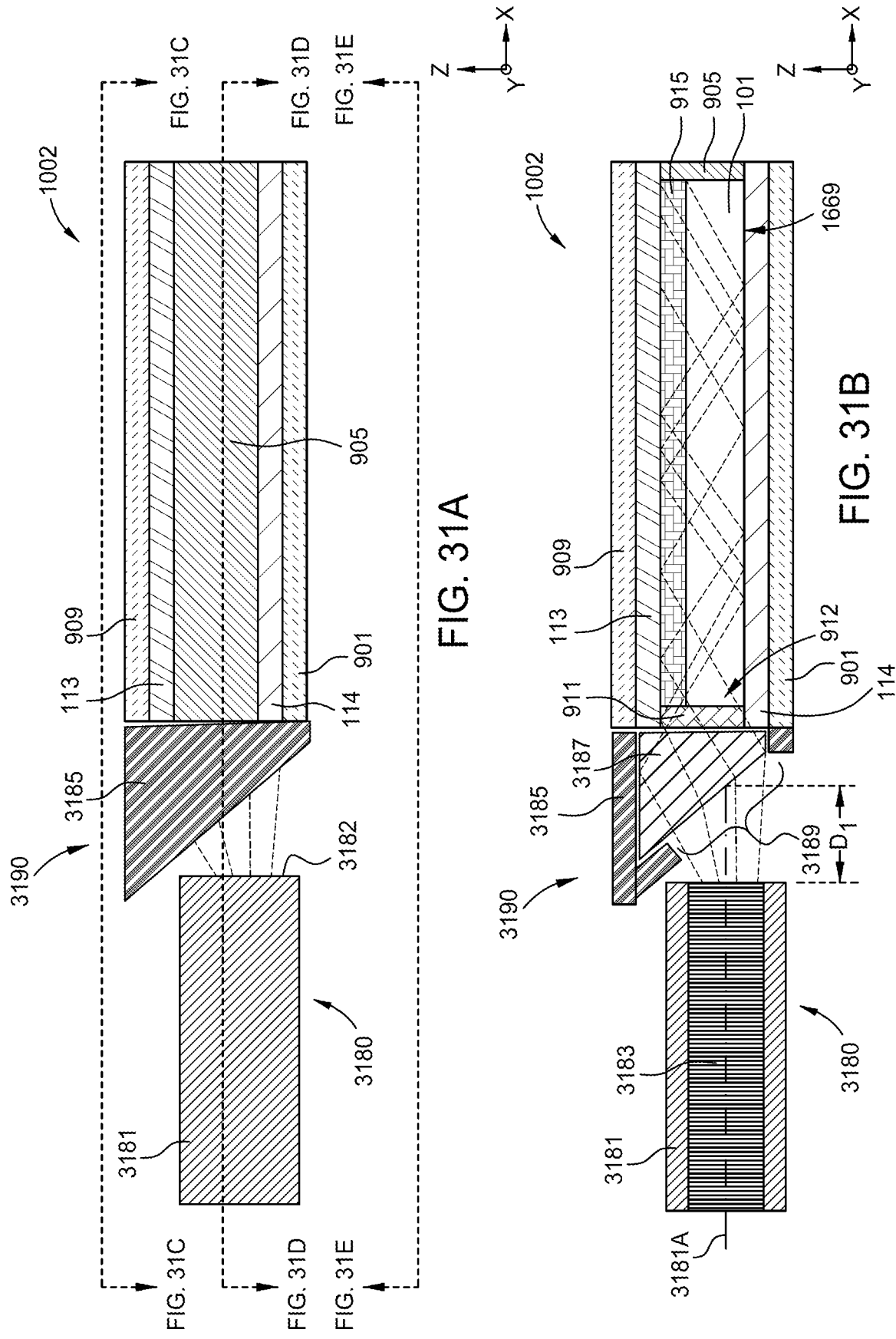

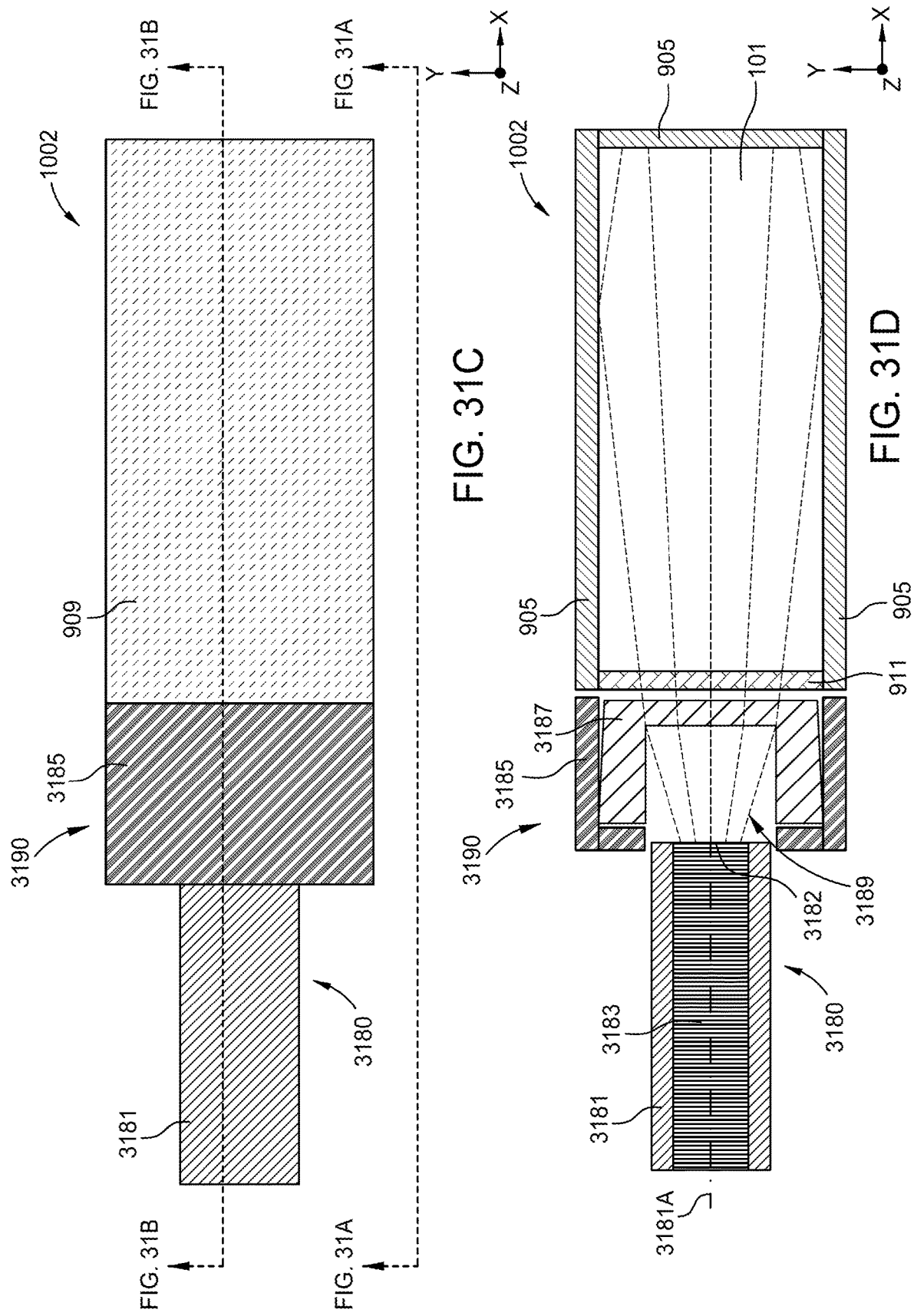

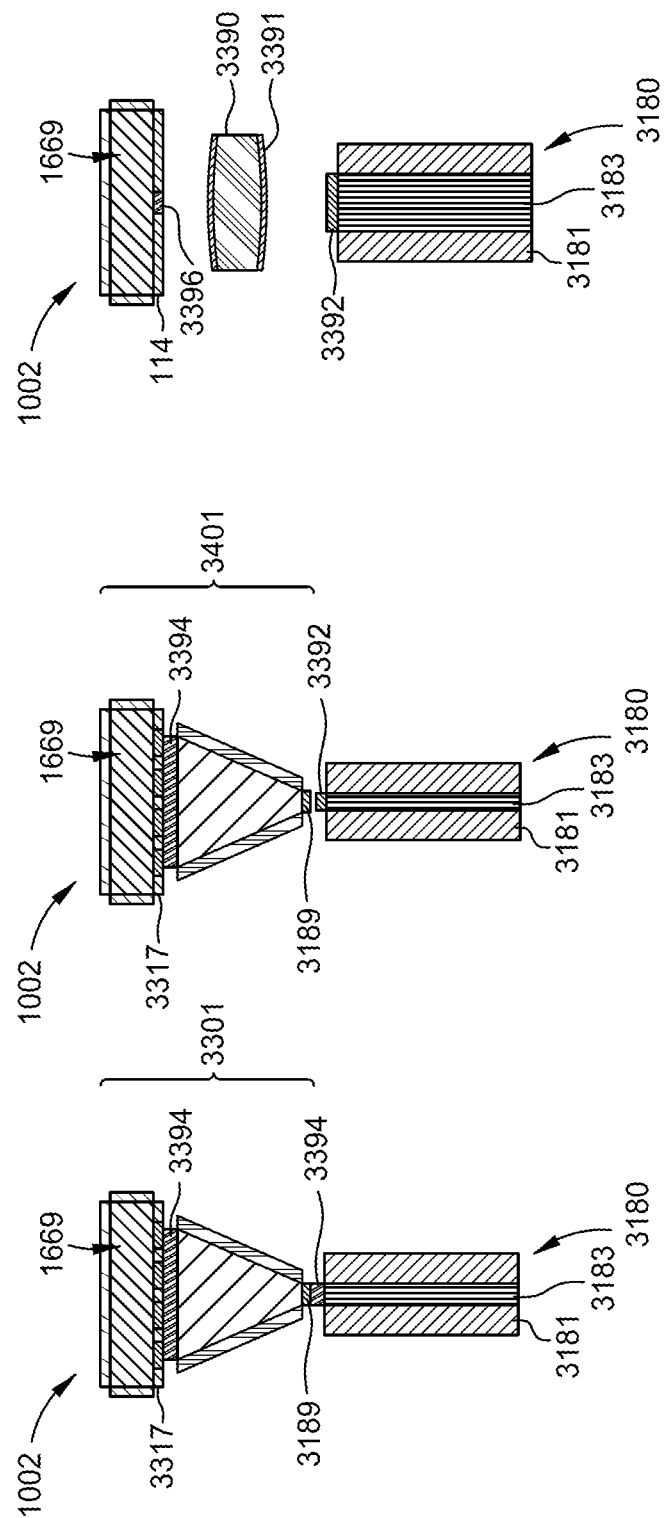

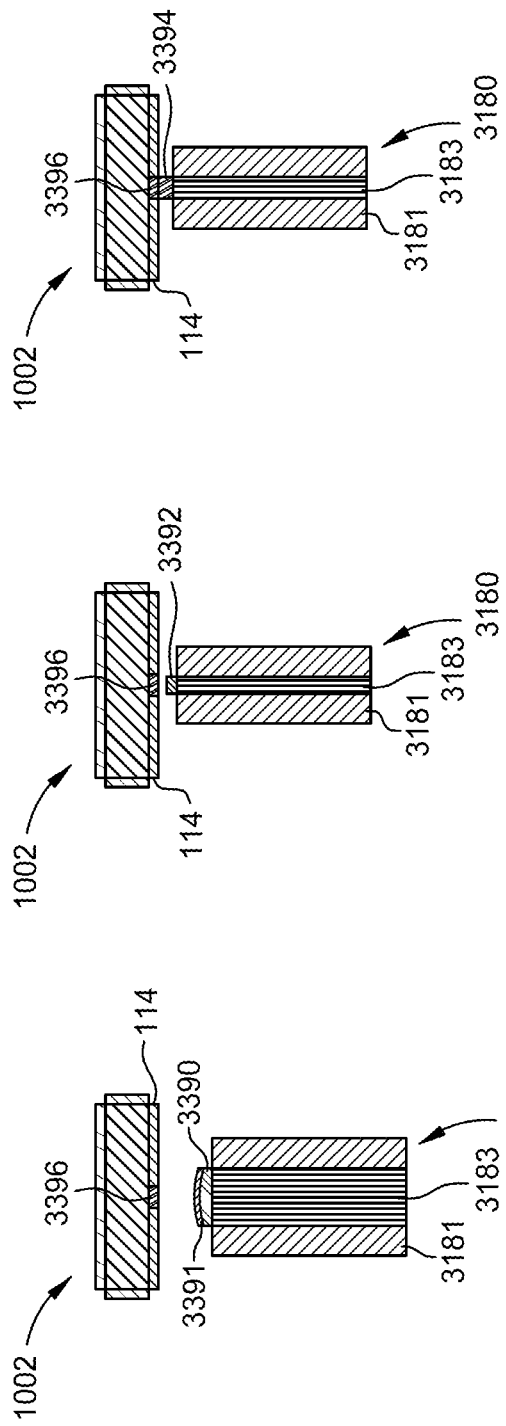

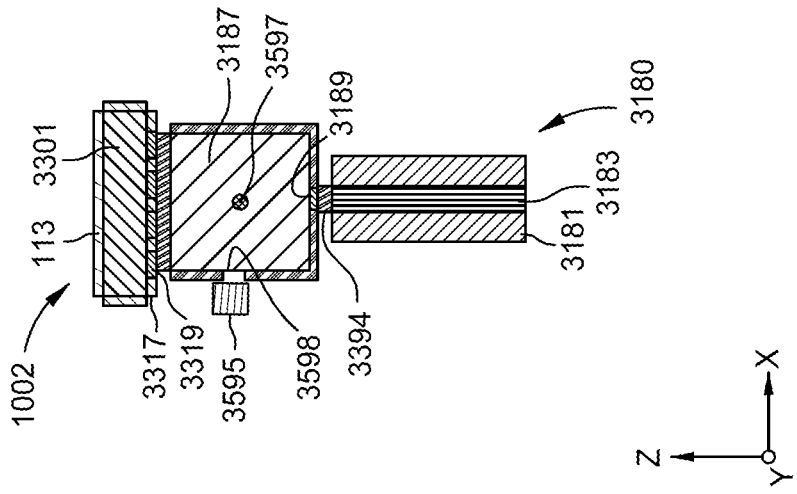
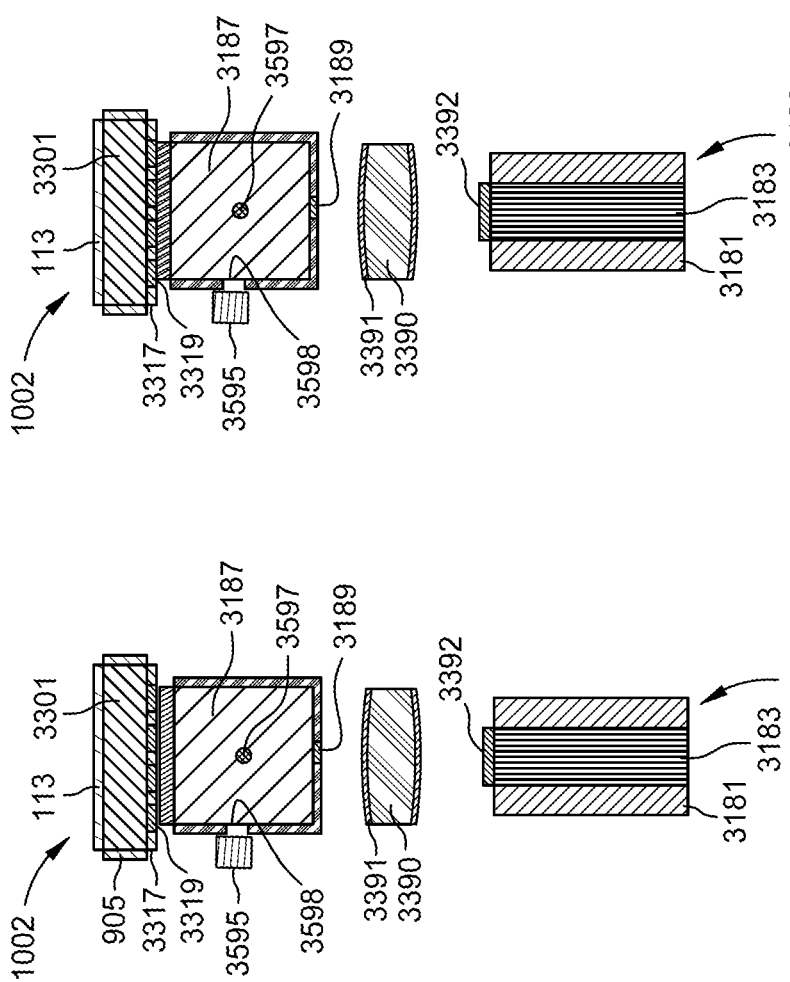
FIG. 35D  FIG. 35E  FIG. 35F

METHODS FOR COUPLING OF OPTICAL FIBERS TO A POWER PHOTODIODE

CROSS-REFERENCE TO RELATED APPLICATIONS

This patent application is a continuation of U.S. patent application Ser. No. 17/151,110, filed Jan. 15, 2021, which continuation-in-part of U.S. patent application Ser. No. 16/930,250, filed Jul. 15, 2020, which claims the benefit of U.S. Provisional Application No. 62/874,487, filed Jul. 15, 2019. The U.S. patent application Ser. No. 17/151,110 also claims the benefit of U.S. Provisional Application No. 62/978,281, filed Feb. 18, 2020. Each of these patent applications are incorporated by reference herein.

BACKGROUND

Field

This disclosure relates generally to techniques for transmitting power through optical fibers and, in particular, to techniques for high current density power photodiode structures and devices fabricated on bulk gallium and nitrogen containing polar, semipolar, or nonpolar materials. The invention can be applied to applications involving conversion of light energy to electrical energy, particularly via optical fibers, other optoelectronic devices, and similar products.

Description of the Related Art

Electrical power is typically transmitted over a wire, for example, a copper wire. However, such wires can be heavy, cumbersome, and expensive, and the transmitted power can be subject to electromagnetic interference. Some of these limitations can be overcome by transmitting power over an optical fiber but, unfortunately, with current capability such approaches are not yet commercially viable. In addition, current approaches generally involve light at infrared wavelengths, which has certain disadvantages over visible light, or visible optical radiation, such as greater sensitivity to temperature variations in the surrounding environment.

Gallium nitride (GaN) based optoelectronic and electronic devices are of tremendous commercial importance. The best-developed of these devices include light emitting diodes (LEDs) and laser diodes, and GaN-based power diodes and transistors are becoming increasingly important. There is also interest in emerging applications. De Santi, and coauthors [Materials 11, 153 (2018)] described an application whereby electrical power is converted to optical power using a laser diode, the optical power is coupled to an optical fiber and transmitted to a remote location, then the optical power is converted back to electrical power using a photodiode. Both the laser diode and the photodiode were based on GaN-on-sapphire devices and the system performance was relatively poor. The photodiode was a particular challenge, with a reported efficiency of 17%. GaN-based solar cells have also been reported by a number of groups, typically utilizing GaN-on-sapphire structures for low power (ca. one sun) applications. Even concentrator solar cell structures, which are well known in the art for other materials systems, are only able to generate substantially lower current densities than those that are the principal focus of the current invention.

In the case of laser diodes, it is well known that superior performance and reliability can be obtained in GaN-on-GaN devices, which have greatly reduced defect densities and have undergone many years of optimization and improvement. In the case of photodiodes, considerably less work has been done. For example, D'Evelyn et al. [U.S. Pat. No. 6,806,508] disclosed a GaN-on-GaN photodiode that was intended for photodetector applications rather than for power diode applications.

Related applications have been disclosed using GaAs-based lasers and photodiodes, at wavelengths in the near-infrared. However, due to its larger bandgap, photodiodes based on the nitrides should enable considerably higher open-circuit voltages and superior efficiencies at elevated temperatures and at high input power levels, relative to corresponding GaAs-based devices and systems.

From the above, it is seen that techniques for improving GaN-based power photodiodes and methods for optical coupling thereto are highly desirable. There is also a need for systems, device(s) and methods that solve the problems described above.

SUMMARY

Embodiments of the disclosure may provide a photodiode structure, including a substrate having a first surface and a second surface, wherein the second surface of the substrate is opposite to the first surface, the substrate is a single-crystalline group-III metal nitride, and the first surface of the substrate has a crystallographic orientation within 5 degrees of (0001) +c-plane, {10–10} m-plane, or a semipolar plane selected from one of {11–2±2}, {60–6±1}, {50–5±1}, {40–4±1}, {30–3±1}, {50–5±2}, {70–7±3}, {20–2±1}, {30–3±2}, {40–4±3}, {50–5±4}, {10–1±1}, {10–1±2}, {10–1±3}, or differs from (000–1) by between 2 degrees and 5 degrees. The photodiode structure also includes an n-type layer and a p-type layer that are disposed over the first surface of the substrate, wherein the n-type layer and the p-type layer each comprise $Al_xIn_yGa_{1-x-y}N$, where $0 \le x$, y, $x+y \le 1$, and have a dopant concentration of at least $1 \times 10^{17}$ $cm^{-3}$, one or more absorber layers disposed between the n-type and the p-type layers, wherein the one or more absorber layers comprise $Al_xIn_yGa_{1-x-y}N$, where $0 \le x$, y, $x+y \le 1$ and have a dislocation density below about $10^9$ $cm^{-2}$, a p-side electrical contact layer disposed over the p-type layer, wherein the p-side electrical contact layer has an average reflectance of at least 70% for at least one wavelength between 390 nanometers and 460 nanometers and a contact resistance below $3 \times 10^{-3}$ $\Omega cm^2$, an n-side electrical contact layer disposed over the second surface of the substrate, wherein the n-side electrical contact layer has an average reflectance of at least 70% for at least one wavelength between 390 nanometers and 460 nanometers and a contact resistance below $1 \times 10^{-3}$ $\Omega cm^2$; and a light receiving surface, wherein the light receiving surface is aligned to cause light, having at least one wavelength between 390 nanometers and 460 nanometers and incident on the light receiving surface at an angle, to be reflected at least once from the n-side electrical contact layer and from the p-side electrical contact layer. The photodiode structure may also be characterized by a fill factor of at least 50% under an illumination level producing a current density of at least 10 A $cm^{-2}$.

Embodiments of the disclosure may further provide a photodiode structure, including one or more absorber layers, wherein the one or more absorber layers comprise $Al_xIn_yGa_{1-x-y}N$, where $0 \le x$, y, $x+y \le 1$, an n-type layer and a p-type layer, wherein the one or more absorber layers being disposed over the n-type layer and the p-type layer being disposed over the one or more absorber layers, a carrier substrate having a first surface and a second surface, wherein the first surface of the carrier substrate being disposed over the p-type layer or under the n-type layer, a p-side electrical contact layer placed in electrical contact with the p-type layer, wherein the p-side electrical contact layer has a contact resistance below $3\times10^{-3}$ $\Omega\text{cm}^2$, a p-side reflector layer disposed on one of the p-type layer and the second surface of the carrier substrate, the p-side reflector layer having an average reflectance of at least 70% for at least one wavelength between 390 nanometers and 460 nanometers, an n-side electrical contact layer placed in electrical contact with the n-type layer, wherein the n-side electrical contact layer has a contact resistance below $1\times10^{-3}$ $\Omega\text{cm}^2$, an n-side reflector layer disposed over one of the n-side layer and the second surface of the carrier substrate, the n-side reflector layer having an average reflectance of at least 70% for at least one wavelength between 390 nanometers and 460 nanometers, and a light receiving surface, wherein the light receiving surface is aligned to cause light, having at least one wavelength between 390 nanometers and 460 nanometers and incident on the light receiving surface at an angle, to be reflected at least once from the n-side reflector layer and from the p-side reflector layer. The n-type layer and the p-type layer each comprise $Al_xIn_yGa_{1-x-y}N$, where $0 \le x$, y, $x+y \le 1$, and have a dopant concentration of at least $1\times10^{16}$ $\text{cm}^{-3}$. The carrier substrate being substantially transparent at wavelengths between 390 nanometers and 460 nanometers.

Embodiments of the disclosure may further provide a photodiode structure, including a substrate having a first surface, a second surface and a third surface, an n-type layer and a p-type layer that are disposed over the first surface of the substrate, one or more absorber layers disposed between the n-type and the p-type layers, a p-type electrode layer disposed over the p-type layer, an n-type electrode layer disposed over the second surface of the substrate, and a light receiving surface, wherein the third surface comprises the light receiving surface and is configured to cause light received therethrough to be reflected at least once between the n-type electrode layer and the p-type electrode layer. The n-type electrode layer includes an array of openings formed therein, and has an average reflectance of at least 70% at wavelengths between 390 nanometers and 460 nanometers. The p-type electrode layer includes an array of openings formed therein, and has an average reflectance of at least 70% at wavelengths between 390 nanometers and 460 nanometers. The one or more absorber layers include an $Al_xIn_yGa_{1-x-y}N$ material, where $0 \le x$, y, $x+y \le 1$ and have a dislocation density below about $10^9$ $\text{cm}^{-2}$. The n-type layer and the p-type layer each include an $Al_xIn_yGa_{1-x-y}N$ material, where $0 \le x$, y, $x+y \le 1$; and have a dopant concentration of at least $1\times10^{16}$ $\text{cm}^{-3}$. The second surface of the substrate is opposite to the first surface, the third surface of the substrate is aligned at an angle to the first and second surfaces, the substrate is a single-crystalline group-III metal nitride, and the first surface of the substrate has a crystallographic orientation within 5 degrees of (0001) +c-plane, {10–10} m-plane, or a semipolar plane selected from one of {11–2±2}, {60–6±1}, {50–5±1}, {40–4±1}, {30–3±1}, {50–5±2}, {70–7±3}, {20–2±1}, {30–3±2}, {40–4±3}, {50–5±4}, {10–1±1}, {10–1±2}, {10–1±3}, or differs from (000–1) by between 2 degrees and 5 degrees.

Embodiments of the disclosure may include a photodiode structure, comprising one or more absorber layers lying between n-type and p-type layers, each of the absorber and n-type and p-type layers comprising $Al_xIn_yGa_{1-x-y}N$, where $0 \le x$, y, $x+y \le 1$ and having a dislocation density below about $10^9$ $\text{cm}^{-2}$, each of the first and second non-absorber layers being characterized by a dopant concentration of at least $1\times10^{16}$ $\text{cm}^{-3}$, wherein the absorber layer is configured for efficient power conversion of light having a wavelength between about 390 nanometers and 460 nanometers; and the structure is characterized by a fill factor of at least 50% under an illumination level producing a current density of at least 10 A $\text{cm}^{-2}$.

Embodiments of the disclosure may further provide an optical device, comprising a die that comprises one or more absorber layers disposed between an first non-absorber layer and a second non-absorber layer, each of the one or more absorber layers and the first and second non-absorber layers comprising $Al_xIn_yGa_{1-x-y}N$, where $0 \le x$, y, $x+y \le 1$ and having a dislocation density below about $10^{10}$ $\text{cm}^{-2}$; wherein the one or more absorber layers each have a thickness, measured in a first direction, and an absorber layer surface that is parallel to a first plane and oriented normal to the first direction, and the die having an device cavity region having an optical window, the device cavity region comprising at least two opposing reflective members that are configured to cause internal reflection of electromagnetic radiation entering through the optical window to pass through the one or more absorber layers at least two or more times.

Embodiments of the disclosure may further provide an optical device, comprising a die that comprises an optical window and at least two absorber layers that are disposed between an n-type first non-absorber layer and a second non-absorber layer, each of the absorber and non-absorber layers comprising $Al_xIn_yGa_{1-x-y}N$, where $0 \le x$, y, $x+y \le 1$ and having a dislocation density below about $10^{10}$ $\text{cm}^{-2}$; wherein a separate n-contact is disposed on the first non-absorber layer and a p-type contact is disposed on the second non-absorber layer.

Embodiments of the disclosure may further provide a power-over-fiber module that comprises at least one laser diode, at least one optical fiber, and at least one photodiode. The laser diode comprises at least one active layer comprising $Al_xIn_yGa_{1-x-y}N$, where $0 \le x$, y, $x+y \le 1$ and having a dislocation density below about $10^7$ $\text{cm}^{-2}$. The laser diode is configured to have an emission wavelength between about 400 nanometers and about 500 nanometers. The photodiode comprises at least one absorber layer comprising $Al_xIn_yGa_{1-x-y}N$, where $0 \le x$, y, $x+y \le 1$ and having a dislocation density below about $10^{10}$ $\text{cm}^{-2}$. The photodiode is configured to have absorber layer bandgap wavelengths that are between about 400 nanometers and about 550 nanometers.

Embodiments of the disclosure may further provide a power-over-fiber system, comprising at least one laser diode, at least one optical fiber, and at least one photodiode, wherein the electrical power from the photodiode is used to power an Internet-of-Things sensor or actuator or a personal electronic device. The laser diode comprises at least one active layer comprising $Al_xIn_yGa_{1-x-y}N$, where $0 \le x$, y, $x+y \le 1$ and having a dislocation density below about $10^7$ $\text{cm}^{-2}$. The laser diode is configured to have an emission wavelength between about 400 nanometers and about 500 nanometers. The photodiode comprises at least one absorber layer comprising $Al_xIn_yGa_{1-x-y}N$, where $0 \le x$, y, $x+y \le 1$ and having a dislocation density below about $10^{10}$ $\text{cm}^{-2}$. The photodiode is configured to have absorber layer bandgap wavelengths that are between about 400 nanometers and about 550 nanometers.

The power-over-fiber module or power-over-fiber system may further comprise at least one optical dispensing device, and/or control modules to modulate the laser diode power at at least one controlled AC frequency and to separate the photodiode signal into a DC power component and an AC signal component at the at least one controlled frequency. In some cases, the amplitude of the modulated AC component of the laser diode power and of the photodiode power is less than 10% of the corresponding DC components. In some embodiments, the AC signal component is modulated at an audio frequency and the module is coupled to a headphone or to an audio speaker. In some embodiments, the AC signal component at the at least one controlled frequency is detected using the same photodiode that also converts the DC power component into electrical power. In some embodiments, the AC signal component at the at least one controlled frequency is detected using a separate, signal photodetector device. In some embodiments, the separate, signal photodetector device is positioned between an end of the optical fiber and the one photodiode. In some embodiments, the separate, signal photodetector device is positioned proximate to an optical coupling member, the optical coupling member being positioned between an end of the optical fiber and the one photodiode. In some embodiments, the power-over-fiber system further comprises an internal reflector within the optical coupling member, the internal reflector comprising at least one of a metal, a dielectric, and a void and has a maximum dimension less than about 1 millimeter.

In some embodiments of the power-over-fiber module or power-over-fiber system, the optical fiber has a branched structure. In some embodiments of the power-over-fiber module or power-over-fiber system, the at least one laser diode comprises at least two laser diodes, the at least one photodiode comprises at least two photodiodes, and is the module configured to enable signal communication in at least two different directions. In some embodiments, at least one photodiode is configured for both input and output optical power. In some embodiments of the power-over-fiber module, at least one non-rigid or non-contact optical coupling is used to accommodate rotation of the photodiode relative to the laser diode. In some embodiments, the power-over-fiber system further includes a lighting system that comprises at least one of a phosphor, a heat sink, a reflective or transmissive optic for shaping the far-field distribution of light, a sensor, and a control system. The lighting system may comprise a luminaire.

Embodiments of the disclosure may further provide an optical assembly, comprising a first die comprising one or more absorber layers disposed between an first non-absorber layer and a second non-absorber layer, wherein each of the one or more absorber layers and the first and second non-absorber layers comprising $Al_xIn_yGa_{1-x-y}N$, where $0 \leq x, y, x+y \leq 1$ and having a dislocation density below about $10^{10}$ cm$^{-2}$, an optical cavity region having an optical window, and a fixture that is configured to position a first end of an optical fiber a first distance from a surface of the optical window of the first die. The one or more absorber layers each have a thickness, measured in a first direction, and an absorber layer surface that is parallel to a first plane and oriented normal to the first direction. The optical cavity region comprising a device cavity region, the device cavity region comprising the one or more absorber layers, the first non-absorber layer, the second non-absorber layer, and at least two opposing reflective members that are configured to cause internal reflection of electromagnetic radiation entering through the optical window to pass through the device cavity region at least two or more times.

Embodiments of the disclosure may further provide an optical assembly, comprising a first die comprising one or more absorber layers disposed between an first non-absorber layer and a second non-absorber layer, wherein each of the one or more absorber layers and the first and second non-absorber layers comprising $Al_xIn_yGa_{1-x-y}N$, where $0 \leq x, y, x+y \leq 1$ and having a dislocation density below about $10^{10}$ cm$^{-2}$, and having a device cavity region having an optical window. The optical assembly will further include an optical element that is configured to receive optical radiation from an optical fiber and transmit the received optical radiation to at least a portion of the optical window. The one or more absorber layers each have a thickness, measured in a first direction, and an absorber layer surface that is parallel to a first plane and oriented normal to the first direction. The device cavity region comprising at least two opposing reflective members that are configured to cause internal reflection of electromagnetic radiation entering through the optical window to pass through the one or more absorber layers at least two or more times.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 8A, 9A, and 10A are simplified diagrams showing photocurrent as a function of applied voltage for a photodiode structure according to embodiments of the current disclosure.

FIGS. 8B, 9B, and 10B are simplified diagrams showing local band structure as a function of position within a photodiode structure according to embodiments of the current disclosure.

FIG. 15 includes a table of the illuminated I-V performance characteristics of InGaN/GaN photodiode structures according to one or more embodiments of the present disclosure.

FIG. 18E is a simplified diagram showing a plan view of a photodiode die according to an embodiment of the present disclosure.

FIG. 20E is a simplified diagram showing a plan view of a photodiode die according to an alternative embodiment of the present disclosure.

FIGS. 22C and 21D are simplified diagrams showing cross sections of a photodiode die according to another alternative embodiment of the present disclosure.

FIGS. 25A, 25B, 25C, and 25D are simplified diagrams illustrating configurations of a power-over-fiber module incorporating both power and a modulated signal according to several embodiments of the present disclosure.

FIGS. 29A and 29B are simplified diagrams showing an optical absorption model for a packaged photodiode according to an embodiment of the present disclosure.

FIGS. 31A and 31B are simplified diagrams showing side and side-cross-sectional views of a packaged photodiode coupled to an optical fiber according to an embodiment of the present disclosure.

FIGS. 31C and 31D are simplified diagrams showing top and top-cross-sectional views of a packaged photodiode coupled to an optical fiber according to an embodiment of the present disclosure.

FIGS. 33A-33I are simplified diagrams showing side cross sectional views of a packaged photodiode coupled to an optical fiber according to alternate embodiments of the present disclosure.

FIGS. 35A-35F are simplified diagrams showing side cross sectional views of a packaged photodiode and a separate photodetector coupled to an optical fiber according to embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
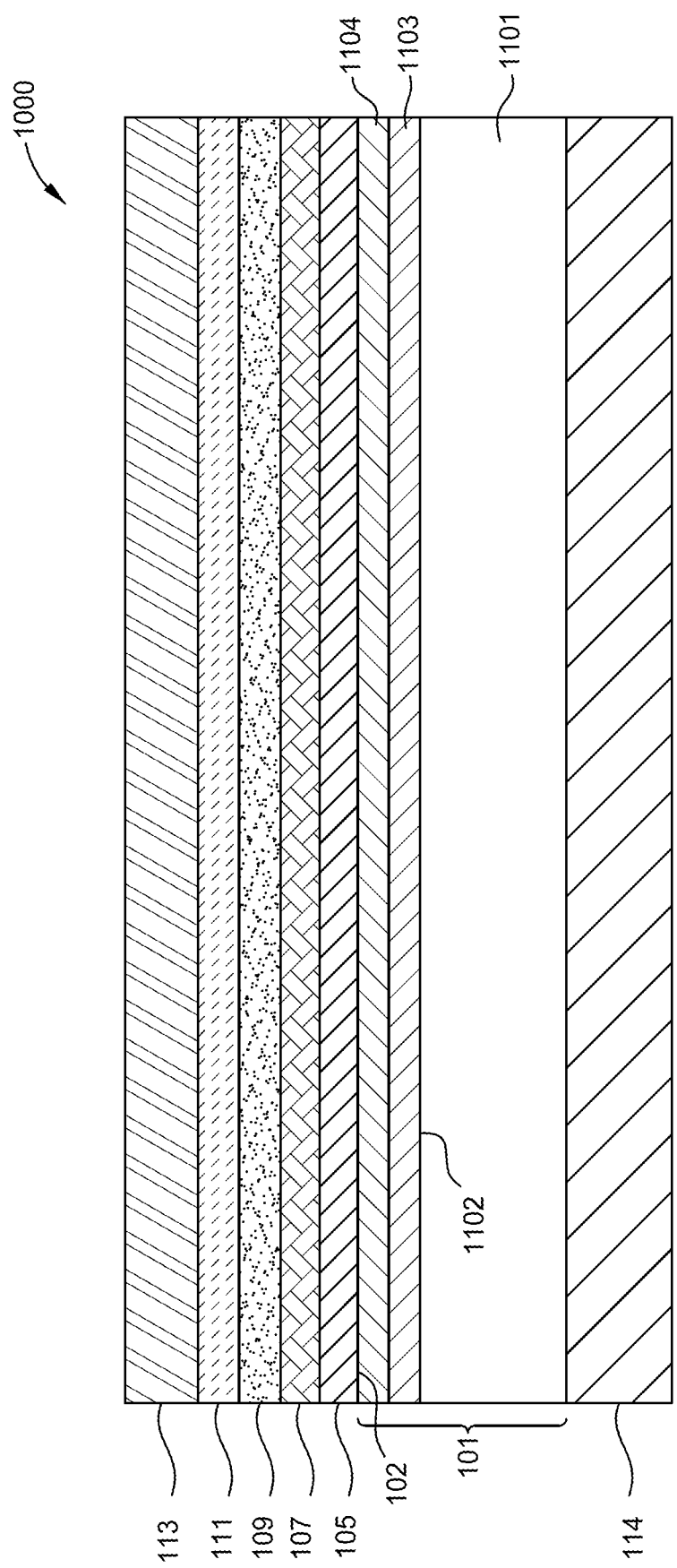
FIG. 1 is a simplified diagram illustrating a nitride-based power photodiode structure that has been prepared according to an embodiment of the present disclosure.

According to the present disclosure, techniques related to manufacturing and applications of power photodiode structures and devices based on group-III metal nitride and gallium-based substrates are provided. More specifically, embodiments of the disclosure include techniques for fabricating photodiode devices comprising one or more of GaN, AlN, InN, InGaN, AlGaN, and AlInGaN, structures and devices. Such structures or devices can be used for a variety of applications including optoelectronic devices, photodiodes, power-over-fiber receivers, and others.

As noted previously, lasers and photodiodes are better developed in the GaAs material system. One of the key differences in materials properties between the arsenide and nitride systems is that the bandgap may be varied readily with minimal impact on lattice constant in the case of the arsenides, e.g., via AlGaAs, but not in the case of the nitrides. Traditional photodiode package architectures incorporating nitride absorber layers may require an absorber layer thickness on the order of several hundred nanometers to absorb the large majority of the incident light. Assuming an absorber layer absorption coefficient of $1\times10^5$ cm$^{-1}$, the light absorbed in a single pass is approximately 39%, 63%, 87%, 95%, and 98% for thicknesses of 50, 100, 200, 300, and 400 nm, respectively. In the case of the nitrides, such a thickness of InGaN, with sufficient indium (In) to efficiently absorb blue or violet light, may be too strained to avoid relaxation by dislocation generation or by cracking. The inventors have discovered an approach to circumvent this problem, involving delivering electromagnetic radiation along long optical paths through an absorber layer to achieve near-100% optical absorption even when a relatively thin absorber layer containing power photodiode structure is provided. Additional benefits of the new approach include excellent heat dissipation, zero or very low grid shadow losses, and long effective minority carrier lifetimes. Here, the effective minority carrier lifetime includes photon recycling, defined as reabsorption of photons emitted by the absorber layer. The term "light" and "optical radiation" are often used herein interchangeably and are both intended to generally describe electromagnetic radiation at one or more wavelengths unless otherwise noted in the context of the discussion.

In order to take proper advantage of geometries involving long optical paths through the absorber layer, novel optical coupling geometries, fixtures, and methods are disclosed herein. Additional benefits of the novel optical coupling methods include improved ease and precision of alignment and improved efficiency, robustness, durability, and lifetime.

In addition, photodiode structures, such as a stack of epitaxially-grown layers, have both similarities and differences to structures for light-emitting diodes (LEDs) and laser diodes (LDs). For example, both LED and LD structures commonly include electron blocking layers within a p-type layer, to minimize electron loss from the active region and promote radiative carrier recombination within the active region. However, such structures may increase the series resistance for photodiode structures and may be counter-productive. Similarly, LD structures commonly include one or more of cladding layers, optical confinement layers, and separate confinement heterostructure (SCH) layers that may detract from the performance of the photodiodes, as their design is driven by different considerations than the present application.

For purposes of designing effective epitaxial structures for a photodiode, both in general and for the specific case where the active layer includes or consists of InGaN or Ga(In)N, high levels of active layer optical absorption and of the collection efficiency for minority carriers will increase the detection sensitivity and the operating current, $I_{mp}$. Low concentrations of defects, both point defects and extended defects, such as dislocations and stacking faults, will reduce Shockley-Read-Hall nonradiative recombination and thereby result in higher operating voltages $V_{mp}$. Low concentrations of defects may also enable improved photodiode performance under high light conditions (i.e., high optical power (Watts) conditions). The efficiency η of a photodiode may be written as $\eta=V_{mp}\times I_{mp}/P_{in}$, where $P_{in}$ is the input radiative power.

Figure 4:
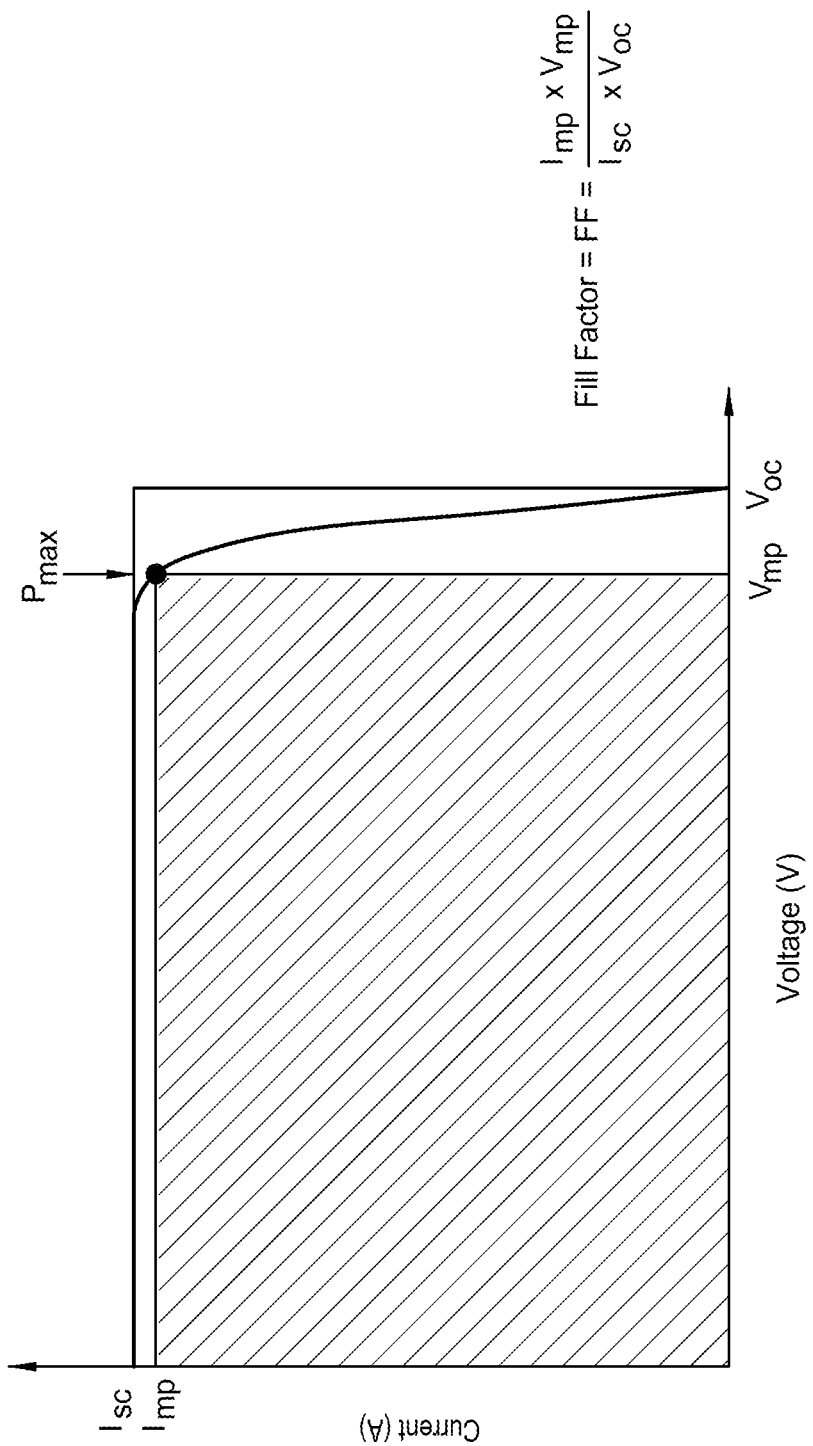
FIG. 4 is a simplified diagram illustrating the definition of the fill factor for a photodiode according to an embodiment of the present disclosure.

Another way of expressing the efficiency η of a photodiode is $\eta=V_{oc}\times I_{sc}\times FF/P_{in}$, as illustrated schematically in FIG. 4, where $V_{oc}$ is the open-circuit voltage, $I_{sc}$ is the short-circuit current, and FF is the fill factor. Still another way of expressing the efficiency η of a semiconductor photodiode is $\eta=(eV_{oc}/E_g)\times OA\times IQE\times FF\times E_g/(h\nu)$, where e is the charge of an electron, $E_g$ is the band gap of the semiconductor, OA is the optical absorption (or fraction of incident photons absorbed in the absorber layer), IQE is the internal quantum efficiency (fraction of absorbed photons producing an electron-hole pair that is collected), h is Planck's constant, and ν is the photon frequency. In preferred embodiments, the FF is greater than 50%, greater than 60%, greater than 70%, greater than 80%, or greater than 90%.

Figure 2:
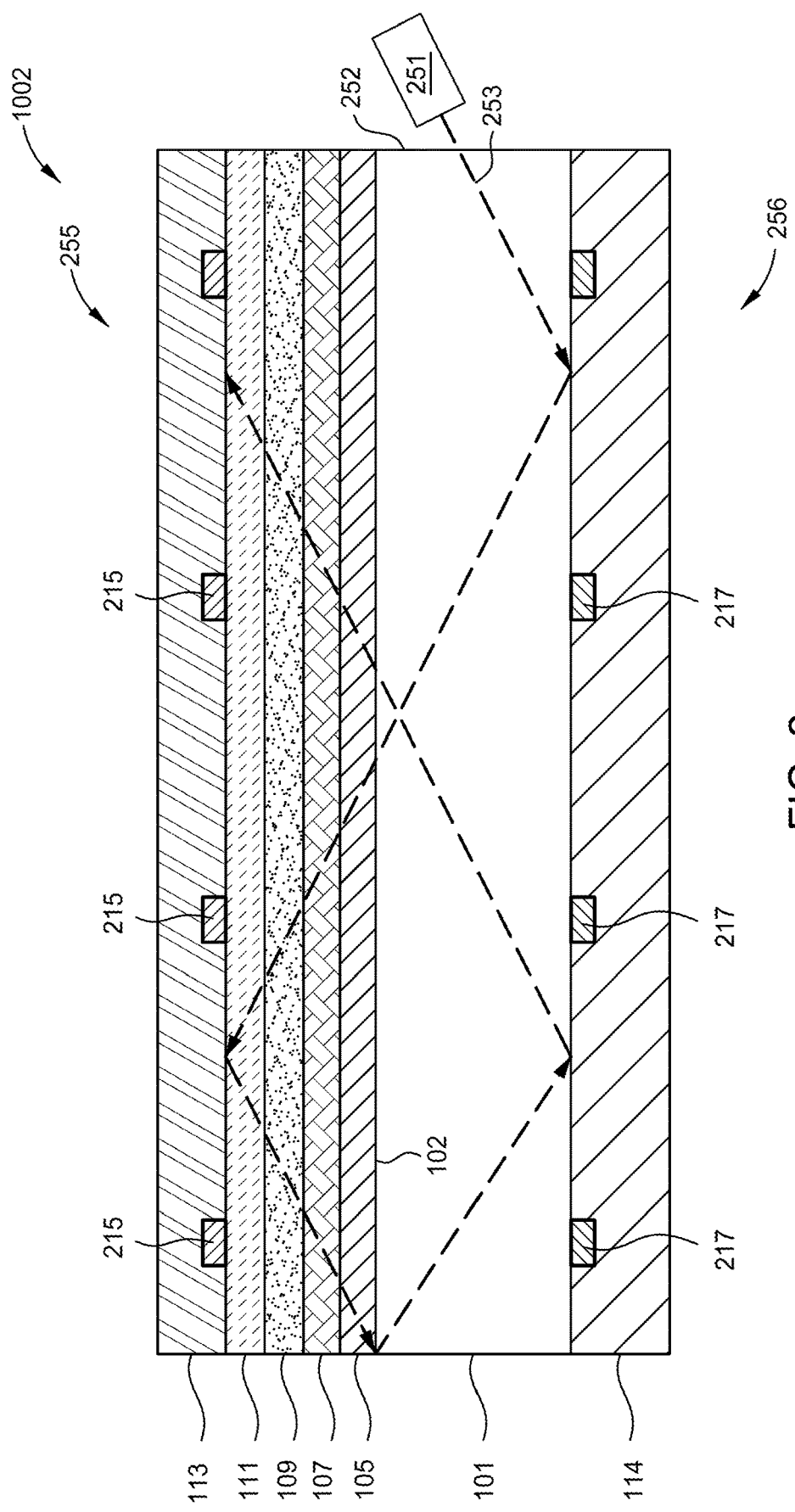
FIG. 2 is a simplified diagram illustrating an alternative nitride-based power photodiode die that has been prepared according to an embodiment of the present disclosure.

Relative to prior art photodiodes designed for much lower photon fluxes, mostly fabricated using GaN-on-sapphire structures, the inventive photodiodes, including GaN-on-GaN structures, feature high conversion efficiency due to careful optimization of the composition and doping of the semiconductor layers and to large area p-side and n-side electrical contacts with high reflectivity for use with a many-reflection excitation architecture and with very low contact resistance to minimize lateral ohmic losses at high current densities. In certain embodiments, the current photodiode structures are designed for applications where illumination is provided by a single laser or multiple lasers and enters the structure though an edge or through an aperture, as schematically illustrated in FIG. 2. In certain embodiments, the laser light is coupled into an edge of the photodiode structure or into an aperture formed in the photodiode structure using optical fibers, lenses, or waveguides. In certain embodiments, the inventive photodiode structures further incorporate a much lower dislocation density, with longer minority carrier diffusion lengths for higher current plus longer minority carrier lifetimes for higher open circuit voltage and fill factor. In addition, the inventive devices may include electrically conductive substrates, enabling vertical transport in vertically oriented power devices for a simpler design and reduced series resistance, and transparent substrates with a very similar refractive index of that of the absorber layers, minimizing optical losses. In certain embodiments, the substrate has a nonpolar or semipolar crystallographic orientation, enabling tuning of polarization fields for optimum device performance.

Figure 3:
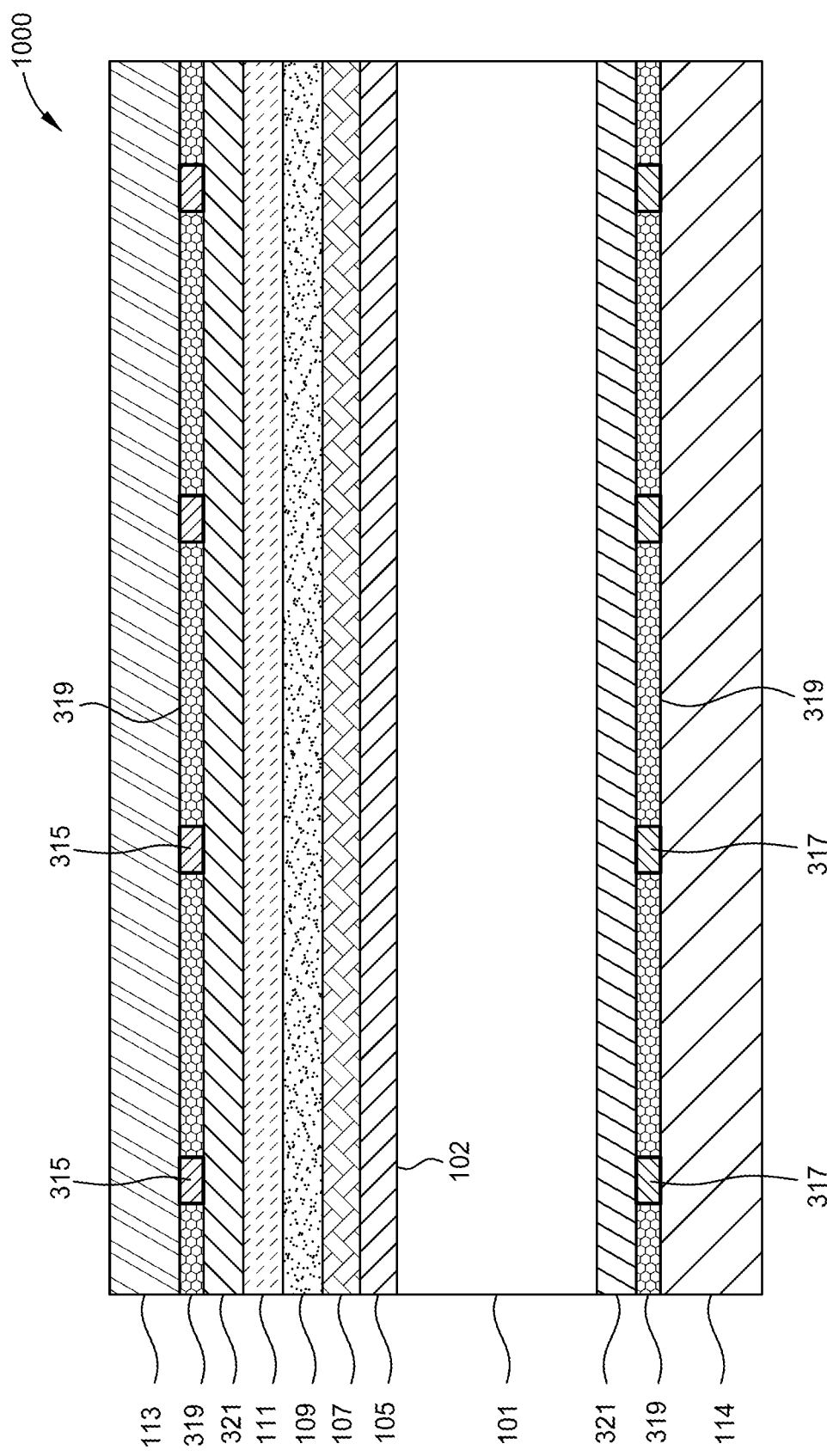
FIG. 3 is a simplified diagram illustrating another alternative nitride-based power photodiode structure that has been prepared according to an embodiment of the present disclosure.

FIGS. 1 and 3 depict simplified diagrams of group III-metal nitride based photodiode structures 1000, and FIG. 2 depicts a simplified diagram of a group III-metal nitride based photodiode die 1002. Referring to FIG. 1, a substrate 101 is provided. In certain embodiments, substrate 101 comprises single-crystalline group-III metal nitride, gallium-containing nitride, or gallium nitride. Substrate 101 may be grown by HVPE, ammonothermally, or by a flux method. In certain embodiments, substrate 101 is a template, where a single-crystalline group-III metal nitride layer 1104 has been deposited or grown on a template substrate 1101 that consists of or includes a material such as sapphire ($Al_2O_3$), silicon carbide (SiC), or silicon. In alternative embodiments, template substrate 1101 may consist of or include gallium arsenide, germanium, a silicon-germanium alloy, $MgAl_2O_4$ spinel, ZnO, $ZrB_2$, BP, InP, AlON, $ScAlMgO_4$, $YFeZnO_4$, MgO, $Fe_2NiO_4$, $LiGa_5O_8$, $Na_2MoO_4$, $Na_2WO_4$, $In_2CdO_4$, lithium aluminate ($LiAlO_2$), $LiGaO_2$, $Ca_8La_2(PO_4)_6O_2$, gallium nitride (GaN), aluminum nitride (AlN), or the like. One or both large area surfaces of substrate 101 may be polished and/or chemical-mechanically polished. A large-area surface 102 of substrate 101 may have a crystallographic orientation within 5 degrees, within 2 degrees, within 1 degree, or within 0.5 degree of (0001) +c-plane, (000–1) –c-plane, {10–10} m-plane, {11–2±2}, {60–6±1}, {50–5±1}, {40–4±1}, {30–3±1}, {50–5±2}, {70–7±3}, {20–2±1}, {30–3±2}, {40–4±3}, {50–5±4}, {10–1±1}, {10 –1±2}, {10 –1±3}, {21 –3±1}, or {30–3±4}. It will be understood that plane {30–3±4} means the {30 –34} plane and the {30 –3–4} plane. Large-area surface 102 may have an (h k i l) semipolar orientation, where i=–(h+k) and l and at least one of h and k are nonzero. In certain embodiments, template substrate 1101 consists of or includes sapphire and has a large-area surface 102 that has a crystallographic orientation within 5 degrees, within 2 degrees, within 1 degree, or within 0.5 degree of (0001), (10–10), (10–12), (22–43), or (11–23). In certain embodiments, template substrate 1101 consists of or includes sapphire and has a large-area surface 102 that is misoriented from (0001) by an angle between about 0.5 degree and about 8 degrees, or between about 2 degrees and about 4 degrees, toward the {11–20} a-plane, toward the {10–10} m-plane, or toward a-plane intermediate between a-plane and m-plane. In certain embodiments, template substrate 1101 has a cubic structure and a large-area surface 102 that has a crystallographic orientation within 5 degrees, within 2 degrees, within 1 degree, or within 0.5 degree of {111}, {100}, {110}, or {114}. Other orientations may also be chosen.

Figure 30:
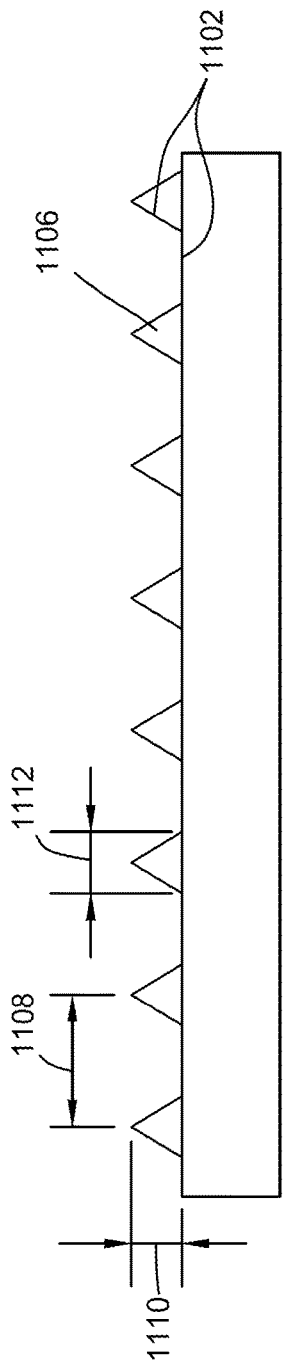
FIG. 30 is a simplified diagram showing a patterned substrate according to an embodiment of the present disclosure.

In certain embodiments, surface 1102 of template substrate 1101 is patterned, to facilitate light transmission between template substrate 1101, and a stack of n-type first non-absorber layer 105, absorber layer 107, optional second non-absorber layer 109, and p-type layer or p-type non-absorber layer 111. Referring to FIG. 30, surface 1102 may include a patterned array of features 1106. Features 1106 may include or consist of cones, domes, hemispheres, triangular pyramids, square pyramids, hexagonal pyramids, or the like. Other shapes are also possible. Features 1106 may be characterized by a pitch 1108, a height 1110, and a width 1112. Features 1106 may be arranged in a square array, a rectangular array, or a hexagonal array across surface 1102. Other patterns of features 1106 are also possible. Pitch 1108 may be between about 0.2 micrometer and about 10 micrometers, or between about 1 micrometer and about 5 micrometers. Height 1110 may be between about 0.1 micrometer and about 10 micrometers, or between about 1 micrometer and about 3 micrometers. Width 1112 may be between about 0.1 micrometer and about 10 micrometers, or between about 1 micrometer and about 5 micrometers. In certain embodiments, template substrate 1101 consists of or includes sapphire, and has a surface 1102 that has a crystallographic orientation within about 5 degrees of (0001). The template substrate 1101 may be referred to as a patterned sapphire substrate, as is known in the art, in certain embodiments.

Large-area surface 102 may have a maximum dimension between about 0.2 millimeter and about 600 millimeters and a minimum dimension between about 0.2 millimeter and about 600 millimeters and substrate 101 may have a thickness between about 10 micrometers and about 10 millimeters, or between about 100 micrometers and about 2 millimeters. In certain embodiments, substrate 101 is substantially circular, with one or more orientation flats. In alternative embodiments, substrate 101 is substantially rectangular. In certain embodiments, large-area surface 102 has a maximum dimension of about 50 mm, 100 mm, 125 mm, 150 mm, 200 mm, 250 mm, or 300 mm. The variation in the crystallographic orientation of the large-area surface 102 may be less than about 5 degrees, less than about 2 degrees, less than about 1 degree, less than about 0.5 degrees, less than about 0.2 degrees, less than about 0.1 degrees, or less than about 0.05 degrees relative to the average orientation at the large area surface.

Large-area surface 102 of substrate 101 may have a threading dislocation density less than about $10^{10}$ cm$^{-2}$, less than about $10^9$ cm$^{-2}$, less than about $10^8$ cm$^{-2}$, less than about $10^7$ cm$^{-2}$, less than about $10^6$ cm$^{-2}$, less than about $10^5$ cm$^{-2}$, less than about $10^4$ cm$^{-2}$, less than about $10^3$ cm$^{-2}$, or less than about $10^2$ cm$^{-2}$. Large-area surface 102 of substrate 101 may have a stacking-fault concentration below about $10^4$ cm$^{-1}$, below about $10^3$ cm$^{-1}$, below about $10^2$ cm$^{-1}$, below about 10 cm$^{-1}$ or below about 1 cm$^{-1}$. Large-area surface 102 of substrate 101 may have a symmetric x-ray rocking curve full width at half maximum (FWHM) less than about 500 arcsec, less than about 300 arcsec, less than about 200 arcsec, less than about 100 arcsec, less than about 50 arcsec, less than about 35 arcsec, less than about 25 arcsec, or less than about 15 arcsec. Large-area surface 102 of substrate 101 may have a crystallographic radius of curvature greater than 0.1 meter, greater than 1 meter, greater than 10 meters, greater than 100 meters, or greater than 1000 meters, in at least one or at least two independent or orthogonal directions. In a specific embodiment, large-area surface 102 of substrate 101 has a threading dislocation density less than about $10^5$ cm$^{-2}$, a stacking-fault concentration below about 10 cm$^{-1}$, and a symmetric x-ray rocking curve full width at half maximum (FWHM) less than about 50 arcsec. The reduced dislocation density in the substrate 101, relative to most prior art photodiodes, is expected to result in a reduced dislocation density in the semiconductor layers of the photodiode and to a higher open-circuit voltage $V_{oc}$ and a higher efficiency at high current densities.

In some embodiments, the substrate 101 may include regions having a relatively high concentration of threading dislocations separated by regions having a relatively low concentration of threading dislocations. The concentration of threading dislocations in the relatively high concentration regions may be greater than about $10^5$ cm$^{-2}$, greater than about $10^6$ cm$^{-2}$, greater than about $10^7$ cm$^{-2}$, or greater than about $10^8$ cm$^{-2}$. The concentration of threading dislocations in the relatively low concentration regions may be less than about $10^6$ cm$^{-2}$, less than about $10^5$ cm$^{-2}$, or less than about $10^4$ cm$^{-2}$. Substrate 101 may also or separately include regions having a relatively high electrical conductivity separated by regions having a relatively low electrical conductivity. Substrate 101 may have a thickness between about 10 microns and about 100 millimeters, or between about 0.1 millimeter and about 10 millimeters. Substrate 101 may have a dimension, including a diameter, of at least about 5 millimeters, at least about 10 millimeters, at least about 25 millimeters, at least about 50 millimeters, at least about 75 millimeters, at least about 100 millimeters, at least about 150 millimeters, at least about 200 millimeters, at least about 300 millimeters, at least about 400 millimeters, or at least about 600 millimeters. In a specific embodiment, substrate 101 has a thickness between about 250 micrometers and about 600 micrometers, a maximum lateral dimension or diameter between about 15 millimeters and about 160 millimeters, and includes regions where the concentration of threading dislocations is less than about $10^4$ cm$^{-2}$.

Substrate 101 may include a release layer 1103 for facile separation of single-crystalline group-III metal nitride layer 1104 from the balance of the substrate, such as a template substrate 1101. In some embodiments, the release layer 1103 has an optical absorption coefficient greater than 1000 cm$^{-1}$ at least one wavelength where the template substrate is substantially transparent, with an optical absorption coefficient less than 50 cm$^{-1}$, thereby enabling substrate removal by a laser lift-off technique, for example, after fabrication of at least one device structure. In certain embodiments, release layer 1103 includes or consists of GaN that is heavily doped with Co, increasing its optical absorption coefficient to greater than 5000 cm$^{-1}$ over the entire visible spectrum. In one specific embodiment, Co-doped release layer 1103 having a thickness between 0.5 micrometer and 50 micrometers is formed ammonothermally on template substrate 1101, with CoF$_2$ as an additive to the mineralizer and template substrate 1101 consisting of a high quality GaN seed crystal. In another specific embodiment, Co-doped release layer 1103 is formed by MOCVD on a template substrate 1101 (e.g., high-quality GaN substrate), using at least one of cyclopentadienylcobalt dicarbonyl (($C_5H_5$)Co(CO)$_2$), cobalt (II) acetylacetonate (Co(CH$_3$C(O)CHC(O)CH$_3$)$_2$), cobalt tricarbonyl nitrosyl (Co(CO)$_3$NO), dicobalt octacarbonyl (Co$_2$(CO)$_8$), and tetracobalt dodecacarbonyl (Co$_4$(CO)$_{12}$) as a dopant precursor. In still another specific embodiment, Co-doped release layer 1103 is formed by hydride vapor phase epitaxy (HVPE) on a template substrate 1101, such as a high quality GaN substrate, using at least one of cyclopentadienylcobalt dicarbonyl (($C_5H_5$)Co(CO)$_2$), cobalt (II) acetylacetonate (Co(CH$_3$C(O)CHC(O)CH$_3$)$_2$), cobalt tricarbonyl nitrosyl (Co(CO)$_3$NO), dicobalt octacarbonyl (Co$_2$(CO)$_8$), and tetracobalt dodecacarbonyl (Co$_4$(CO)$_{12}$) as a dopant precursor. Further details are described in U.S. Pat. No. 8,148,801, which is hereby incorporated by reference in its entirety. In some embodiments, the release layer 1103 includes or consists of InGaN, thereby enabling substrate removal by a photoelectrochemical etching technique, for example, after fabrication of at least one device structure. In some embodiments, the InGaN-containing release layer has a thickness between about 2 nanometers and about 100 nanometers or between about 5 nanometers and about 50 nanometers. In some embodiments, the release layer has a bandgap less than that of the absorber layer 107 described below. In a specific embodiment, release layer 1103 includes or consists of a strained-layer superlattice of InGaN and GaN or AlGaN. In some embodiments, the percent (%) indium (In) in the strained-layer superlattice is greater than that in the absorber layer 107, and is grown by MOCVD on a template substrate 1101, such as a high quality GaN substrate. Further details of an InGaN release layer are described in more detail in U.S. Pat. No. 8,866,149 and in U.S. Patent Application publication no. US2019/0088495, each of which are hereby incorporated by reference in their entirety.

In certain embodiments, substrate 101 consists of or includes a single-crystalline group-III metal nitride layer 1104 bonded to or formed on a surface of a template substrate 1101. The single-crystalline group-III metal nitride layer 1104 may include gallium. The single-crystalline group III metal nitride layer 1104 may be deposited by HVPE, by metalorganic chemical vapor deposition (MOCVD), molecular beam epitaxy (MBE), or the like. The single-crystalline group-III metal nitride layer 1104 may have a thickness between about 1 micrometer and about 100 micrometers, between about 2 micrometers and about 25 micrometers, or between about 3 micrometers and about 15 micrometers. In certain embodiments, the single-crystalline group-III metal nitride layer 1104 has a wurtzite crystal structure and a crystallographic orientation within 5 degrees, within 2 degrees, within 1 degree, or within 0.5 degree of (0001) +c-plane, (000-1) −c-plane, {10-10} m-plane, {11-2±2}, {60-6±1}, {50-5±1}, {40-4±1}, {30-3±1}, {50-5±2}, {70-7±3}, {20-2±1}, {30-3±2}, {40-4±3}, {50-5±4}, {10-1±1}, {10-1±2}, {10-1±3}, {21-3±1}, or {30-3±4}. In certain embodiments, a nucleation layer (not shown) is present at the interface between the template substrate 1101 and the single-crystalline group-III metal nitride layer 1104. In certain embodiments, the nucleation layer consists of or includes one or more of aluminum nitride, gallium nitride, and zinc oxide. In certain embodiments, the nucleation layer is deposited on the template substrate 1101 by at least one of low-temperature MOCVD, sputtering, and electron-beam evaporation. In certain embodiments, the nucleation layer has a thickness between about 1 nanometer and about 200 nanometers or between about 10 nanometers and about 50 nanometers. In certain embodiments, the substrate further includes one or more strain-management layers, for example, an AlGaN layer or a strained-layer superlattice.

In certain embodiments, large-area surface 102 has atomic impurity concentrations of at least one of oxygen (O), and hydrogen (H) above about $1\times10^{16}$ cm$^{-3}$, above about $1\times10^{17}$ cm$^{-3}$, or above about $1\times10^{18}$ cm$^{-3}$. In certain embodiments, a ratio of the atomic impurity concentration of H to the atomic impurity concentration of O is between about 0.3 and about 2, between about 1.1 and about 1000, or between about 5 and about 100. In certain embodiments, large-area surface 102 has impurity concentrations of at least one of lithium (Li), sodium (Na), potassium (K), fluorine (F), chlorine (Cl), bromine (Br), or iodine (I) above about $1\times10^{15}$ cm$^{-3}$, above about $1\times10^{16}$ cm$^{-3}$, or above about $1\times10^{17}$ cm$^{-3}$, or above about $1\times10^{18}$ cm$^{-3}$. In certain embodiments, large-area surface 102 has impurity concentrations of O, H, carbon (C), Na, and K between about $1\times10^{16}$ cm$^{-3}$ and about $1\times10^{19}$ cm$^{-3}$, between about $1\times10^{16}$ cm$^{-3}$ and about $2\times10^{19}$ cm$^{-3}$, below $1\times10^{17}$ cm$^{-3}$, below $1\times10^{16}$ cm$^{-3}$, and below $1\times10^{16}$ cm$^{-3}$, respectively, as quantified by calibrated secondary ion mass spectrometry (SIMS). In another embodiment, large-area surface 102 has impurity concentrations of O, H, C, and at least one of Na and K between about $1\times10^{16}$ cm$^{-3}$ and $1\times10^{19}$ cm$^{-3}$, between about $1\times10^{16}$ cm$^{-3}$ and about $2\times10^{19}$ cm$^{-3}$, below $1\times10^{17}$ cm$^{-3}$, and between about $3\times10^{15}$ cm$^{-3}$ and about $1\times10^{18}$ cm$^{-3}$, respectively, as quantified by calibrated secondary ion mass spectrometry (SIMS). In still another embodiment, large-area surface 102 has impurity concentrations of O, H, C, and at least one of F and Cl between about $1\times10^{16}$ cm$^{-3}$ and about $1\times10^{19}$ cm$^{-3}$, between about $1\times10^{16}$ cm$^{-3}$ and about $2\times10^{19}$ cm$^{-3}$, below $1\times10^{17}$ cm$^{-3}$, and between about $1\times10^{15}$ cm$^{-3}$ and about $1\times10^{19}$ cm$^{-3}$, respectively, as quantified by calibrated secondary ion mass spectrometry (SIMS). In some embodiments, large-area surface 102 has impurity concentrations of H between about $5\times10^{17}$ cm$^{-3}$ and $1\times10^{19}$ cm$^{-3}$, as quantified by calibrated secondary ion mass spectrometry (SIMS). In a specific embodiment, substrate 101 has an infrared absorption peak at about 3175 cm$^{-1}$, with an absorbance per unit thickness of greater than about 0.01 cm$^{-1}$.

Substrate 101 may be characterized by a wurtzite structure substantially free from any cubic entities or other crystal structures, the other structures being less than about 0.1% in volume in reference to the substantially wurtzite structure.

Substrate 101 may be characterized by a total thickness variation (TTV) of less than about 25 micrometers, less than about 10 micrometers, less than about 5 micrometers, less than about 2 micrometers, or less than about 1 micrometer, and by a macroscopic bow that is less than about 200 micrometers, less than about 100 micrometers, less than about 50 micrometers, less than about 25 micrometers, or less than about 10 micrometers. Substrate 101 may have a concentration of macro defects on the large-area surface 102, with a diameter or characteristic dimension greater than about 100 micrometers, of less than about 2 $cm^{-2}$, less than about 1 $cm^{-2}$, less than about 0.5 $cm^{-2}$, less than about 0.25 $cm^{-2}$, or less than about 0.1 $cm^{-2}$. The variation in miscut angle across a large-area surface 102 of substrate 101 may be less than about 5 degrees, less than about 2 degrees, less than about 1 degree, less than about 0.5 degree, less than about 0.2 degree, less than about 0.1 degree, less than about 0.05 degree, or less than about 0.025 degree in each of two orthogonal crystallographic directions. The root-mean-square surface roughness of large-area surface 102, as measured over an area of at least 10 μm×10 μm, may be less than about 0.5 nanometers, less than about 0.2 nanometers, less than about 0.15 nanometers, less than about 0.1 nanometers, or less than about 0.05 nanometers. Substrate 101 may be characterized by n-type electrical conductivity, with a carrier concentration between about $1 \times 10^{17}$ $cm^{-3}$ and about $3 \times 10^{19}$ $cm^{-3}$ and a carrier mobility greater than about 100 $cm^2/V\text{-}s$. In certain embodiments, substrate 101 is highly transparent, with an optical absorption coefficient at a wavelength of 405 nanometers, or of 450 nanometers, that is less than about 10 $cm^{-1}$, less than about 5 $cm^{-1}$, less than about 2 $cm^{-1}$, less than about 1 $cm^{-1}$, less than about 0.5 $cm^{-1}$. less than about 0.2 $cm^{-1}$, or less than about 0.1 $cm^{-1}$.

In certain embodiments, one or more n-type first non-absorber layers 105, comprising $Al_uIn_vGa_{1-u-v}N$ layers, where 0≤u, v, u+v≤1, is deposited on the substrate. In certain embodiments, n-type first non-absorber layers 105 are deposited immediately following deposition of single-crystalline group-III metal nitride layer 1104, that is, without interrupting the growth process or removing substrate 101 or template substrate 1104 from the deposition reactor. In certain embodiments, one or more additional layers are deposited to help manage stress in the overall structure. The carrier concentration in n-type first non-absorber layer 105 may lie in the range between about $10^{16}$ $cm^{-3}$ and $10^{20}$ $cm^{-3}$. In certain embodiments, silicon, germanium, or oxygen is the n-type dopant in n-type first non-absorber layer 105. In certain embodiments, germanium is selected as the n-type dopant. In certain embodiments, the n-type carrier concentration in n-type first non-absorber layer 105 lies in the range between $5 \times 10^{17}$ $cm^{-3}$ and $10^{20}$ $cm^{-3}$ or between $2 \times 10^{18}$ $cm^{-3}$ and $6 \times 10^{19}$ $cm^{-3}$. A high doping level may be particularly desirable if substrate 101 has a (0001) +c-plane orientation, as piezoelectric fields may more effectively be screened for efficient carrier collection. A high doping level may also be desirable if template substrate 1101 is electrically insulating or highly resistive. Abrupt or graded composition or doping profiles may be incorporated at interfaces within the n-type first non-absorber layer 105. The deposition may be performed using metalorganic chemical vapor deposition (MOCVD) or molecular beam epitaxy (MBE). For example, the substrate may be placed on a susceptor in an MOCVD reactor. After closing, evacuating, and backfilling the reactor, the susceptor may be heated to a temperature between about 800 and about 1350 degrees Celsius in the presence of a nitrogen-containing gas. In one specific embodiment, the susceptor is heated to approximately 1185 degrees Celsius under flowing ammonia. A flow of a gallium-containing metalorganic precursor, such as trimethylgallium (TMG), triethylgallium (TEG), or triisopropylgallium may be initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm, may be initiated. In certain embodiments, doping is achieved by adding one or more of $SiH_4$, $Si_2H_6$, $SiH_2Cl_2$, $SiHCl_3$, $SiCl_4$, $GeH_4$, $GeCl_4$, $O_2$, and $H_2O$ to the input gases. In certain embodiments, one or more n-type first non-absorber layer 105 and second non-absorber layer 109 is a metamorphic buffer layer and facilitates accommodation of lattice constant differences between layers. In certain embodiments, the doping level in the n-type first non-absorber layer 105 may be non-uniform, with two or more levels of doping and/or graded doping levels. In certain embodiments, the substrate temperature is varied during the deposition of the n-type first non-absorber layer 105. In certain embodiments, the substrate temperature is held at a high value, for example, between 1100 and 1350 degrees Celsius for a first portion of the n-type first non-absorber layer 105, then reduced to a lower value, for example, the same temperature as the temperature at which the absorber layer 107 is deposited, for a second portion of the n-type first non-absorber layer 105, for example, between about 700 and about 950 degrees Celsius. In certain embodiments, the thickness of the second portion of the n-type first non-absorber layer 105 is between about 1 nanometer and about 20 nanometers.

Following deposition of the n-type first non-absorber layer 105 for a predetermined period of time, so as to achieve a predetermined thickness, an absorber layer 107 is deposited. In certain embodiments, the absorber layer 107 is deposited by MOCVD, at a substrate temperature between about 700 and about 950 degrees Celsius. Indium may be added to the absorber layer 107 by using at least one of trimethylindium (TMIn), triethylindium (TEIn), and triisopropylindium as a precursor in MOCVD. The deposition rate for the absorber layer 107 may be chosen to lie between about 0.005 and about 1 nanometer per second, or between about 0.01 and about 0.5 nanometer per second, or between about 0.02 and about 0.2 nanometer per second. In certain embodiments, the absorber layer 107 is unintentionally doped. In certain embodiments, the absorber layer 107 is n-type doped, using oxygen, silicon, or germanium, as a dopant, with a dopant concentration between about $5 \times 10^{15}$ $cm^{-3}$ and about $5 \times 10^{19}$ $cm^{-3}$, or between about $5 \times 10^{16}$ $cm^{-3}$ and about $5 \times 10^{18}$ $cm^{-3}$. In certain embodiments, the absorber layer 107 is p-type doped, using Mg as a dopant, with a dopant concentration between about $5 \times 10^{15}$ $cm^{-3}$ and about $5 \times 10^{19}$ $cm^{-3}$, or between about $5 \times 10^{16}$ $cm^{-3}$ and about $5 \times 10^{18}$ $cm^{-3}$. In some embodiments, the absorber layer 107 has a bandgap wavelength that is between about 400 nanometers and about 550 nanometers, such as a bandgap wavelength that is between about 440 nanometers and about 500 nanometers. The absorber layer 107 may comprise a single quantum well or multiple quantum wells, with 2-50 quantum wells (not shown). In some embodiments, the absorber layer 107 includes between about 10 and about 30 quantum wells.

The quantum wells may comprise InGaN well layers and GaN barrier layers. In other embodiments, the quantum wells may comprise $Al_wIn_xGa_{1-w-x}N$ well layers and $Al_yIn_zGa_{1-y-z}N$ barrier layers, respectively, where $0 \le w, x, y, z$, $w+x, y+z \le 1$, where $w<u$, y and/or $x>v$, z so that the bandgap of the well layer(s) is less than that of the barrier layer(s) and of the n-type first non-absorber layer 105 and second non-absorber layer 109. The well layers and barrier layers may each have a thickness between about 0.5 nanometer and about 20 nanometers. In certain embodiments, the barrier layers have a thickness between about 1 nanometer and about 3 nanometers, between about 3 nanometers and about 5 nanometers, between about 5 nanometers and 10 nanometers, or between about 10 nanometers and 15 nanometers. In certain embodiments, the well layers have a thickness between 0.5 nanometer and about 1.5 nanometer, between about 1.5 nanometer and about 2.5 nanometers, between about 2.5 nanometers and about 3.5 nanometers, between about 3.5 nanometers and about 4.5 nanometers, or between about 4.5 nanometers and about 10 nanometers. In another embodiment, the absorber layer 107 includes or consists of a double heterostructure, with an InGaN or $Al_wIn_xGa_{1-w-x}N$ layer about 20 nm to about 500 nm thick surrounded by GaN or $Al_yIn_zGa_{1-y-z}N$ layers, where $w<u$, y and/or $x>v$, z. In certain embodiments, the thickness of the double heterostructure is between about 10 nanometers and about 25 nanometers, between about 25 nanometers and about 40 nanometers, between about 40 nanometers and about 60 nanometers, between about 60 nanometers and about 100 nanometers, between about 100 nanometers and about 200 nanometers, or thicker than about 200 nanometers. Abrupt or graded composition or doping profiles may be incorporated at interfaces within the absorber layer 107. The composition and structure of the active layer are chosen to provide light absorption at a preselected wavelength, for example, at 405 nanometers or at 450 nanometers. In certain embodiments, the wavelength is selected to lie between about 400 nanometers to about 500 nanometers. The absorber layer 107 may be characterized by photoluminescence spectroscopy. In certain embodiments, the composition of the absorber layer 107 is chosen such that the photoluminescence spectrum has a peak that is longer in wavelength than the desired absorption wavelength of the photodiode structure 1000 by between 5 nanometers and 50 nanometers or by between 10 nanometers and 25 nanometers. In certain embodiments, the quality and layer thicknesses within the absorber layer 107 are characterized by x-ray diffraction.

In some embodiments, one or more optional second non-absorber layers 109 is deposited next. Second non-absorber layer 109 may comprise $Al_sIn_tGa_{1-s-t}N$, where $0 \le s, t, s+t \le 1$, with a higher bandgap than the absorber layer 107, and may be doped p-type or may be unintentionally doped. In one specific embodiment, second non-absorber layer 109 comprises AlGaN. In another embodiment, second non-absorber layer 109 comprises an AlGaN/GaN multi-quantum barrier (MQB), comprising alternating layers of AlGaN and GaN, each with a thickness between about 0.2 nm and about 5 nm. In certain embodiments, one or more second non-absorber layer 109 is a metamorphic buffer layer and facilitates accommodation of lattice constant differences between layers of the photodiode structure 1000. Abrupt or graded composition or doping profiles may be incorporated at interfaces within the second non-absorber layer 109. In some embodiments, the optical designs of the second non-absorber layers 109 are tuned to achieve greater than about 70% optical reflection of light transmitted from the substrate through the absorber layers 107.

Next, a p-type layer, or p-type non-absorber layer, 111, formed of $Al_qIn_rGa_{1-q-r}N$, where $0 \le q, r, q+r \le 1$, is deposited above the absorber layer 107 and, if present, the second non-absorber layer 109. The p-type layer 111 may be doped with Mg, to a level between about $10^{16}$ $cm^{-3}$ and $10^{21}$ $cm^{-3}$ and may have a thickness between about 5 nanometers and about 1 micrometer, between about 20 nanometers and about 400 nanometers, or between about 100 nanometers and about 250 nanometers. In certain embodiments, the concentration of Mg in the p-type layer 111 closest to the absorber layer 107 is between $10^{18}$ $cm^{-3}$ and $10^{21}$ $cm^{-3}$, between $3 \times 10^{18}$ $cm^{-3}$ and $3 \times 10^{20}$ $cm^{-3}$, or between $10^{19}$ $cm^{-3}$ and $2 \times 10^{20}$ $cm^{-3}$. A high doping level may be particularly desirable if substrate 101 has a (0001) +c-plane orientation, as piezoelectric fields may more effectively screened for efficient carrier collection. The outermost 1-30 nanometers of the p-type layer 111 may be doped more heavily than the rest of the p-type layer 111, so as to enable an improved electrical contact. In certain embodiments, the substrate temperature is varied during the deposition of the p-type layer 111. In certain embodiments, the substrate temperature is held at a low value, for example, the same temperature as the temperature at which the absorber layer 107 is deposited, for a first portion of the p-type layer 111, for example, between about 700 and about 950 degrees Celsius. Then the substrate temperature is raised to a higher level, for example, between about 750 and about 1000 degrees Celsius, for a second portion of the p-type layer 111. In certain embodiments, the thickness of the first portion of the p-type layer 111 is between about 1 nanometer and about 20 nanometers, or between about 20 nanometers and about 40 nanometers.

In a specific embodiment, a tunnel junction and another n-type layer (not shown) are deposited on top of the p-type layer 111. In certain embodiments, one or more additional non-absorber layers and additional absorber layers are deposited overlying the tunnel junction.

The semiconductor layers, which include the n-type first non-absorber layer 105, absorber layer 107, one or more optional second non-absorber layers 109, p-type layer 111, and may also include additional absorber layers, one or more n-type cladding layers, and one or more p-type cladding layers, have the same crystallographic orientation, to within about two degrees, within about one degree, or within about 0.5 degree, as the crystallographic orientation of large-area surface 102 of substrate 101, have a very high crystalline quality, comprise nitrogen, and may have a surface dislocation density below $10^9$ $cm^{-2}$. The semiconductor layers may have a surface dislocation density below $10^{10}$ $cm^{-2}$, below $10^9$ $cm^{-2}$, below $10^8$ $cm^{-2}$, below $10^7$ $cm^{-2}$, below $10^6$ $cm^{-2}$, below $10^5$ $cm^{-2}$, below $10^4$ $cm^{-2}$, below $10^3$ $cm^{-2}$, or below $10^2$ $cm^{-2}$. In some embodiments, the semiconductor layers are substantially transparent, with an optical absorption coefficient below 100 $cm^{-1}$, below 50 $cm^{-1}$ or below 5 $cm^{-1}$ at wavelengths between about 400 nm and about 3077 nm and at wavelengths between about 3333 nm and about 6667 nm.

In a specific embodiment, the semiconductor layers have an orientation within five degrees of m-plane and the FWHM of the 1-100 x-ray rocking curve of the top surface is below 300 arc sec, below 100 arc sec, or below 50 arc sec. In another specific embodiment, the semiconductor layers have an orientation within five degrees of a-plane and the FWHM of the 11-20 x-ray rocking curve of the top surface is below 300 arc sec, below 100 arc sec, or below 50 arc sec. In yet another specific embodiment, the semiconductor layers have an orientation within five degrees of a semipolar orientation selected from {1 −10±1}, {1−10±2}, {1-10±3}, {20-2±1}, {30-3±1}, or {11-2.+-.2} and the FWHM of the lowest-order semipolar symmetric x-ray rocking curve of the top surface is below 300 arc sec, below 100 arc sec, or below 50 arc sec. In another specific embodiment, the semiconductor layers have an orientation within five degrees of (0001) c-plane and the FWHM of the 0002 x-ray rocking curve of the top surface is below 300 arc sec, below 100 arc sec, or below 50 arc sec. In still another specific embodiment, the semiconductor layers have an orientation within ten degrees of (000-1) c-plane and the FWHM of the 0002 x-ray rocking curve of the top surface is below 300 arc sec, below 100 arc sec, or below 50 arc sec.

In certain embodiments, for process development purposes, it may be useful to fabricate structures with one or more of the above-described layers missing. For example, the p-type layer 111 and the absorber layer 107 could be omitted for purposes of developing or optimizing a p-side reflective electrical contact 113, as described below. One or more of the p-side reflective electrical contact 113 and the p-type layer 111 could be omitted for purposes of developing or optimizing the electrical, optical and material properties of the absorber layer 107.

The crystallographic orientation of the semiconductor layers and the doping and bandgap profile may have a major impact on the performance of a photodiode, including one or more of a photodiode structure, a photodiode die, or a packaged photodiode. It is well known that for +c-plane GaN-based devices containing heterostructures, spontaneous and piezoelectric polarization, due to the strong polarity of the Ga—N bond and the lack of inversion symmetry in the wurtzite crystal structure, can create strong electric fields that can result in unfavorable device performance. It is believed that these fields can negatively impact the performance of photodiodes, particularly at high current densities, and have identified and disclosed herein several approaches to overcome these effects.

The use of +c-plane substrates, that is, where the crystallographic orientation is within 5 degrees, within 2 degrees, within 1 degree, or within 0.5 degree of (0001), has several advantages for high-power photodiodes, including 1) a more mature commercial supply chain with large-area, epi-ready substrates, 2) well-established, stable epitaxy growth conditions, and 3) relative ease in controlling dopant concentrations over many orders of magnitude. However, as illustrated in the Comparative Examples below, the use of relatively-standard LED-type structures may not enable photodiodes with high fill factors.

In certain embodiments, the deleterious effects of spontaneous and piezoelectric fields in +c-plane photodiodes, which become progressively more severe as the indium (In) percent in the absorber layer 107 is increased, are mitigated by the use of high doping levels on both the n-side and the p-side of the absorber layer 107. The impacts of bandgap alignment and spontaneous and piezoelectric fields on photodiode performance at high current densities has been investigated. The semiconductor layers used in the analysis of the performance of a photodiode structure 1000 of a photodiode die are shown schematically in FIG. 7. In the simplified model, absorber layer 730 is positioned between n-type doped layer 710 and p-type doped layer 750. Optionally, an n-type non-absorber layer (or cladding layer) 720 is interposed between n-type doped layer 710 and absorber layer 730. Optionally, a p-type non-absorber layer (or cladding layer) 740 is interposed between absorber layer 730 and p-type doped layer 750. For simplicity, the absorber layer 730 was modeled as a double heterostructure, with a thickness of 40 nanometers, but similar effects are expected when the absorber layer consists of or includes multiple quantum well (MQW) structures.

Figure 8B:
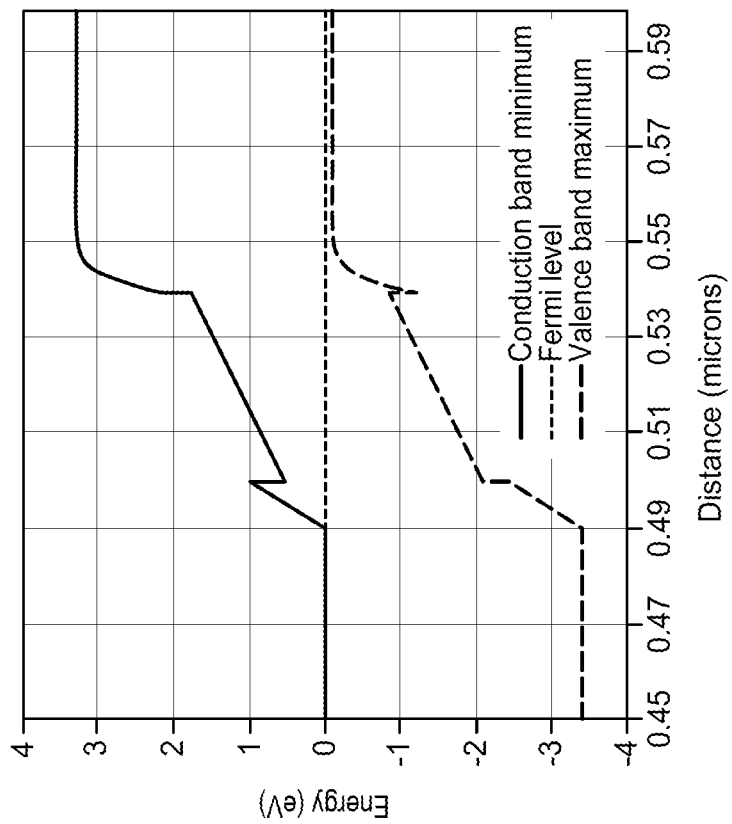
Figure 8A:
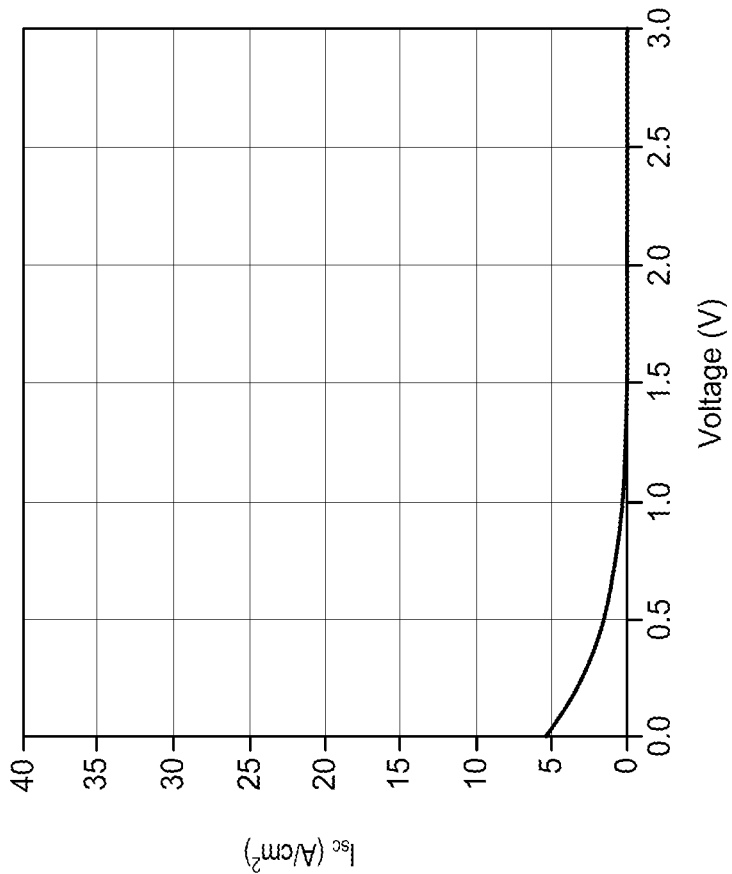

In the case of absorber layers 730 containing one or more layers that include $In_{0.18}Ga_{0.82}N$, which are appropriate for absorption of light having a wavelength of about 473 nanometers or less, the short-circuit current and fill factor are very low when the doping level of the n-type doped layer 710 in contact with a first side of the absorber layer 730 is $2.0 \times 10^{19}$ cm$^{-3}$ and the doping level of the p-type doped layer 750 in contact with a second side of the absorber layers 730 is $2.0 \times 10^{19}$ cm$^{-3}$, as shown in FIG. 8A. This very poor performance is believed to be due to poor screening of the electric fields related to the polarization discontinuity and band offsets between InGaN and GaN, as shown in FIG. 8B. However, when the doping level of the n-type doped layer 710 in contact with a first side of the absorber layer 730 is raised to $3.5 \times 10^{19}$ cm$^{-3}$ and the doping level of the p-type doped layer 750 in contact with a second side of the absorber layers 730 is raised to $6.0 \times 10^{20}$ cm$^{-3}$, the illuminated I-V performance is much better, as shown in FIG. 9A. This greatly improved performance is due to much better screening of the electric fields in the absorber layer 730 and in close proximity to the GaN—InGaN interface, as shown in FIG. 9B. As shown in the table illustrated in FIG. 15, improvements in fill factor FF can be achieved by increasing the doping levels in both layers in contact with the absorber layer 730. In particular, fill factors above 90% can be achieved by doping in the n-type doped layer 710, or the n-type non-absorber layer 720, if present, at a concentration of about $3.5 \times 10^{19}$ cm$^{-3}$ or higher and by the activated doping level in the p-type doped layer 750, or the p-type non-absorber layer 740, if present, at a concentration of about $2.0 \times 10^{20}$ cm$^{-3}$ or higher.

Referring back to FIG. 1, in some embodiments, the photodiode structure 1000 includes an n-type first non-absorber layer 105, at least one absorber layer 107, and a p-type layer 111 that each have a threading dislocation density below $10^7$ cm$^{-2}$. The photodiode structure 1000 may also include one or more absorber layers 107, an n-type first non-absorber layer 105, and a p-type layer 111 that have a crystallographic orientation that differs from (000-1) –c-plane by between 2 degrees and 5 degrees. The photodiode structure 1000 may also include one or more absorber layers 107, an n-type first non-absorber layer 105, and a p-type layer 111 that have a crystallographic orientation within 5 degrees of {10-10} m-plane and each of the n-type first non-absorber layer 105 and p-type layer 111 are characterized by a dopant concentration of at least $4 \times 10^{18}$ cm$^{-3}$. The photodiode structure 1000 may also include one or more absorber layers 107, an n-type first non-absorber layer 105, and a p-type layer 111 that have a crystallographic orientation within 5 degrees of a semipolar plane selected from {10-1-2}, {10-1-1}, {20-2-1}, {30-3-1}, and {40-4-1} and each of the n-type first non-absorber layer 105 and p-type layer 111 are characterized by a dopant concentration of at least $2 \times 10^{18}$ cm$^{-3}$.

Figure 7:
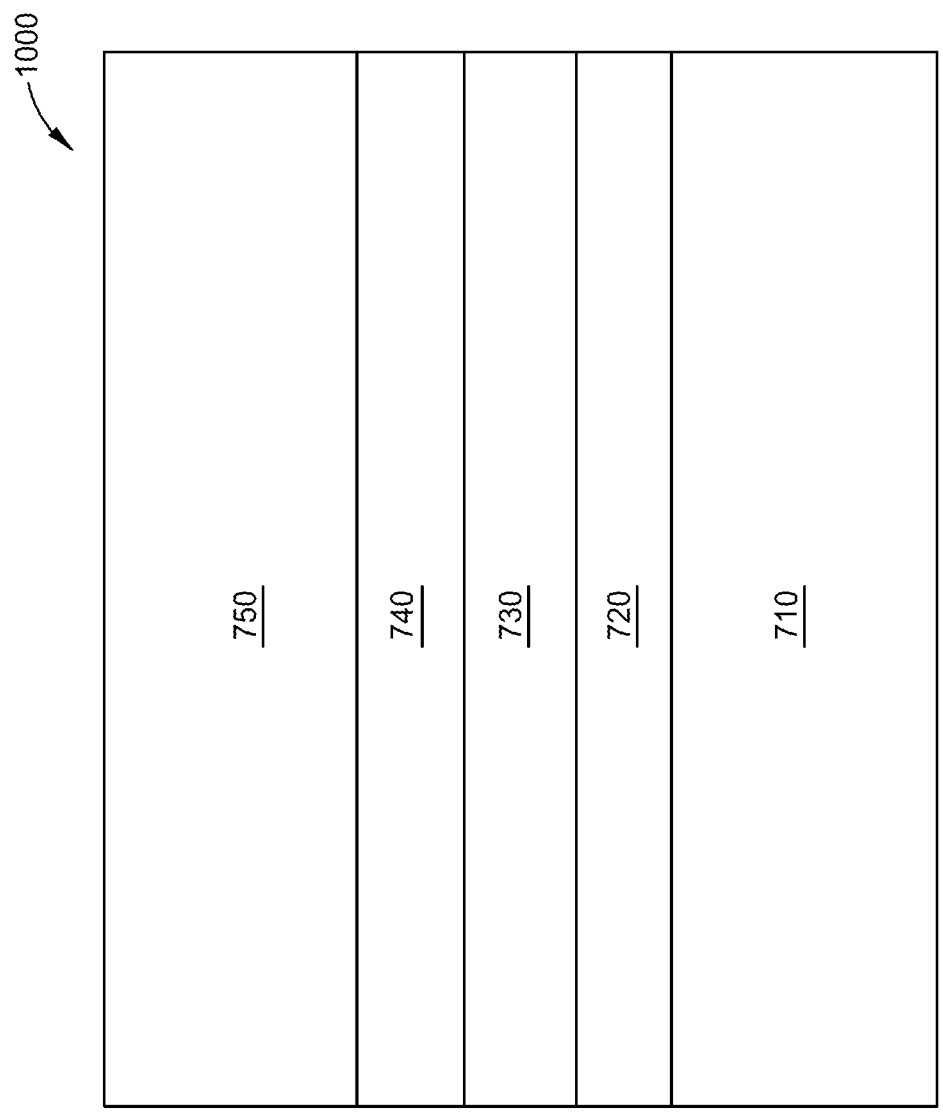
FIG. 7 is a simplified diagram showing a schematic illustration of semiconductor layers within a photodiode structure according to an embodiment of the current disclosure.

FIG. 15 includes the illuminated I-V performance characteristics of InGaN/GaN photodiodes having the structure indicated schematically in FIG. 7. For simplicity, the absorber layer is modeled as a 40 nanometer thick double heterostructure.

In the case of absorber layers 730 containing one or more layers that include $In_{0.12}Ga_{0.88}N$, which are appropriate for absorption of light having a wavelength of about 435 nanometers or less, the fill factor is below 60% when the doping level of the n-type doped layer 710 or the n-type cladding layer 720, if present, in contact with a first side of the absorber layers 730 is $2.0 \times 10^{19}$ cm$^{-3}$ and the doping level of the p-type doped layer 750 or the p-type cladding layer 740, if present, in contact with a second side of the absorber layers 730 is $8.0 \times 10^{18}$ cm$^{-3}$. However, when the doping level of the p-type doped layer 750 or the p-type cladding layer 740, if present, in contact with the second side of the absorber layers 730 is raised to $2.0 \times 10^{19}$ cm$^{-3}$, the fill factor is raised to almost 80%, and when the doping level of the p-type doped layer 750 or the p-type cladding layer 740, if present, in contact with the second side of the absorber layers 730 is raised further to $1.0 \times 10^{20}$ cm$^{-3}$, the fill factor is raised to about 93%. The results in the table of FIG. 15 show that if the doping level in a p-type cladding layer 740 adjacent to the absorber layer 730 is reduced, relative to the doping level in the p-type doped layer 750, the fill factor is reduced significantly. This result is significant because it may be difficult to achieve full doping all the way up to deposition of the undoped absorber layer 730, thus producing a sharp transition in the doping profile, and immediately upon switching from an undoped absorber layer 730 deposited at a temperature below 950 degrees Celsius to a p-type doped layer 750, which is deposited at considerably higher temperature, that has a desired doping level. However, as also shown in the table of FIG. 15, improvements in the fill factor FF can also be achieved by introducing n-type cladding layer 720 and/or p-type cladding layer 740 on one or both of the n-type and p-type sides of the absorber layer 730, respectively, particularly when the p-type cladding layer 740 has an indium concentration intermediate between that of the absorber layer 730 and of the n-type doped layer 710 and/or the p-type doped layer 750. The intermediate indium concentration in the cladding layer may be uniform, continuously graded, or step graded. The n-type cladding layer 740 may include a strained layer superlattice. In some embodiments, the photodiode structure 1000 includes at least one of an n-type cladding layer and a p-type cladding layer, wherein the n-type cladding layer 720 lies between an n-type doped layer 710 and one or more absorber layers 730, and wherein the n-type cladding layer 720 has a dopant concentration of at least $2 \times 10^{19}$ cm$^{-3}$, and the p-type cladding layer 740 lies between the one or more absorber layers 730 and a p-type doped layer 750, and wherein the p-type cladding layer 740 has a dopant concentration of at least $5 \times 10^{19}$ cm$^{-3}$.

In certain embodiments, the deleterious effects of spontaneous and piezoelectric fields in +c-plane-oriented photodiodes are mitigated by use of a −c-plane substrate that has a crystallographic orientation that is within 10 degrees, such as within 6 degrees, within 5 degrees, within 4 degrees, within 3 degrees, within 2 degrees, or within 1 degree of (000−1). In certain embodiments, the substrate and the semiconductor layers have a crystallographic orientation that differs from (000−1) by between 1 degree and 10 degrees or between 2 degrees and 5 degrees. In certain embodiments, the substrate and the semiconductor layers are misoriented from (000−1) toward a <10−10> m-direction. In certain embodiments, the substrate and the semiconductor layers are misoriented from (000−1) toward a <11−20> a-direction. Referring again to the table of FIG. 15, it has been found that doping concentrations of $1.0 \times 10^{16}$ cm$^{-3}$ or $1.0 \times 10^{17}$ cm$^{-3}$ or $1.0 \times 10^{18}$ cm$^{-3}$ in the n-type doped and the p-type doped layers, which are immediately adjacent to the absorber layer 730, are sufficient to achieve a high fill factor for both 12% and 18% indium concentrations in the absorber layer 730. It is believed that a fill factor greater than 85% can be achieved if the doping concentration in the n-type doped layer 710 and p-type doped layer 750 is between $1.0 \times 10^{16}$ cm$^{-3}$ and $1.0 \times 10^{20}$ cm$^{-3}$ for absorber Indium concentrations greater than 8% in the case where the substrate and the semiconductor layers each have a −c crystallographic orientation. In one example, the photodiode is characterized by a fill factor of at least 50% under an illumination level producing a current density of at least 10 A cm$^{-2}$.

In certain embodiments, the deleterious effects of spontaneous and piezoelectric fields in +c-plane photodiodes are mitigated by use of an m-plane substrate, that is, with an orientation within where the crystallographic orientation is within 5 degrees, within 2 degrees, within 1 degree, or within 0.5 degree of (10−10). Referring again to the table of FIG. 15, it has been found that a doping concentration of $2.0 \times 10^{19}$ cm$^{-3}$ in the n-type doped layer 710 or the n-type cladding layer 720, if present, and the p-type doped layer 750 or the p-type cladding layer 740, if present, which are immediately adjacent to the absorber layer, are sufficient to achieve a fill factor above 90% for both 12% and 18% indium concentrations in the absorber layer.

In certain embodiments, the deleterious effects of spontaneous and piezoelectric fields in +c-plane photodiodes are mitigated by use of semipolar substrate that has a crystallographic orientation that is within 5 degrees, within 2 degrees, within 1 degree, or within 0.5 degree of {20−2−1} or {30−3−1}. Referring again to the table of FIG. 15, it has been found that a doping concentration of $8.0 \times 10^{18}$ cm$^{-3}$ in the n-type doped and the p-type doped layers, which are immediately adjacent to the absorber layer, are sufficient to achieve a fill factor above about 90% for both 12% and 18% indium concentrations in the absorber layer.

In certain embodiments, in order to reduce the carbon content in N-polar or semipolar InGaN layers, triethylgallium (TEG) and triethylindium (TEIn) are used as the metalorganic precursors rather than the more conventional trimethyl gallium (TMG) and trimethylindium (TMIn). For example, the carbon concentration in the semiconductor layers may be less than $1 \times 10^{18}$ cm$^{-3}$ or less than $1 \times 10^{17}$ cm$^{-3}$. In certain embodiments, the ratio of hydrogen ($H_2$) and nitrogen ($N_2$) carrier gas, the substrate temperature, and the pressure are optimized to minimize formation of hillocks in the N-polar semiconductor layers.

In certain embodiments, the semiconductor layers are annealed to electrically activate the p-type dopant. In certain embodiments, the annealing is performed in situ in the MOCVD reactor used to deposit the semiconductor layers, for example, under flowing $N_2$ to a temperature between about 500 degrees Celsius and about 900 degrees Celsius. In certain embodiments, the annealing is performed in a furnace or in a rapid thermal annealing (RTA) oven, for example, under flowing $N_2$ to a temperature between about 400 degrees Celsius and about 900 degrees Celsius. In certain embodiments, the atmosphere during the annealing process may also contain an oxidizing gas such as $O_2$. In certain embodiments, the fraction of the oxidizing gas within the annealing atmosphere is between about 5% and about 95%. In certain embodiments, the duration of the annealing process is between about one second and about five hours, or between about 10 seconds and about one hour. In certain embodiments, after annealing, the surface of the semiconductor layers is cleaned to prepare them for additional deposition. In certain embodiments, the cleaning includes or consists of one or more of treatment by a mineral acid, such as hydrochloric acid, nitric acid, or aqua regia, a piranha etch, a buffered oxide etch, by dry etching, or by treatment with a plasma, such as an argon plasma.

In certain embodiments, a transparent conductive layer is deposited on the p-type semiconductor layer. In certain embodiments, the transparent conductive layer comprises a transparent conductive oxide (TCO) such as indium tin oxide or aluminum zinc oxide. In certain embodiments, the transparent conductive layer is deposited by a one or more of thermal evaporation, electron-beam evaporation, and sputtering. In certain embodiments, the deposited TCO layer is annealed in a controlled atmosphere containing oxygen at a temperature between about 300 and 700 degrees Celsius, so as to co-optimize the optical/transparency and electrical properties of the TCO layer. In certain embodiments, the transparent conductive layer has a thickness between about 10 nanometers and about 1000 nanometers.

Each of the photodiode structures 1000 described in the present disclosure are intended for use in a photodiode die 1002 of a packaged photodiode with a multiple-reflection geometry. The packaged photodiode contains a photodiode die 1002 and may also contain one or more of a heat sink, an enclosure, a separate photodetector, an optical entrance aperture, solder bumps, wire bonds, or encapsulation consisting of or including a polymer such as an epoxy or a silicone. In some embodiments the packaged photodiode may further include one or more components for coupling light into or out of the photodiode die 1002 and for enabling more reflections.

In order to maximize the efficiency of the packaged photodiode, it may be important to maximize the reflectivity of the front and back faces of the photodiode structure 1000 of a photodiode die 1002. A photodiode die 1002 is generally cut, by singulation or dicing, into discrete dimensions (e.g., rectangular pieces) from a photodiode structure 1000 that includes one or more non-absorber layers 105, 109, an absorber layer 107, p-side reflective electrical contact 113, and n-side reflective electrical contact 114. A photodiode die 1002 consists of or includes a device cavity region, which may include at least one of a substrate and an optically transmissive member and may be bounded by edge structures, such as an optical window and reflective coatings. A device cavity region is formed of at least two opposing reflective members and an optically transmissive member between the two opposing reflective members. Electromagnetic radiation entering through an optical window into the device cavity region passes through the optically transmissive member and is internally reflected between the reflective members at least two or more times. Luminescent light emitted from the one or more absorber layers may also be internally reflected between the reflective members at least two or more times.

In some embodiments, the two opposing surfaces are parallel to each other. In some other embodiments, the two opposing surfaces are not parallel to each other. In the photodiode structure 1000 shown in FIG. 1, the optically transmissive member is substrate 101 and the reflective members are p-side reflective electrical contact 113 and n-side reflective electrical contact 114 described below.

In addition, in order to maximize the efficiency of the packaged photodiode, it is important to minimize the electrical resistance of the contacts in the photodiode structure. Referring again to FIG. 1, a p-side reflective electrical contact 113 may be deposited on the p-type layer 111. In a preferred embodiment, the average reflectivity of the reflective p-side electrical contact is greater than 70%, greater than 80%, greater than 85%, greater than 90%, greater than 95%, greater than 97%, or greater than 98% at a specific angle or range of angles at which light is incident during operation. In general, the term "average reflectivity" as used herein is intended to broadly describe a reflectance value that is calculated by averaging at least two reflectance measurement data points on a surface at a specific wavelength between 390 nanometers and 460 nanometers and at one or more angles with respect to the surface of the layer that are representative of the range of incident angles during device operation. During operation of a packaged photodiode, in some embodiments, light (or optical radiation) is coupled into a vertical edge, or approximately vertical edge, of the photodiode die 1002 and the angle of incidence of the light on the reflective layers (e.g., p-side reflective electrical contact 113 or n-side reflective electrical contact 114 in FIGS. 1 and 2) internally is between about 0 and about 30 degrees, between about 0.2 and about 20 degrees, or between about 0.3 and about 10 degrees, as measured from the plane of the reflective layers (e.g., a plane parallel to the large-area surface 102 in FIG. 2). In one example, the light receiving surface 252, which is illustrated in FIG. 2, is oriented as a vertical edge of the photodiode die 1002 or a vertical plane within the photodiode die 1002 that is at an angle with respect to the large-area surface 102 (e.g., 90° angle). In some embodiments of the photodiode die 1002, light is coupled into a non-vertical edge of the photodiode die 1002 and the angle of incidence on the reflective layers internally is between about 0.1 and about 60 degrees, between about 0.2 and about 40 degrees, or between about 0.3 and about 20 degrees, as measured from the plane of the reflective layers. In other embodiments of the photodiode die 1002, light is coupled into a large area surface of the photodiode die 1002 through an aperture, and the angle of incidence on the reflective layers internally is between about 30 and 90 degrees, between about 45 and 90 degrees, or between about 60 and 90 degrees, as measured from the plane of the reflective layers (e.g., a plane parallel to the large-area surface 102 in FIG. 2). In still other embodiments of the photodiode die 1002, light is coupled into a large area surface of the photodiode die 1002 through an aperture and undergoes internal reflection at an oblique angle, and the angle of incidence on the reflective layers internally is between about 0.1 and about 45 degrees, between about 0.3 and about 30 degrees, or between about 0.5 and about 20 degrees, as measured from the plane of the reflective layers. The contact resistance of the p-side reflective electrical contact is less than $3\times10^{-3}$ $\Omega cm^2$, less than $1\times10^{-3}$ $\Omega cm^2$, less than $5\times10^{-4}$ $\Omega cm^2$, less than $2\times10^{-4}$ $\Omega cm^2$, less than $10^{-4}$ $\Omega cm^2$, less than $5\times10^{-5}$ $\Omega cm^2$, less than $2\times10^{-5}$ $\Omega cm^2$, or less than $10^{-5}$ $\Omega cm^2$. In preferred embodiments, the contact resistance is less than $1\times10^{-4}$ $\Omega cm^2$. The p-side reflective electrical contact may include at least one of silver, gold, aluminum, nickel, platinum, rhodium, palladium, titanium, chromium, germanium, ruthenium, magnesium, scandium, or the like. In some embodiments, the p-side reflective electrical contact may include or consist of at least two layers, with a first layer providing a good electrical contact and comprising platinum, nickel, aluminum, or titanium and having a thickness between 0.1 and 5 nanometers, and a second layer providing superior optical reflectivity and comprising silver, gold, or nickel and having a thickness between 0.4 nanometer and 1 micrometer. In certain embodiments, the p-side reflective electrical contact may include or consist of at least three layers, at least four layers, or at least five layers. In certain embodiments, the p-side reflective electrical contact comprises three layers, with the first layer comprising silver, with a thickness between about 1 nanometer and about 200 nanometers, a second layer comprising a moderately oxophilic metal, with a thickness between about 0.5 nanometer and about 2 nanometers, and a third layer comprising silver, with a thickness between about 50 nanometers and about 200 nanometers. In certain embodiments, the moderately oxophilic metal includes or consists of nickel. In certain embodiments, the moderately oxophilic metal includes or consists of or includes one or more of copper, cobalt, iron, and manganese. In certain embodiments, the reflective p-side electrical contact is annealed after deposition to improve its reflectivity and/or to reduce its contact resistance. In certain embodiments, the annealing is performed in a rapid thermal anneal (RTA) furnace, to a temperature between about 300 degrees Celsius and about 1000 degrees Celsius. In certain embodiments the p-side reflective electrical contact is annealed to a temperature between about 500 and about 900 degrees Celsius under a controlled atmosphere containing oxygen at a partial pressure between about 0.1 Torr and about 200 Torr, so as to cause interdiffusion between the moderately oxophilic metal and silver and introduction of a controlled concentration of oxygen atoms into the p-side reflective electrical contact layer. In preferred embodiments, the partial pressure of oxygen is reduced below about $10^{-4}$ Torr before cooling the p-side reflective electrical contact below a temperature of about 250 degrees Celsius, so as to avoid formation of excess silver oxide. In certain embodiments, the p-side reflective electrical contact includes oxygen with a maximum local concentration between about $1 \times 10^{20}$ cm$^{-3}$ and about $7 \times 10^{20}$ cm$^{-3}$. Further details are described in U.S. Pat. No. 9,917,227, which is hereby incorporated by reference in its entirety. The p-side reflective electrical contact may be deposited by thermal evaporation, electron beam evaporation, sputtering, or another suitable technique. In a preferred embodiment, the p-side reflective electrical contact serves as the p-side electrode for the power photodiode. In certain embodiments, the p-side reflective electrical contact is planar and parallel to the semiconductor layers, which may be useful for maximizing its reflectivity. In alternative embodiments, the p-side reflective electrical contact is patterned or textured, which may be useful for admission or extraction of light, for example, within an aperture.

In certain embodiments, a reflectance measurement of a particular reflective surface may be performed by preparing at least two sample types, with one having the reflective surface left intact and the other having the reflective surface removed. Both samples may be fabricated such that measurement probe light is coupled in with low reflectance through a first surface, undergoes reflection and refraction from a second surface corresponding to the reflective surface that is to be measured, and is coupled out with low internal reflectance through a third surface. In some embodiments, reflections at the first and third surfaces are minimized by application of a dielectric anti-reflective coating tuned to the wavelength of a probe light, which has a similar wavelength as the wavelength that is to be used during operation of the power photodiode device. Reflections at the first and third surfaces can be reduced further by fabricating the samples such that light transmits through the first and third surfaces at near normal incidence. The optical power transmitted out of the surface corresponding to the reflective surface and the third surface are measured for both sample types and used to calculate the reflectance of the reflective surface according to methods that are well known in the art.

Referring again to FIG. 1, in certain embodiments, an n-side reflective electrical contact 114, with an average reflectivity greater than about 70%, is deposited on the back side of substrate 101. In a preferred embodiment, the average reflectivity of the reflective n-side electrical contact is greater than 80%, greater than 85%, greater than 90%, greater than 95%, greater than 97%, or greater than 98% at a specific angle or range of angles at which light is incident during operation. The contact resistance of the reflective n-side electrical contact is less than $1 \times 10^{-3}$ Ωcm$^2$, less than $5 \times 10^{-4}$ Ωcm$^2$, less than $2 \times 10^{-4}$ Ωcm$^2$, less than $10^{-4}$ Ωcm$^2$, less than $5 \times 10^{-5}$ Ωcm$^2$, less than $2 \times 10^{-5}$ Ωcm$^2$, or less than $10^{-5}$ Ωcm$^2$. In preferred embodiments, the contact resistance is less than $5 \times 10^{-5}$ Ωcm$^2$. The reflective n-side electrical contact may comprise at least one of silver, gold, aluminum, nickel, platinum, rhodium, palladium, titanium, chromium, or the like. In some embodiments, the reflective n-side electrical contact may include or consist of at least two layers, with a first layer providing a good electrical contact and comprising aluminum or titanium and having a thickness between 0.1 and 5 nanometers, and a second layer providing superior optical reflectivity and comprising aluminum, nickel, platinum, gold, or silver and having a thickness between 10 nanometers and 10 micrometers. In certain embodiments, the n-side reflective electrical contact may include or consist of at least three layers, at least four layers, or at least five layers, so as to co-optimize the reflectivity (maximized), the contract resistance (minimized), and the robustness (maximized). The reflective n-side electrical contact may be deposited by thermal evaporation, electron beam evaporation, sputtering, or another suitable technique. In certain embodiments, the n-side reflective electrical contact serves as the n-side electrode for the power photodiode. In certain embodiments, the n-side reflective electrical contact is planar and is aligned parallel to the semiconductor layers, which may be useful for maximizing its reflectivity. In alternative embodiments, the n-side reflective electrical contact is patterned or textured, which may be useful for admission or extraction of light, for example, within an aperture.

In certain embodiments, particularly embodiments where the n-side reflective electrical contact includes aluminum, in order to reduce the contact resistance of the n-side reflective electrical contact, the back side of substrate 101 is processed by reactive ion etching (RIE) using a chlorine-containing gas or plasma. In one specific embodiment, the chlorine-containing gas or plasma includes SiCl$_4$. In certain embodiments, in order to reduce the contact resistance of the n-side reflective electrical contact, further cleaning steps are performed. In certain embodiments, the further cleaning steps include or consist of one or more of treatment by a mineral acid, such as hydrochloric acid, nitric acid, or aqua regia, a buffered oxide etch, by dry etching, or by treatment with a plasma, such as an argon plasma.

In some embodiments, as shown in FIG. 2, the p-side reflective electrical contact comprises a two-component mirror/p-electrode, including a discontinuous p-electrode 215 and a p-side reflective electrical contact 113, which is shown as a p-side reflective electrical contact layer that is deposited over the discontinuous p-electrode 215 elements. The discontinuous p-electrode 215 is optimized as an electrical contact and can be made, for example, of a nickel/gold, or a platinum/gold stack where the nickel, or platinum is about 20 to 200 nm thick and the gold is about 100 nm to 1 micron thick. In one suitable embodiment, the discontinuous p-electrode 215 is a gridded electrode having grid openings of between about 1 micron and 0.1 cm on a side. The p-side reflective electrical contact 113 may comprise at least one of silver, gold, aluminum, platinum, rhodium, palladium, chromium, or the like, and may be deposited over the p-type layer 111 and over the gridded discontinuous p-electrode 215. Preferably, the p-side reflective electrical contact is deposited after any annealing processing of the discontinuous p-electrode to reduce interdiffusion. Optionally, a diffusion barrier layer such as nickel, rhodium, platinum, palladium, iridium, ruthenium, rhenium, tungsten, molybdenum, niobium, tantalum, or $MC_xN_yO_z$ (where M includes a metallic element such as aluminum, boron, silicon, titanium, vanadium, chromium, yttrium, zirconium, lanthanum, or a rare earth metal, and x, y, z are each between 0 and 3) is disposed between the discontinuous p-electrode 215 and the p-side reflective electrical contact 113. Assuming an operating current density of 10 A/cm$^2$, a sheet resistance of $4\times10^5$ Ω/sq for the p-type layers, and that current is conducted from the p-type layer only to the gridded, discontinuous p-electrode 215 and not directly to the p-side reflective electrical contact 113, the calculated percent power loss due to lateral conduction within the p-type layers is approximately 0.6, 3.6, and 14.5% for 2, 5, and 10 micron grid finger spacing, respectively. Rather than a grid configuration, the discontinuous p-electrode 215 can alternatively be arranged as an array of dots, rectangles, circles, or the like that are positioned in a plane that is parallel to large-area surface 102. The separation between the discontinuous p-electrode 215 is preferably between about 1 micron and 0.1 cm. The use of a reflective metal p-electrode or combination of reflective electrical contact and discontinuous electrode enables fabrication of large area power photodiodes without necessitating lateral carrier transport through p-doped layers over large distances, thus minimizing lateral ohmic losses and the series resistance in the device. Parasitic optical absorption by a discontinuous p-electrode can be minimized by designing the electrode pattern and orienting the light propagation path so that light incident on the discontinuous p-electrode pattern is largely avoided.

The photodiode structure may include a p-side reflective electrical contact disposed over the p-type layer, wherein the p-side reflective electrical contact has an average reflectance of at least 80% at a specific angle or range of angles at which light is incident during operation for wavelengths between 390 nanometers and 460 nanometers and a contact resistance below $1\times10^{-3}$ Ωcm$^2$.

As noted above, the photodiode structures 1000 described in the present disclosure are intended for use in a photodiode die and in a packaged photodiode with a multiple-reflection geometry. In some embodiments, during operation a photodiode die disposed within a packaged photodiode is configured to receive one or more wavelengths of radiation, which is also referred to herein as light, from an illumination source 251. The illumination source 251 may include a laser, an optical fiber, or other useful radiation source. In order to optimize the power efficiency of a packaged photodiode, it is important to maximize the reflectivity of the front and back faces of the photodiode die, and also the sides of individual photodiode die after singulation. In addition, it is important to minimize the electrical resistance of the contacts and to optimize the configuration between the light receiving surface 252 of the photodiode die and the reflective contact structures (for example, the p-side reflective electrical contact and the n-side reflective electrical contact). Referring again to FIG. 2, light of a desired wavelength, for example, 405 nanometers or 450 nanometers may enter the photodiode structure 1000 through an aperture or a window (not shown) and enters the light receiving surface 252, such that light propagates within substrate 101 and the semiconductor layers, and is reflected from the p-side reflective electrical contact 113 and the n-side reflective electrical contact 114 and from an edge reflector (not shown). The light receiving surface 252 generally includes a portion of the photodiode device (or photodiode die) that is positioned and aligned to provide the radiation emitted from the illumination source 251 to a region of the photodiode die disposed between the p-side reflective electrical contact 113 and the n-side reflective electrical contact 114, as shown in FIG. 2. The light receiving surface 252, in some embodiments, may include a region on an edge of the photodiode die, such as shown schematically in FIG. 2. In other embodiments, the light receiving surface 252 may include an open region on one of the surfaces 255 or 256, which does not include portions of the materials used to form the p-side reflective electrical contact 113 or the n-side reflective electrical contact 114, respectively. In this configuration, the open region is designed to allow the radiation emitted from the illumination source 251 to enter the region of the photodiode die disposed between the p-side reflective electrical contact 113 and the n-side reflective electrical contact 114. In some embodiments, the light receiving surface 252 is aligned relative to the photodiode die to cause light delivered from the illumination source 251 to be reflected at least once, at least twice, at least three times, or at least five times between the p-side reflective electrical contact 113 and the n-side reflective electrical contact 114. The light delivered from the illumination source 251 can, for example, have at least one wavelength between 390 nanometers and 460 nanometers.

In certain embodiments, as also shown in FIG. 2, an n-side reflective electrical contact comprises a two-component mirror/n-electrode including a discontinuous n-electrode 217 and an n-side reflective electrical contact 114. The discontinuous n-electrode 217 is optimized as an electrical contact and can be made, for example, of a titanium/aluminum or a titanium/aluminum/gold stack where the titanium is about 5 to 200 nm thick and the aluminum or gold is about 100 nm to 1 micron thick. In one suitable embodiment, the discontinuous n-electrode 217 is a gridded electrode having grid openings of between about 1 micrometer and 1 centimeter on a side. In certain embodiments, the portion of the surface beneath the gridded electrode is roughened, for example, using a wet etching treatment, prior to deposition of the gridded electrode. In certain embodiments, a roughened surface has a root-mean-square roughness between about 300 nanometers and about 1 millimeter, or between about 1 micrometer and about 200 micrometers. Assuming an operating current density of 10 A/cm$^2$ and a sheet resistance of 0.27 Ω/sq for an n-type GaN substrate, the calculated percent power loss due to lateral conduction within the substrate layers is approximately 0.4, 2.5, and 9.8% for 0.2, 0.5, and 1 cm grid finger spacing, respectively. In certain embodiments, n-side reflective electrical contacts on the side of a singulated die prepared from this structure are added in addition to or instead of the backside n-side reflective electrical contact. In certain embodiments, n-contacts and p-contacts are added to the same side of the die, after formation of trenches to the n-type doped layer or the p-type doped layer, respectively, as needed. The trenches may be formed by lithography and dry or wet etching, as is well known in the art and described in further detail below. The n-side reflective electrical contact 114 may comprise at least one of silver, gold, aluminum, platinum, rhodium, palladium, chromium, or the like, and may be deposited over the back side of substrate 101 and over the gridded discontinuous n-electrode 217. Preferably, the electrical contact is deposited after any annealing processing of the discontinuous n-electrode to reduce interdiffusion. Optionally, a diffusion barrier layer such as nickel, rhodium, platinum, palladium, iridium, ruthenium, rhenium, tungsten, molybdenum, niobium, tantalum, or $MC_xN_yO_z$ (where M includes a metallic element such as aluminum, boron, silicon, titanium, vanadium, chromium, yttrium, zirconium, lanthanum, or a rare earth metal, and x, y, z are each between 0 and 3) is disposed between the discontinuous n-electrode 217 and the n-side reflective electrical contact 114. Rather than a grid configuration, the discontinuous n-electrode 217 can be arranged as an array of dots, rectangles, circles, or the like that are positioned in a plane that is parallel to large-area surface 102. The separation between the discontinuous n-electrode 217 is preferably between about 1 micron and 0.1 cm. The use of a reflective metal n-electrode or combination of reflective electrical contact and discontinuous electrode enables fabrication of large area power packaged photodiodes without necessitating lateral carrier transport through substrate 101 over large distances, which may be important if the carrier concentration of substrate 101 is low in order to optimize transparency or if it is quite thin, for example, less than about 100 micrometers, less than about 50 micrometers, or less than about 25 micrometers. Parasitic optical absorption by a discontinuous n-electrode can be minimized by designing the electrode pattern and the light propagation path so that light incident on the discontinuous n-electrode pattern is largely avoided.

The photodiode structure 1000 may include an n-side reflective electrical contact that has an average reflectance of at least 80% at a specific angle or range of angles at which light is incident during operation for wavelengths between 390 nanometers and 460 nanometers and has a contact resistance below $5\times10^{-4}$ $\Omega cm^2$.

In some embodiments, as illustrated in FIG. 3, at least one of the p-side reflective electrical contact and the n-side reflective electrical contact further includes a semi-transparent current-spreading layer 321. The semi-transparent current-spreading layer 321 may consist of or include at least one of nickel oxide (NiO), nickel oxide/gold (NiO/Au), NiO/Ag, indium tin oxide (ITO), p-type zinc oxide (ZnO), ruthenium oxide ($RuO_2$), another transparent conductive oxide, or the like. The semi-transparent current-spreading layer 321 facilitates electrical contact to the p-type layer 111 or to the substrate 101, for example, ohmic or quasi-ohmic behavior. To minimize light absorption in the semi-transparent current-spreading layer 321, this layer has a thickness which is preferably between about 1 nm and about 100 nm, with more than 70% light transmission. Assuming an operating current density of 10 $A/cm^2$ and a sheet resistance of 25 $\Omega$/sq for the semi-transparent current-spreading layer 321 overlying the p-type layers, the calculated percent power loss due to lateral conduction within the current spreading layer is approximately 0.4, 2.3, and 9.1% for 0.02, 0.05, and 0.1 cm grid spacing, respectively.

In some embodiments, a transparent dielectric 319 is disposed on a portion of the semi-transparent current-spreading layer 321 and between discontinuous p-electrode 315 and/or discontinuous n-electrode 317. The transparent dielectric may comprise at least one of $TiO_2$, $Ta_2O_5$, $ZrO_2$, $SiO_2$, $SiO_x$, $SiN_x$, $Si_3N_4$, $SiO_xN_y$, $Al_2O_3$, or $MgF_2$. The transparent dielectric 319 may be a quarter-wave thick, that is, have a thickness approximately equal to one-quarter of the incident photon wavelength in air divided by the refractive index of the dielectric medium. For example, in the case that the photodiode structure 1000 has a design wavelength of 405 nanometers and the transparent dielectric consists of $Ta_2O_5$, with a refractive index of approximately 2.28, the thickness of the transparent dielectric 319 may be chosen as about 405/2.28/4=44 nanometers. The transparent dielectric 319 includes open areas in which a discontinuous p-electrode 315 or a discontinuous n-electrode 317 is disposed.

The discontinuous p-electrode 315 and the discontinuous n-electrode 317 may comprise at least one of nickel (Ni), nickel oxide (NiO), titanium-tungsten/gold (Ti—W/Au). In a preferred embodiment, the discontinuous p-electrode 315 and/or the discontinuous n-electrode 317 does not extend over the transparent dielectric. A p-side reflective electrical contact 113 is disposed over the transparent dielectric and the electrical contact material and electrically interconnects the discontinuous p-electrode 315 in the various grid openings. An n-side reflective electrical contact 114 is disposed over the transparent dielectric and the electrical contact material and electrically interconnects the discontinuous n-electrode 317 in the various grid openings. The p-side reflective electrical contact 113 and n-side reflective electrical contact 114 also cooperate with the transparent dielectric 319 to define a reflector for reflecting light within the device. Further variations of the reflective metallic contact are described in U.S. Pat. No. 7,119,372, which is hereby incorporated by reference in its entirety.

Figure 13A:
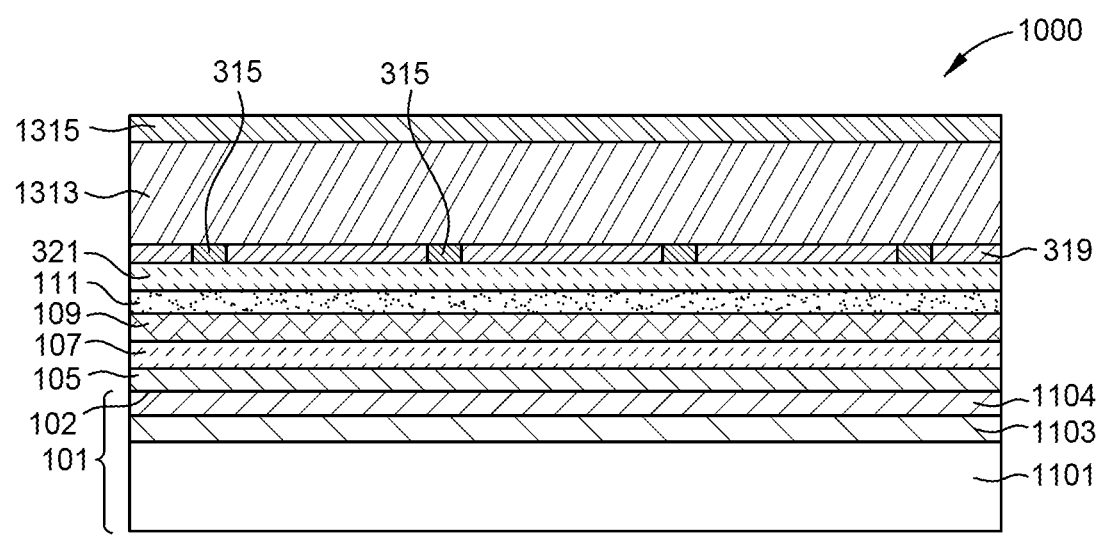
FIGS. 13A and 13D are simplified diagrams illustrating another alternative nitride-based power photodiode structure and photodiode die, respectively, that have been prepared according to an embodiment of the present disclosure.
Figure 13B:
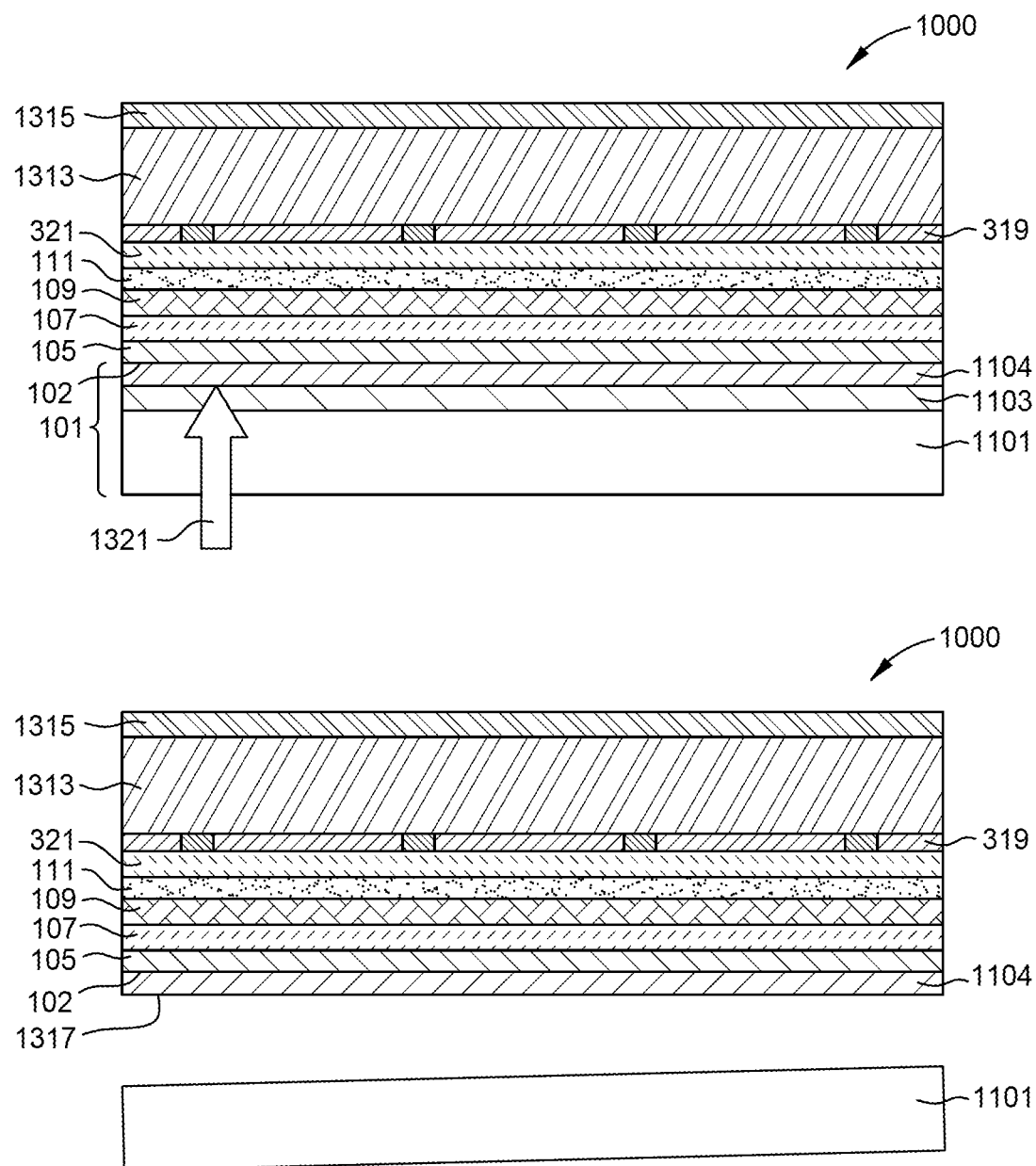
FIGS. 13B and 13C are simplified diagrams illustrating methods to remove a substrate from a nitride-based power photodiode structure according to embodiments of the present disclosure.
Figure 13C:
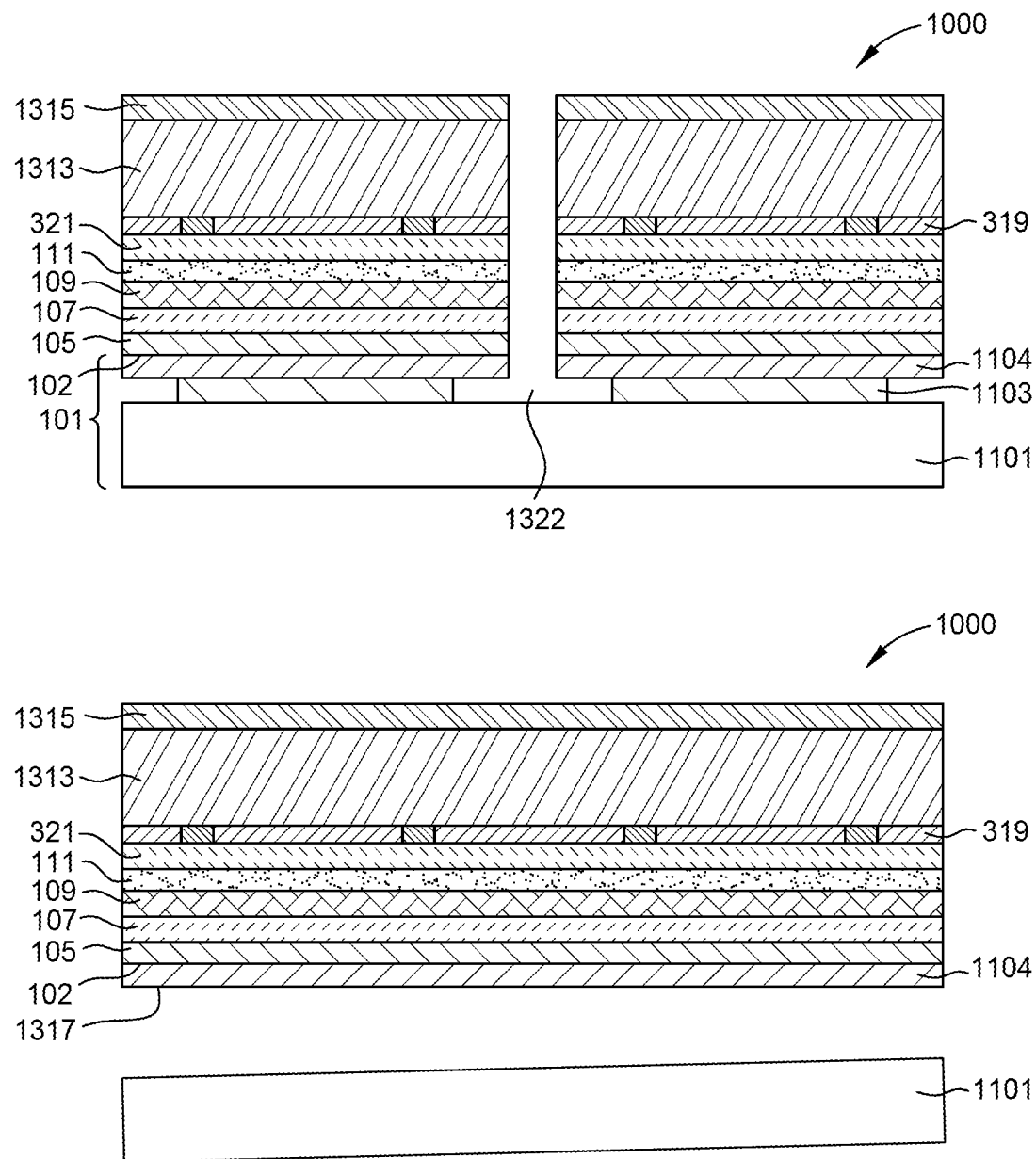

In another set of embodiments, as illustrated schematically in FIGS. 13A, 13B, and 13C, the semiconductor layers are transferred to one or more carrier substrates 1313 and the template substrate 1101 removed. By comparison to the structure illustrated schematically in FIG. 3, the p-side electrical contact may similarly comprise a semi-transparent current-spreading layer 321 and a discontinuous p-electrode 315, and may further comprise a transparent dielectric 319 disposed on portions of the semi-transparent current-spreading layer 321 (FIG. 13A). A carrier substrate 1313 is then bonded to one or more of the p-type layer 111, the semi-transparent current-spreading layer 321, if present, the discontinuous p-electrode 315, if present, and the transparent dielectric 319, if present. The bonding of carrier substrate or optically transmissive member 1313 may be achieved by means of an adhesive, by means of a thermo-compression bond between one or more adhesion layers (not shown) deposited on at least one of a first surface of carrier substrate 1313 and the layer to which it is to be bonded, or by alternative bonding methods that are known in the art. In certain embodiments, carrier substrate 1313 and the adhesion layers are transparent at the wavelengths of interest for the packaged photodiode, for example, between 390 nanometers and 460 nanometers. In certain embodiments, carrier substrate 1313 includes or consists of one or more of a glass, a transparent ceramic, silica glass, borosilicate glass, aluminosilicate glass, quartz, sapphire, $MgAl_2O_4$ spinel, zinc oxide, or aluminum oxynitride. The adhesion layers may include or consist of one or more of $SiO_x$, $GeO_x$, $SiN_x$, $AlN_x$, $GaO_x$, $Al_2O_3$, $Sc_2O_3$, $Y_2O_3$, $B_2O_3$, $R_2O_3$, where R is a rare earth element, MgO, CaO, SrO, $HfO_2$, $ZrO_2$, $Ta_2O_5$, or B, Al, Si, P, Zn, Ga, Si, Ge, Au, Ag, Ni, Ti, Cr, Zn, Cd, In, Sn, Sb, Tl, or Pb, or an oxide, nitride, or oxynitride thereof. The adhesion layers may be deposited by thermal evaporation, electron-beam evaporation, sputtering, chemical vapor deposition, plasma-enhanced chemical vapor deposition, or the like, or by thermal oxidation of a deposited metallic film. The thickness of the adhesion layers may between about 1 nanometer and about 10 microns, or between about 10 nanometers and about 1 micron. The adhesion layer(s) may be annealed, for example, to a temperature between about 300 degrees Celsius and about 1000 degrees Celsius. In some embodiments, at least one adhesion layer is chemical-mechanically polished. In a preferred embodiment, the root-mean-square surface roughness of at least one adhesion layer is below about 0.5 nanometer, or below about 0.3 nanometer over a 20×20 $\mu m^2$ area. In certain embodiments, the thermo-compression bonding is performed in a clean room, with less than 10,000, less than 1,000, less than 100, or less than 10 particles per cubic centimeter in the air. Particles may be removed from at least one of the surfaces immediately prior to wafer bonding by spraying, brushing, or rinsing with ionized nitrogen, a $CO_2$ jet, $CO_2$ snow, high-resistivity water, an organic solvent, such as methanol, ethanol, isopropanol, acetone, or the like. In some embodiments, the opposing surfaces are brought into contact while immersed in a liquid. Optionally, at least one of the surfaces is exposed to a plasma to enhance wafer bonding. The pressure between opposing surfaces during the thermocompression bonding process may be between about 0.1 megapascals and about 100 megapascals, and the temperature may be held at between about 30 degrees Celsius and about 950 degrees Celsius, between about 30 degrees Celsius and about 400 degrees Celsius, or between about 30 degrees Celsius and about 200 degrees Celsius for a period between about 1 minute and about 10 hours.

A p-side reflector layer 1315 may be deposited on the opposite surface of carrier substrate 1313 from the photodiode structure 1000. P-side reflector layer 1315 may include or consist of one or more of silver, a dielectric mirror, and a distributed Bragg reflector (DBR). P-side reflector layer 1315 may have a reflectivity, at a specific angle or range of angles at which light is incident during operation, above about 80%, above about 85%, above about 90%, above about 95%, above about 97%, or above about 98% at the design wavelength of the packaged photodiode, for example, between 360 nanometers and 460 nanometers.

The photodiode structure 1000 may be separated from the template substrate 1101 by a laser lift-off method, as shown schematically in FIG. 13B. A laser beam 1321 may be rastered over the backside of substrate 101. In certain embodiments, where single-crystalline group-III metal nitride layer 1104 is deposited on a template substrate 1101, such as a sapphire substrate, and an ultraviolet laser beam is focused on the interface between single-crystalline group-III metal nitride layer 1104 and template substrate 1101, to cause localized decomposition of the backside of single-crystalline group-III metal nitride layer 1104 and formation of micro- or nano-bubbles of $N_2$ and resulting in separation of template substrate 1101 from the balance of the photodiode structure 1000. In certain embodiments, where single-crystalline group-III metal nitride layer 1104 is deposited on a release layer 1103 having an optical absorption coefficient greater than 1000 cm$^{-1}$ at at least one wavelength where the balance of template substrate 1101 is substantially transparent, with an optical absorption coefficient less than 50 cm$^{-1}$, laser beam 1321 having a wavelength where release layer 1103 is strongly absorbing may be focused on release layer 1103, causing localized decomposition and formation of micro- or nano-bubbles of $N_2$ and resulting in separation of template substrate 1101 from the balance of the photodiode structure 1000. The optimal degree of weakening of the interface, without causing undesired damage to the high quality epitaxial layer or the semiconductor structure, may achieved by adjusting the temperature of the photodiode structure 1000, the laser power, the laser spot size, the laser pulse duration, and/or the number of laser pulses. The laser fluence to effect separation may be between 300 and 900 millijoules per square centimeter or between about 400 mJ/cm$^2$ and about 750 mJ/cm$^2$. The uniformity of the laser beam 1321 may be improved by inclusion of a beam homogenizer in the beam path, and the beam size may be about 4 mm by 4 mm. In some embodiments, the laser beam 1321 is scanned or rastered across the release layer rather than being held stationary. Separation may be performed at a temperature above the melting point of the metal produced by decomposition, e.g., above about 30 degrees Celsius in the case of gallium metal.

Alternatively, the photodiode structure 1000 may be separated from the template substrate 1101 by photoelectrochemical etching, as shown schematically in FIG. 13C. In certain embodiments, release layer 1103 comprises InGaN and has a bandgap less than that of the absorber layer. Trenches 1322 may be formed between adjacent carrier substrates 1313 though each of the semiconductor layers down to release layer 1103, forming mesas. Trenches 1322 may be formed by dry etching or wet etching following conventional lithography, as is well known in the art. The photodiode structure 1000 is then immersed in a photoelectrochemical etching solution and may be illuminated with light having wavelengths that are strongly absorbed by the release layer 1103 but not by at least some of the other semiconductor layers. In certain embodiments the etch solution includes one or more of potassium hydroxide (KOH) potassium persulfate ($K_2S_2O_8$), sodium hydroxide (NaOH), hydrogen peroxide ($H_2O_2$), ethylene glycol, and tetramethylammonium hydroxide (TMAH). The KOH may have a concentration between 0.01 and 10 molar or between about 0.1 molar and about 2 molar. In certain embodiments, the light source includes a broadband source such as a mercury arc lamp, a mercury-xenon lamp, a tungsten lamp, or an LED. In certain embodiments, the light source is coupled with a filter to exclude wavelengths that are strongly absorbed by one or more of the semiconductor layers. The fluence of the light source may be between about 1 W/cm$^2$ and about 50 W/cm$^2$. In certain embodiments, the photodiode structure 1000 is connected electrically to an anode, with a separate cathode immersed in the etch solution. In certain embodiments, an electrical current is passed between the cathode and the anode to cause dissolution of the release layer 1103, beginning from the bases of the trenches 1322 and extending laterally. In other embodiments, the photoelectrochemical etching process is electrodeless. In certain embodiments, oxidation and dissolution of the release layer is driven by an oxidizing agent present in the etch solution such as $K_2S_2O_8$. After etching for a predetermined time, release layer 1103 is substantially dissolved, enabling easy removal of the photodiode structures 1000 from template substrate 1101.

Figure 13D:
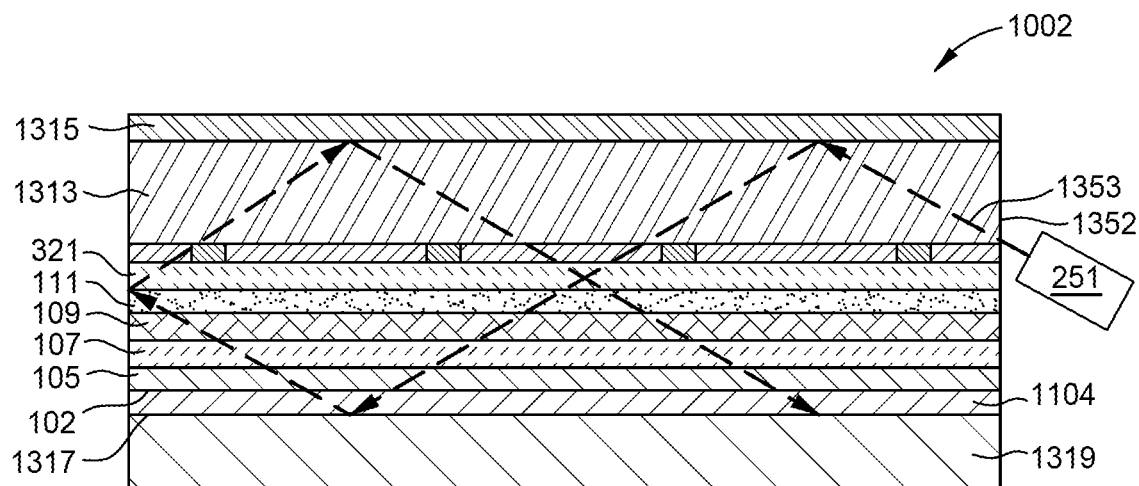

After removal of template substrate 1101, n-side reflective electrical contact 1319, with a reflectivity greater than about 70%, greater than about 80%, greater than about 90%, greater than about 95%, greater than about 97%, or greater than about 98% at a specific angle or range of angles at which light is incident during operation, may deposited on the freshly-exposed back side surface 1317 of single-crystalline group-III metal nitride layer 1104, as shown schematically in FIG. 13D and described above. In some embodiments, surface 1317 is cleaned, by one or more of a wet process or a dry process, prior to deposition of n-side reflective electrical contact 1319. During operation, light from illumination source 251 passes through an aperture or light receiving surface 1352, enters carrier substrate 1313 as beam 1353, and is multiply reflected between p-side reflector layer 1315 and n-side reflective electrical contact 1319.

Figure 14A:
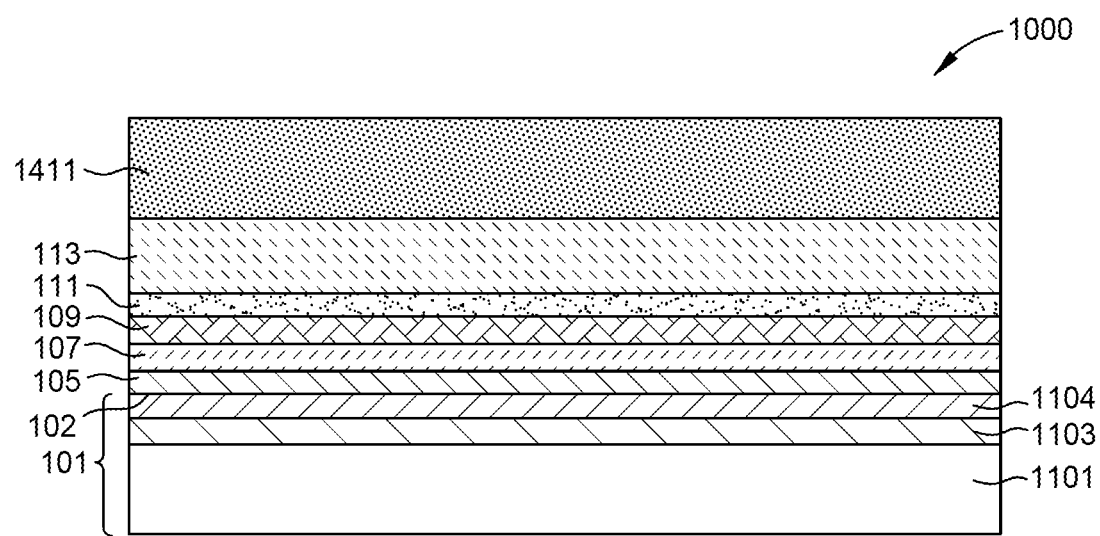
FIGS. 14A, 14B, and 14C are simplified diagrams illustrating alternate photodiode structures and a photodiode die, respectively, that have been prepared according to an embodiment of the present disclosure.
Figure 14B:
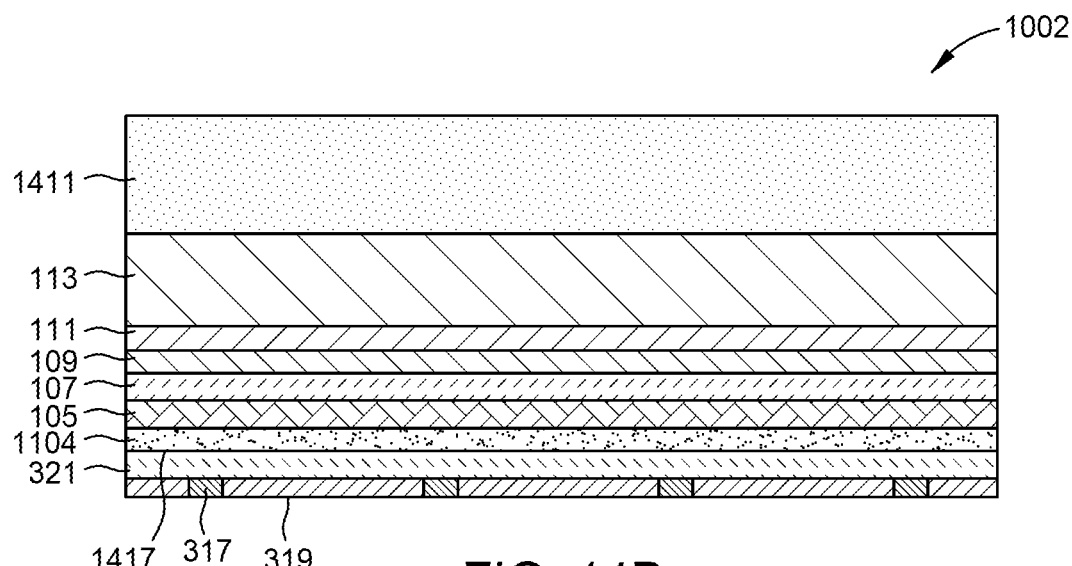
Figure 14C:
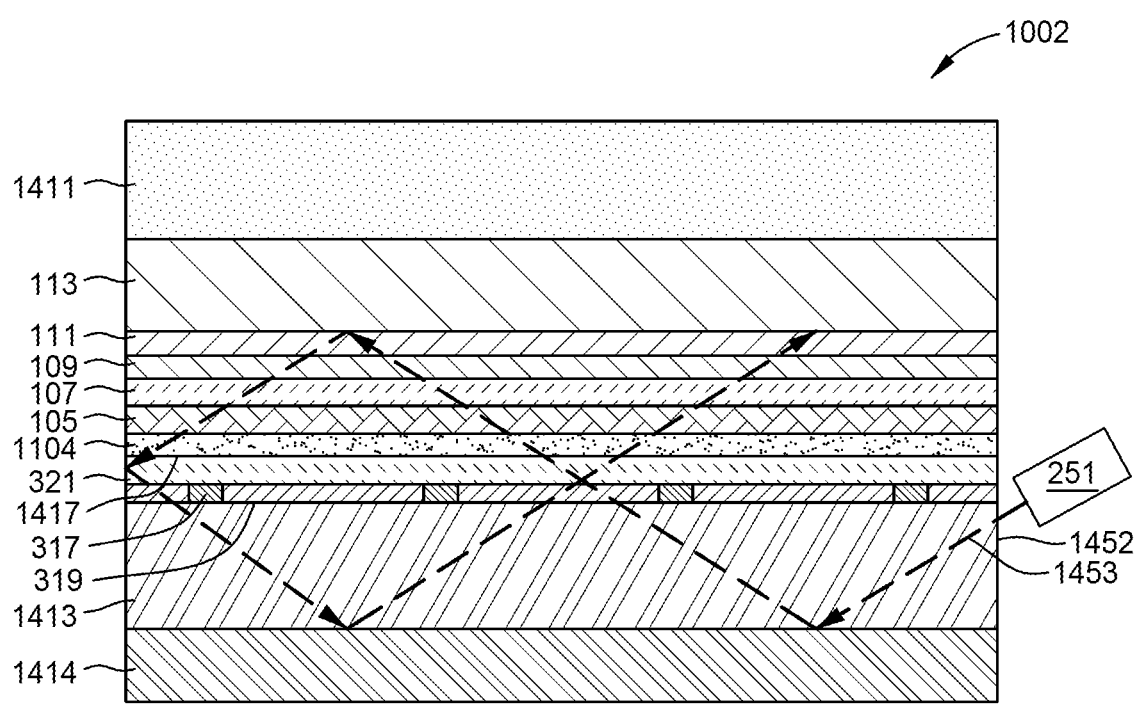

Variations of the template substrate removal and carrier substrate bonding process are possible. For example, a first carrier substrate 1411, which may or may not be transparent, may be bonded to p-side reflective electrical contact 113, as shown schematically in FIG. 14A. First carrier substrate 1411 may include or consist of one or more of sapphire, silicon carbide, zinc oxide, silicon, $SiO_2$, glass, copper, silver, and aluminum. Then, following removal of template substrate 1101 by a process similar to that described above and shown schematically in FIGS. 13B and 13C, a semi-transparent current-spreading layer 321 may be deposited on the freshly-exposed back side surface 1417 of single-crystalline group-III metal nitride layer 1104, as shown schematically in FIG. 14B and described above. The semi-transparent current-spreading layer 321 facilitates electrical contact to the single-crystalline group-III metal nitride layer 1104, for example, ohmic or quasi-ohmic behavior. In some embodiments, a transparent dielectric 319 is disposed on a portion of the semi-transparent current-spreading layer 321 and between discontinuous n-electrode 317. In certain embodiments, discontinuous n-electrode 317 is highly reflective and transparent dielectric 319 is an anti-reflection layer. A first surface of a second carrier substrate 1413, transparent at the wavelengths of interest, may then be bonded to single-crystalline group-III metal nitride layers 1104, semi-transparent current-spreading layer 321, discontinuous n-electrode 317, and/or transparent dielectric 319, as shown in FIG. 14C. An n-side reflector layer 1414 may then be deposited on a second surface of the second carrier substrate 1413, which can function as an optically transmissive member. Now, light from illumination source 251 passes through an aperture or light receiving surface 1452, enters carrier substrate 1313 as beam 1453, and is multiply reflected between p-side reflective electrical contact 113 and n-side reflector layer 1414.

Figure 16A:
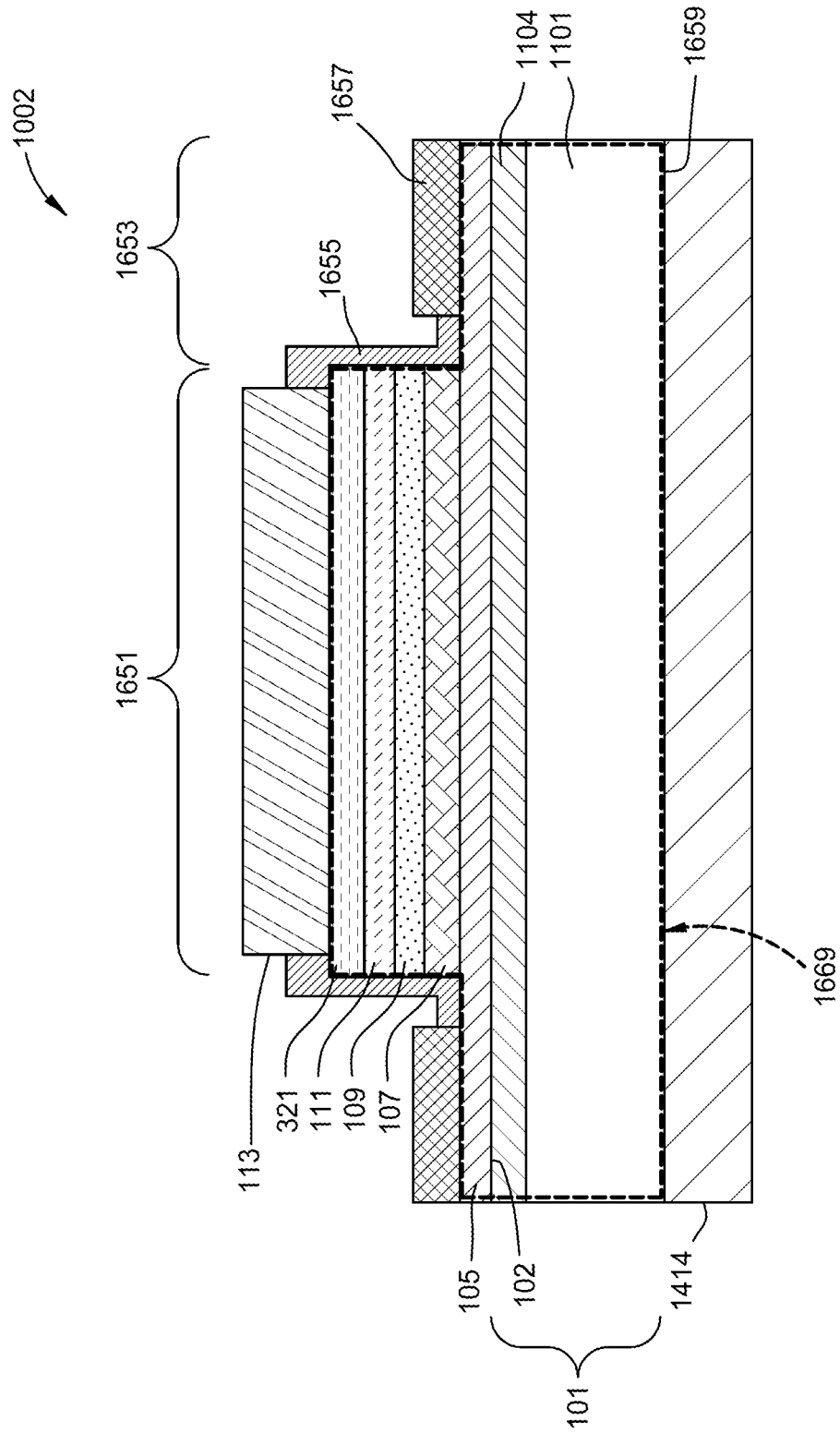
FIGS. 16A, 16B, and 16C are simplified diagrams illustrating alternate photodiode die that have been prepared according to an embodiment of the present disclosure.
Figure 16B:
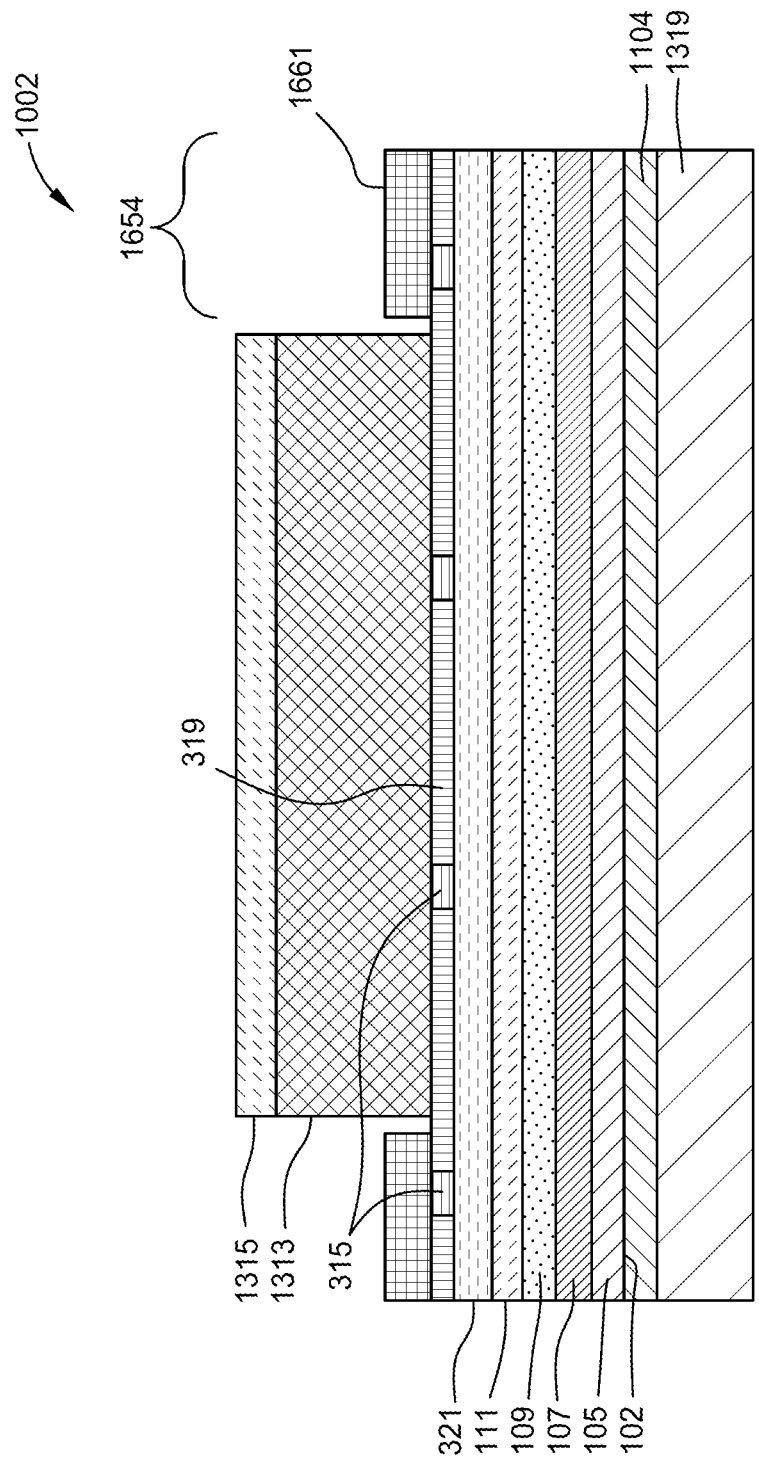
Figure 16C:
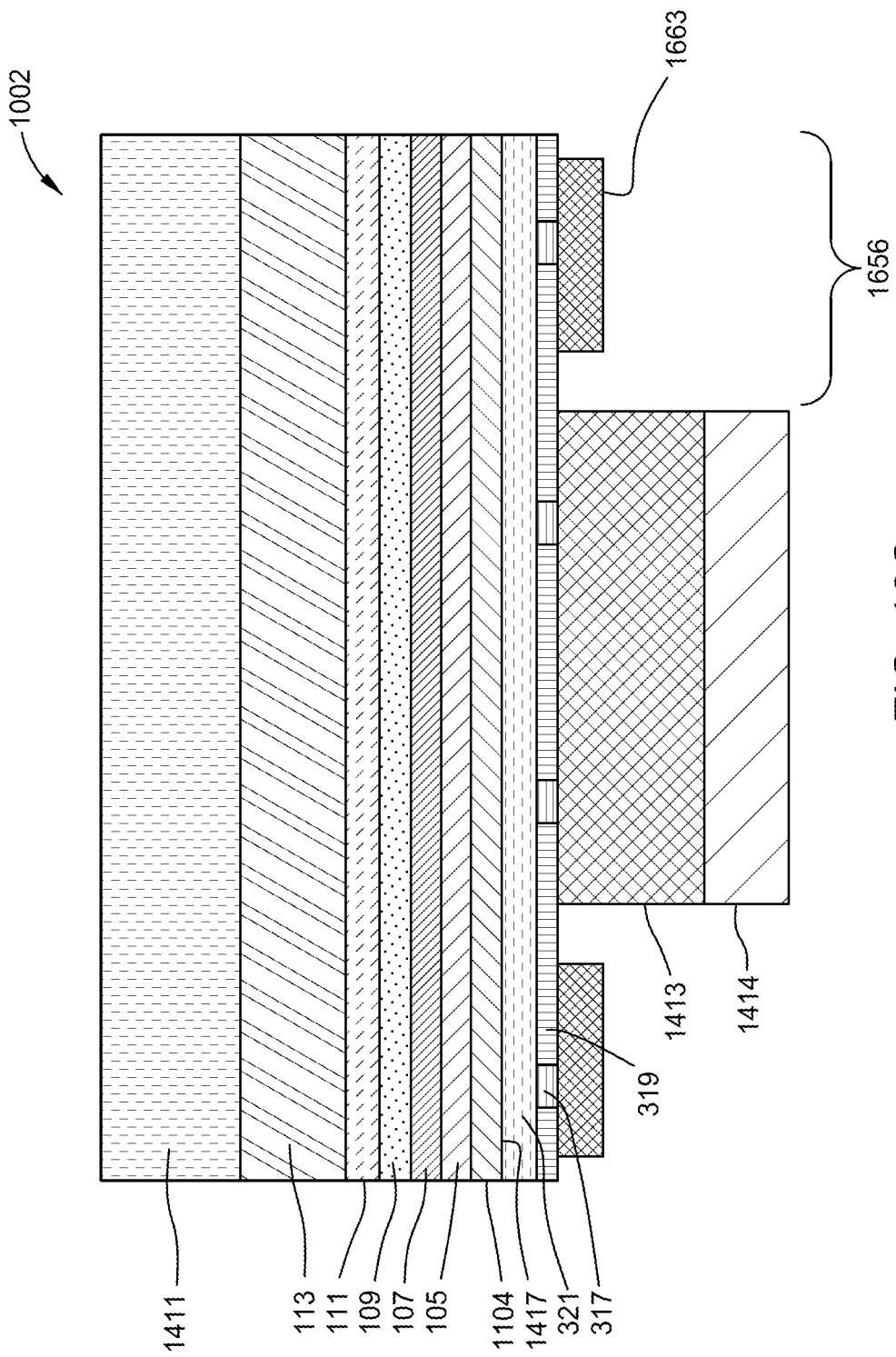

In certain embodiments, as shown schematically in FIGS. 16A, 16B, and 16C, both n-type and p-type electrical contacts are placed on the same side of an optically transmissive member. In certain embodiments, the optically transmissive member includes or consists of the substrate on which the semiconductor layers were deposited. In other embodiments, the semiconductor layers are removed from the substrate and subsequently bonded to an optically transmissive member. The substrate or the optically transmissive member, together with semiconductor layers and dielectric layers, if present, can define a device cavity region 1669 through which light is multiply reflected as it undergoes absorption within the absorber layer 107. In certain embodiments the device cavity region 1669 may comprise a portion of an optical cavity region, which may include regions that are filled with air or a gaseous or liquid fluid or a dielectric in addition to the device cavity region 1669. Some embodiments of optically transmissive members and lateral electrical contacts are described in further detail below.

In one specific embodiment, as shown in FIG. 16A, electrical contacts are placed on device layers overlying template substrate 1101 and are positioned adjacent to mesas 1651 on template substrate 1101, which can define a device cavity region 1669. In the device cavity region 1669, the optically transmissive member is substrate 101 and the reflective members are p-side reflective electrical contact 113 and n-side reflector layer 1414. Such a configuration may be advantageous, for example, when template substrate 1101 is electrically insulating. Subsequent to deposition of p-type layer 111 and optional semi-transparent current-spreading layer 321, trenches 1653 may be formed between adjacent mesas 1651 by lithography and dry etching, using processes that are well known in the art. The depth of trenches 1653 may be chosen so that regions of n-type first non-absorber layer 105 are exposed but such that most of the thickness of n-type first non-absorber layer 105 remains intact under trench 1653, enabling good lateral electrical conduction with a minimum of ohmic losses. P-side reflective electrical contact 113 may be deposited either before or after formation of trenches 1653. N-side electrical contacts 1657 may be deposited on exposed portions of n-type first non-absorber layer 105. An insulating dielectric layer 1655 is disposed between the p-side reflective electrical contact 113 and the n-side electrical contacts 1657. Insulating dielectric layer 1655 may be deposited, for example, by plasma-enhanced chemical vapor deposition (PECVD), by atomic layer deposition (ALD), or by high density plasma chemical vapor deposition (HDPCVD), and may comprise $SiO_2$, $SiN_x$, $Al_2O_3$, or the like. In some embodiments, insulating dielectric layer 1655 is deposited after one or both of p-side reflective electrical contact 113 and n-side electrical contacts 1657. In some embodiments, insulating dielectric layer 1655 is deposited before one or both of p-side reflective electrical contact 113 and n-side electrical contacts 1657. The contact resistance of the n-side electrical contact 1657 is less than $1\times10^{-3}$ $\Omega cm^2$, less than $5\times10^{-4}$ $\Omega cm^2$, less than $2\times10^{-4}$ $\Omega cm^2$, less than $10^{-4}$ $\Omega cm^2$, less than $5\times10^{-5}$ $\Omega cm^2$, less than $2\times10^{-5}$ $\Omega cm^2$, or less than $10^{-5}$ $\Omega cm^2$. In preferred embodiments, the contact resistance is less than $5\times10^{-5}$ $\Omega cm^2$. The n-side electrical contact 1657 may comprise at least one of silver, gold, aluminum, nickel, platinum, rhodium, palladium, titanium, chromium, or the like. In certain embodiments, the surface on which the n-side electrical contact is placed is exposed to a $SiCl_4$ plasma to reduce electrical contact resistance prior to deposition of the n-side electrical contact. An n-side reflector layer 1414 may then be deposited on the backside surface 1659 of template substrate 1101. N-side reflector layer 1414 may include or consist of one or more of silver and aluminum. If necessary, backside surface 1659 is ground and/or polished and, optionally, chemical-mechanically polished prior to deposition of n-side reflector layer 1414 in order to enable a reflectivity greater than 80%, greater than 85%, greater than 90%, greater than 95%, greater than 97%, or greater than 98%. In preferred embodiments, the width of mesas 1651 is much larger than that of trenches 1653 after die singulation, so that very little of light reflected internally between p-side reflective electrical contact 113 and n-side reflector layer 1414 is lost out the sides of the device. In certain embodiments, n-side electrical contacts 1657 may be highly reflective, with a reflectivity greater than 70%, greater than 80%, greater than 90%, or greater than 95%.

Figure 17A:
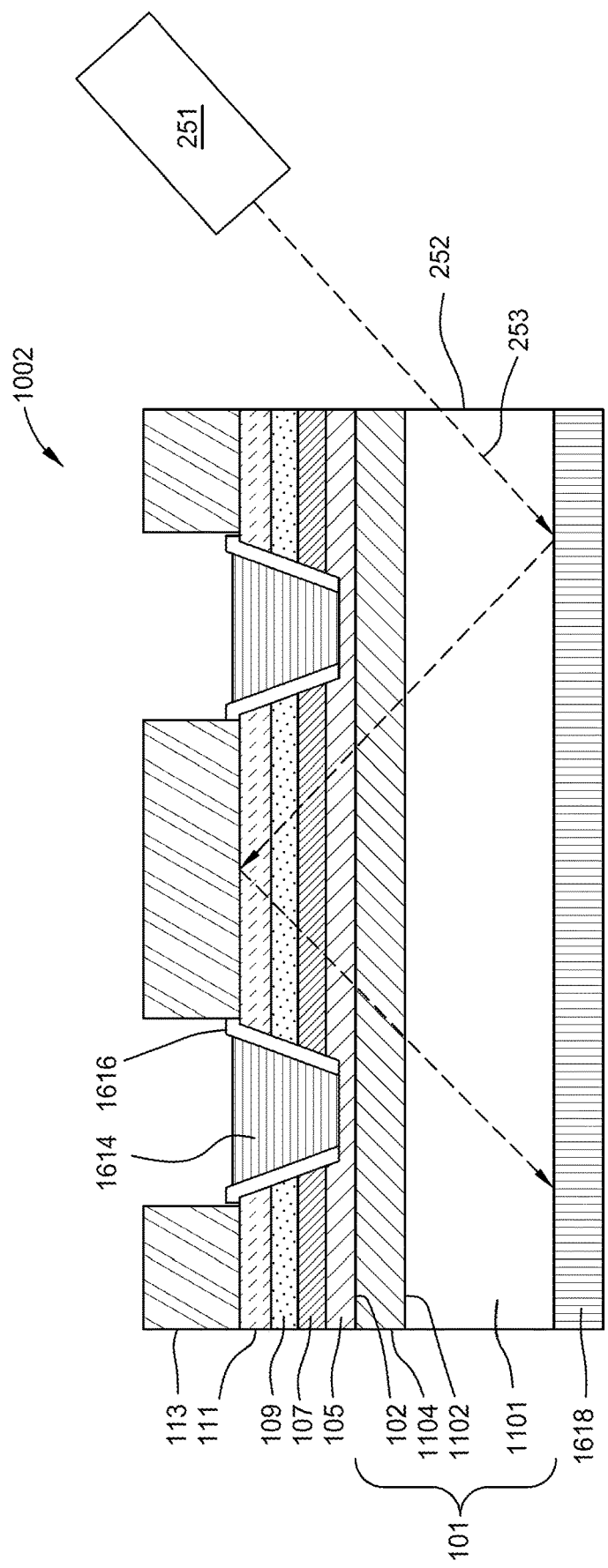
FIG. 17A is a simplified diagram illustrating an alternate photodiode die that has been prepared according to an embodiment of the present disclosure.

In certain embodiments, the device is flip-chipped and both p-type and n-type electrical contacts are placed on the same side of the device structure. Such a configuration may be advantageous, for example, when template substrate 1101 is optically transparent but electrically insulating. Referring to FIG. 17A, after deposition of p-type layer 111, two or more vias may be etched through p-type layer 111, second non-absorber layer 109, if present, absorber layer 107, and into n-type first non-absorber layer 105. The vias may be formed by conventional lithography and a dry etching process such as reactive ion etching (RIE), inductively-coupled plasma (ICP), or chemically-assisted ion beam etching (CAIBE). Insulating dielectric layer 1616 may be deposited on the side walls of the vias, for example, by plasma-enhanced chemical vapor deposition (PECVD), by atomic layer deposition (ALD), or by high density plasma chemical vapor deposition (HDPCVD), and may comprise $SiO_2$, $SiN_x$, $Al_2O_3$, or the like. P-side reflective electrical contact 113 may be deposited on the portion of p-type layer 111 between the vias, and n-side reflective electrical contacts 1614 may be placed within the vias. A dielectric reflector layer 1618 or a metallic n-side reflector layer, may be deposited on the back side of substrate 101, or template substrate 1101. Light of a desired wavelength, for example, 405 nanometers or 450 nanometers may enter the photodiode structure 1000 through an aperture or window (not shown) that may include the light receiving surface 252, such that emitted light propagates within substrate 101 and the semiconductor layers, and be reflected from the p-side reflective electrical contact 113, the n-side reflective electrical contacts 1614, from dielectric reflector layer 1618, and from an edge reflector (not shown). Light within the device will undergo some scattering from the material disposed within the vias. However, since the areal fraction of the vias is relatively small and their depth is small compared to the thickness of substrate 101, the scattering will be modest.

Figure 17B:
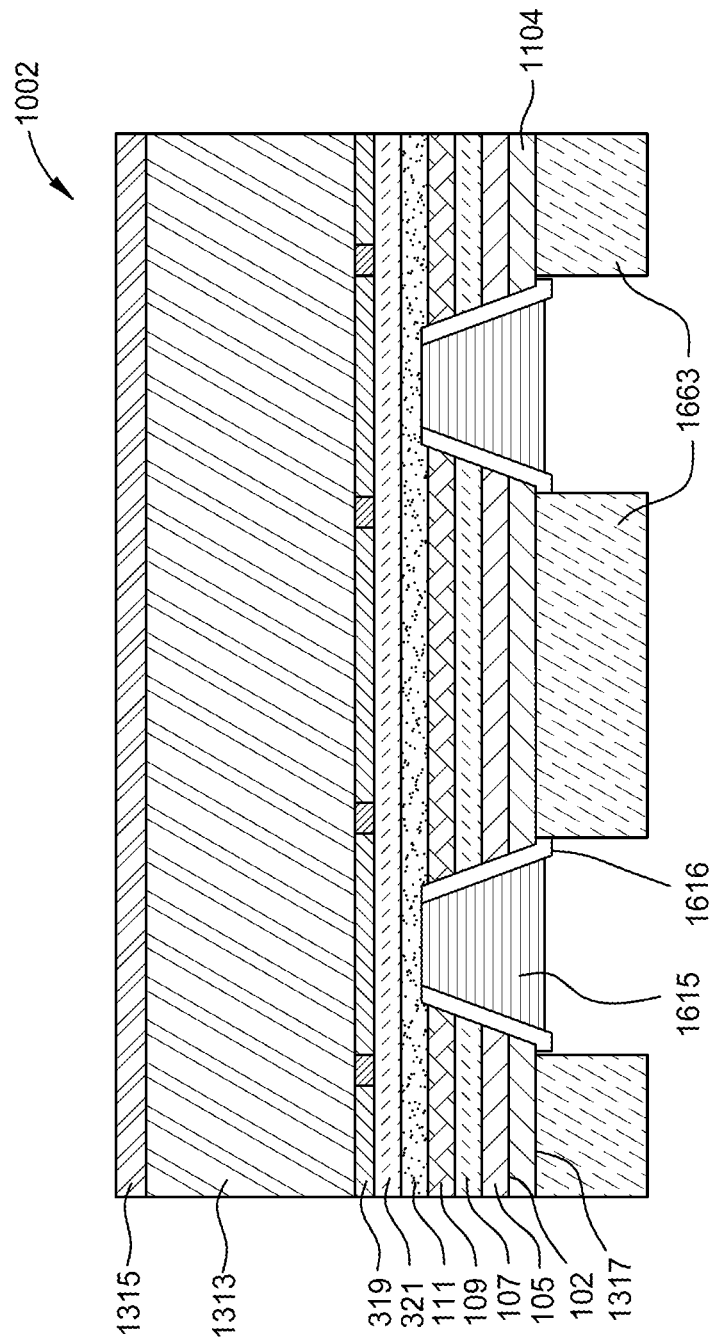
FIG. 17B is a simplified diagram illustrating an alternate photodiode die that has been prepared according to an embodiment of the present disclosure.

In alternative embodiments, vias are placed on the n-side rather than on the p-side, as shown schematically in FIG. 17B. For example, referring again to FIGS. 13C, after removal of template substrate 1101, rather than depositing or bonding n-side reflective electrical contact 1319 to surface 1317, as shown schematically in FIG. 13D, instead, two or more vias may be etched through single-crystalline group-III metal nitride layer 1104, n-type first non-absorber layer 105, absorber layer 107, and second non-absorber layer 109, if present, and into p-type layer 111 or semi-transparent current-spreading layer 321. Insulating dielectric layers 1616, p-side reflective electrical contacts 1615, and n-side reflective electrical contacts 1663 may be placed, analogous to the structures of the photodiode die 1002 shown in FIG. 17A.

Referring again to FIG. 16B, in certain embodiments electrical contacts are placed on device layers underlying and lateral to carrier substrate 1313. Such a configuration may be advantageous when carrier substrate 1313 is optically transparent but electrically insulating, constituting another example of an optically transmissive member. For example, p-side reflective electrical contacts 1661 may be placed in contact with one or more of p-type layer 111, semi-transparent current-spreading layer 321, discontinuous p-electrode 315, and transparent dielectric 319. Gaps or trenches 1654 adjacent to or surrounding carrier substrate 1313, into which p-side reflective electrical contacts 1661 are placed, may be formed by one or more of cutting carrier substrate 1313 using a dicing saw, wet or dry etching of carrier substrate 1313, for example, through a residual portion left over after a saw cut, or bonding placement of multiple, discrete carrier substrates 1313 rather than a single large carrier substrate. N-side reflective electrical contact 1319 may be deposited on the underside of single-crystalline group-III metal nitride layer 1104.

Referring again to FIG. 16C, in certain embodiments electrical contacts are placed on device layers overlying and lateral to a second carrier substrate 1413, which can constitute yet another embodiment of an optically transmissive member. Such a configuration may be advantageous when second carrier substrate 1413 is optically transparent but electrically insulating. For example, n-side reflective electrical contacts 1663 may be placed in contact with one or more of single-crystalline group-III metal nitride layer 1104, semi-transparent current-spreading layer 321, discontinuous n-electrode 317, and transparent dielectric 319. Gaps or trenches 1656 adjacent to or surrounding second carrier substrate 1413, into which n-side reflective electrical contacts 1663 are placed may be formed by one or more of cutting second carrier substrate 1413 using a dicing saw, wet or dry etching of second carrier substrate 1413, for example, through a residual portion left over after a saw cut, or bonding placement of multiple, discrete second carrier substrates 1413 rather than a single large carrier substrate.

In certain embodiments, the photodiode structure 1000 may be characterized prior to singulation. For example, the optical properties, such as transmission or reflection, may be investigated by optical absorption spectroscopy. The morphology of one or more layers may be characterized by differential interference contrast microscopy (DICM, or Nomarski) and/or by atomic force microscopy. The luminescence properties of one or more epitaxial layers may be characterized by one or more of photoluminescence spectroscopy, photoluminescence microscopy, and microfluorescence. The impurity concentrations in one or more layers may be characterized by calibrated secondary ion mass spectrometry (SIMS). The crystallinity of one or more epitaxially grown layers may be characterized by x-ray diffraction. The electrical properties of one or more layers may be characterized by Hall measurements, Van der Pauw measurements, or non-contact resistivity measurements. The contact resistance and series resistance of one or more of the p-side and n-side reflective electrical contacts and of one or more layers may be investigated by transmission line measurements (TLM). The photodiode electrical properties and power conversion efficiency may be characterized by current-voltage (I-V) measurements, either in the dark or under illumination by conventional or laser light sources of various intensities. Minority carrier collection within the photodiode structure 1000 may be quantified by quantum efficiency measurements. The photodiode structure 1000 may be further characterized by electroluminescence measurements.

After wafer-level fabrication, individual photodiode die may be separated, for example, by laser scribing and cleaving, by laser cutting, by stealth dicing, by die sawing, or the like, and packaged. The dicing or cleave direction relative to the crystal axes may be chosen to control the morphology of the edges. For example, c-plane fabricated photodiode wafers, including semiconductor layers, reflective p-type and/or n-type contacts, and other device structures, may be cleaved along the m-plane for a smooth cleaved surface, or along the a-plane for a rough cleaved surface composed of m-plane facets.

Figure 18A:
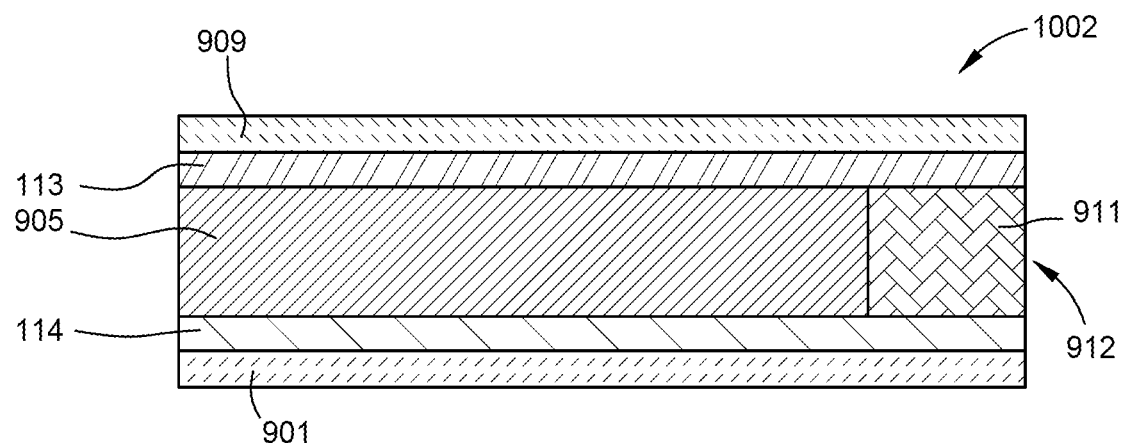
FIGS. 18A and 18B are simplified diagrams showing side views of a photodiode die according to an embodiment of the present disclosure.
Figure 18B:
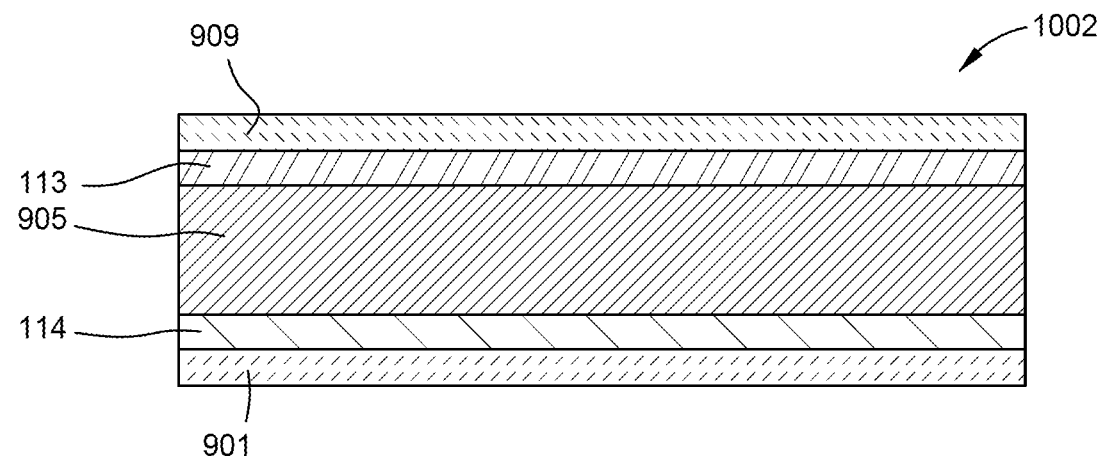
Figure 18C:
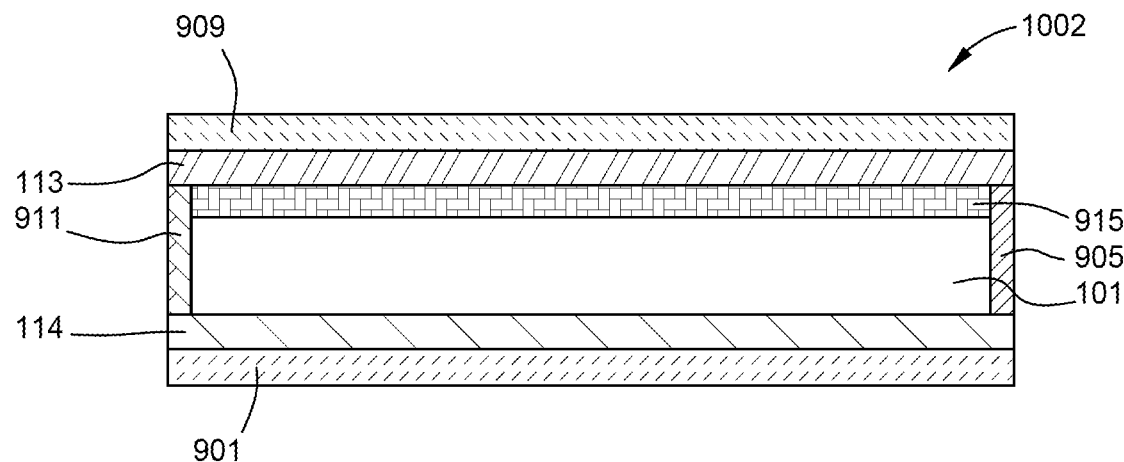
FIGS. 18C and 18D are simplified diagrams showing cross sections of a photodiode die according to an embodiment of the present disclosure.
Figure 18D:
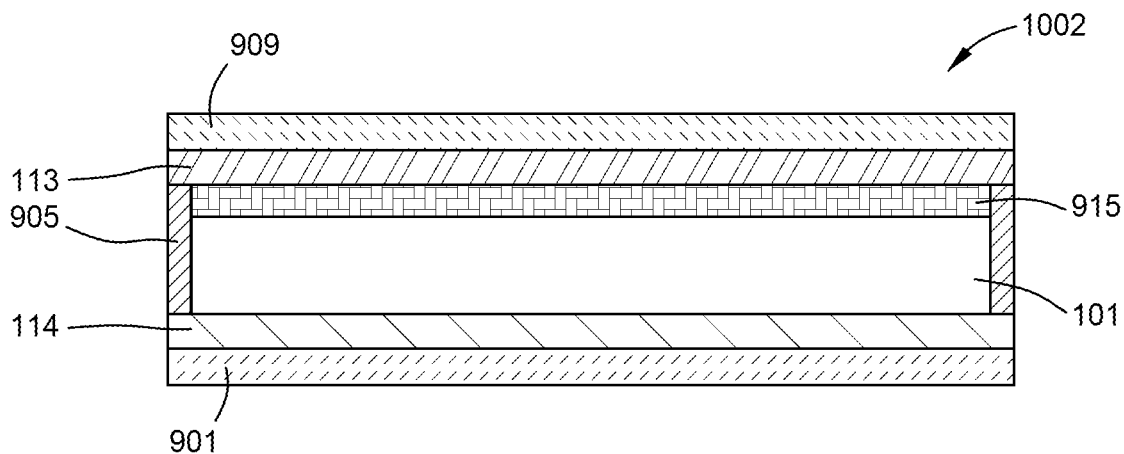

FIGS. 18A-18E show simplified schematic diagrams of side views, cross sections, and a plan view of a photodiode die 1002 of a packaged photodiode designed for side illumination through a corner or edge. FIG. 18E includes sectioning lines that illustrate the viewing position of the views shown in FIGS. 18A-18D. In addition to an n-side reflective electrical contact 114 and a p-side reflective electrical contact 113, the side edges of one or more absorber layers may be passivated (e.g., also referred to herein as the edge passivation) due to the deposition or formation of a passivation layer or by performing one or more processing techniques (e.g., exposure to plasma-generated ions or radicals, reactive annealing process, etc.) on an existing layer to reduce shunt current paths along the device edges. In certain embodiments, the passivation process includes or consists of a coating and the coating includes or consists of one or more of $AlN_x$, $Al_2O_3$, $TiO_2$, $Ta_2O_5$, $ZrO_2$, $SiO_2$, $SiO_x$, $SiN_x$, $Si_3N_4$, $SiO_xN_y$, $AlO_xN_y$, or $Si_uAl_vO_xN_y$. In certain embodiments, the passivation coating or layer is deposited by atomic layer deposition (ALD), chemical vapor deposition (CVD), plasma enhanced chemical vapor deposition (PECVD), high density plasma chemical vapor deposition (HDPCVD), or electron cyclotron resonance (ECR) plasma deposition. In certain embodiments, a deposited passivation layer comprises hydrogen at a concentration greater than $10^{19}$ cm$^{-3}$, which passivates dangling-bond point defects at the interface between the semiconductor layers and the passivation layer. In certain embodiments the passivation layer has a lower work function than that of the semiconductor layers. In some embodiments, edge passivation is not utilized in or formed on a photodiode die.

At one location of the edge of the photodiode die, the edge includes an optical window 912. The optical window 912 may be coated with an anti-reflection optical window layer 911, while the remainder of the perimeter of the edge may be coated with an edge reflector layer 905. In some embodiments, the optical window 912 portion of the edge includes a surface that has a desired roughness or texture, in lieu of or in addition to the anti-reflection optical window layer 911. In certain embodiments the optical window 912 is placed at a corner. In other embodiments the optical window 912 is placed away from a corner. The area of the optical window 912 may be less than about 40%, less than about 30%, less than about 20%, less than about 10%, less than about 5%, less than about 2%, less than about 1%, less than about 0.5%, less than about 0.2%, or less than about 0.1% of the surface area of at least one absorber area, as measured in a plane parallel to large-area surface 102. The anti-reflection optical window layer 911 may comprise at least one of $MgF_2$, $SiO_2$, $Al_2O_3$, $HfO_2$, $LaTiO_3$, $Si_3N_4$ or $TiO_2$ and may be deposited by electron beam deposition, sputtering, or other suitable deposition techniques. In certain embodiments, the anti-reflection optical window layer 911 is textured. In certain embodiments, the angle between the surface normal of the edge of the optical window 912 and the surface normal of the substrate can deviate from 90 degrees. The optical window 912 may comprise one or more planar layers and/or textured structures. In certain embodiments the orientation of the optical window 912 is parallel to the edge of the die. In other embodiments, the optical window has an outer orientation that is not parallel to the edge of the die, for example, to minimize optical losses upon coupling to a fiber at non-normal incidence angle. The edge reflector layer may comprise at least one of silver, gold, aluminum, platinum, rhodium, palladium, chromium, or the like, and may be deposited by electron beam deposition or sputtering. In certain embodiments, the edge reflector layer may include dielectric layers to enhance edge reflection. Light entering the optical window 912 makes multiple passes through the combination of semiconductor layers (including non-absorber, absorber, and p-type contact semiconductor layers) 915 (FIGS. 18C-18D) that are disposed on the substrate.

The die may be attached to one or more of a lower heat sink 901 or an upper heat sink 909. A separate submount may also be provided and positioned between the die and lower heat sing 901 or upper heat sink 909. The heat sink and the submount may include a layer and/or a plate or other shape that comprises at least one of copper, aluminum, silicon, silicon carbide, sapphire, aluminum nitride, beryllium oxide, diamond, or the like. The photodiode die 1002 may be attached to the heat sink and/or to the submount by one of a Au/Sn eutectic, a Au/Ge eutectic, or the like bonding layer.

Figure 19A:
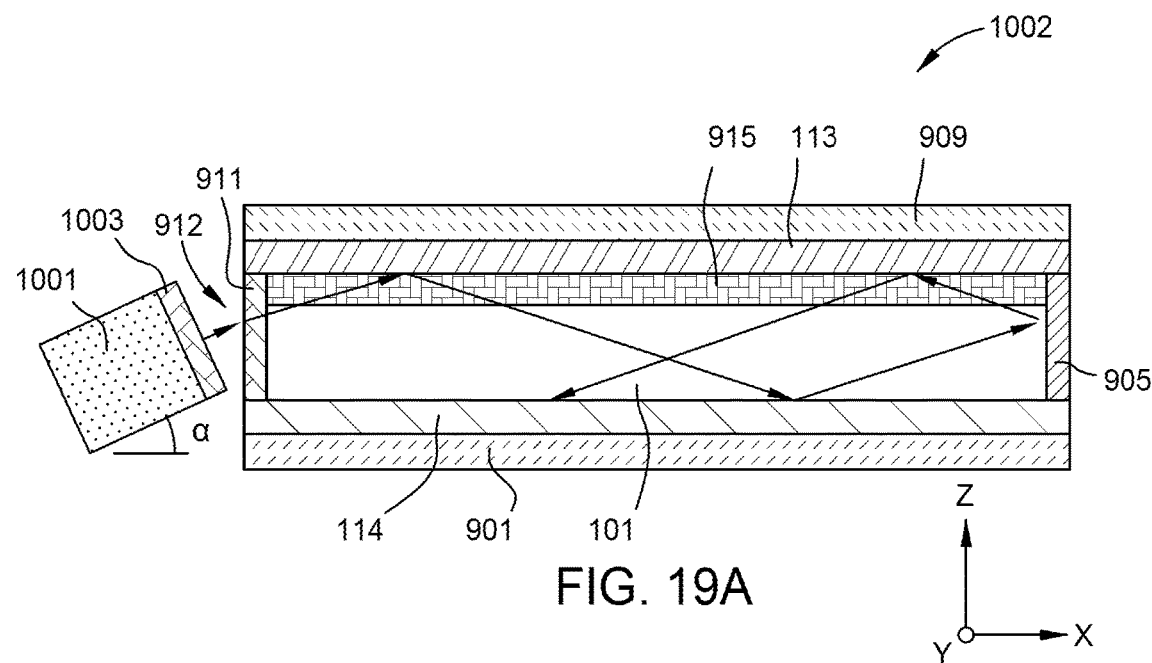
FIGS. 19A, 19B, 19C, 19D, and 19E are simplified diagrams illustrating the optical path into and within a photodiode die according to an embodiment of the present disclosure.
Figure 19B:
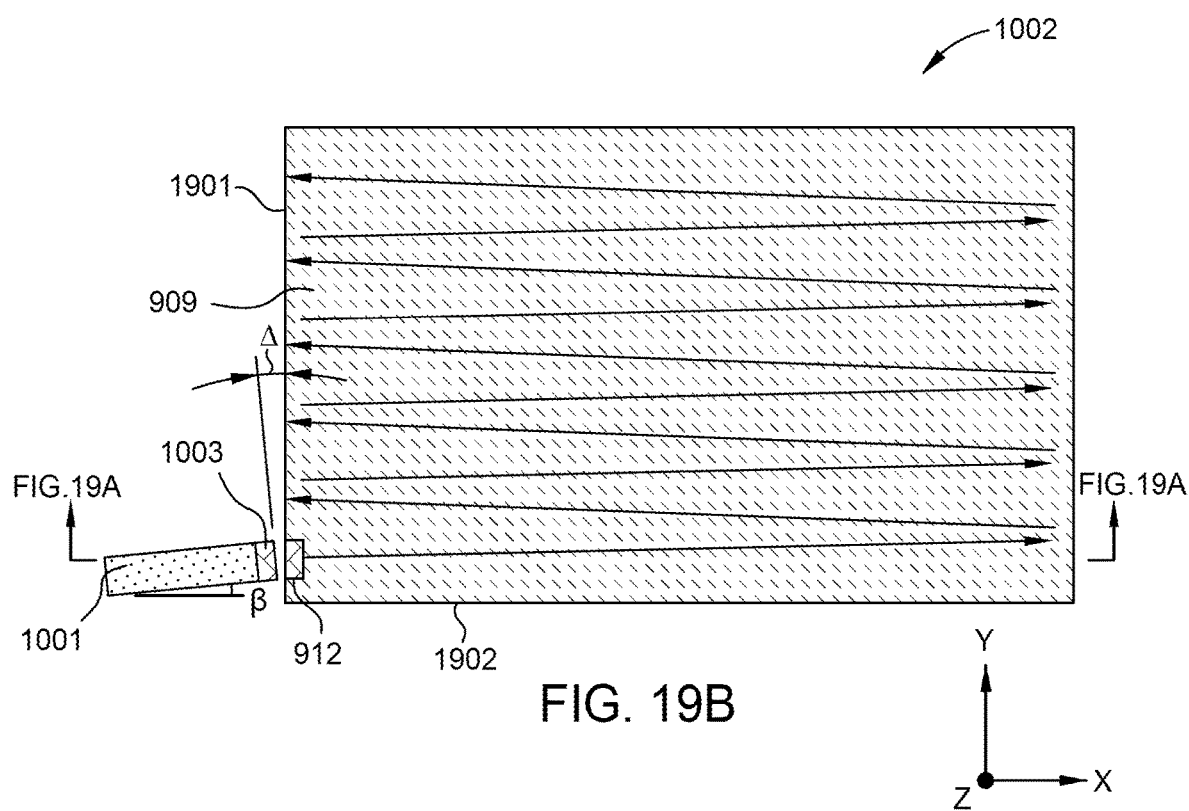
Figure 19C:
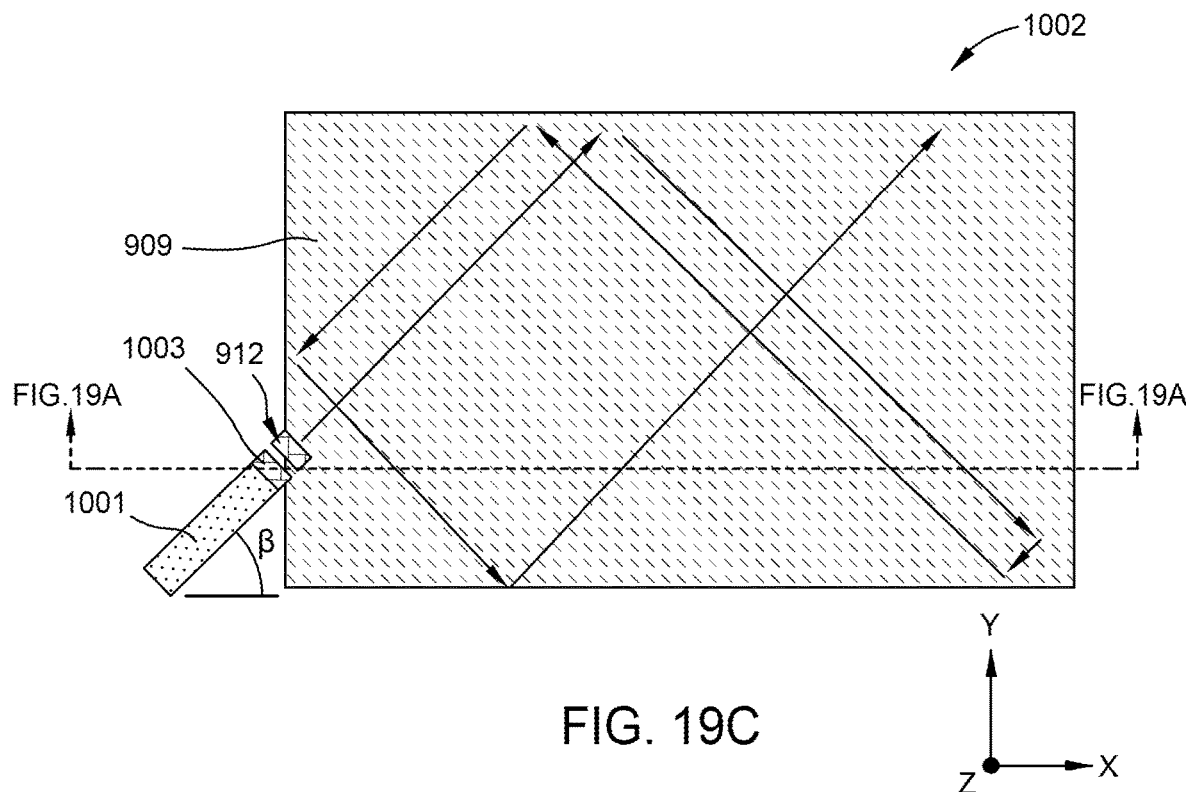
Figure 19D:
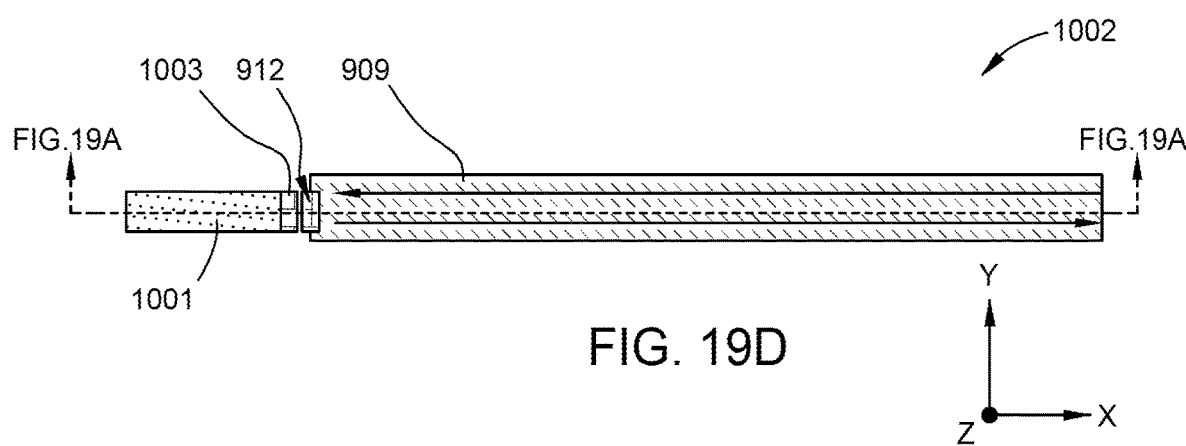

FIGS. 19A, 19B, 19C, 19D, and 19E show schematic illustrations of cross-sectional and plan views, respectively, of the light path from an optical fiber 1001 into the photodiode die 1002. The optical fiber 1001 described in relation to FIGS. 19A-19E is similarly configured as the optical fiber 3180, which is described in greater detail below. In these figures, the X-direction is chosen to lie in the plane of the photodiode die (i.e., parallel to large-area surface 102) along a first direction, the Y-direction is chosen to lie in the plane of the die, perpendicular to the X-direction, and the Z-direction is chosen to be perpendicular to the plane of the die. The optical fiber 1001, which may have an anti-reflection coating 1003, is coupled to the optical window 912 at an angle α with respect to the plane of the photodiode die (cf. FIG. 19A) and an angle β with respect to an edge 1902 of the die (cf. FIG. 19B). The plane of the photodiode die is generally parallel to a major surface of the semiconductor layers 915, which, in one example, is parallel to the X-Y plane in FIG. 19A. In some embodiments, as illustrated in FIG. 19B, the optical fiber 1001 is coupled to the photodiode die such that it also includes an angle Δ with respect to an edge 1901 (e.g., light receiving edge in FIG. 19B of the photodiode die 1002. Deviation of angle α from zero degrees causes the light that enters the die to undergo multiple reflections from the reflective p-type contact and from the reflective n-type contact. In certain embodiments, total internal reflection may be exploited in the top and bottom mirrors. In certain embodiments, the value of α is chosen to be between 0 and about 50 degrees, between 0 and about 40 degrees, between 0 and about 20 degrees, or between 0 and about 5 degrees, or even between 0.1 and 5 degrees. Deviation of angle β from zero degrees causes the light that enters the die to undergo multiple reflections from edge reflector layers and illuminate the entire die volume. With a relatively small value of β, the light bounces incrementally from one edge of the photodiode die to another (FIG. 19B). With a larger value of β the light traverses the die with fewer bounces (FIG. 19C). In certain embodiments, the value of β is chosen to be between 0 and about 60 degrees, between 0 and about 20 degrees, between 0 and about 10 degrees, between 10 and about 30 degrees, or between about 30 and about 50 degrees. In certain embodiments the die may be narrow in the Y-direction, for example, with a width between 5× and 0.5× the thickness of the die, between 2× and 0.8× the thickness of the die, or between 1.5× and 1× the thickness of the die, and the value of β may be small, for example, less than about 20 degrees, less than about 10 degrees, less than about 5 degrees, or approximately zero, so that the light travels to the distal end of the die and is then reflected back along approximately the same path. In certain embodiments, efficient reflection from the edges of the die may be facilitated by making use of total internal reflection, that is, ensuring that incident angle of the internal light rays relative to the surface normal is greater than $(360/(2\pi))*\arcsin(n_1/n_2)$ degrees, where $n_1$ is the exterior refractive index and $n_2$ is the interior refractive index. In certain embodiments, the value of angle Δ is chosen to be between 0 and about 20 degrees, between 0 and about 10 degrees, or between 0 and about 5 degrees, or even between 0.1 and 5 degrees.

Figure 36:
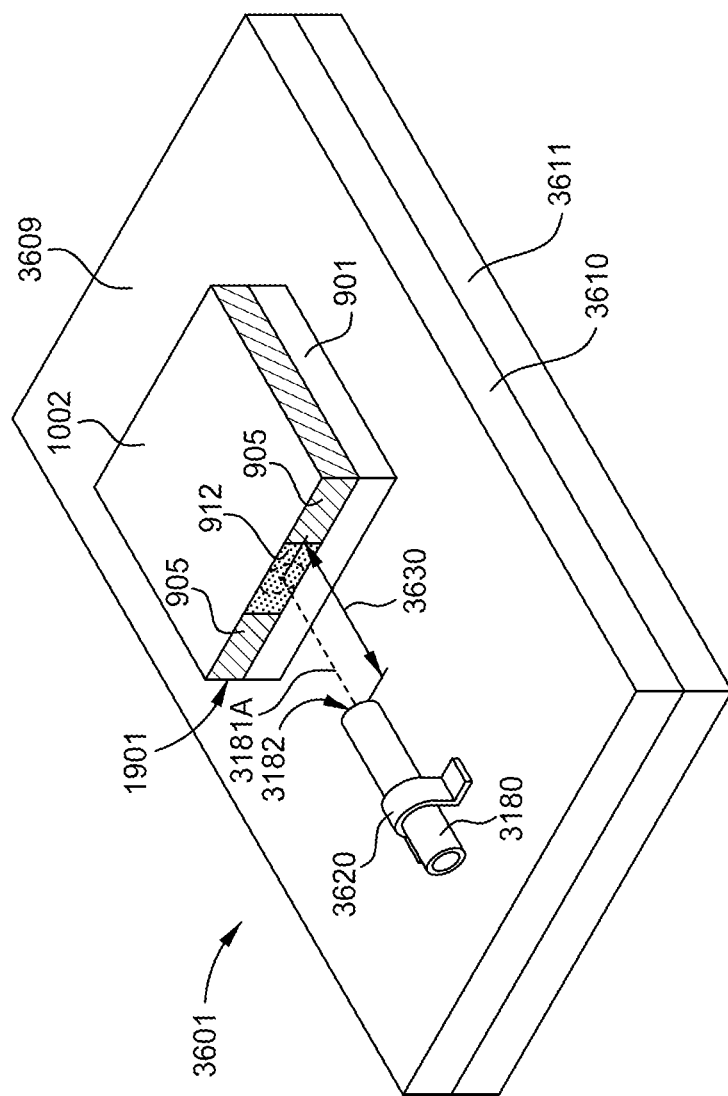
FIG. 36 is an isometric view of a fixture used to support a photodiode die and optical fiber according to an embodiment of the present disclosure.

One or more optical fibers may be coupled to the photodiode die using a fixture that includes one or more of a connector and a ferrule by methods that are known in the art. In one embodiment, as illustrated in in FIG. 36, a fixture 3601 includes a supporting structure 3611, mounting plate 3610 and mounting elements 3620 that are configured to position, support and align the light emitting end 3182 of an optical fiber 3180 relative to an edge 1901 (e.g., FIGS. 19B and 36) or surface (e.g., n-side reflective electrical contact containing surface in FIGS. 33A-33I) of a photodiode die 1002. The optical fiber 3180 is positioned on and attached to a surface 3609 of the mounting plate 3610 by use of the mounting element 3620. The mounting element 3620 can include a simple clamping device that is configured retain a portion of the optical fiber. However, in some embodiments, the mounting element 3620 may include one or more retaining features that are configured to support a connector or ferrule that are coupled to a portion of the optical fiber 3180. The photodiode die 1002 is also positioned on and attached to the surface 3609 of the mounting plate 3610. In some embodiments, the photodiode die 1002 is bonded to or clamped to the surface 3609 of the mounting plate 3610 by use of removable clamps, fastening elements, adhesives, metallic or ceramic bonding layers, or other similar devices or device retaining methods known in the art. In some embodiments, the photodiode die 1002 includes a heat sink 901 that is disposed between the active regions of the photodiode die 1002 and the surface 3609 of the mounting plate 3610. In some embodiments, a submount (not shown) is positioned between photodiode die 1002 and heat sink 901. In some embodiments, the relative positions of a first end (i.e., light emitting end 3182) of the optical fiber 3180, the principal axis 3183A (FIGS. 31B and 36) of the optical fiber, a first edge and a second edge of the photodiode die are controlled to a tolerance between about 1 micrometer and about 1 millimeter, or between about 1 micrometer and about 100 micrometers, or between about 2 micrometers and about 50 micrometers, or between about 3 micrometers and about 25 micrometers. In some embodiments, the fixture is configured to position the radiation emitting end 3182 of the optical fiber a first distance 3630 (FIG. 36) from a surface of the optical window 912, wherein the first distance is between about 2 micrometers and about 10 millimeters. In configurations where the radiation emitting end 3182 of the optical fiber 3180 is not parallel to an edge 1901 of the photodiode die 1002 or surface of the optical window 912, the first distance can be measured from a point where the principal axis 3183A extends through the radiation emitting end 3182 of the optical fiber 3180 to the center of emitted radiation that impinges on the surface of the optical window 912 or the edge 1901 of the photodiode die 1002. Similarly, in configurations where the radiation emitting end 3182 of the optical fiber 3180 is not parallel to a light receiving surface of an optical coupling member 3187 (FIGS. 33A-33E) or light receiving surface of an optical waveguide 3190 (FIGS. 31A-32), the first distance (e.g., distance $D_1$ in FIG. 31B) can be measured from a point where the principal axis 3183A extends through the radiation emitting end 3182 of the optical fiber 3180 to the center of emitted radiation that impinges on the light receiving surface of the optical coupling member 3187 or optical waveguide 3190.

The fixture generally provides a structure that is used for holding the relative positions of the light emitting end 3182 of the optical fiber 3180 relative to the light receiving edge 1901 of the photovoltaic die 1002 constant to within a tolerance between about 1 micrometer and about 1 millimeter. In some embodiments, the mounting plate 3610 is formed from a material that has a coefficient-of-thermal expansion (CTE) that matches the CTE of the optical fiber 3180 and/or photodiode die 1002 to help maintain the desired tolerance during operation of the photodiode package. In one example, the mounting plate 3610 includes a material such a Kovar®, Invar or other materials that have a CTE that is similar to the materials from which the optical fiber 3180 and/or photodiode die 1002 are formed.

In certain embodiments, ends of the one or more optical fibers, which may include or consist of one or more of silica, glass, and plastic and may be single mode or multimode, may be attached to a ferrule by an adhesive such as epoxy. The ferrule, which may be used in the fixture, may consist of or include a ceramic, stainless steel, aluminum, copper, or plastic. The end face of the ferrule may be polished, along with the ends (i.e., radiation emitting ends 3182) of the one or more optical fibers. The ferrule may be attached to the fixture by means of a connector. The position of the photodiode die 1002 within the fixture may be determined by precisely controlling the lateral dimensions of the die, for example, to better than 100 micrometers, to better than 50 micrometers, to better than 25 micrometers, or to better than 10 micrometers, and by positioning a first edge (e.g., edge 1901) and a second edge of the die, a submount to which the die is attached, or a heatsink 901 to which the submount is attached, against features in the fixture. As noted above, the photodiode die 1002 may be attached to the mounting plate 3610 of the fixture 3601 by one or more of gold-tin solder, a Au—Au-thermocompression bond, epoxy, silver epoxy, sintered silver interface material, or thermal adhesives. One or more of a submount and a heatsink may be included in the thermal and mechanical path between the photodiode die and the fixture. Each of the photodiode die and the submount, the submount and the heatsink, and the heatsink and the fixture may be bonded by one or more of gold-tin solder, a Au—Au-thermocompression bond, epoxy, silver epoxy, sintered silver interface material, or thermal adhesives. The submount may consist of or include one or more of silicon, glass, sapphire, silicon carbide, beryllium oxide, diamond, copper tungsten alloy, or aluminum nitride. The heatsink 901 may consist of or include one or more of copper and aluminum.

The edge-optical-coupling geometries shown in FIGS. 19A-19D have a number of advantages, including simplicity and easy achievement of high optical reflectivities from the front and back surfaces of the device due to the high incident angle of the light received from the optical fiber 1001. However, these geometries may also have some drawbacks, which are addressed in the alternative geometries described below. For example, without incorporating focusing optics, the optical coupling may be most efficient with an edge-coupling geometry if the device is thicker than the diameter of the optical fiber, or at least thicker than the diameter of the core of the optical fiber. As GaN, sapphire, and other substrate thicknesses are often of the order of 300 micrometers, this may be a challenge for certain optical fibers. For example, in certain embodiments, optical fiber 1001 may be a single mode fiber, with a diameter of the fiber core below about 15 micrometers. However, in other embodiments, which may be useful for high-power applications where the power being transmitted from one or more laser diodes is above 1 watt, above 2 watts, above 5 watts, above 10 watts, above 20 watts, or above 50 watts, optical fiber 1001 may be a multimode fiber, with a diameter of the fiber core between about 25 micrometers and about 500 micrometers, between about 40 micrometers and about 300 micrometers, or between about 50 micrometers and about 200 micrometers. In still other embodiments optical fiber 1001 is actually an optical fiber bundle, or fiber optic bundle, with an overall diameter between about 100 micrometers and about 5 millimeters, or between about 200 micrometers and about 2 millimeters, or between about 250 micrometers and about 1 millimeter. A second challenge is that quite precise alignment between the fiber and the device may be required to assure that a desired fraction of optical radiation is delivered to the photodiode die 1002. A third challenge is that, due to a high intensity of light during the initial passes through the absorber layer or active region, a high density of electron and hole carriers may be generated in certain locations within the photodiode, causing a high concentration of carriers within the absorber layer and possibly-significant non-radiative Auger recombination processes that will lead to a loss of efficiency. The active region will generally include the absorber layer, which may include one or more layers that have differing compositions and/or material characteristics.

Figure 19E:
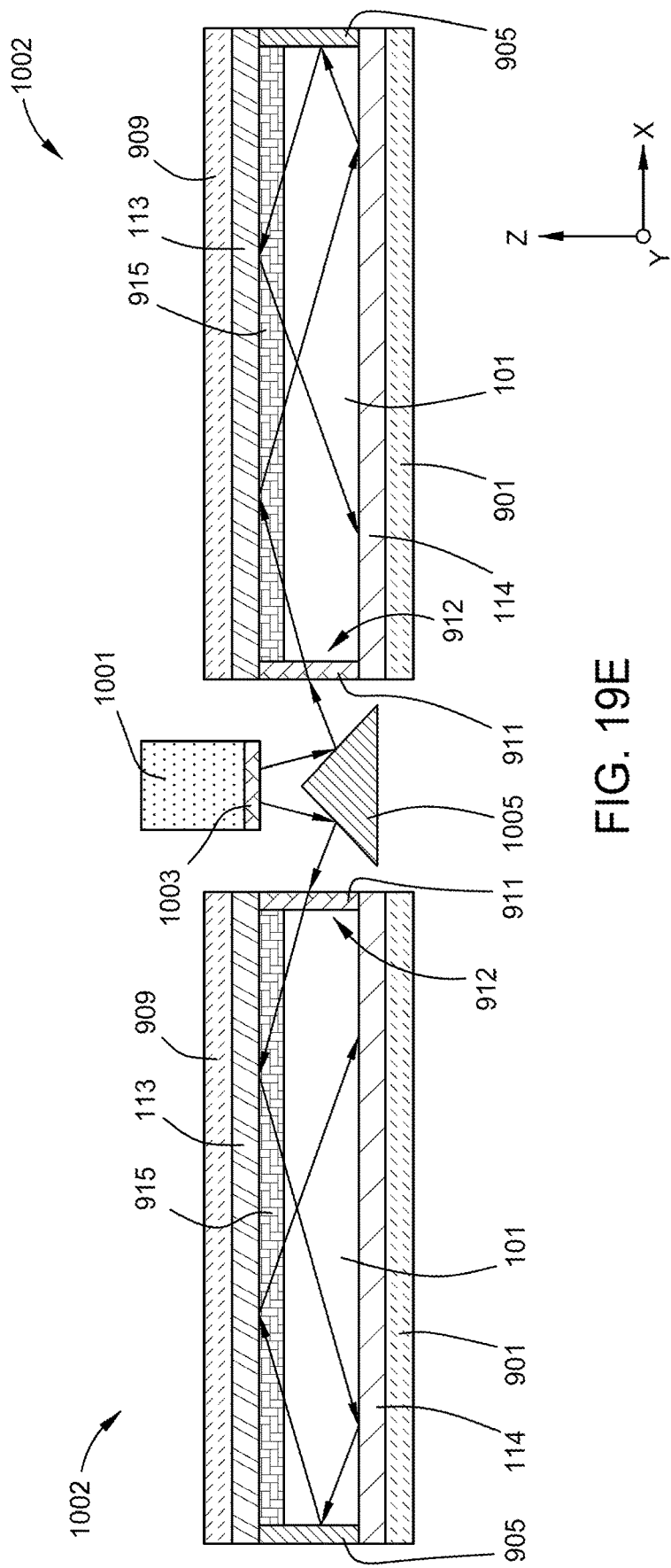

In certain embodiments, as illustrated schematically in FIG. 19E, light is transmitted from a fiber, which is oriented approximately perpendicular to the surface of the die (i.e., the Z-direction), to a surface of a mirror 1005 and into the edges of one, two, three, four, or more die simultaneously. This geometry may be advantageous for enhancing the optical coupling and leveraging a mature commercial supply chain for fiber coupling fixtures.

Figure 27A:
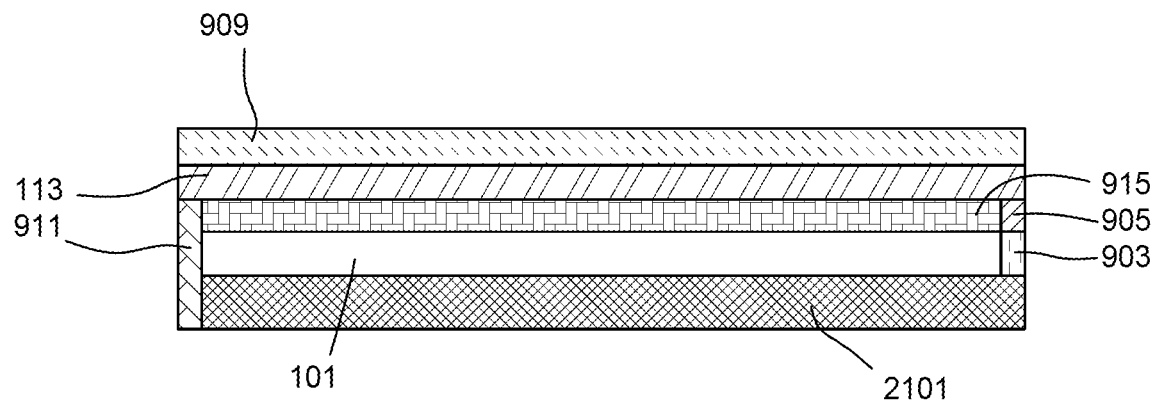
FIGS. 27A and 27B are simplified diagrams showing cross sections of a photodiode die according to yet another alternative embodiment of the present disclosure.
Figure 27B:
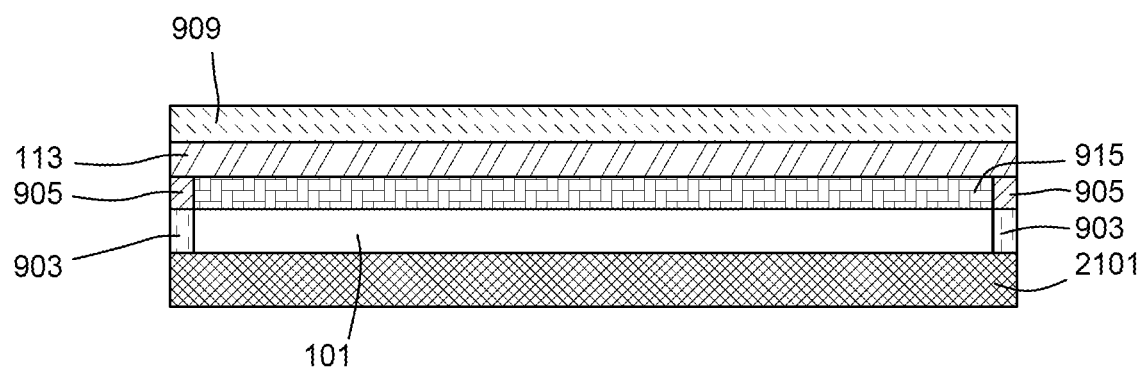

The side-entrance die geometry illustrated in FIGS. 19A, 19B, 19C, and 19D has the advantage of relative simplicity and ease of fabrication. However, in these embodiments it may be beneficial if the substrate is maintained at a thickness greater than that of the optical fiber or fiber bundle, for example, approximately 100 micrometers, 200 micrometers, 300 micrometers, or 500 micrometers. In addition, the relatively long path length, created by the orientations shown in FIGS. 19A-19D of the optical radiation delivery into the side-entrance die geometry configuration, will necessitate minimizing the optical absorption coefficient of the substrate in embodiments where the substrate constitutes the optically transmissive member. In certain embodiments, as illustrated in FIGS. 27A and 27B, light is coupled into a second optically transmissive member 2101 affixed to the first optically transmissive member (e.g., the substrate 101), or in some embodiments, affixed directly to the edge reflector layers 905, to achieve efficient light spreading laterally through the device. In these embodiments the optical cavity region may include second optically transmissive member 2101 in addition to substrate 101, the latter of which is a major component of the device cavity region. In certain embodiments, such as that shown in FIG. 14B, substrate 101 has been removed, and second optically transmissive member 2101 may be optically coupled directly to semiconductor layers 915. The second optically transmissive member may consist of or include $SiO_2$ or $Al_2O_3$, or the like. In certain embodiments, total internal reflection may be exploited in the second optically transmissive member. In certain embodiments, reflective structures comprised of dielectric and metal layers may be disposed on one or more of the second optically transmissive member surfaces to enhance internal reflections. In some embodiments, the interface between the second optically transmissive member and the group III-N substrate is roughened or patterned with RMS height variation between 30 nanometers and 100 micrometers, or between 50 nanometers and 10 micrometers. In some embodiments, one or more surfaces on the second optically transmissive member are roughened. In some embodiments, one or more surfaces on the second optically transmissive member are roughened. In some embodiments, dielectric anti-reflective coating layers are deposited on the group III-N surface. In certain embodiments, second optically transmissive member 2101 is chosen to be thicker than the diameter of an optical fiber coupled to it in an assembly.

Figure 20A:
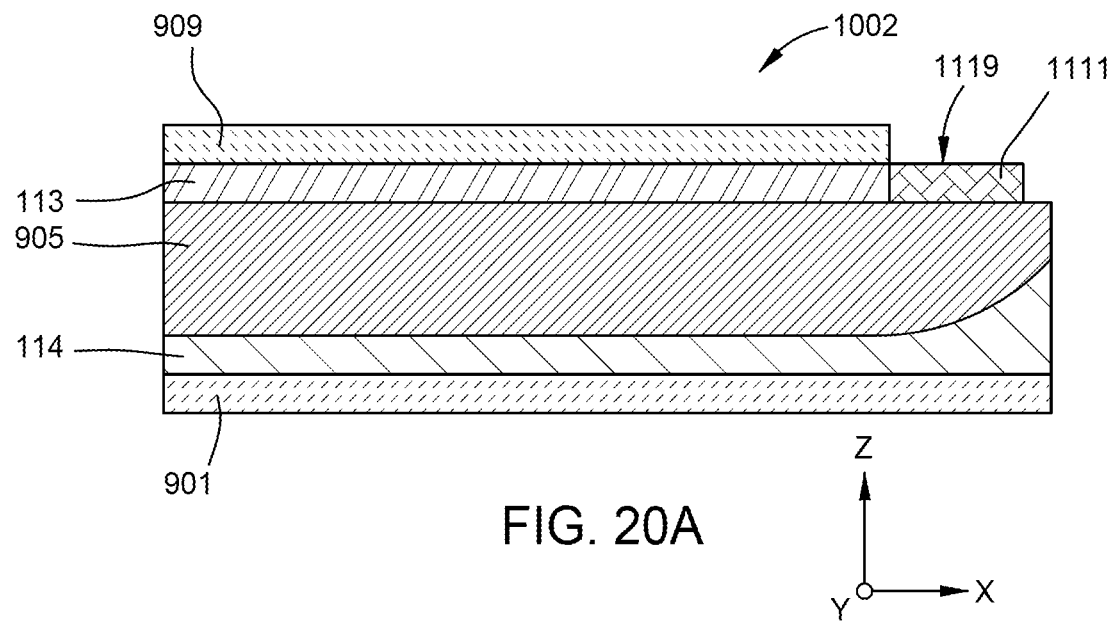
FIGS. 20A and 20B are simplified diagrams showing side views of a photodiode die according to an alternative embodiment of the present disclosure.
Figure 20B:
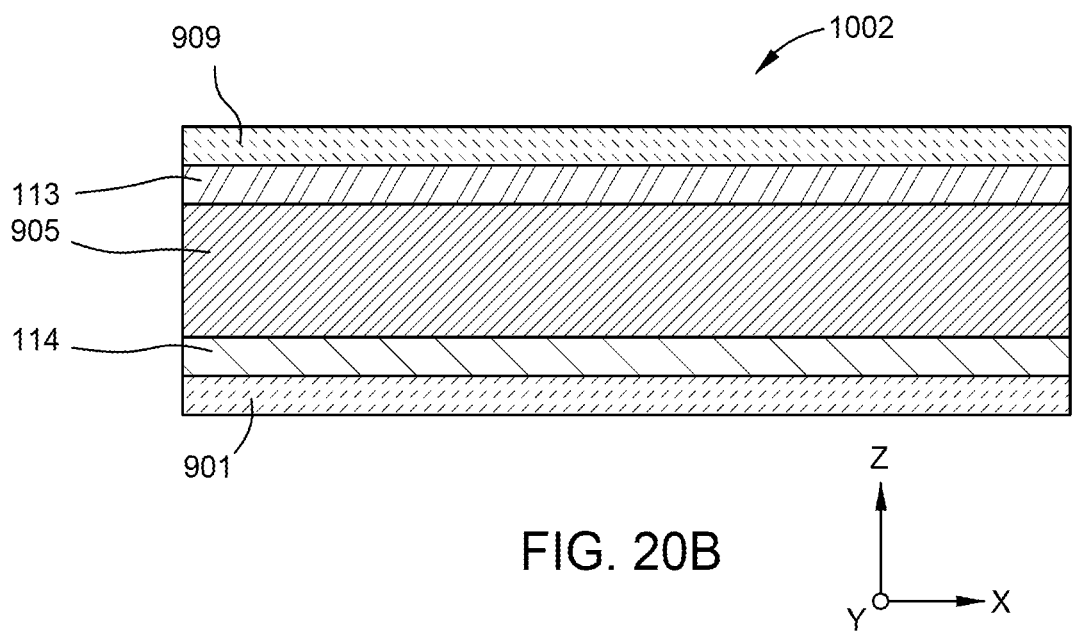
Figure 20C:
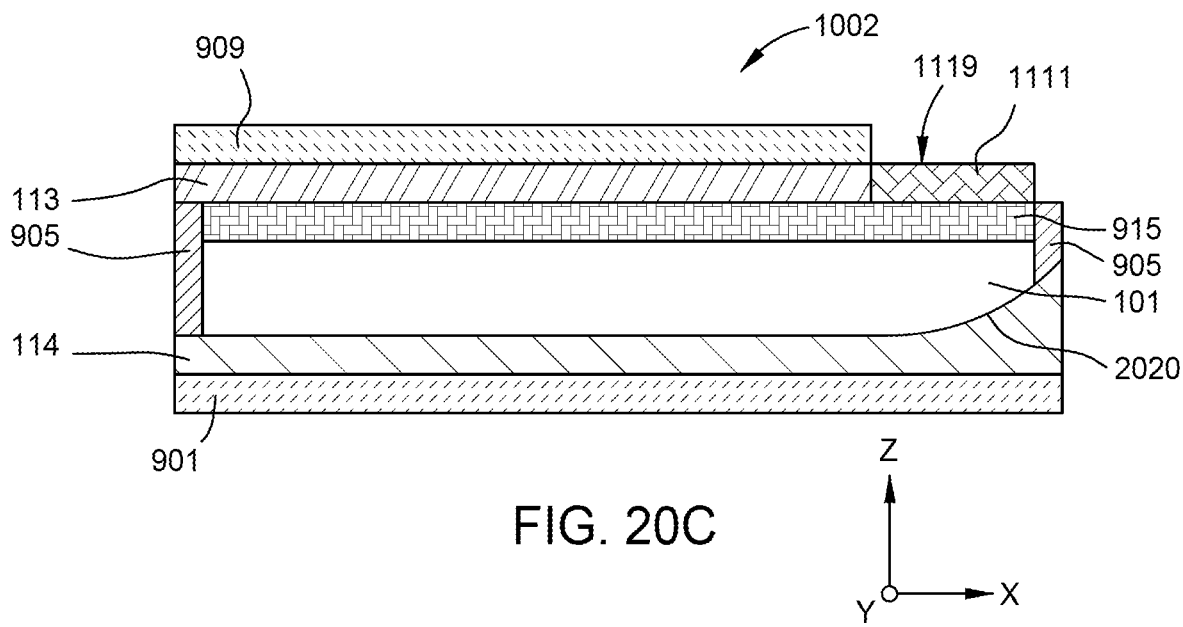
FIGS. 20C and 20D are simplified diagrams showing cross sections of a photodiode die according to an alternative embodiment of the present disclosure.
Figure 20D:
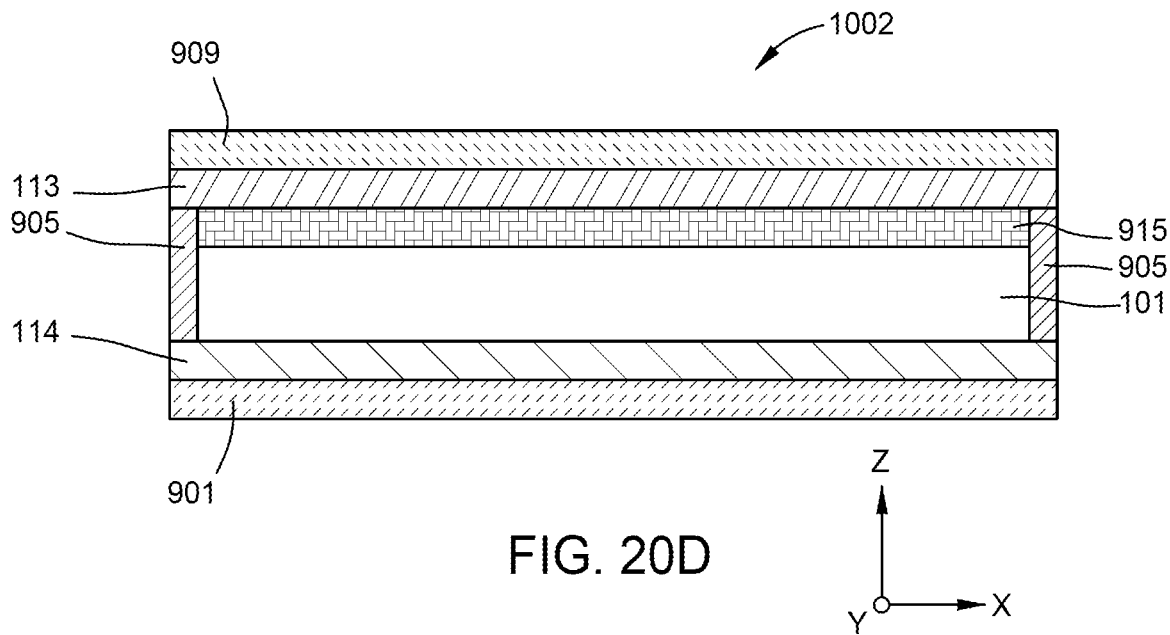

FIGS. 20A-20E show simplified schematic diagrams of side views, cross sections, and a plan view of a photodiode die 1002 of a packaged photodiode designed for top or bottom illumination near a corner or edge. FIG. 20E includes sectioning lines that illustrate the viewing position of the views shown in FIGS. 20A-20D. Edge passivation, anti-reflection window coating 1111, edge reflection layers 905, and the like, are similar to those described in conjunction with FIGS. 19A-19E except for the location of the optical window (or entrance aperture) to the photodiode die. However, in certain embodiments the backside of the substrate, together with the reflective n-type electrical contact, is shaped so that light incident into the die though the optical window 1119 with an anti-reflection coating 1111 is reflected back at a different angle, causing the light to spread laterally through the die via subsequent reflections with the reflective p-type and n-type layers. In certain embodiments the orientation of the optical window 1119 is parallel to the top or bottom surface of the die. In other embodiments, the 1119 optical window has an outer orientation that is not parallel to the top or bottom surface of the die, for example, to minimize optical losses upon coupling to a fiber at non-normal incidence angle.

In certain embodiments, a reflective member 2020 (FIG. 20C) in contact with the substrate or optically transmissive member changes the propagation direction of light within the device cavity region by more than about 30 degrees, more than about 45 degrees, or more than about 60 degrees. In some embodiments, the reflective member 2020 changes the propagation direction of first reflection of light entering the device cavity region by between about 40 degrees and about 140 degrees. These embodiments may enable efficient coupling to fibers having a diameter larger than the thickness of the substrate and may also be advantageous for the robustness and stability of the optical coupling or to leverage a mature commercial supply chain for fiber coupling fixtures.

Figure 21A:
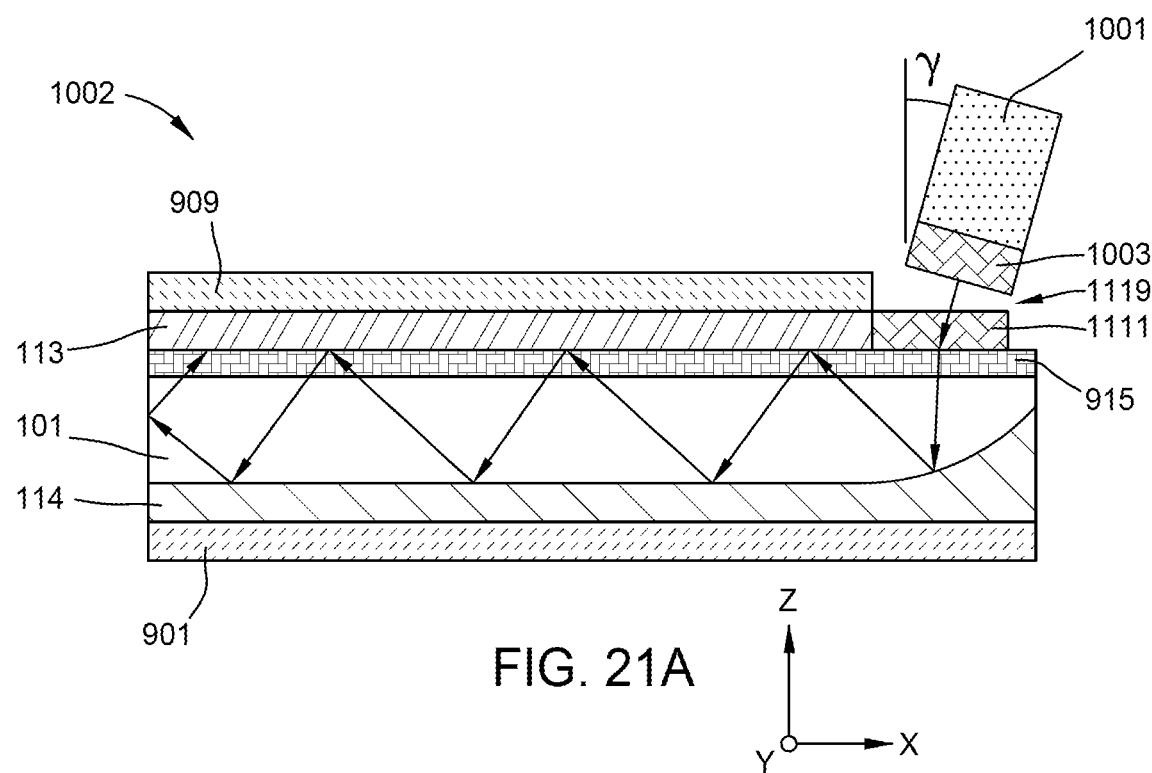
FIGS. 21A and 21B are simplified diagrams illustrating the optical path into and within a photodiode die according to an alternative embodiment of the present disclosure.
Figure 21B:
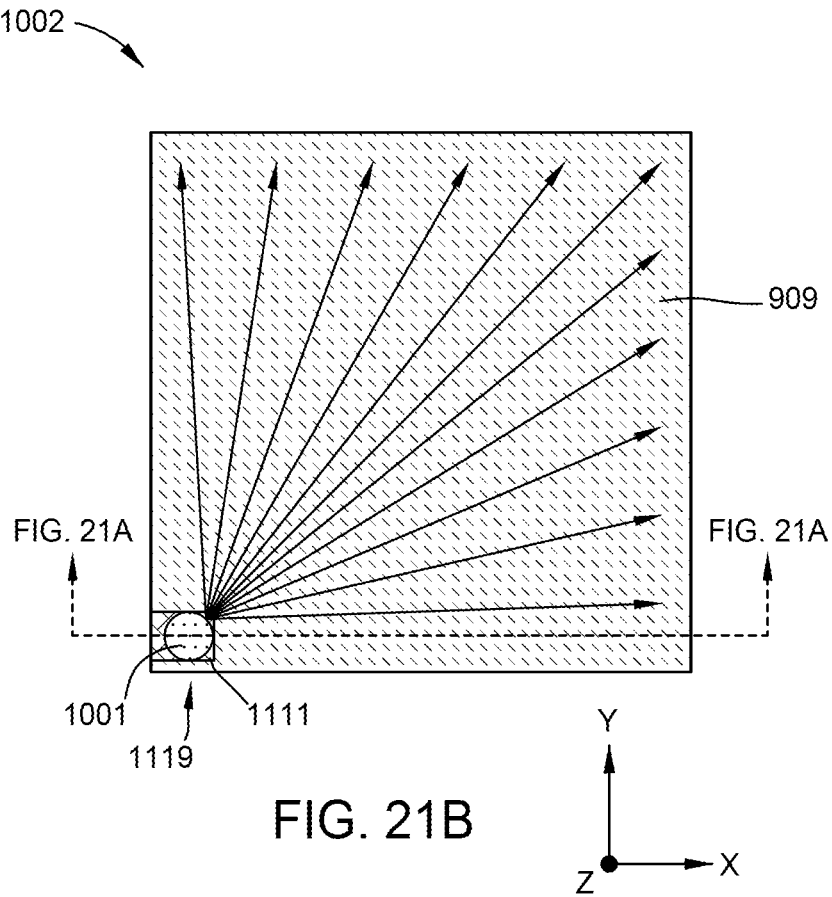
Figure 22A:
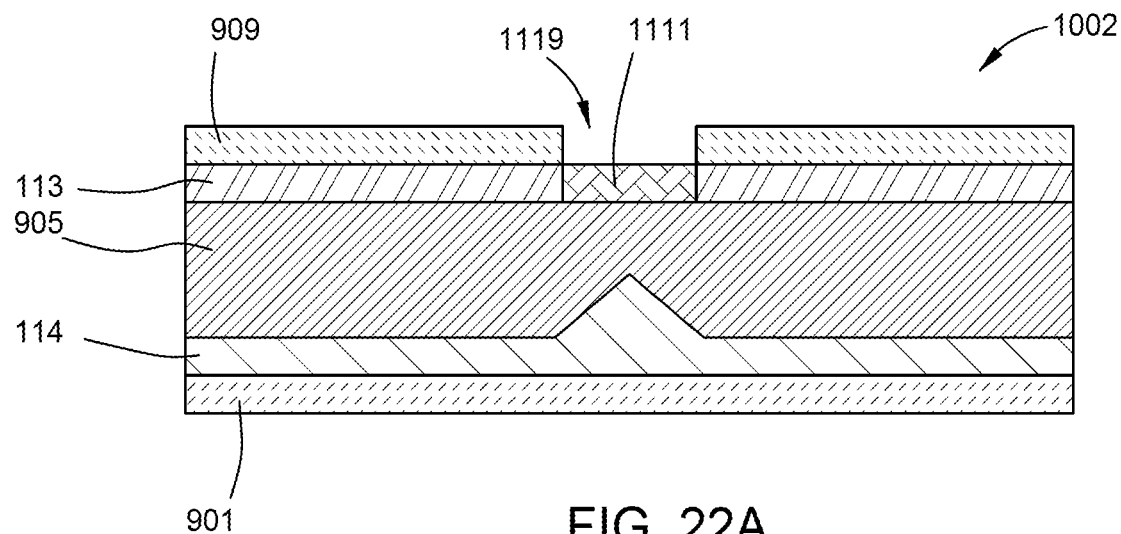
FIGS. 22A and 22B are simplified diagrams showing side views of a photodiode die according to another alternative embodiment of the present disclosure.
Figure 22B:
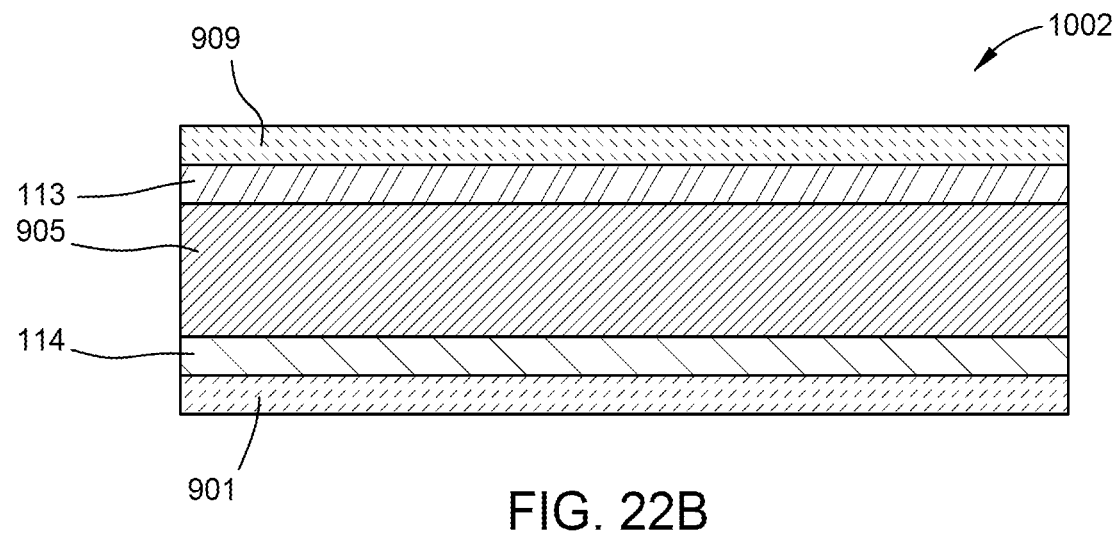
Figure 22C:
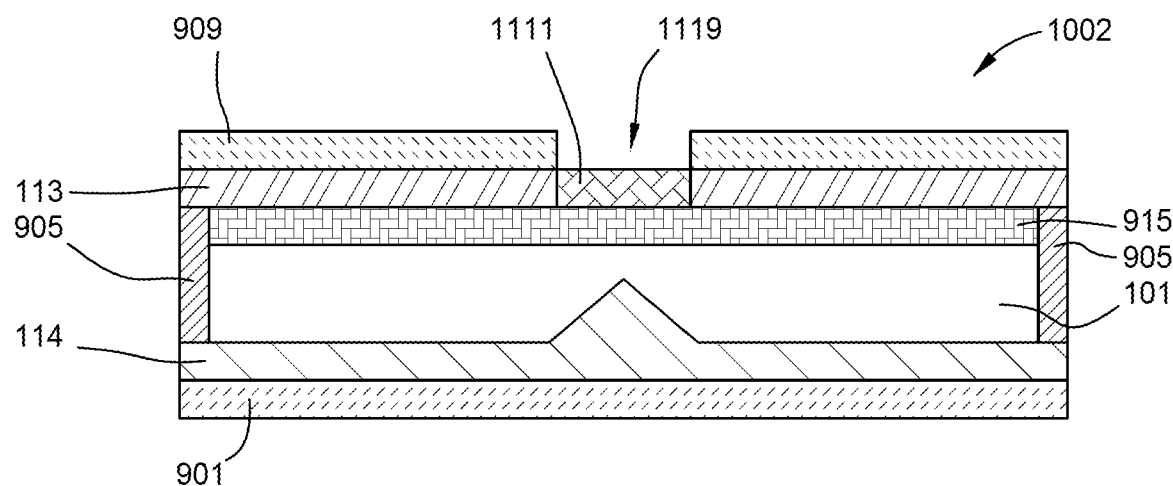
Figure 22D:
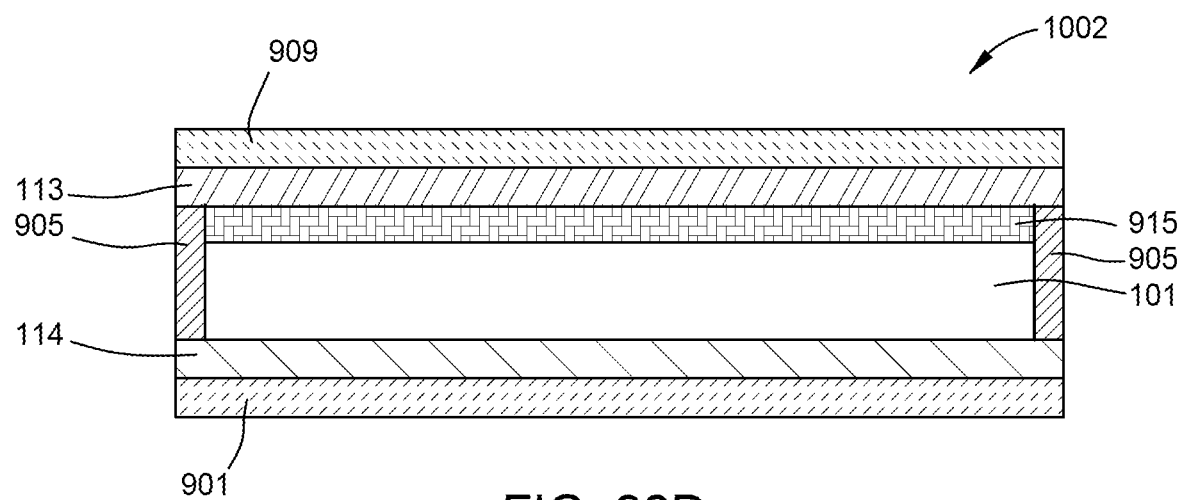
Figure 22E:
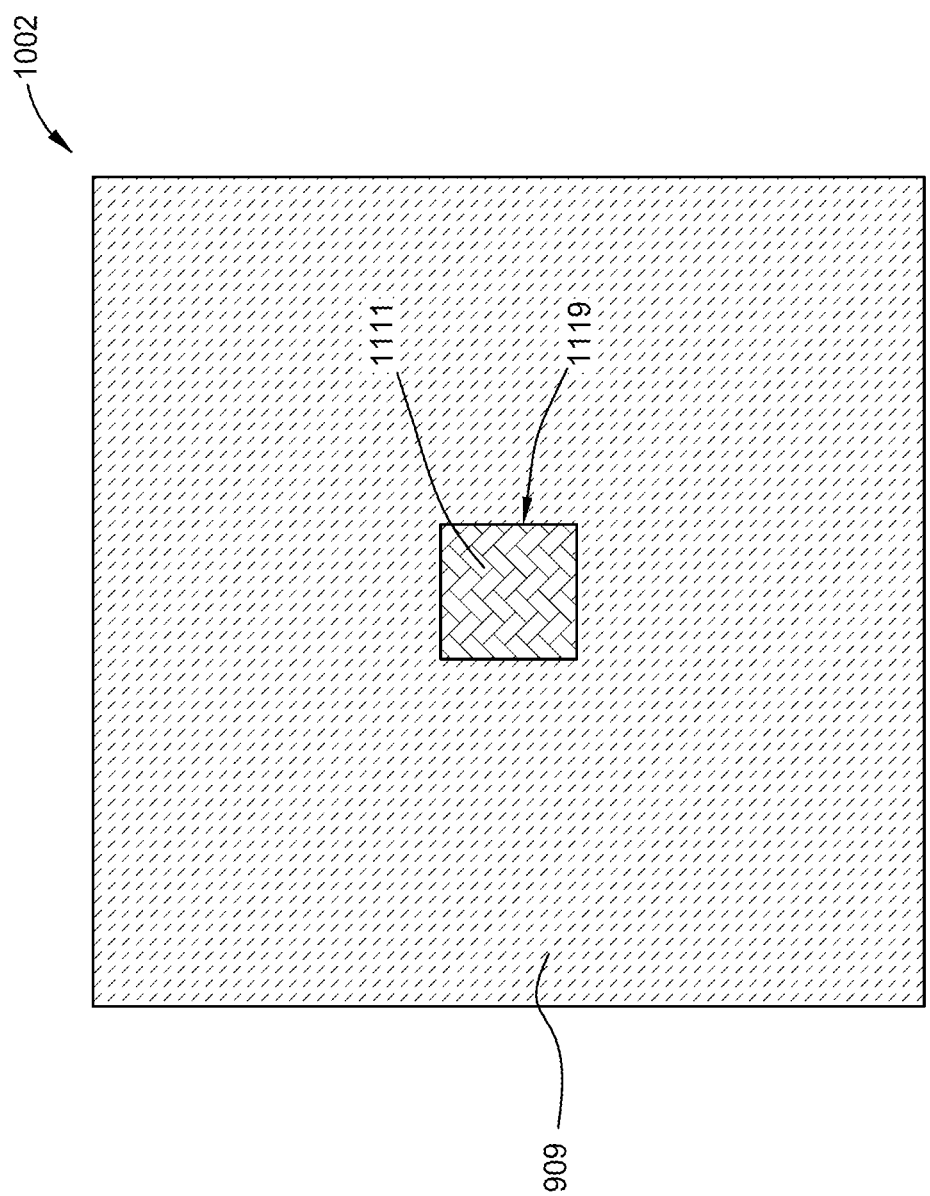
FIG. 22E is a simplified diagram showing a plan view of a photodiode die according to another alternative embodiment of the present disclosure.

FIGS. 21A and 21B are schematic illustrations of cross-sectional and plan views, respectively, of the light path from an optical fiber into the top/edge-illuminated photodiode die similar to the configuration shown in FIGS. 20A-20E. The fiber is coupled to the optical window with an anti-reflection coating 1111 at an angle $\gamma$ with respect to a surface normal of the photodiode die (cf. FIG. 21A). In certain embodiments, the value of $\gamma$ is chosen to be between 0 and about 60 degrees, between 0 and about 40 degrees, between 0 and about 20 degrees, or between 0 and about 5 degrees, or even between 0.1 and 5 degrees. Deviation of angle $\gamma$ from zero degrees causes the light that enters the photodiode die to undergo multiple reflections from the reflective p-type contact and from the reflective n-type contact. However, in this case, due to one or more nonplanar features in the reflector (e.g., n-side reflective electrical contact 114 layer in FIG. 21A) opposite the optical window (or entrance aperture) 1119 (FIGS. 20E and 21A-21B) formed in the p-side reflective electrical contact 113, light is reflected in various lateral directions away from the entrance aperture 1119 (FIG. 21B). In certain embodiments, total internal reflection may be exploited in the edge mirrors.

FIGS. 22A-22E show simplified schematic diagrams of side views, cross sections, and a plan view of a photodiode die for a packaged photodiode designed for top or bottom illumination at the center or in a middle position of the die. Edge passivation, anti-reflection coatings, edge reflection layers, and the like are similar to those described in conjunction with FIGS. 18A-18E except for the location of the optical window or entrance aperture to the photodiode die. However, in certain embodiments the backside of the substrate (e.g., heat sink 901 side), together with the n-side reflective electrical contact 114, is shaped so that light incident into the die though the optical window (i.e., entrance aperture 1119) with an anti-reflection coating 1111 is reflected back at a different angle, causing the light to spread laterally through the die via subsequent reflections with the reflective p-type and n-type layers. In certain embodiments, the reflective n-type electrical contact 114 has a conical or pyramidal feature formed therein so that light incident from the entrance aperture is reflected laterally in multiple directions away from the entrance aperture 1119.

The top (or bottom)-entrance die geometry illustrated in FIGS. 22A-22E may require fabrication that is somewhat more complicated than that of an edge-entrance design, which is discussed above (e.g., FIGS. 2, 13D, 14B, 17, 19A, etc.). For example, non-planar features must be placed in or formed on the substrate, either before or after deposition of the semiconductor and reflective p-type contact layers and before deposition of the reflective n-type layer. The non-planar features (e.g., hemispherical, pyramidal or conical) may be formed by at least one of lithography, laser ablation, grinding, wet etching, and dry etching. Residual surface damage from a laser, grinding, or dry etch process may be removed by wet etching. In certain embodiments the substrate is thinned before formation of the nonplanar features, for example, to a thickness below 300 micrometers, below 200 micrometers, below 100 micrometers, below 50 micrometers, or below 25 micrometers. Substrate thinning may be performed by at least one of lapping, grinding, polishing, chemical mechanical polishing, dry etching, and wet etching. In certain embodiments, the substrate 101 is removed from the device altogether.

FIGS. 18A-22E show die that have a predominantly rectangular or square perimeter. In other embodiments, the die has a triangular, trapezoidal, or hexagonal perimeter. In still other embodiments at least one portion of the edge of the die is curved, for example, following a circular or elliptical contour. Other perimeters are also possible and within the scope of this invention. In certain embodiments, one or more electrical contacts to the die are made at one or more of its edges in addition to or instead of to top or bottom surfaces.

In certain embodiments, one or more optical components are utilized to spread out optical radiation exiting from an optical fiber along at least one dimension prior to introduction into the photodiode. Such configurations may be useful, for example, to reduce the maximum carrier concentration in regions of the absorber layer near the entrance of optical radiation into the photodiode, reducing the extent of non-radiative Auger recombination and increasing the efficiency of the photodiode and of the optical system.

Figure 31E:
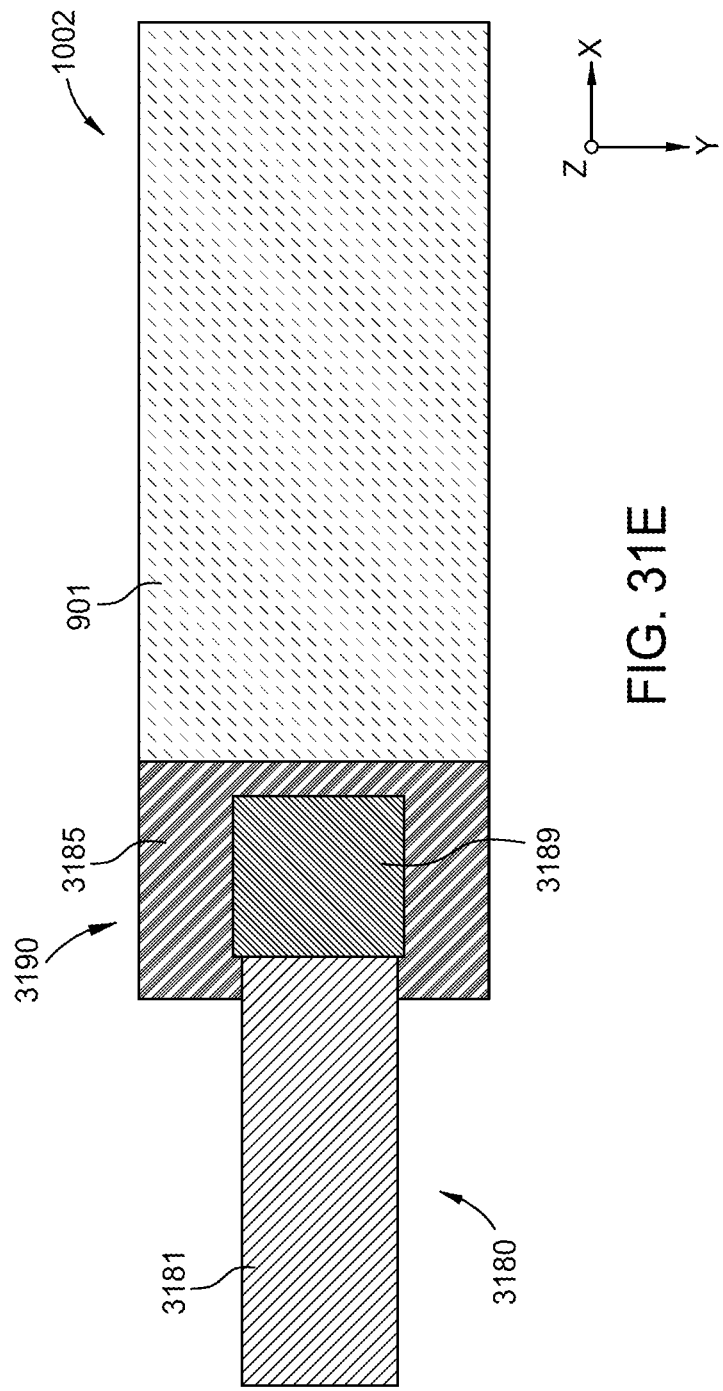
FIG. 31E is a simplified diagram showing a bottom view of a packaged photodiode coupled to an optical fiber according to an embodiment of the present disclosure.

FIGS. 31A-31E are simplified schematic diagrams of side views, cross sections, and top and bottom views of a packaged photodiode designed for side illumination through a corner or edge through an optical coupling member 3187 of an optical waveguide 3190. FIG. 31A is a side view of a packaged photodiode that is optically coupled to the optical fiber 3180, as viewed by the sectioning line shown in FIG. 31C. FIG. 31B is a side cross-sectional view of the packaged photodiode as viewed by the sectioning line shown in FIG. 31C. FIG. 31C is a top view of the packaged photodiode as viewed by the sectioning line shown in FIG. 31A. FIG. 31D is a top cross-sectional view of the packaged photodiode as viewed by the sectioning line shown in FIG. 31A. FIG. 31E is a bottom view of the packaged photodiode as viewed by the sectioning line shown in FIG. 31A.

Referring to FIG. 31A-31E, in certain embodiments, an optical waveguide 3190 or light pipe having a low optical absorption coefficient at a predetermined wavelength is coupled optically to both an optical fiber 3180 and a photodiode die 1002 of a photodiode package, spreading optical radiation exiting from the optical fiber 3180 in a lateral direction (i.e., Y direction) so as to homogenize the optical radiation intensity within the device cavity region 1669, enabling higher efficiency for a given optical power than a comparative design without the optical waveguide 3190.

An optical fiber 3180 may include fiber core 3183 and fiber cladding 3181 and may be positioned in close proximity to one edge of the photodiode die 1002 of the packaged photodiode by means of a fixture (e.g., fixture 3601 of FIG. 36), as is known in the art. The optical fiber 3180 includes a principal axis 3183A, which is the central axis of fiber core 3181, and is often referred to herein as a reference to a direction that radiation is emitted from the radiation emitting end 3182, which is often referred to herein as the first end, of the optical fiber 3180. Referring to FIG. 31B, in one example, the principal axis 3183A is parallel to the X-axis. The fiber core 3183 may include or consist of silica, glass, or plastic and the fiber cladding 3181 may include or consist of a dielectric composition, such as a glass or a plastic, having a lower refractive index than that of optical core 3183 in order to confine the optical radiation by total internal reflection, as is known in the art. At one location of the edge of the photodiode die 1002, the edge may be coated with an anti-reflection optical window layer 911, while the remainder of the perimeter may be coated with an edge reflector layer 905. The photodiode die 1002 may be attached to one or more of a lower heat sink 901 or an upper heat sink 909. The heat sink may include a layer and/or a plate or other shape that comprises at least one of copper, aluminum, or the like. The photodiode die 1002 may be attached to the heat sink 909 by one of a Au/Sn eutectic, a Au/Ge eutectic, or the like bonding layer. In preferred embodiments, optical coupling member 3187 is highly transparent at one or more wavelengths of the radiation that is absorbed by the absorber layer of the photodiode die 1002. In certain embodiments, optical coupling member 3187 consists of or includes one or more of silica glass, borosilicate glass, aluminosilicate glass, high-refractive-index glass, another glass composition, sapphire, quartz, zinc oxide, $MgAl_2O_4$ spinel, another crystalline composition, polycarbonate, polymethylmethacrylate, or another polymer composition. In certain embodiments, one or more surfaces of optical coupling member 3187 is coated with reflective coating 3185. Reflective coating 3185 may include one or more of silver, gold, platinum, nickel, aluminum, or a dielectric such as $TiO_2$, $Ta_2O_5$, $ZrO_2$, $SiO_2$, $SiO_x$, $SiN_x$, $Si_3N_4$, $SiO_xN_y$, $Al_2O_3$, or $MgF_2$. Reflective coating 3185 may have a reflectivity at a preselected wavelength greater than 85%, greater than 90%, greater than 95%, greater than 98%, or greater than 99% at the one or more wavelengths absorbed by the absorber layer. In some embodiments, the one or more wavelengths of the radiation are within a region between 400 nm and 550 nm. One or more of entrance aperture 3189 and the side of optical coupling member 3187 facing the photodiode die may be coated with an anti-reflection coating. The anti-reflection coating may include a material selected from a group including $MgF_2$, $SiO_2$, $Al_2O_3$, $HfO_2$, $LaTiO_3$, $Si_3N_4$ or $TiO_2$ and may be deposited by electron beam deposition, sputtering, or other suitable deposition techniques.

Referring to FIGS. 31A and 31B, optical radiation provided from the optical fiber 3180 is coupled into the device cavity region 1669 (FIG. 31B) of the photodiode die 1002 without significant spreading in the Z-direction, perpendicular to the semiconductor layers of the photodiode, with an angle that is determined by the geometry of optical coupling member 3187 and is chosen to enable high reflectivity from the reflective layers and multiple passes through the absorber layer for efficient optical absorption. As discussed herein, the device cavity region 1669 will include the active region that includes one or more semiconductor layers 915, such as one or more of the non-absorber, absorber, and p-type contact semiconductor layers, and the substrate 101. Referring to FIGS. 31C and 31D, optical radiation is coupled from the optical fiber 3180 is coupled into the device cavity region 1669 of the photodiode die 1002 with significant spreading in the direction parallel to the edge of the semiconductor layers 915 of the photodiode die 1002 (i.e., Y direction), with an angle that is determined by the geometry and shape of the optical coupling member 3187 and is chosen to enable significant spreading in the lateral dimension, a reduced carrier concentration in regions of the absorber layer close to the entrance aperture 3189, and a high conversion efficiency.

In alternative embodiments, entrance aperture 3189 is chosen to be convex vertically (i.e., in the Z-direction (not shown)), to collimate to collimate or lightly focus the optical radiation in the vertical direction, and concave in the lateral direction (i.e., Y direction (not shown)) to spread optical radiation more rapidly laterally. In certain embodiments, curvature is added to the radiation emitting end 3182 of the optical fiber 3180 to change the angular distribution of the emitted radiation. In certain embodiments, optical coupling member 3187 and/or the photodiode die 1002 are non-rectangular in the X-Y plane. In certain embodiments, an edge of the optical coupling member 3187 and/or the photodiode die 1002 are non-linear. The optimal design will depend on photodiode parameters such as substrate absorption coefficient, substrate refractive index, active region effective absorption coefficient and thickness, n and p contact reflectivities, edge reflectance, and the like. The material for optical coupling member 3187 may be chosen for a close match to the refractive index of the device cavity region 1669, in which case anti-reflection optical window layer 911 disposed over the optical window 912 may not be needed.

Figure 32:
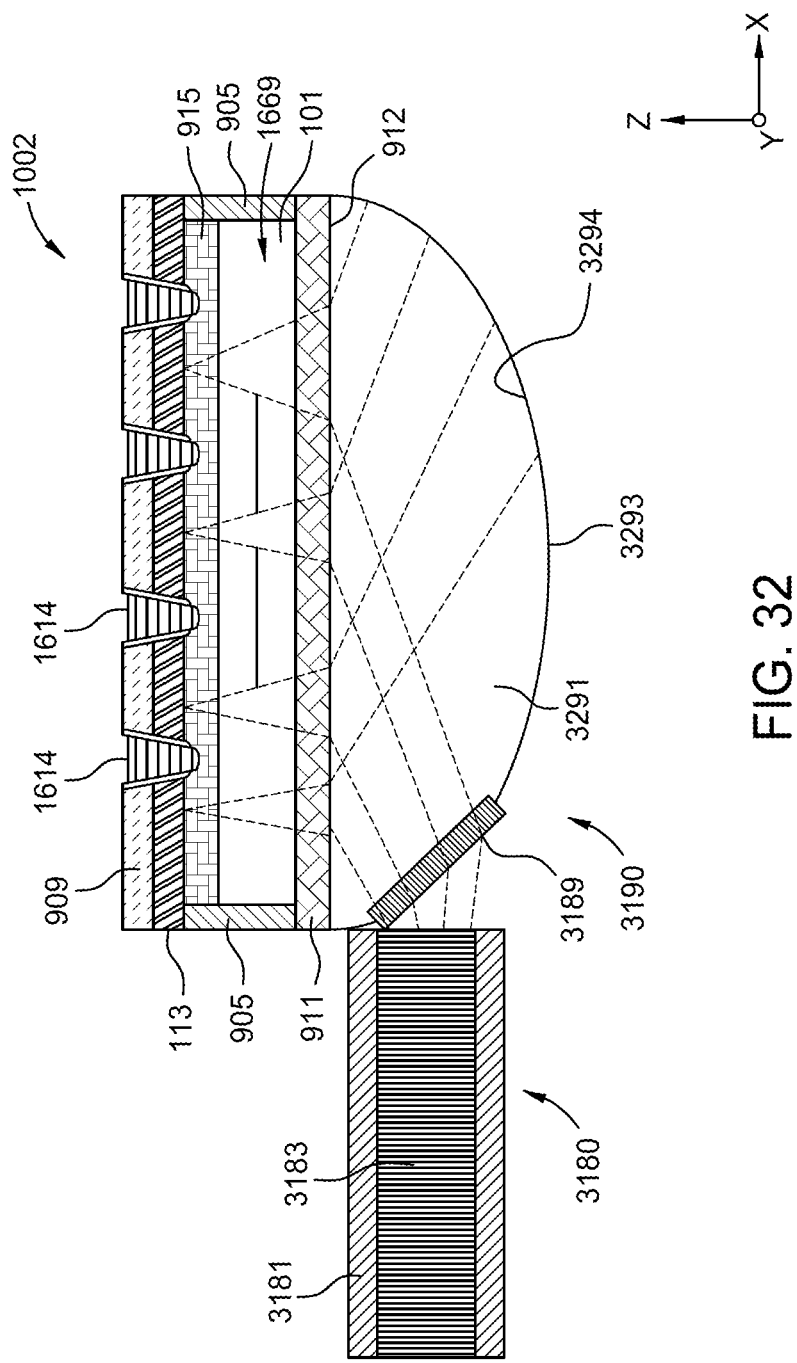
FIG. 32 is a simplified diagram showing a side-cross-sectional view of a packaged photodiode coupled to an optical fiber according to an embodiment of the present disclosure.

In another set of embodiments, as shown schematically in FIG. 32, optical radiation is coupled from fiber core 3183 into the photodiode die 1002 by means of an integrating sphere 3293. Optical radiation may enter cavity 3291 of integrating sphere 3293 through the entrance aperture 3189 and may impinge on anti-reflection optical window layer 911 of the optical window 912 disposed at the entrance to the device cavity region 1669. In certain embodiments, integrating sphere 3293 has a shape that is a section of a sphere, an ellipsoid, a paraboloid, or other non-spherical shape. Optical radiation from device cavity region 1669 may pass through semiconductor layers 915 and substrate 101, if present, reflect from p-side reflective electrical contact 113, exit device cavity region 1669, and impinge on an interior surface 3294 of the integrating sphere 3293. In certain embodiments, reflection on an interior surface 3294 of integrating sphere 3293 is diffuse, due to the incorporation of a coating, surface texture, surface features or other light distributing features. In certain embodiments, the interior surface 3294 of integrating sphere 3293 is coated with a diffuse reflector, which may include or consist of titania (TiO$_2$). In certain embodiments, substrate 101 is removed, for example, as illustrated schematically in FIG. 14B. In some embodiments, such as that illustrated schematically in FIG. 32, the optical cavity region encompasses both the device cavity region 1669 and cavity 3291.

In certain embodiments, the geometry of entrance aperture 3189 and integrating sphere 3293 are chosen so that light entering cavity 3291 may undergo reflection from an interior surface 3294 of integrating sphere 3293 before impinging on anti-reflection optical window layer 911. In certain embodiments aperture 3189 includes or consists of a transparent window, which may contain an anti-reflection coating (not shown). In certain embodiments, cavity 3291 is filled with a transparent liquid or gas rather than air. In certain embodiments, the transparent liquid or gas includes or consists of one or more of a silicone, an epoxy, a perfluorinated compound, and a polymer. In certain embodiments, cavity 3291 is maintained at a sub-atmospheric pressure to avoid scattering of the optical radiation. In certain embodiments, the photodiode is flip-chipped and n-side electrical connections are made through n-type contacts 1614, as illustrated schematically in more detail in FIGS. 17A and 17B.

Figure 33A:
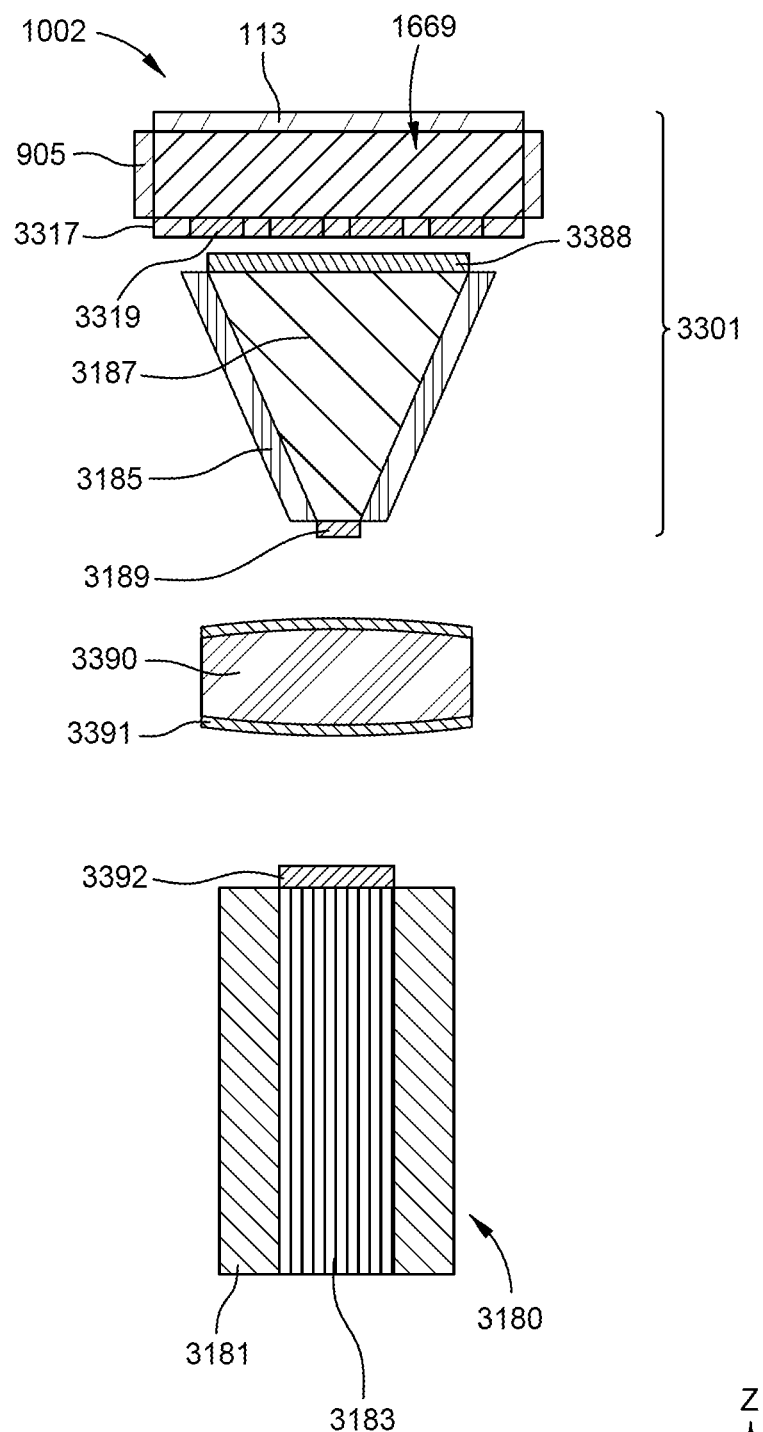
Figure 33C:
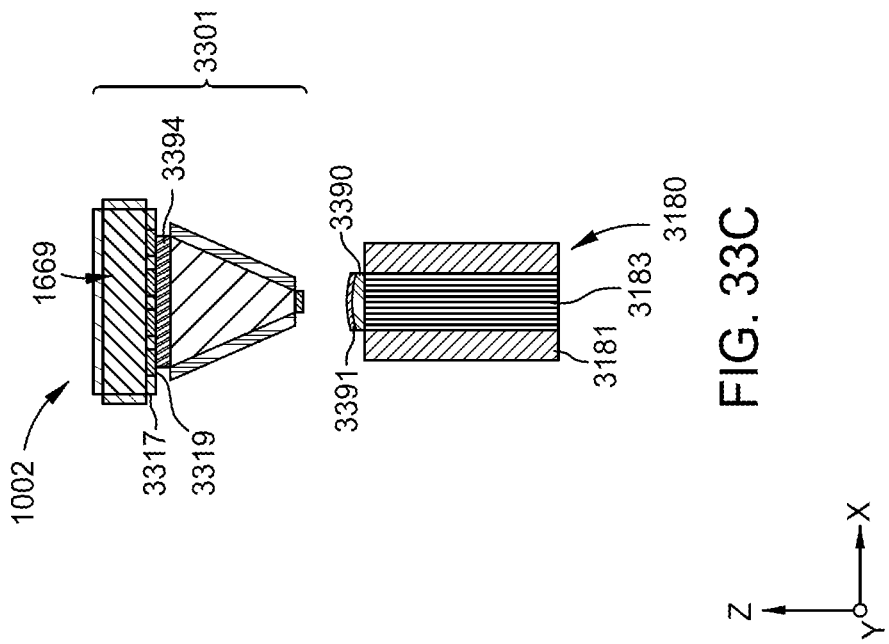
Figure 33B:
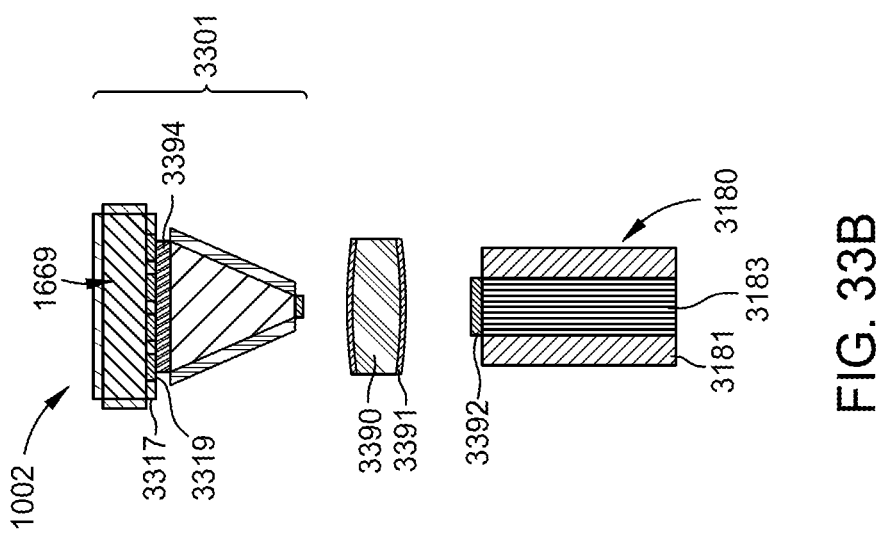

In another set of embodiments, optical radiation at the one or more wavelengths that is provided from an optical fiber is coupled through transparent openings in the n-side electrical contact, such as the n-side reflective electrical contact 3317 shown schematically in FIGS. 33A-33I. FIGS. 33A-33I are simplified side views of a packaged photodiode designed for illumination through a surface of the photodiode die 1002 that includes the n-side reflective electrical contact. Referring to FIG. 33A, in certain embodiments device cavity region 1669 of photodiode die 1002 consists of or includes substrate 101 and the semiconductor layers 915. The optical cavity region 3301, as described below, may include the device cavity region 1669. In some embodiments, such as shown schematically in FIGS. 13C and 14B, substrate 101 has been removed and device cavity region 1669 may include semiconductor layers 915, such as p-type layer 111, second non-absorber layer 109, absorber layer 105, and n-type non-absorber layer 103 bonded to p-type reflective contact 113 or p-side reflective layer 1315 but may not include a separate optically transmissive member (FIG. 14B). Photodiode die 1002 may include n-side reflective electrical contact 3317 and dielectric layer 3319 that are disposed on a surface of the photodiode die 1002. In preferred embodiments, n-side reflective electrical contact 3317 has a gridded structure, with an open area greater than 50%, greater than 75%, greater than 80%, greater than 90%, or greater than 95% in a plane that is parallel to the side of the photodiode die 1002 that includes the n-side electrical contact (e.g., X-Y plane), and is highly reflective. The openings formed in n-side reflective electrical contact 3317 may be filled with dielectric layer 3319, which may consist of or include an anti-reflection coating. Optical coupling member 3187 may have reflective coating 3185 covering most of its periphery, with anti-reflection coatings on entrance aperture 3189 and on exit aperture 3388. Optical coupling member 3187 may have a conical, square-pyramidal, rectangular-pyramidal, triangular-pyramidal, hexagonal-pyramidal, cubic, rectangular-prism, spherical, ellipsoidal, paraboloidal, or other similar shape. Optical radiation from optical fiber core 3183 may be focused by fiber coupling lens 3390 onto entrance aperture of optical coupling member 3187. One or both large-area surfaces of fiber coupling lens 3390 may be covered with an anti-reflection coating 3391 (e.g., MgF$_2$). In certain embodiments, an anti-reflection coating 3392 is present on the emitting end of fiber core 3183. In embodiments described by FIG. 33A, optical coupling member 3187 functions as a portion of the optical cavity region 3301, which includes the device cavity region 1669, in which optical radiation incident through entrance aperture 3189 undergoes multiple reflections as it undergoes optical absorption within absorber layer 107, and optical radiation may undergo multiple passes through dielectric layer 3319 and exit aperture 3388. Similarly, optical radiation that is emitted (e.g., luminescent light) within absorber layer 107, that is, where electrons and holes recombine radiatively rather than being separated and collected by the p-side reflective electrical contact 113 and the n-side reflective electrical contact 3317, may undergo multiple reflections within the optical cavity before being re-absorbed within absorber layer 107 (so-called photon recycling). The use of fiber coupling lens 3390 enables optical radiation from optical fiber core 3183 to be focused onto an area smaller than the cross sectional area of the fiber core, enabling entrance aperture 3189 to be relatively small and to minimize loss of reflected or luminescent optical radiation outward through entrance aperture 3189. When the medium between the fiber coupling lens and the focal plane has a refractive index of 1, the focused area can be reduced by up to a factor of $NA^{-2}$, relative to the area of the fiber core, where NA is the numerical aperture of the optical fiber.

Variations of this approach, where optical radiation is coupled into the photodiode die 1002 through the n-side reflective electrical contact 3317 rather than through an optical window 912, 1119 on the edge or top of the device, are possible. For example, a transparent, index-matched adhesive 3394 may be provided between optical coupling member 3187 and n-side reflective electrical contact 3317 and dielectric layer 3319, as shown schematically in FIGS. 33B-33E. Fiber coupling lens 3390 may be provided on the end of optical fiber core 3183 rather than as a discrete element, as shown schematically in FIG. 33C. Fiber coupling lens 3390 may be omitted, as shown schematically in FIGS. 33D and 33E. Optical radiation may pass from optical fiber core 3183 into entrance aperture 3189 through a transparent, index-matched adhesive 3394, as shown schematically in FIG. 33D, or through anti-reflection coating 3392 on the end of fiber core 3183, as shown schematically in FIG. 33E. In alternative embodiments, optical radiation may be coupled into the photodiode die 1002 through openings in the p-side reflective electrical contact rather than through openings in the n-side reflective electrical contact.

Rather than coupling optical radiation from an optical fiber 3180 into a relatively large area through many openings in the n-side reflective electrical contact 3317, as in FIGS. 33A-33E, the optical radiation may be coupled into photodiode entrance aperture 3396 in n-side reflective electrical contact 114, as shown schematically in FIGS. 33F-33I. Photodiode entrance aperture 3396 may be coated with an anti-reflection layer (not shown), similar to the anti-reflection optical window layer 911 of the optical window 912 described above in the discussion of FIGS. 18A-22E. In these embodiments the optical cavity region 3301 encompasses device cavity region 1669, but not an external integrating optical cavity. In preferred versions of this embodiment, device cavity region 1669 includes at least one of a substrate or an optically transmissive member, as described above. Optical radiation from optical fiber core 3183 may be focused onto photodiode entrance aperture 3396 by fiber coupling lens 3390, either as a free-standing element (FIG. 33F) or coupled to the end of optical fiber core 3183 (FIG. 33G). Alternatively, optical radiation from optical fiber core 3183 may be coupled directly to entrance aperture 3396, through an anti-reflection coating 3392 on the end of optical fiber core 3183 (FIG. 33H) or through a transparent, index-matched adhesive 3394 (FIG. 33I). In certain embodiments, the area of the optical window, or photodiode entrance aperture on the edge of photodiode die 1002, is between about 1% and about 20%, or between 2% and about 10%, of the area of the edge of photodiode die 1002.

Figure 34C:
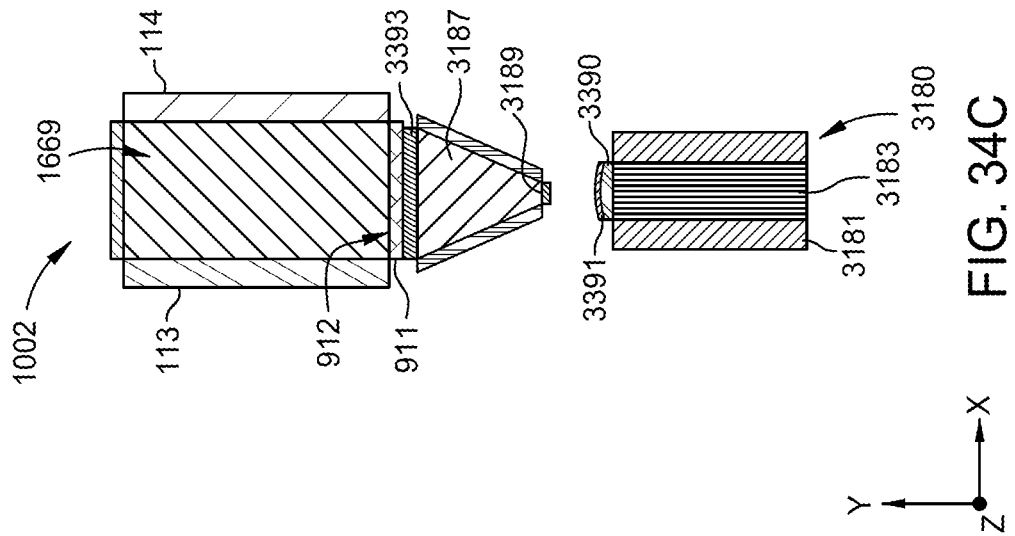
FIGS. 34A-34I are simplified diagrams showing side cross sectional views of a packaged photodiode coupled to an optical fiber according to alternate embodiments of the present disclosure.
Figure 34B:
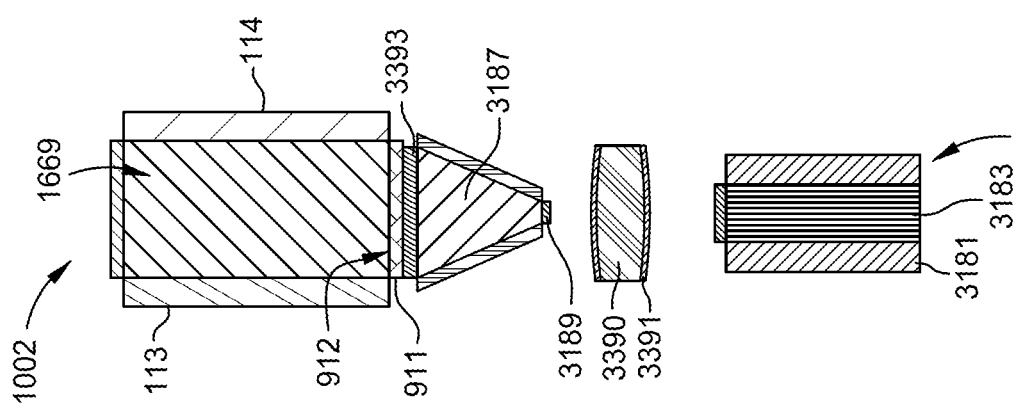
Figure 34A:
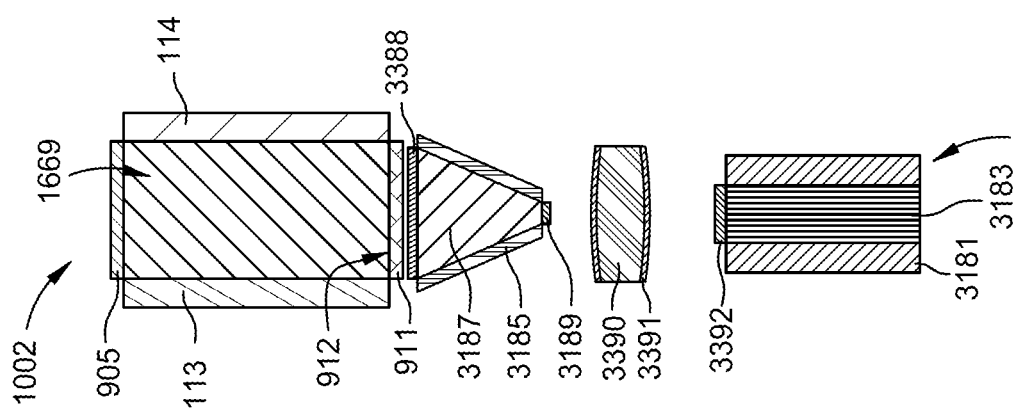
Figure 34F:
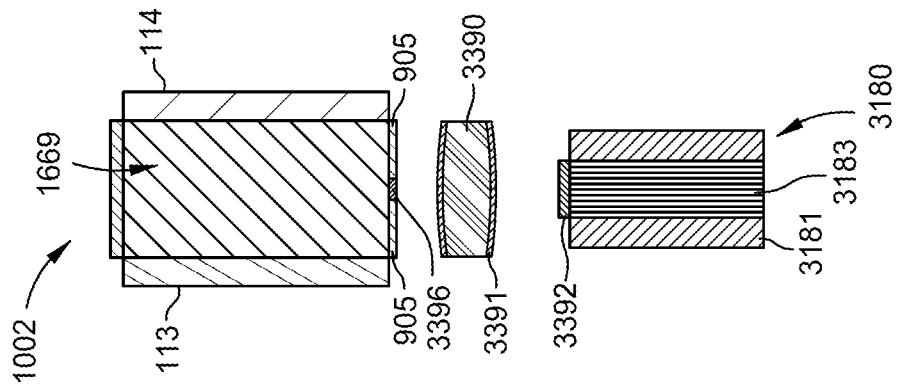
Figure 34E:
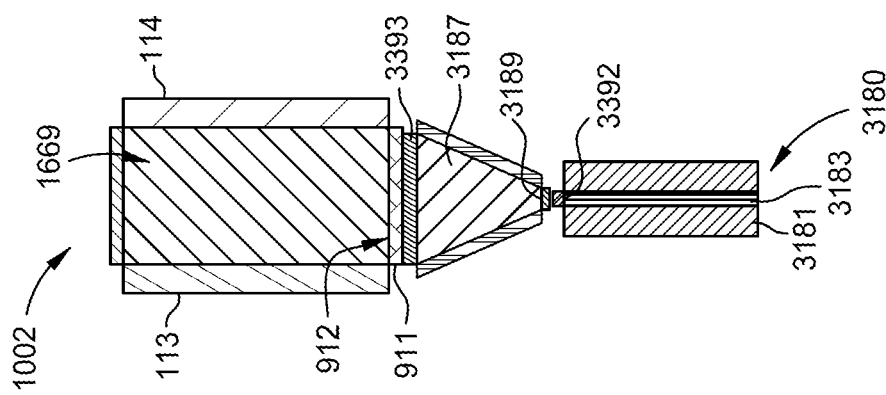
Figure 34D:
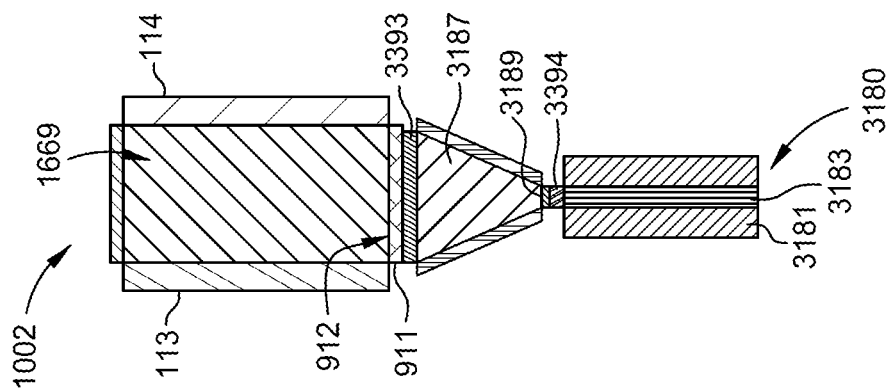

In still another set of embodiments, optical radiation is coupled from an optical fiber 3180 to an optical window 912 on an edge of the photodiode die 1002 using additional optical elements, as shown schematically in FIGS. 34A-34I. In one or more of the embodiments disclosed herein, the area of the optical window 912 can be between about one percent and about twenty percent of the surface area of the edge of the photodiode die 1002. In one or more alternate embodiments, the area of the optical window 912 can be greater than 20 percent, such as greater than 50 percent, or between 50 and 100 percent, or even between 80 and 99.9 percent of the surface area of the edge or side of the photodiode die 1002. FIGS. 34A-34I are simplified side cross-sectional views of a packaged photodiode designed for illumination through an edge of the photodiode die 1002. Referring to FIG. 34A, the device cavity region 1669 includes a substrate or optically transmissive member 3401 and semiconductor layers 915 (not shown), similar to FIG. 31A-E. Photodiode die 1002 may include n-side reflective electrical contact 114 and p-side reflective electrical contact 113. Optical coupling member 3187 may have reflective coating 3185 covering most of its periphery, with anti-reflection coatings on entrance aperture 3189 and exit aperture 3388. Optical coupling member 3187 may have a conical, square-pyramidal, rectangular-pyramidal, triangular-pyramidal, hexagonal-pyramidal, cubic, rectangular-prism, spherical, ellipsoidal, paraboloidal, or other similar shape. Optical radiation from optical fiber core 3183 may be focused by fiber coupling lens 3390 onto entrance aperture 3189 of optical coupling member 3187 and then enter optically transmissive member 3401 through optical window 912, which may include an anti-reflection optical window layer 911. One or both large-area surfaces of fiber coupling lens 3390 may be covered with an anti-reflection coating 3391. In certain embodiments, an anti-reflection coating 3392 is present on the radiation-emitting end of fiber core 3183. In embodiments described by FIG. 34A, optical coupling member 3187 functions as a portion of the optical cavity region 3301, along with substrate or device cavity region 1669, in which optical radiation incident through entrance aperture 3189 undergoes multiple reflections as it undergoes optical absorption within absorber layer 107 (not shown). Similarly, optical radiation that is emitted within absorber layer 107, that is, where electrons and holes recombine radiatively rather than being separated and collected by the p-side reflective electrical contact 113 and the n-side reflective electrical contact 114, may undergo multiple reflections within the optical cavity region before being re-absorbed within absorber layer 107 (so-called photon recycling). The use of fiber coupling lens 3390 enables optical radiation from optical fiber core 3183 to be focused onto a small area, enabling entrance aperture 3189 to be relatively small and to minimize loss of reflected optical radiation outward through entrance aperture 3189.

Variations of this approach, where optical radiation is coupled into the photodiode die 1002 through an optical window 912 on the edge of the photodiode die 1002 are possible. For example, a transparent, index-matched adhesive 3394 may be provided between optical coupling member 3187 and optical window 912, as shown schematically in FIGS. 34B-34E. Fiber coupling lens 3390 may be provided on the end of optical fiber core 3183 rather than as a discrete element, as shown schematically in FIG. 34C. Fiber coupling lens 3390 may be omitted, as shown schematically in FIGS. 34D and 34E. Optical radiation may pass from optical fiber core 3183 into entrance aperture 3189 through a transparent, index-matched adhesive 3394, as shown schematically in FIG. 34D, or through anti-reflection coating 3392 on the end of fiber core 3183, as shown schematically in FIG. 34E.

Figure 34I:
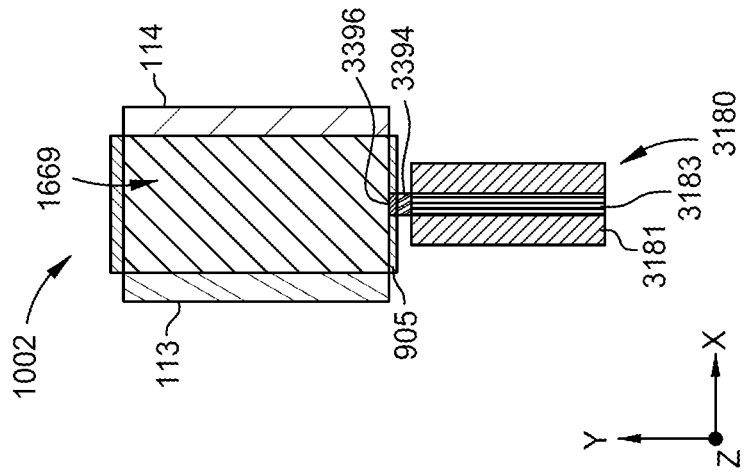
Figure 34H:
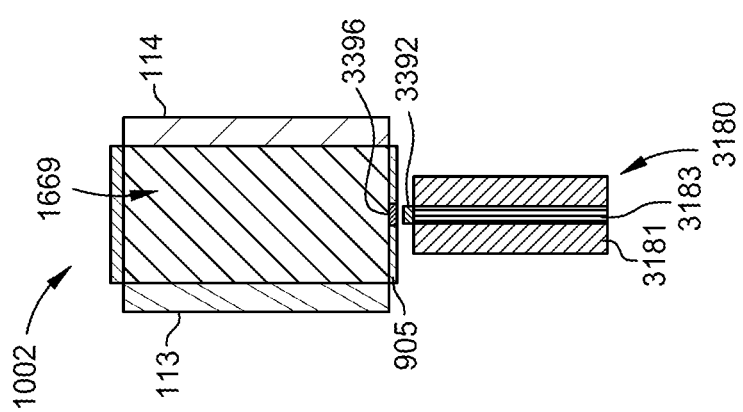
Figure 34G:
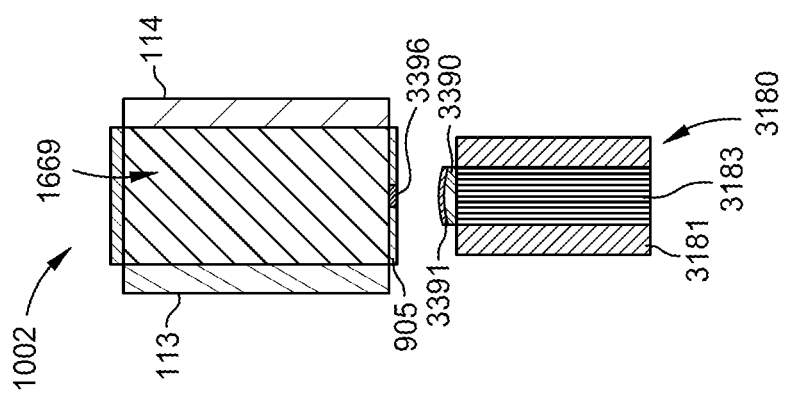

Rather than coupling optical radiation from an optical fiber 3180 into a relatively large area at an edge of the photodiode die 1002, as in FIGS. 34A-34E, the optical radiation may be coupled into photodiode entrance aperture 3396, as shown schematically in FIGS. 34F-34I. In some configurations, the edge of the photodiode die 1002 will include photodiode entrance aperture 3396 that is surrounded by an edge reflector layer 905. Photodiode entrance aperture 3396 may be coated with an anti-reflection layer (not shown), similar to the anti-reflection optical window layer 911 of the optical window 912 described above in the discussion of FIGS. 18A-22E. In these embodiments the optical cavity region 3301 encompasses device cavity region 1669, but not an external integrating optical cavity. In some preferred versions of this embodiment, device cavity region 1669 includes at least one of a substrate or an optically transmissive member, as described above. In alternative versions of this embodiment, the optical cavity region 3301 encompasses a second optically transmissive member 2101, as shown schematically in FIGS. 27A and 27B, and may or may not include a substrate 101 or a first optically transmissive member. Optical radiation from optical fiber core 3183 may be focused onto photodiode entrance aperture 3396 by fiber coupling lens 3390, either as a free-standing element (FIG. 34F) or coupled to the end of optical fiber core 3183 (FIG. 34G). Alternatively, optical radiation from optical fiber core 3183 may be coupled directly to entrance aperture 3396, through an anti-reflection coating 3392 on the end of optical fiber core 3183 (FIG. 34H) or through transparent, index-matched adhesive 3394 (FIG. 34I).

Figure 23B:
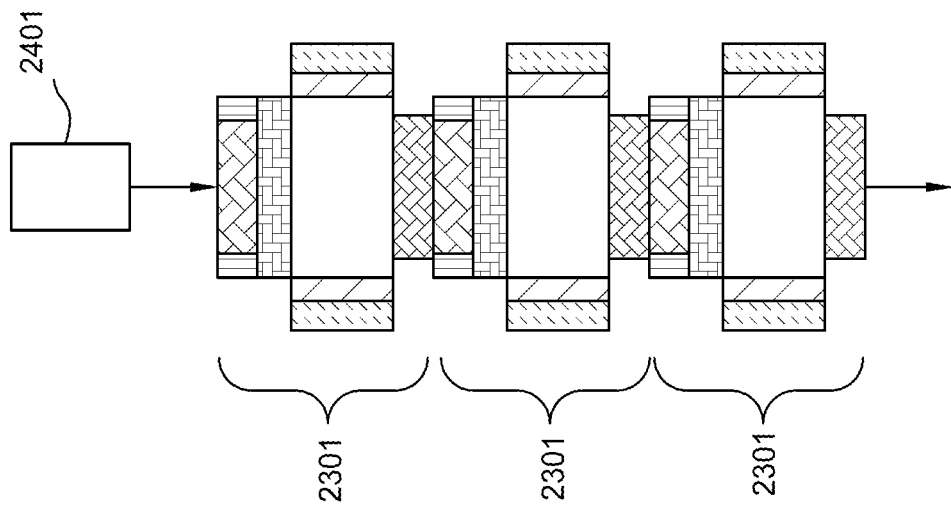
FIG. 23B is a simplified diagram showing a cross section of an array of photodiode dies according to yet another alternative embodiment of the present disclosure.
Figure 23A:
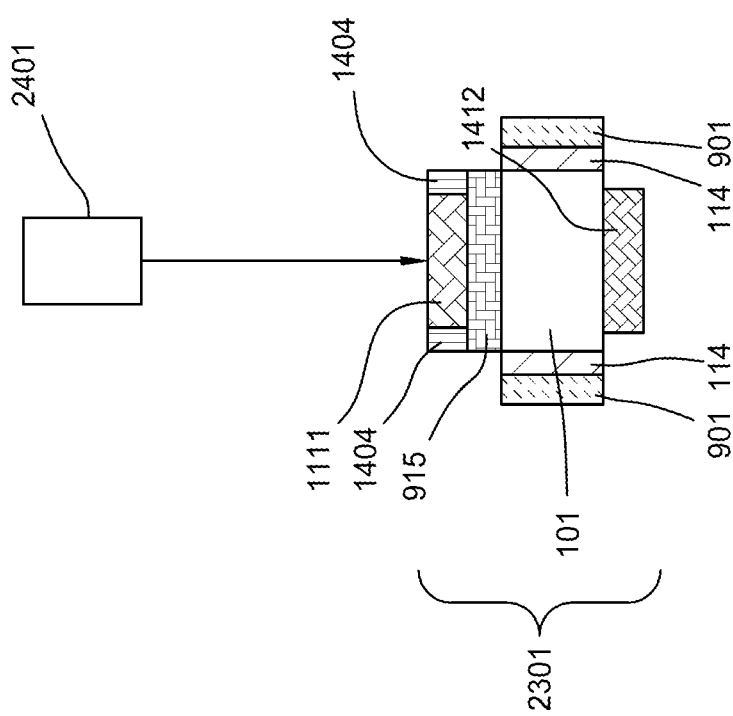
FIG. 23A is a simplified diagram showing a cross section of a photodiode die according to yet another alternative embodiment of the present disclosure.

In certain embodiments, a packaged photodiode is desired that can convert some, but not all, of the incident optical radiation energy from a fiber to electrical power. A schematic cross section of a photodiode assembly 2301 designed for extraction of only a fraction of incident optical radiation energy generated by a laser diode or optical fiber 2401 is shown in FIG. 23A. In certain embodiments, as illustrated in FIG. 23A, a photodiode assembly 2301 includes reflective edge layers 1404 but optical radiation is coupled from a fiber into the top (or bottom in some alternate configurations) of the photodiode die, through p-type contact 1111, semiconductor layers 915, through an optically transmissive member (e.g., the substrate 101), and through an output optical window 1412 into another adjacently positioned and similarly configured fiber (not shown). A number of such photodiode assemblies may be placed in series, such as vertically stacked, as illustrated in FIG. 23B. In some embodiments multiple photodiode assemblies in series have approximately the same peak absorption wavelength, as determined by the indium composition in the absorber layers. In alternative embodiments the photodiode assemblies are configured to absorb optical radiation at different wavelengths, for example, by varying the indium composition in the respective absorber layers.

Figure 26:
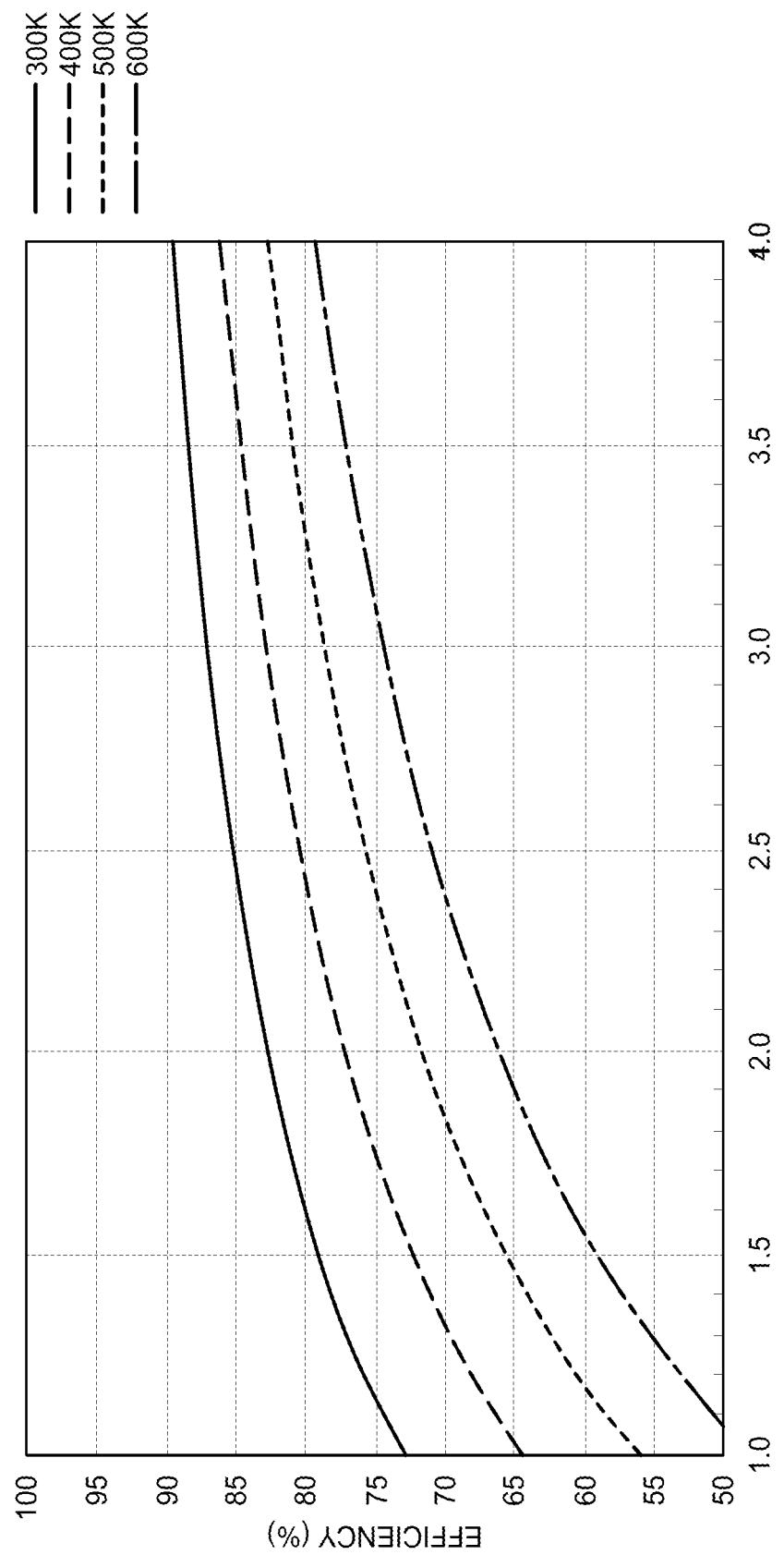
FIG. 26 is a simplified diagram showing detailed-balance model efficiency calculations as a function of semiconductor bandgap at temperatures of 300, 400, 500, and 600 degrees Kelvin.

As noted above, a nitride-based packaged photodiode, operating at visible wavelengths, is expected to have certain advantages over arsenide-based packaged photodiodes operating in the infrared. FIG. 26 shows a schematic illustration of comparative efficiencies as a function of bandgap energy including the energies of nitride-based and arsenide-based packaged photodiodes. The efficiency is calculated assuming the detailed-balanced limit of power packaged photodiodes operating under non-degenerate conditions with input photon energies slightly above the band gap, 100% optical absorption, and 100% external quantum efficiency, using an approach described by Shockley and Queisser [Journal of Applied Physics 32, 510 (1961)]. For simplicity the input power has been assumed to be 0.1 W and the area of the optical window has been assumed to be $10^{-5}$ m$^2$, but similar results are expected for a wide range of values of these parameters. In certain embodiments, the packaged photodiode will be used at approximately room temperature. As shown in FIG. 26, at a temperature of 300 Kelvin (room temperature) the theoretical limiting efficiency is 78.2% for a GaAs photodiode operating at a wavelength of 880 nanometers but 86.5% for an InGaN photodiode operating at a wavelength of 450 nanometers. The higher bandgap of InGaN compared to GaAs yields a higher efficiency due to the nature and shape of the Planck distribution. In certain embodiments, however, the photodiode will be employed at elevated temperatures, for example, 400 degrees Kelvin, 500 degrees Kelvin, or 600 degrees Kelvin, or at even higher temperatures. At a temperature of 400 degrees Kelvin the theoretical limiting efficiency is 71.2% for a GaAs photodiode operating at a wavelength of 880 nanometers but 82.0% for an InGaN photodiode operating at a wavelength of 450 nanometers. Although the absolute values of the efficiencies are lower at the higher temperature, the relative efficiency advantage of the InGaN photodiode over the GaAs photodiode increases from +10% to +15%. At a temperature of 500 degrees Kelvin the theoretical limiting efficiency is 64.2% for a GaAs photodiode operating at a wavelength of 880 nanometers but 77.6% for an InGaN photodiode operating at a wavelength of 450 nanometers. Although the absolute values of the efficiencies are lower the relative efficiency advantage of the InGaN photodiode over the GaAs photodiode has increased further to +21%. At a temperature of 600 degrees Kelvin the theoretical limiting efficiency is 57.4% for a GaAs photodiode operating at a wavelength of 880 nanometers but 73.2% for an InGaN photodiode operating at a wavelength of 450 nanometers. Although the absolute values of the efficiencies are lower the relative efficiency advantage of the InGaN photodiode over the GaAs photodiode has increased further to +28%.

Figure 24A:
FIGS. 24A, 24B, and 24C are simplified diagrams illustrating configurations of a power-over-fiber module according to several embodiments of the present disclosure.
Figure 24B:
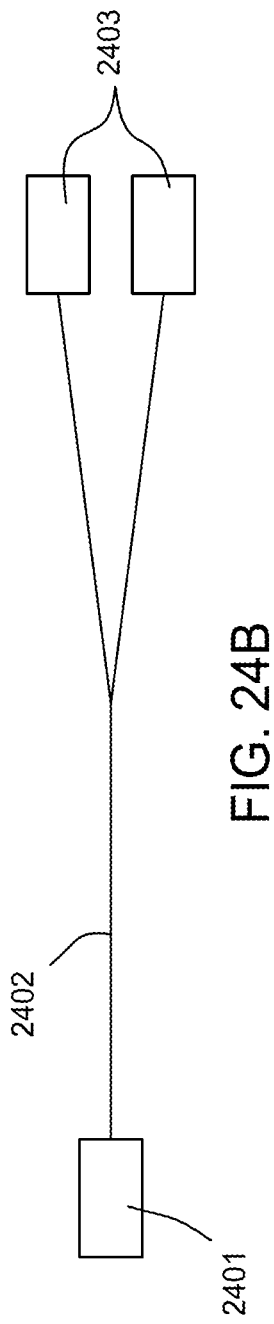
Figure 24C:
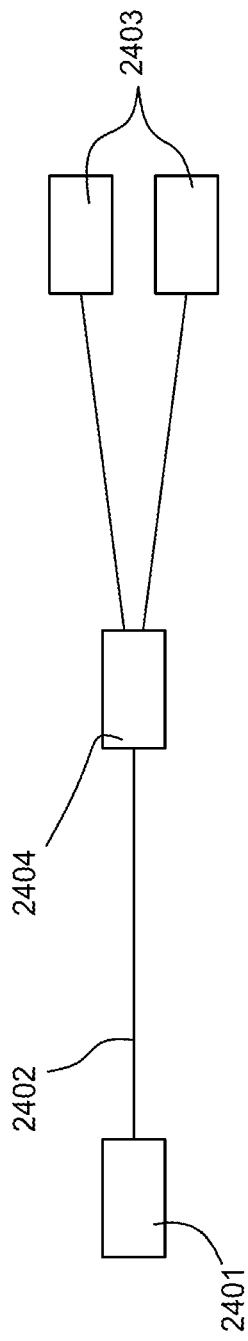

At least one packaged, nitride-based power photodiode may be incorporated into a power-over-fiber module. The power-over-fiber module includes at least one laser diode 2401 and at least one section of optical fiber 2402 that is coupled to at least one laser diode 2401 and also to at least one photodiode 2403, as shown schematically in FIGS. 24A-24C. In some embodiments, the optical fiber 2402 includes an optical fiber bundle. In certain embodiments the power-over-fiber module comprises only one laser diode 2401, one optical fiber 2402, and one photodiode 2403 (FIG. 24A). In certain embodiments, one or more branches are present in the optical fiber 2402 (or optical fiber bundle), with different optical fiber segments coupled to different photodiodes 2403 (FIG. 24B). In certain embodiments the power-over-fiber module comprises one or more optical dispensing devices 2404, where each optical dispensing device 2404 is capable of transmitting a controlled fraction of optical power to at least two output optical fiber branches (FIG. 24C). In some embodiments, the optical dispensing device 2404 includes or consists of at least one of one or more galvanometric mirrors, one or more micro scanning mirrors, one or more focusing lenses, and one or more optical beam splitters.

In certain embodiments the power-over-fiber module is designed simply to transmit power optically. In other embodiments, as shown schematically in FIGS. 25A-25D, the power-over-fiber module is designed to transmit both power and a signal. For example, a signal may be superimposed on the optical power by modulating the amplitude of the laser diode 2401 at one or more frequencies. In some embodiments, a control module is configured to modulate the emitted power of the laser diode at at least one controlled AC frequency and to separate the photodiode signal into a DC power component and an AC signal component at the at least one controlled frequency. An amplitude of the modulated AC component of the modulated laser diode power and power of the photodiode power can be less than 10%, less than 1%, or less than 0.1% of the corresponding DC components. The first photodiode, which is configured to convert the DC power component into electrical power, can be further configured to detect the AC signal component at the at least one controlled frequency. In some embodiments, a separate signal photodetector device is provided, wherein the separate signal photodetector device is configured to detect the AC signal component at the at least one controlled frequency.

Figure 25D:
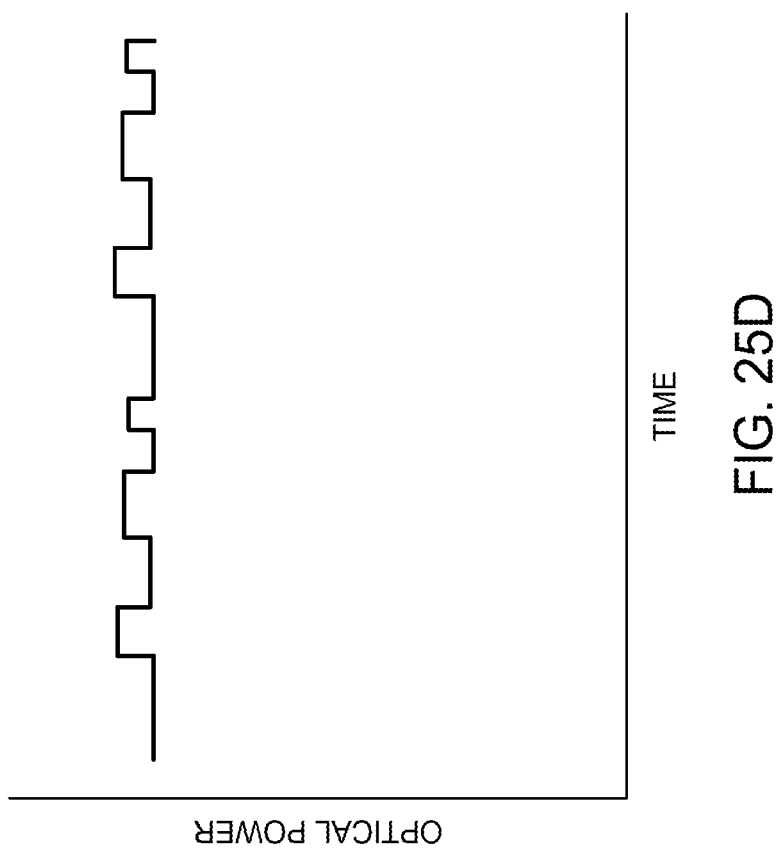

An amplifier system coupled to the photodiode then extracts the signal or signals at one or more frequencies. In certain embodiments, the power-over-fiber module comprises at least two laser diodes 2401 and 2405 and at least two photodiodes 2403 and 2404, and is configured to enable signal communication in at least two different directions (FIG. 25C). In certain embodiments, the signal is modulated at audio frequencies and the output is coupled to an audio device such as a headphone or a speaker. In certain embodiments, the AC signal component is modulated at an audio frequency and the module is coupled to a headphone or to an audio speaker. In certain embodiments the signal is modulated at kilohertz, megahertz or gigahertz frequencies (FIG. 25D).

In certain embodiments, the modulated signal is detected using the same GaN-based photodiode device that also converts optical power to electrical power. In alternative embodiments, a separate, signal photodetector device is used to convert a portion of the modulated optical signal to a modulated electrical signal. In certain embodiments, the separate, signal photodetector device is selected from a GaN-based photodiode, a Si-based photodiode, an avalanche photodiode, an InGaAs-based photodiode, and an InP-based photodiode. In certain embodiments, the separate, signal photodetector device is edge-coupled or incorporates a resonant cavity region or refracting facet. In certain embodiments the separate, signal photodetector device has a bandwidth of at least 1 MHz, at least 10 MHz, at least 100 MHz, at least 1 GHz, at least 10 GHz, at least 25 GHz, or at least 100 GHz. In certain embodiments the separate, signal photodetector device is mounted to and receives modulated optical signal from the same optical cavity region from which a GaN-based photodiode receives DC optical power. In certain embodiments, the separate, signal photodetector device receives signal from an optical fiber connected to the same network as the GaN-based power photodiode. In certain embodiments, the separate, signal photodetector device is optically decoupled from the GaN-based power photodiode, so that stray light emission from the latter does not degrade the bandwidth of the former. In certain embodiments, a small fraction of the optical radiation from the optical fiber is routed to the separate photodetector device and the remaining, large fraction, optical radiation is routed to the GaN-based power photodiode.

FIGS. 35A-35F are simplified diagrams showing side cross sectional views of a packaged photodiode and a separate, signal photodetector device 3595 coupled to an optical fiber, according to embodiments of the present disclosure. In some embodiments, optical radiation emitted from optical fiber 3180 is reflected from signal photodetector device 3595 prior to being routed to photodiode die 1002 by fiber coupling lens 3390 into entrance aperture 3189 of optical coupling member 3187, as shown schematically in FIG. 35A. In certain embodiments, signal photodetector device 3595 has a high-reflectivity coating 3596 that allows only a small portion of the incident optical radiation into signal photodetector device 3595. In certain embodiments, the reflectivity of high-reflectivity coating 3596 is greater than 90%, greater than 95%, greater than 97%, or greater than 98%. In certain embodiments, high-reflectivity coating 3596 includes one or more of a metal, such as silver, and a dielectric.

In certain embodiments, a second fiber coupling lens 3390 is used to focus optical radiation from optical fiber 3180 onto signal photodetector device 3595 (FIG. 35B), enabling the use of small lateral dimensions of signal photodetector device 3595, which may reduce the capacitance and increase the bandwidth of the latter. In certain embodiments, a lateral dimension of signal photodetector device 3595 is less than 1 millimeter, less than 300 micrometers, less than 200 micrometers, less than 100 micrometers, or less than 50 micrometers. In certain embodiments, signal photodetector device 3595 samples optical radiation through an aperture 3598 in reflective coating 3185 on optical coupling member 3187, as shown schematically in FIGS. 35C-35F. In certain embodiments, a small internal reflector 3597 contained within optical coupling member 3187 reflects a portion of the optical radiation toward aperture 3598. In certain embodiments, internal reflector 3597 includes one or more of a metal, such as silver, and a dielectric. In certain embodiments, internal reflector 3597 includes a bubble or void within optical coupling member 3187. In certain embodiments, a maximum dimension of internal reflector 3597 is less than about 2 millimeters, less than about 1 millimeter, less than about 500 micrometers, less than about 200 micrometers, less than about 100 micrometers, or less than about 50 micrometers.

Figure 35C:
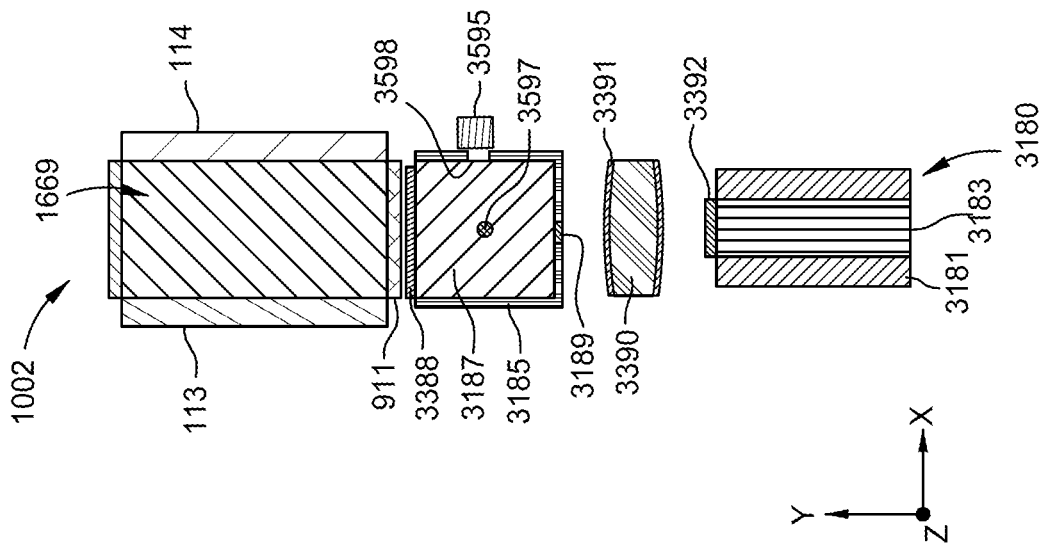
Figure 35B:
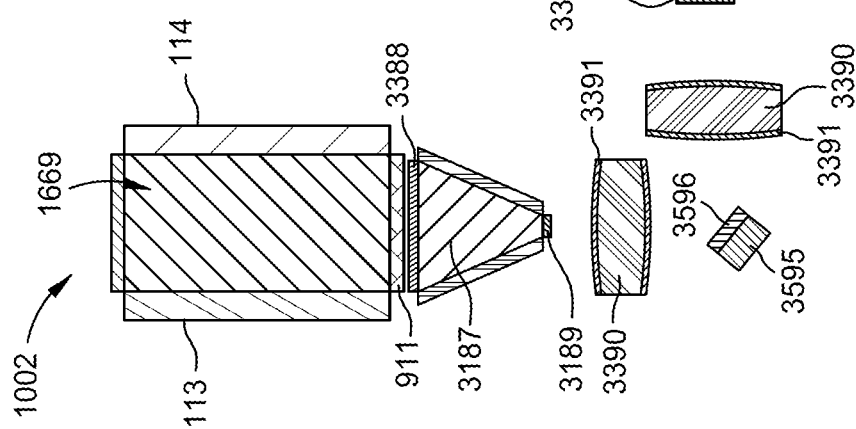
Figure 35A:
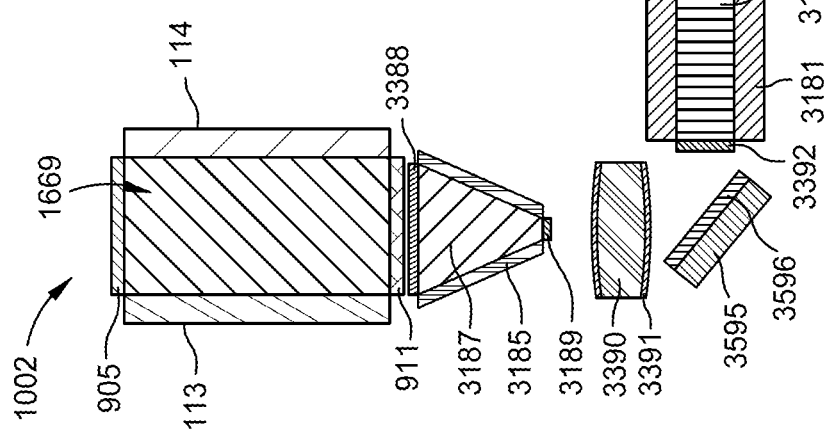

In certain embodiments, optical radiation exiting from optical coupling member 3187 enters an edge of photodiode die 1002 (FIG. 35C). In other embodiments, optical radiation exiting from optical coupling member 3187 enters photodiode die 1002 through openings in n-side reflective electrical contact 3317 (FIGS. 35D-35F). In certain embodiments, optical radiation from optical fiber 3180 is focused onto the entrance aperture 3189 of optical coupling member 3187 by fiber coupling lens 3390 (FIGS. 35C-35E). In certain embodiments, index-matched adhesive 3394 is used to transmit optical radiation from optical coupling member 3187 to photodiode die 1002 (FIGS. 35E, 35F) or from optical fiber 3180 to entrance aperture 3189 (FIG. 35F).

In certain embodiments, the power-over-fiber module is operated near room temperature, that is, less than a temperature of about 400 degrees Kelvin. In other embodiments, the power-over-fiber module is operated at a temperature between about 400 degrees Kelvin and about 500 degrees Kelvin, between about 500 degrees Kelvin and about 600 degrees Kelvin, or above about 600 degrees Kelvin.

In certain embodiments, optical coupling between the optical fiber and the photodiode may be nonrigid or noncontact, enabling easy coupling of optical power to an object that is rotating.

In certain embodiments, electrical power from the photodiode is used to power an Internet-of-Things (IoT) sensor or actuator. In certain embodiments, electrical power from the photodiode is used to power a personal electronic application or personal electronic device.

Figure 28:
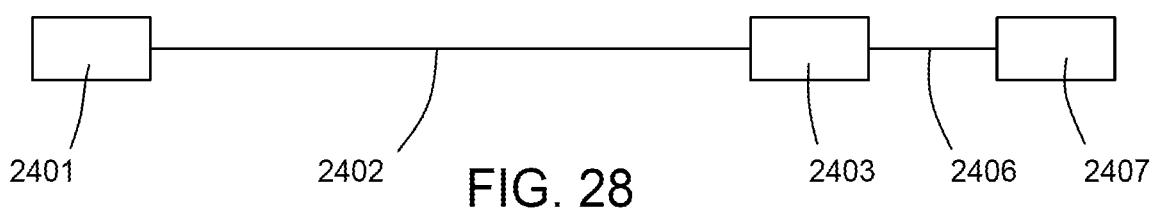
FIG. 28 is a simplified diagram of a power-over-fiber module coupled to a lighting system according to an embodiment of the present disclosure.

In alternative embodiments, transmission of optical power from a light source such as a laser diode to the photodiode is accomplished without a fiber, for example between satellites in space or between the ground and an airborne drone. In certain embodiments, as shown schematically in FIG. 28, the power-over-fiber module is integrated with a lighting system 2407. Lighting system 2407 may include one or more of a phosphor, a heat sink, a reflective or transmissive optic for shaping the far-field distribution of light, a sensor, and a control system. Such a capability is possible with a lighting source (e.g., laser diode) 2401 and photodiode system based on a nitride semiconductor material system but is not possible with an arsenide-based system, for example. A portion of the light injected by a light source, such as a laser diode 2401, through an optical fiber 2402 is converted to electrical power by a photodiode 2403 and the remainder of the light is out-coupled to another optical fiber 2406 and injected into a lighting system 2407. In some embodiments the lighting system 2407 is a luminaire. In some embodiments the lighting system 2407 is an automotive headlight. In some embodiments the luminaire contains one or more phosphors to convert a portion of the light from the optical fiber, for example, having one or more wavelengths between 400 nanometers and 460 nanometers, to emit green, yellow, and/or red light. In some embodiments the luminaire emits light approximating a solar spectrum. In some embodiments the luminaire emits light having a color temperature of approximately 2700 degrees Kelvin, approximately 3000 degrees Kelvin, approximately 4000 degrees Kelvin, or approximately 6000 degrees Kelvin. In some embodiments the luminaire emits light having a color rendition index (CRI) of approximately 80, between 80 and 90, between 90 and 95, or above 95. In some embodiments the luminaire emits collimated light with a cone angle less than 45 degrees, less and 30 degrees, less than 20 degrees, less than 10 degrees, less than 5 degrees, or less than 3 degrees. In certain embodiments electrical power from the photodiode 2403 is used to power a component in the luminaire, such as a sensor or a wireless communication device. In certain embodiments electrical power from the photodiode 2403 is used to power a control system that changes an output characteristic of the lighting system, such as the color temperature, the intensity of blue light relative to the intensity of other colors, the angular distribution of light, or the like.

One or more power-over-fiber modules may be incorporated into a power-over-fiber system. In addition to at least one laser diode light source, at least one power photodiode, and at least one section of optical fiber, the power-over-fiber system may include one or more of a control system, electrical leads to a power source such as a battery, alternator, or mains AC or DC power, a flexible jacket surrounding at least a portion of the optical fiber, at least one temperature sensor, at least one harness member to maintain a position of at least one component of a power-over-fiber module with respect to a structure within which it is placed, a means for providing cooling, such as a fan or flowing coolant liquid, and at least one sensor. The power-over-fiber system may be placed within an automobile, within an automobile engine, within a truck or truck engine, within a bus or bus engine, within a locomotive, within an aircraft or aircraft engine, within a helicopter or helicopter engine, within a house, apartment, or residential building, or within a commercial building.

In certain embodiments, such as a power-over-fiber system in an automobile or within a room in a building, the length of the fiber is relatively short, between about one centimeter and about one meter. In such a case optical attenuation within the fiber may not be performance limiting and other factors, such as turning radius and thermal stability may be more important. In other embodiments, such as a power-over-fiber system in a building where optical power is being transported from one room to another, the length of the fiber may be between one meter and one hundred meters. In this case optical attenuation within the fiber may be more important but turning radius may be less important. In other embodiments the length of the fiber may be between 100 meters and one kilometer, or greater than one kilometer.

The power-over-fiber system may have improved reliability compared to other systems. For example, relative to traditional power-over-wire systems, contacts (optical rather than contact-electrical) may be less susceptible to oxidation or other degradation, and electrical transmission noise generated by electric currents may be eliminated Relative to arsenide-based systems, the nitride-based system may have a longer operating lifetime and be less sensitive to elevated-temperature excursions.

Figure 29B:
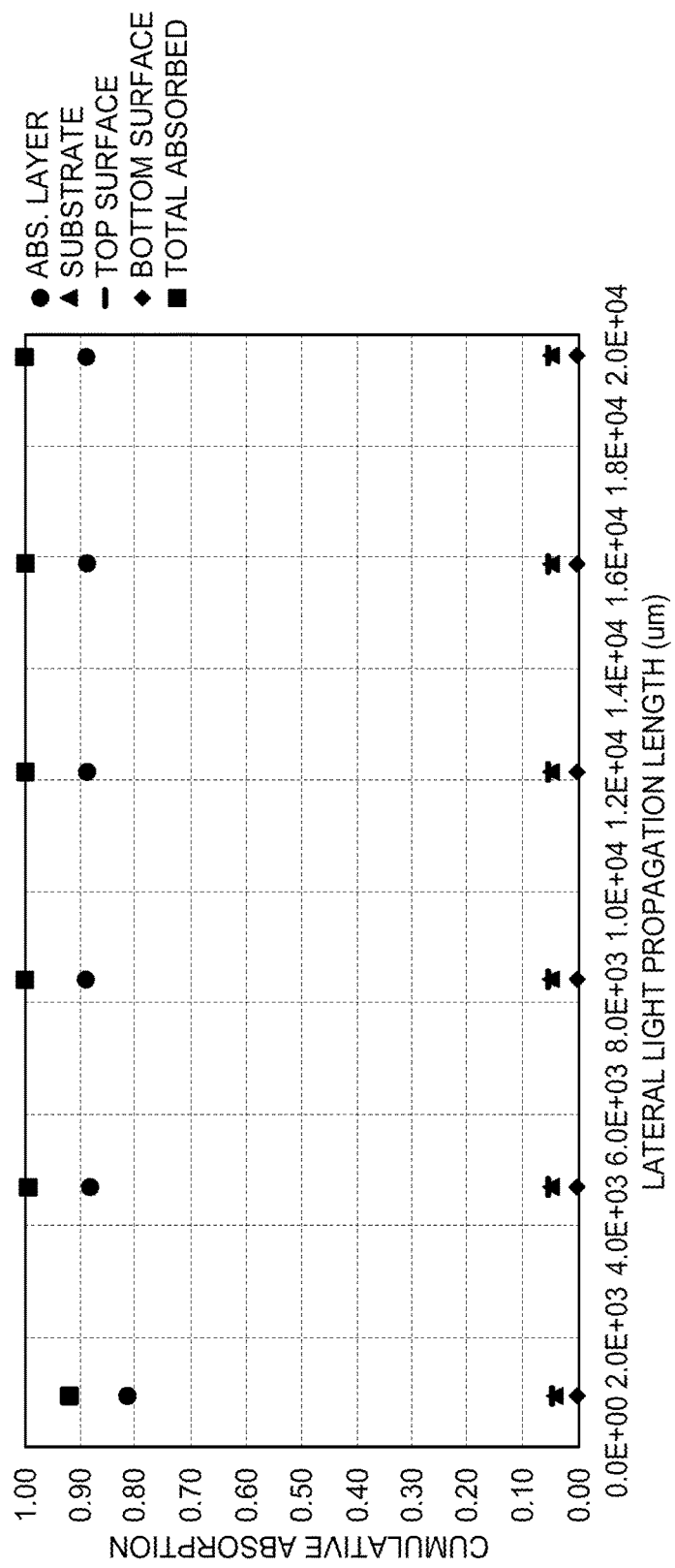

As mentioned above, the primarily lateral propagation of light within the device cavity region of the photodiode enables a relatively thin absorber layer deposited on a relatively thick substrate to absorb the large fraction of light within the device cavity region. We have constructed an optical absorption model for the device cavity region that accounts for absorption within the substrate, non-absorber layers(s), absorber layer(s), and top and bottom reflective contacts in order to quantify the trade-offs between various design parameters for the photodiode. Inputs to the model include the substrate and absorber layer absorption coefficients, refractive indices, and thicknesses, along with the reflectance of the and bottom reflective contacts. With these inputs, the fraction of optical absorption can be calculated as a function of the light propagation angle relative to the plane of the absorber layer(s). As an example, FIGS. 29A-29B shows the cumulative optical absorption in the substrate, absorber layer, top p-contact mirror, and bottom p-contact mirror as a function of lateral propagation distance, along with the input parameters for this calculation. A 15 degree light propagation angle maximized optical absorption within the absorber layer for the set of parameters shown in FIG. 29A.

EXAMPLES

Embodiments provided by the present disclosure are further illustrated by reference to the following comparative examples and exemplary process examples. It will be apparent to those skilled in the art that many modifications, both to materials, and methods, may be practiced without departing from the scope of the disclosure.

Comparative Example 1

Figure 5:
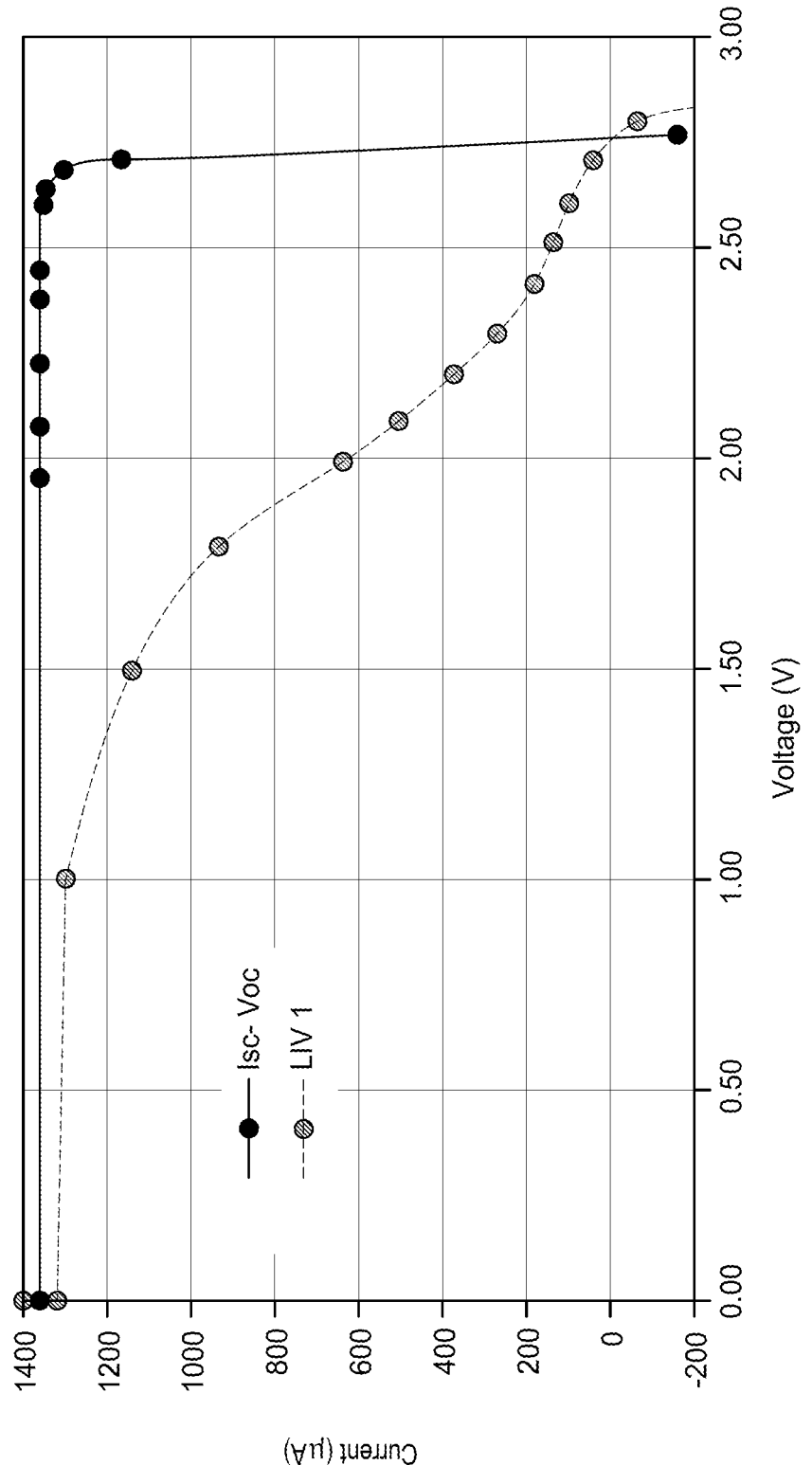
FIG. 5 is a simplified diagram illustrating the illuminated current-voltage behavior and fill factor of a photodiode according to a first comparative embodiment of the present disclosure.

As a point of comparison, a +c-plane, GaN-on-GaN die was harvested from a commercial LED emitting at approximately 405 nanometers and utilized as a photodiode. The LED structure is believed to include an AlGaN electron blocking layer underlying a p-type GaN layer and a multi-quantum-well MQW structure comprising InGaN well layers and GaN barrier layers. The LED structure is believed not to include either highly-doped layers or doped, reduced-bandgap layers directly adjoining the MQW layers. The reverse current-voltage characteristics were recorded under dark and light conditions, where illumination was provided by a commercial 405 nm laser diode. The results are shown in FIG. 5 as the "LIV" curve. From the measured results, $V_{oc}$ was evaluated as 2.74 V, $E_g$=3.06 eV, $I_{sc}$=2.6 A/cm², $eV_{oc}/E_g$=0.89, and FF=46%. The values of $V_{oc}$ and of $I_{sc}$ are seen to be relatively good, whereas the low value for the fill factor indicates that improved device designs are needed. By contrast, a curve with a relatively high fill factor is shown for comparison in FIG. 5.

Comparative Example 2

Figure 6:
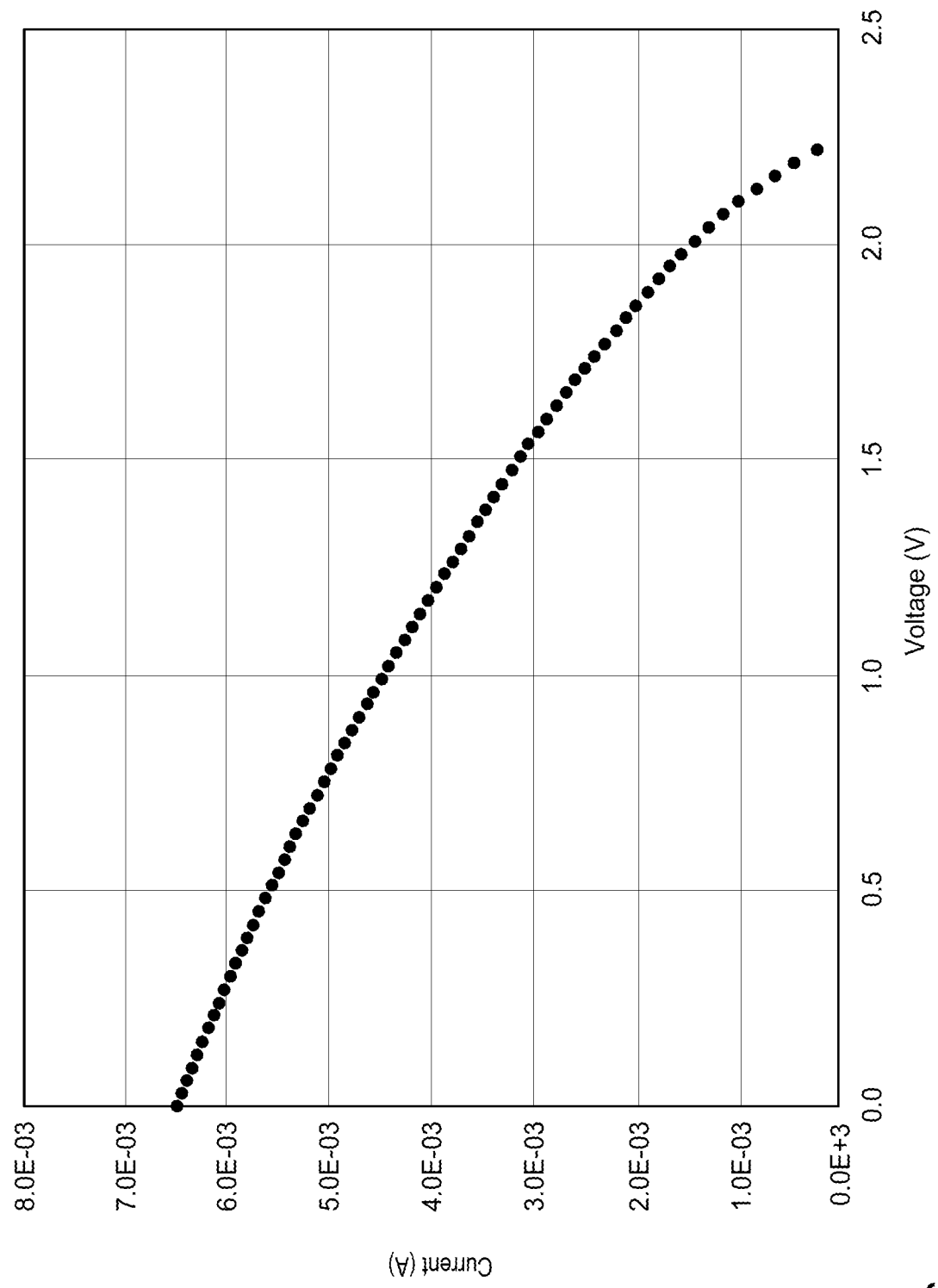
FIG. 6 is a simplified diagram illustrating the illuminated current-voltage behavior and fill factor of a photodiode according to a second comparative embodiment of the present disclosure.

An epitaxial structure, including a 500 nanometer n-type doped GaN layer containing Si dopant at a concentration of $2\times10^{18}$ cm$^{-3}$, followed by a 100 nanometer n-type doped GaN layer containing Si dopant at a concentration of $4\times10^{18}$ cm$^{-3}$, followed by an unintentionally doped absorber layer, followed by a 90 nanometer p-type doped layer containing Mg at a concentration of $1\times10^{19}$ cm$^{-3}$, followed by a 10 nanometer p+-type doped layer containing Mg at a concentration of $1\times10^{20}$ cm$^{-3}$, was deposited on a bulk GaN substrate miscut from (0001) by approximately 0.4 degrees toward [10–10]. The absorber layer was unintentionally doped and consisted of a 7 nanometer GaN layer followed by 10 alternating layers of 4 nanometer $In_{0.14}Ga_{0.86}N$ well layers and 7 nanometer GaN barrier layers. The structure was characterized by an electroluminescence peak at approximately 447 nanometers. The reverse current-voltage characteristics were recorded under dark and light conditions, where illumination was provided by a commercial 405 nm laser diode. The results are shown in FIG. 6. From the measured results, $V_{oc}$ was evaluated as 2.32 V, $E_g$=2.77 eV, $I_{sc}$=6.5×10$^{-3}$ A, $eV_{oc}/E_g$=0.84, and FF=33%. The values of $V_{oc}$ and of $I_{sc}$ are seen to be relatively good, whereas the low value for the fill factor indicates that improved device designs are needed.

Comparative Example 3

Figure 11:
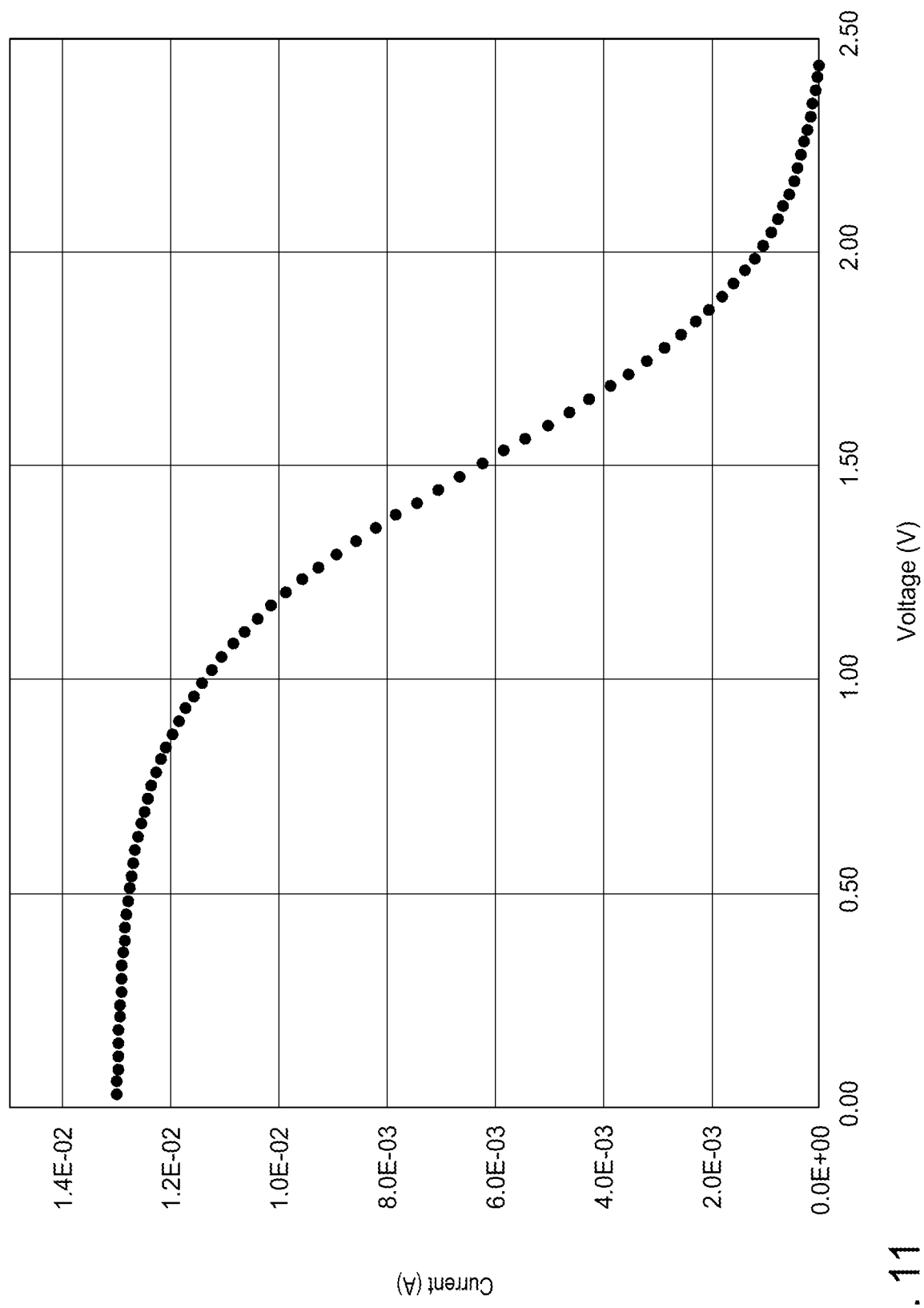
FIG. 11 is a simplified diagram showing photocurrent as a function of applied voltage for an illuminated photodiode according to an embodiment of the current disclosure.

An epitaxial structure, including a 1000 nanometer n-type doped GaN layer containing Si dopant at a concentration of $2.0\times10^{18}$ cm$^{-3}$, followed by a 30 nanometer n-type doped GaN layer containing Si dopant at a concentration of $2\times10^{19}$ cm$^{-3}$, followed by an unintentionally doped absorber layer, followed by a 50 nanometer p-type doped layer containing Mg at a concentration of $2\times10^{19}$ cm$^{-3}$, followed by a 10 nanometer p+-type doped layer containing Mg at a concentration of $1\times10^{20}$ cm$^{-3}$, was deposited on a bulk GaN substrate miscut from (0001) by approximately 0.4 degrees toward [10–10]. The absorber layer was unintentionally doped and consisted of a 40 nanometer double-heterostructure $In_{0.13}Ga_{0.87}N$ layer. The structure was characterized by an electroluminescence peak at approximately 435 nanometers. The reverse current-voltage characteristics were recorded under dark and light conditions, where illumination was provided by a commercial 405 nm laser diode. The results are shown in FIG. 11. From the measured results, $V_{oc}$ was evaluated as 2.43 V, $E_g$=2.85 eV, $I_{sc}$=0.013 A, $eV_{oc}/E_g$=0.85, and FF 38%. The values of $V_{oc}$ and of $I_{sc}$ are seen to be relatively good, whereas the low value for the fill factor indicates that improved device designs are needed.

Comparative Example 4

An epitaxial structure, including a 1000 nanometer n-type doped GaN layer containing Si dopant at a concentration of $2.0\times10^{18}$ cm$^{-3}$, followed by a 100 nanometer n-type doped GaN layer containing Si dopant at a concentration of $5.0\times10^{17}$ cm$^{-3}$, followed by an unintentionally doped absorber layer, followed by a 50 nanometer p-type doped layer containing Mg at a concentration of $2\times10^{20}$ cm$^{-3}$, followed by a 10 nanometer p+-type doped layer containing Mg at a concentration of $1\times10^{20}$ cm$^{-3}$, is deposited on a bulk GaN substrate miscut from (0001) by approximately 0.4 degrees toward [10–10]. The absorber layer is unintentionally doped and consists of a 40 nanometer double-heterostructure $In_{0.18}Ga_{0.82}N$ layer. The structure is characterized by an electroluminescence peak at approximately 473 nanometers. The reverse current-voltage characteristics are recorded under dark and light conditions, where illumination is provided by a commercial 405 nm laser diode. From the measured results, $V_{oc}$ is evaluated as 2.20 V, $E_g$=2.62 eV, $eV_{oc}/E_g$=0.84, and FF 45%. The value of $V_{oc}$ is seen to be relatively good, whereas the low value for the fill factor indicates that improved device designs are needed.

Example 1

An epitaxial structure, including a 1000 nanometer n-type doped GaN layer containing Si dopant at a concentration of $2.0\times10^{18}$ cm$^{-3}$, followed by a 30 nanometer n-type doped GaN layer containing Si dopant at a concentration of $3.0\times10^{19}$ cm$^{-3}$, followed by an unintentionally doped absorber layer, followed by a 50 nanometer p-type doped layer containing Mg at a concentration of $3\times10^{19}$ cm$^{-3}$, followed by a 10 nanometer p+-type doped layer containing Mg at a concentration of $1\times10^{20}$ cm$^{-3}$, is deposited on a bulk GaN substrate miscut from (0001) by approximately 0.4 degrees toward [10–10]. The absorber layer is unintentionally doped and consists of a 40 nanometer double-heterostructure $In_{0.13}Ga_{0.87}N$ layer. The structure is characterized by an electroluminescence peak at approximately 435 nanometers. The reverse current-voltage characteristics are recorded under dark and light conditions, where illumination is provided by a commercial 405 nm laser diode. From the measured results, $V_{oc}$ is evaluated as 2.43 V, $E_g$=2.85 eV, $eV_{oc}/E_g$=0.85, and FF 85%.

Example 2

An epitaxial structure, including a 1000 nanometer n-type doped GaN layer containing Si dopant at an average concentration of $2.0\times10^{18}$ cm$^{-3}$, followed by a 30 nm n-type doped GaN layer containing Si at an average concentration of $4.0\times10^{19}$ cm$^{-3}$, followed by an unintentionally doped absorber layer, followed by a 50 nanometer p-type doped layer containing Mg at a concentration of $2\times10^{20}$ cm$^{-3}$, is deposited on a bulk GaN substrate miscut from (0001) by approximately 0.4 degrees toward [10–10]. The absorber layer is unintentionally doped and consists of a 40 nanometer double-heterostructure $In_{0.18}Ga_{0.82}N$ layer. The structure is characterized by a photoluminescence peak at approximately 473 nanometers. The reverse current-voltage characteristics are recorded under dark and light conditions, where illumination is provided by a commercial 405 nm laser diode. From the measured results, $V_{oc}$ is evaluated as 2.20 V, $E_g$=2.62 eV, $eV_{oc}/E_g$=0.84, and FF 91%.

Example 3

An epitaxial structure, including a 1000 nanometer n-type doped GaN layer containing Si dopant at an average concentration of $2.0\times10^{18}$ cm$^{-3}$, followed by a 100 nm n-type doped GaN layer containing Si at an average concentration of $5.0\times10^{17}$ cm$^{-3}$, followed by an approximately 6 nm thick compositionally-graded InGaN layer with an initial composition of GaN and final composition of approximately $In_{0.18}Ga_{0.72}N$ and a Si dopant concentration of approximately $5.0\times10^{17}$ cm$^{-3}$ followed by an unintentionally doped absorber layer, followed by a 50 nanometer p-type doped layer containing Mg at a concentration of $2\times10^{20}$ cm$^{-3}$, is deposited on a bulk GaN substrate miscut from (0001) by approximately 0.4 degrees toward [10–10]. The absorber layer is unintentionally doped and consists of a 40 nanometer double-heterostructure $In_{0.18}Ga_{0.82}N$ layer. The structure is characterized by a photoluminescence peak at approximately 473 nanometers. The reverse current-voltage characteristics are recorded under dark and light conditions, where illumination is provided by a commercial 405 nm laser diode. From the measured results, $V_{oc}$ is evaluated as 2.20 V, $E_g$=2.62 eV, $eV_{oc}/E_g$=0.84, and FF 85%.

Example 4

Figure 12:
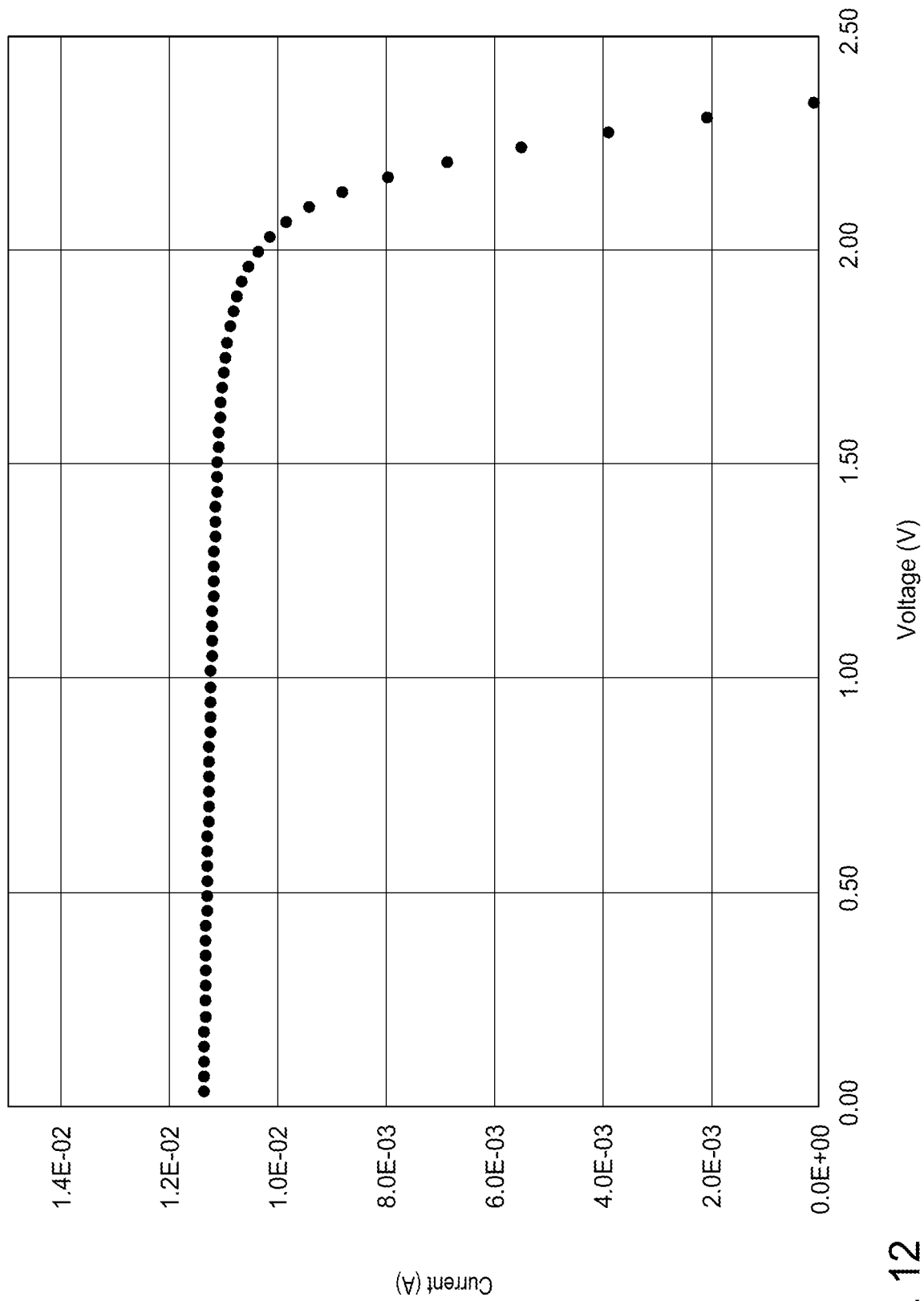
FIG. 12 is a simplified diagram showing photocurrent as a function of applied voltage for an illuminated packaged photodiode according to an embodiment of the current disclosure.

An epitaxial structure, including a 300 nanometer n-type doped GaN layer containing Si dopant at an average concentration of $3.5\times10^{18}$ $cm^{-3}$, followed by an InGaN—GaN strained-layer-superlattice (SLS), followed by an approximately 6 nm thick compositionally-graded InGaN layer with an initial composition of approximately $In_{0.04}Ga_{0.96}N$ and final composition of approximately $In_{0.2}Ga_{0.8}N$ and a Si dopant concentration of approximately $4.0\times10^{17}$ $cm^{-3}$, followed by a 9-period multi-quantum well structure comprised of 3 nm $In_{0.2}Ga_{0.8}N$ wells and 9 nm GaN barrier layers containing Si dopant at a concentration of approximately $3\times10^{17}$ $cm^{-3}$, followed by a 100 nanometer p-type doped layer containing Mg at a concentration of approximately $2\times10^{20}$ $cm^{-3}$, was grown on a sapphire substrate with the substrate surface normal within 5 degrees of the [0001] of the nitride epitaxial layers. The absorber layer consisted of the 9-period multi-quantum well structure. The structure was characterized by a photoluminescence peak at approximately 457 nanometers. The reverse current-voltage characteristics of fabricated devices were recorded under dark and light conditions, where illumination was provided by a commercial 405 nm laser diode. The results are shown in FIG. 12. From the measured results, $V_{oc}$ was evaluated as 2.34 V, $E_g$=2.71 eV, $I_{sc}$=0.0114 A, $eV_{oc}/E_g$=0.86, and FF 78%. The values of $V_{oc}$, $I_{sc}$, and FF are seen to be relatively good. The measured FF is artificially low due to series resistance arising from the method of electrically probing the n metal contact.

Example 5

An epitaxial structure, including a 1000 nanometer n-type doped GaN layer containing Si dopant at an average concentration of $1.0\times10^{18}$ $cm^{-3}$, followed by an unintentionally-doped, 20-period multi-quantum well structure comprised of 2 nm $In_{0.18}Ga_{0.82}N$ wells and 4 nm GaN barrier layers, followed by a 50 nanometer p-type doped layer containing Mg at a concentration of approximately $2\times10^{18}$ $cm^{-3}$, is deposited on a bulk GaN substrate miscut from (000–1) by approximately 4 degrees toward [10–10]. The absorber layer consisted of the 9-period multi-quantum well structure. The structure is characterized by a photoluminescence peak at approximately 470 nanometers. The reverse current-voltage characteristics are recorded under dark and light conditions, where illumination is provided by a commercial 405 nm laser diode. From the measured results, $V_{oc}$ is evaluated as 2.20 V, $E_g$=2.63 eV, $eV_{oc}/E_g$=0.84, and FF 88%.

Example 6

An epitaxial structure, including a 1000 nanometer n-type doped GaN layer containing Si dopant at an average concentration of $5.0\times10^{18}$ $cm^{-3}$, followed by an unintentionally-doped, 20-period multi-quantum well structure comprised of 2 nm $In_{0.18}Ga_{0.82}N$ wells and 4 nm GaN barrier layers, followed by a 100 nanometer p-type doped layer containing Mg at a concentration of approximately $1\times10^{19}$ $cm^{-3}$, is deposited on a bulk GaN substrate having a crystallographic orientation within 0.1 degree of (30–3–1). The structure is characterized by a photoluminescence peak at approximately 470 nanometers. The reverse current-voltage characteristics are recorded under dark and light conditions, where illumination is provided by a commercial 405 nm laser diode. From the measured results, $V_{oc}$ is evaluated as 2.20 V, $E_g$=2.63 eV, $eV_{oc}/E_g$=0.84, and FF 88%.

While the foregoing is directed to embodiments of the present disclosure, other and further embodiments of the disclosure may be devised without departing from the basic scope thereof, and the scope thereof is determined by the claims that follow.

What is claimed is:

1. An optical assembly, comprising:
at least one laser diode,
at least a first photodiode; and
at least one optical fiber that is configured to transmit electromagnetic radiation between the laser diode and the first photodiode, wherein
the at least one laser diode comprises at least one active layer comprising $Al_xIn_yGa_{1-x-y}N$, where $0\leq$ x, y, x+y$\leq$ 1 and having a dislocation density below about $10^7$ $cm^{-2}$,
the first photodiode comprises one or more absorber layers disposed between an n-type layer and a p-type layer, each of the one or more absorber layers, the n-type layer and the p-type layer comprising $Al_xIn_yGa_{1-x-y}N$, where $0\leq$ x, y, x+y$\leq$ 1 and having a dislocation density below about $10^{10}$ $cm^{-2}$;
the at least one laser diode has an emission wavelength between about 400 nanometers and about 500 nanometers,
the first photodiode has one or more absorber layer bandgap wavelengths that are between about 400 nanometers and about 550 nanometers and is characterized by an electrical power fill factor greater than about 50%, and
at least one optical fiber has a branched structure that is formed between the at least one laser diode and the first photodiode.

2. The optical assembly of claim 1, wherein the one or more absorber layers each comprise:
a multi-quantum-well structure that comprises alternating quantum well layers, with a thickness between 1 nanometer and 20 nanometers, and barrier layers, with a thickness between 0.5 nanometer and 15 nanometers, or
a double-heterostructure having a thickness between 10 nanometers and 100 nanometers,
the thicknesses being measured in a first direction, and an absorber layer surface that is oriented normal to the first direction.

3. The optical assembly of claim 1, further comprising an optical cavity region having an optical window, the optical cavity region comprising:
a device cavity region, the device cavity region comprising the one or more absorber layers, the n-type layer, and the p-type layer; and
at least two reflective members that are positioned to cause internal reflection of electromagnetic radiation entering through the optical window to pass through the device cavity region at least two or more times.

4. The optical assembly of claim 1, wherein
the at least one laser diode is configured to have an emission wavelength between 400 nanometers and 410 nanometers and the photodiode is configured to have one or more absorber layer bandgap wavelengths between 400 nanometers and 460 nanometers; or the at least one laser diode is configured to have an emission wavelength between 440 nanometers and 460 nanometers and the photodiode is configured to have one or more absorber layer bandgap wavelengths between 440 nanometers and 500 nanometers.

5. The optical assembly of claim 1, further comprising at least one optical dispensing device configured to receive the electromagnetic radiation emitted from the at least one laser diode and transmit a portion of the received electromagnetic radiation to the first photodiode.

6. The optical assembly of claim 1, wherein
the at least one laser diode comprises a first laser diode and a second laser diode,
the optical assembly further comprises a second photodiode,
the at least one optical fiber comprises a first optical fiber that has a first branch at a first end and a second branch at a second end,
the first laser diode is in optical communication with a first fiber branch of the first branch at the first end,
the first photodiode is in optical communication with a second fiber branch of the first branch at the first end,
the second laser diode is in optical communication with a first fiber branch of the second branch at the second end, and
the second photodiode is in optical communication with a second fiber branch of the second branch at the second end.

7. The optical assembly of claim 1, wherein the first photodiode is configured for both input and output optical power.

8. The optical assembly of claim 1, further comprising at least one non-rigid or non-contact optical coupling to accommodate rotation of the first photodiode relative to the at least one laser diode.

9. An optical assembly, comprising:
at least one laser diode,
at least a first photodiode; and
at least one optical fiber that is configured to transmit electromagnetic radiation between the laser diode and the first photodiode; and
a control module, wherein
the at least one laser diode comprises at least one active layer comprising $Al_xIn_yGa_{1-x-y}N$, where $0 \leq x, y, x+y \leq 1$ and having a dislocation density below about $10^7$ cm$^{-2}$,
the first photodiode comprises one or more absorber layers disposed between an n-type layer and a p-type layer, each of the one or more absorber layers, the n-type layer and the p-type layer comprising $Al_xIn_yGa_{1-x-y}N$, where $0 \leq x, y, x+y \leq 1$ and having a dislocation density below about $10^{10}$ cm$^{-2}$;
the at least one laser diode has an emission wavelength between about 400 nanometers and about 500 nanometers,
the first photodiode has one or more absorber layer bandgap wavelengths that are between about 400 nanometers and about 550 nanometers and is characterized by an electrical power fill factor greater than about 50%, and
the control module is configured to modulate laser diode power provided from the at least one laser diode at at least one controlled AC frequency and to separate a photodiode signal into a DC power component and an AC signal component at the at least one controlled frequency.

10. The optical assembly of claim 9, wherein the AC signal component is modulated at an audio frequency and the control module is coupled to a headphone or to an audio speaker.

11. The optical assembly of claim 9, wherein an amplitude of the AC signal component of the modulated laser diode power is less than 10% of the corresponding DC power component.

12. The optical assembly of claim 9, wherein the first photodiode, which is configured to convert the DC power component into electrical power, is further configured to detect a characteristic of the AC signal component at the at least one controlled frequency.

13. The optical assembly of claim 9, further comprising a separate, signal photodetector device, wherein the separate, signal photodetector device is configured to detect the AC signal component at the at least one controlled frequency.

14. The optical assembly of claim 13, wherein the separate, signal photodetector device is positioned between an end of the optical fiber and the first photodiode.

15. The optical assembly of claim 13, wherein the separate, signal photodetector device is positioned proximate to an optical coupling member, the optical coupling member being positioned between an end of the optical fiber and the first photodiode.

16. An optical assembly, comprising:
at least one laser diode,
at least a first photodiode; and
at least one optical fiber that is configured to transmit electromagnetic radiation between the laser diode and the first photodiode; and
a lighting system, wherein
the at least one laser diode comprises at least one active layer comprising $Al_xIn_yGa_{1-x-y}N$, where $0 \leq x, y, x+y \leq 1$ and having a dislocation density below about $10^7$ cm$^{-2}$,
the first photodiode comprises one or more absorber layers disposed between an n-type layer and a p-type layer, each of the one or more absorber layers, the n-type layer and the p-type layer comprising $Al_xIn_yGa_{1-x-y}N$, where $0 \leq x, y, x+y \leq 1$ and having a dislocation density below about $10^{10}$ cm$^{-2}$;
the at least one laser diode has an emission wavelength between about 400 nanometers and about 500 nanometers,
the first photodiode has one or more absorber layer bandgap wavelengths that are between about 400 nanometers and about 550 nanometers and is characterized by an electrical power fill factor greater than about 50%, and
the lighting system comprises at least one of a phosphor, a heat sink, a reflective or transmissive optic, or a sensor, wherein a portion of the electromagnetic radiation received by the first photodiode, from the at least one laser diode, is received by the phosphor or reflective or transmissive optic.

17. The optical assembly of claim 16, wherein the lighting system further comprises a luminaire that is configured to receive electromagnetic radiation emitted from the phosphor due to the portion of the electromagnetic radiation emitted by the first photodiode being received by the phosphor.

18. The optical assembly of claim 16, wherein the lighting system comprises an automotive headlight.

\* \* \* \* \*